US012635401B2

(12) United States Patent
Stoessel et al.

(10) Patent No.: US 12,635,401 B2
(45) Date of Patent: May 19, 2026

(54) METAL COMPLEXES

(71) Applicant: UDC IRELAND LIMITED, Dublin (IE)

(72) Inventors: Philipp Stoessel, Darmstadt (DE); Armin Auch, Darmstadt (DE)

(73) Assignee: UDC Ireland, Dublin (IE)

( * ) Notice: Subject to any disclaimer, the term of this patent is extended or adjusted under 35 U.S.C. 154(b) by 918 days.

(21) Appl. No.: 17/779,595

(22) PCT Filed: Dec. 2, 2020

(86) PCT No.: PCT/EP2020/084216

§ 371 (c)(1),
(2) Date: May 25, 2022

(87) PCT Pub. No.: WO2021/110720

PCT Pub. Date: Jun. 10, 2021

(65) Prior Publication Data

US 2023/0056324 A1 Feb. 23, 2023

(30) Foreign Application Priority Data

Dec. 4, 2019 (EP) .................................... 19213385

(51) Int. Cl.

| | |
|---|---|
| ***H10K 85/30*** | (2023.01) |
| ***C07F 15/00*** | (2006.01) |
| ***C09K 11/06*** | (2006.01) |
| ***H10K 50/11*** | (2023.01) |

(52) U.S. Cl.

CPC ....... *H10K 85/342* (2023.02); *C07F 15/0033* (2013.01); *C09K 11/06* (2013.01); *C09K 2211/1029* (2013.01); *C09K 2211/185* (2013.01); *H10K 50/11* (2023.02)

(58) Field of Classification Search

CPC ... H10K 85/342; H10K 50/11; C07F 15/0033; C09K 11/06; C09K 2211/1029; C09K 2211/185

USPC ..................................................... 252/301.16

See application file for complete search history.

(56) References Cited

U.S. PATENT DOCUMENTS

| | | | |
|---|---|---|---|
| 7,332,232 B2 | 2/2008 | Ma et al. | |
| 2017/0309838 A1 | 10/2017 | Layek et al. | |
| 2018/0026208 A1 | 1/2018 | Tsai | |
| 2018/0026209 A1* | 1/2018 | Stoessel ................ | C07F 15/008 252/519.2 |

(Continued)

FOREIGN PATENT DOCUMENTS

| | | |
|---|---|---|
| CN | 107922451 A | 4/2018 |
| CN | 109476691 A | 3/2019 |
| JP | 2013-168552 A | 8/2013 |

(Continued)

OTHER PUBLICATIONS

International Preliminary Report on Patentability received for PCT Patent Application No. PCT/EP2020/084216, mailed on Jun. 16, 2022, 12 pages (6 pages of English Translation and 6 pages of Original Document).

(Continued)

*Primary Examiner* — Anita Nassiri-Motlagh
(74) *Attorney, Agent, or Firm* — Riverside Law LLP

(57) ABSTRACT

The invention relates to iridium complexes that are suitable for use in organic electroluminescent devices, in particular as emitters.

13 Claims, 1 Drawing Sheet

(56) References Cited

U.S. PATENT DOCUMENTS

| | | | |
|---|---|---|---|
| 2018/0254416 | A1 | 9/2018 | Stoessel |
| 2019/0161510 | A1 | 5/2019 | Stoessel |

FOREIGN PATENT DOCUMENTS

| | | | |
|---|---|---|---|
| JP | 2013-243234 | A | 12/2013 |
| JP | 2018510903 | | 4/2018 |
| JP | 2019527684 | | 10/2019 |
| JP | 2019530681 | | 10/2019 |
| JP | 2019534244 | | 11/2019 |
| WO | 2007086505 | A1 | 8/2007 |
| WO | 2013/061850 | A1 | 5/2013 |
| WO | 2016/124304 | A1 | 8/2016 |
| WO | 2018/011186 | A1 | 1/2018 |
| WO | 2018/041769 | A1 | 3/2018 |
| WO | 2018/054798 | A1 | 3/2018 |
| WO | 2018/077769 | A1 | 5/2018 |
| WO | 2019158453 | A1 | 8/2019 |

OTHER PUBLICATIONS

International Search Report and Written Opinion received for PCT Patent Application No. PCT/EP2020/084216, mailed on Feb. 1, 2021, 12 pages (3 pages of English Translation and 9 pages of Original Document).

* cited by examiner

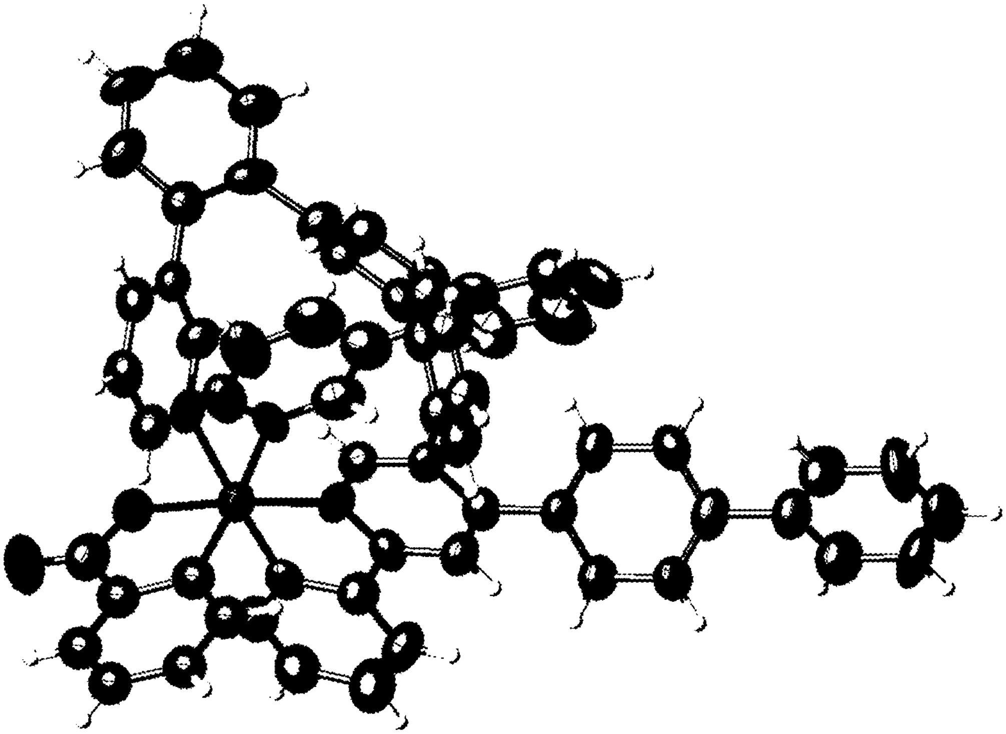

METAL COMPLEXES

CROSS-REFERENCE TO RELATED APPLICATIONS

This application is a national stage application (under 35 U.S.C. § 371) of PCT/EP2020/084216, filed Dec. 2, 2020, which claims benefit of European Application No. 19213385.8, filed Dec. 4, 2019, both of which are incorporated herein by reference in their entirety.

The present invention relates to iridium complexes suitable for use in organic electroluminescent devices, especially as emitters.

According to the prior art, triplet emitters used in phosphorescent organic electroluminescent devices (OLEDs) are in particular bis- and tris-ortho-metalated iridium complexes having aromatic ligands. Examples of such complexes are tris(phenylpyridyl)iridium(III), and a multitude of related complexes, for example with 1- or 3-phenylisoquinoline ligands, with 2-phenylquinoline ligands or with phenylcarbene ligands. Complexes of this kind are also known with polypodal ligands, as described, for example, in U.S. Pat. No. 7,332,232 and WO 2016/124304.

It is an object of the present invention to provide novel and, in particular, improved metal complexes which are suitable as emitter for use in OLEDs and which have a good lifetime and efficiency.

It has been found that, surprisingly, this object is achieved by the metal complexes described hereinafter which contain a tetradentate tripodal ligand and one bidentate or two monodentate ligands, and these are of very good suitability for use in an organic electroluminescent device. The present invention therefore provides these metal complexes and organic electroluminescent devices comprising these complexes.

The invention provides a compound of the formula (1):

Formula (I)

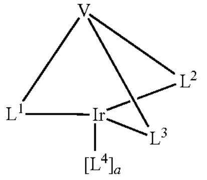

where the symbols and indices used are as follows:

$L^1$ is a bidentate subligand which coordinates to the iridium via one carbon atom and one nitrogen atom or via two carbon atoms;

$L^2$, $L^3$ are the same or different at each instance and are selected from an aryl or heteroaryl group having 5 to 14 aromatic ring atoms or a heteroalicyclic group having 5 to 7 ring atoms, each of which coordinates to the iridium via a carbon atom or a nitrogen atom, each of which is part of the aryl or heteroaryl group or the heteroalicyclic group, and which may be substituted by one or more R radicals;

$L^4$ is a bidentate ligand or is the same or different at each instance and is a monodentate ligand;

a is 1 when $L^4$ is a bidentate ligand, and is 2 when $L^4$ is a monodentate ligand;

V is a group of the formula (2) or (3)

Formula (2)

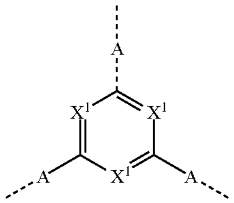

Formula (3)

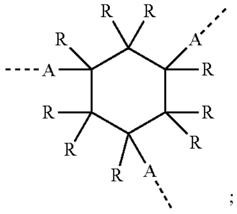

;

where the dotted bonds each represent the position of linkage of the subligands $L^1$, $L^2$ and $L^3$, and in addition:

A is the same or different at each instance and is $CR_2$—$CR_2$ or a group of the following formula (4):

Formula (4)

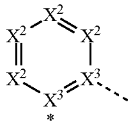

where the dotted bond in each case represents the position of the bond of the subligands $L^1$, $L^2$ or $L^3$ and * represents the position of the linkage of the unit of the formula (4) to the central trivalent aryl or heteroaryl group in formula (2) or to the central cyclohexane group in formula (3);

$X^1$ is the same or different at each instance and is CR or N;

$X^2$ is the same or different at each instance and is CR or N; or two adjacent $X^2$ groups together are NR, O or S, thus forming a five-membered ring, and the remaining $X^2$ groups are the same or different at each instance and are CR or N; or two adjacent $X^2$ groups together are CR or N when one of the $X^3$ groups in the cycle is N, thus forming a five-membered ring, and the remaining $X^2$ groups are the same or different at each instance and are CR or N; with the proviso that not more than two adjacent $X^2$ groups in each ring are N;

$X^3$ is C at each instance in the same cycle or one $X^3$ group is N and the other $X^3$ group in the same cycle is C; with the proviso that two adjacent $X^2$ groups together are CR or N when one of the $X^3$ groups in the cycle is N;

R is the same or different at each instance and is H, D, F, Cl, Br, I, $N(R^1)_2$, $OR^1$, $SR^1$, CN, $NO_2$, COOH, $C({=}O)N(R^1)_2$, $Si(R^1)_3$, $Ge(R^1)_3$, $B(OR^1)_2$, $C({=}O)R^1$, $P({=}O)(R^1)_2$, $S({=}O)R^1$, $S({=}O)_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals and where one or more nonadjacent $CH_2$ groups may be replaced by $Si(R^1)_2$, C═O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, $OR^2$, $SR^2$, CN, $NO_2$, $Si(R^2)_3$, $Ge(R^2)_3$, $B(OR^2)_2$, $C(=O)R^2$, $P(=O)(R^2)_2$, $S(=O)R^2$, $S(=O)_2R^2$, $OSO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals and where one or more nonadjacent $CH_2$ groups may be replaced by $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic and/or heteroaromatic organic radical, especially a hydrocarbyl radical, having 1 to 20 carbon atoms, in which one or more hydrogen atoms may also be replaced by F.

The complex is thus one having a tetradentate tripodal ligand having one bidentate and two monodentate subligands, and one bidentate or two monodentate ligands. What is meant here by "bidentate subligand" is that the subligand in the complex coordinates or binds to the iridium via two coordination sites, and what is meant by "monodentate subligand" is that the subligand coordinates or binds to the iridium via one coordination site. "Tripodal" means that the ligand has three subligands bonded to the bridge V or the bridge of the formula (2) or (3). Since the ligand containing the bridge V has one bidentate and two monodentate subligands, the overall result is a tetradentate ligand, i.e. a ligand which coordinates or binds to the iridium via four coordination sites. The expression "bidentate subligand" or "monodentate subligand" in the context of this application means that $L^1$ would be a bidentate ligand or $L^2$ and $L^3$ would be monodentate ligands if the bridge V or the bridge of the formula (2) or (3) were absent. However, as a result of the formal abstraction of a hydrogen atom from this bidentate or monodentate ligand and the attachment to the bridge V or the bridge of the formula (2) or (3), these are no longer separate ligands but a portion of the resultant tetradentate ligand, and so the term "subligand" is used therefor.

The bonds of the ligands or subligands to the iridium may either be coordinate bonds or covalent bonds, or the covalent component of the bond may vary according to the ligand. When the present application says that the ligand or the subligand coordinates or binds to the iridium, this refers in the context of the present application to any kind of bond of the ligand or subligand to the iridium, irrespective of the covalent component of the bond.

When two R or $R^1$ radicals together form a ring system, it may be mono- or polycyclic, aliphatic, heteroaliphatic, aromatic or heteroaromatic. In this case, these radicals which together form a ring system may be adjacent, meaning that these radicals are bonded to the same carbon atom or to carbon atoms directly bonded to one another, or they may be further removed from one another. Preference is given to this kind of ring formation in radicals bonded to the same carbon atom or to carbon atoms directly bonded to one another.

The wording that two or more radicals together may form an aliphatic ring, in the context of the present description, shall be understood to mean, inter alia, that the two radicals are joined to one another by a chemical bond with formal elimination of two hydrogen atoms. This is illustrated by the following scheme:

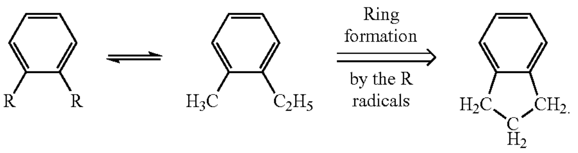

The formation of a fused-on aromatic or heteroaromatic group is also possible, as illustrated by the following scheme:

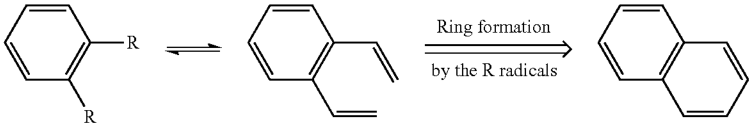

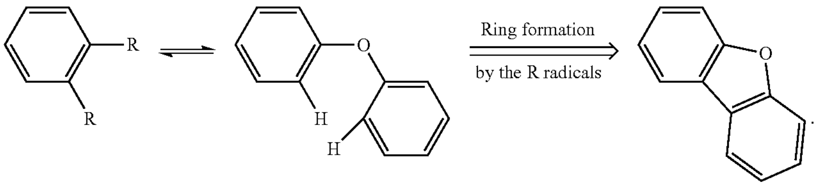

In addition, however, the abovementioned wording shall also be understood to mean that, if one of the two radicals is hydrogen, the second radical binds to the position to which the hydrogen atom was bonded, forming a ring. This will be illustrated by the following scheme:

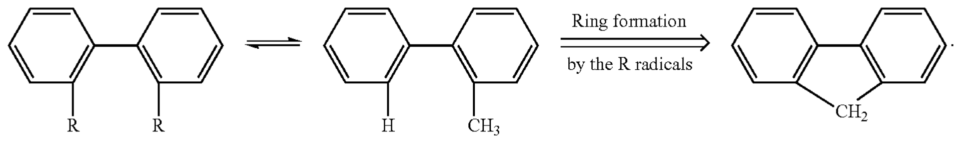

A heteroalicyclic group in the context of the present invention is an aliphatic cyclic group having at least one heteroatom as part of the cycle. It preferably has one or two heteroatoms as part of the cycle, where the heteroatoms are preferably selected from the group consisting of nitrogen, oxygen and sulfur.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. The heteroaryl group in this case preferably contains not more than three heteroatoms. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system. Preferred aromatic or heteroaromatic ring systems are simple aryl or heteroaryl groups and groups in which two or more aryl or heteroaryl groups are joined directly to one another, for example biphenyl or bipyridine, and also fluorene or spirobifluorene.

In the context of the present invention, the term “alkyl group” is used as an umbrella term both for linear or branched alkyl groups and for cyclic alkyl groups. Analogously, the terms “alkenyl group” and “alkynyl group” are used as umbrella terms both for linear or branched alkenyl or alkynyl groups and for cyclic alkenyl or alkynyl groups. A cyclic alkyl, alkoxy or thioalkoxy group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be substituted by the abovementioned groups is understood to mean, for example, the methyl, ethyl, n-propyl, i-propyl, cyclopropyl, n-butyl, i-butyl, s-butyl, t-butyl, cyclobutyl, 2-methylbutyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. An $OR^1$ group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

In a preferred embodiment, the compound of the invention is electrically uncharged. In this case, iridium is in the form of Ir(III). Charge neutrality is achieved by virtue of balancing of the charges of the subligands and ligands $L^1$ to $L^4$ with the charge of the triply positively charged iridium. $L^1$ here may be uncharged, monoanionic or dianionic. $L^2$ and $L^3$ may each be uncharged or monoanionic. Examples of suitable combinations of the subligands and ligands $L^1$ to $L^4$ are listed in the following table:

| $L^1$ | $L^2$ | $L^3$ | $L^4$ (bidentate) | $L^4$ (monodentate) |
|---|---|---|---|---|
| monoanionic | monoanionic | monoanionic | uncharged | — |
| monoanionic | monoanionic | uncharged | monoanionic | — |
| monoanionic | uncharged | uncharged | dianionic | — |
| monoanionic | monoanionic | monoanionic | — | 2x uncharged |
| monoanionic | monoanionic | uncharged | — | uncharged + monoanionic |
| monoanionic | uncharged | uncharged | — | 2x monoanionic |
| uncharged | monoanionic | monoanionic | monoanionic | — |
| uncharged | monoanionic | uncharged | dianionic | — |
| uncharged | monoanionic | monoanionic | — | uncharged + monoanionic |
| uncharged | monoanionic | uncharged | — | 2x monoanionic |
| dianionic | monoanionic | uncharged | uncharged | — |
| dianionic | uncharged | uncharged | monoanionic | — |
| dianionic | monoanionic | uncharged | — | 2x uncharged |
| dianionic | uncharged | uncharged | — | uncharged + monoanionic |

In a preferred embodiment of the invention, $L^1$ is monoanionic, and so the first six entries in the table are preferred.

Preferred embodiments of the bridgehead V, i.e. the structure of the formula (2) or (3), are detailed hereinafter.

In a preferred embodiment of the invention, all $X^1$ groups in the group of the formula (2) are CR, and so the central trivalent cycle of the formula (2) is a benzene, or all $X^1$ groups are a nitrogen atom, and so the central trivalent cycle of the formula (2) is a triazine. More preferably, all $X^1$ groups are the same or different and are CR.

The following is applicable in respect of preferred R radicals on the trivalent central benzene ring of the formula (2) or on the central cyclohexane ring of the formula (3):

R is the same or different at each instance and is H, D, F, CN, $OR^1$, a straight-chain alkyl group having 1 to 10 carbon atoms, preferably having 1 to 4 carbon atoms, or an alkenyl group having 2 to 10 carbon atoms or a branched or cyclic alkyl group having 3 to 10 carbon atoms, preferably having 3 to 6 carbon atoms, each of which may be substituted by one or more $R^1$ radicals but is preferably unsubstituted, or an aromatic or heteroaromatic ring system which has 5 to 24 aromatic ring atoms, preferably 6 to 12 aromatic ring atoms, and may be substituted in each case by one or more $R^1$ radicals; at the same time, the R radical may also form a ring system with an R radical on $X^2$;

$R^1$ is the same or different at each instance and is H, D, F, CN, $OR^2$, a straight-chain alkyl group having 1 to 10 carbon atoms, preferably having 1 to 4 carbon atoms, or an alkenyl group having 2 to 10 carbon atoms or a branched or cyclic alkyl group having 3 to 10 carbon atoms, preferably having 3 to 6 carbon atoms, each of which may be substituted by one or more $R^2$ radicals but is preferably unsubstituted, or an aromatic or heteroaromatic ring system which has 5 to 24 aromatic ring atoms, preferably 6 to 12 aromatic ring atoms, and may be substituted in each case by one or more $R^2$ radicals; at the same time, two or more adjacent $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F, preferably an aliphatic or aromatic hydrocarbyl radical having 1 to 12 carbon atoms.

More preferably, all $X^1$ groups in formula (2) are CH or CD, especially CH. Further preferably, all R groups in the group of the formula (3) are H or D, especially H, and so the central cycle in formula (3) is an unsubstituted cyclohexane group.

Preferred embodiments of the group of the formula (2) or (3) are the structures of the following formulae (2a) and (3a):

Formula (2a)

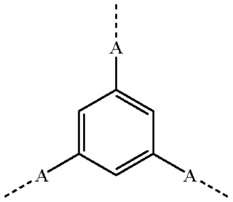

Formula (3a)

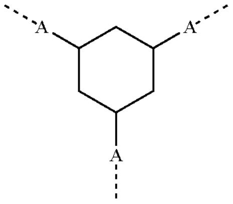

where the symbols used have the definitions given above.

There follows a description of preferred bivalent arylene or heteroarylene units A and the groups of the formula (4) as occur in the group of the formulae (2) and (3).

In a preferred embodiment of the invention, the symbol $X^3$ in the group of the formula (4) is C, and so the group of the formula (4) is represented by the following formula (4'):

Formula (4')

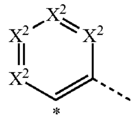

where the symbols have the definitions listed above.

The group of the formula (4) or (4') may represent a heteroaromatic five-membered ring or an aromatic or heteroaromatic six-membered ring. In a preferred embodiment of the invention, the group of the formula (4) or (4') contains not more than two heteroatoms in the aryl or heteroaryl group, more preferably not more than one heteroatom. This does not mean that any substituents bonded to this group cannot also contain heteroatoms. In addition, this definition does not mean that formation of rings by substituents does not give rise to fused aromatic or heteroaromatic structures, for example naphthalene, benzimidazole, etc. Examples of suitable groups of the formula (4) or (4') are benzene, pyridine, pyrimidine, pyrazine, pyridazine, pyrrole, furan, thiophene, pyrazole, imidazole, oxazole and thiazole.

Preferred embodiments of the group of the formula (4') are the structures of the following formulae (4a) to (4q):

Formula (4a)

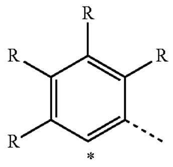

Formula (4b)

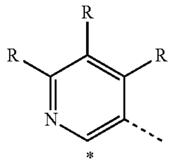

Formula (4c)

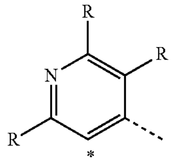

Formula (4d)

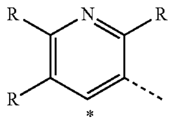

Formula (4e)

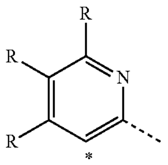

Formula (4f)

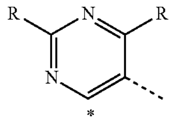

Formula (4g)

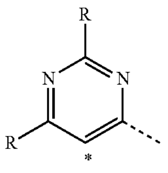

-continued

Formula (4h)

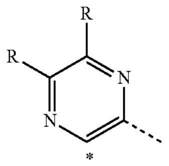

Formula (4i)

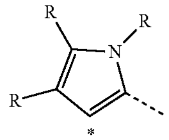

Formula (4j)

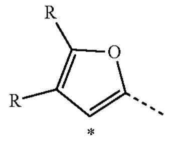

Formula (4k)

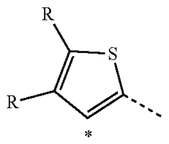

Formula (4l)

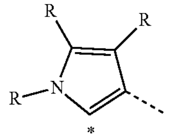

Formula (4m)

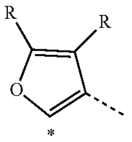

Formula (4n)

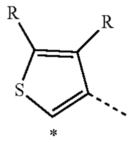

Formula (4o)

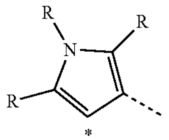

Formula (4p)

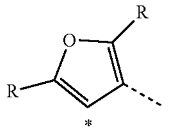

Formula (4q)

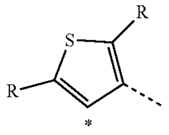

where the symbols used have the definitions given above.

When one $X^3$ group in formula (4) is a carbon atom and the other $X^3$ group is a nitrogen atom, preferred embodiments of the group of the formula (4) are the structures of the following formulae (4r) to (4y):

Formula (4r)

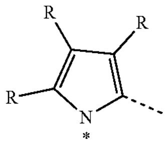

Formula (4s)

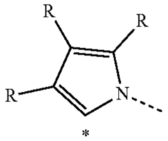

Formula (4t)

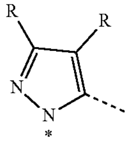

Formula (4u)

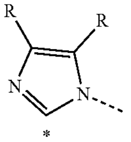

Formula (4v)

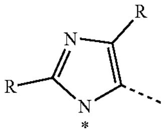

Formula (4w)

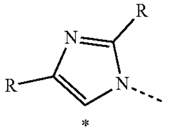

Formula (4x)

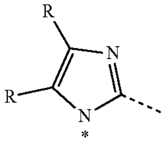

Formula (4y)

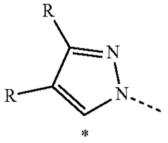

where the symbols used have the definitions given above.

Particular preference is given to ortho-phenylene, i.e. a group of the abovementioned formula (4a).

When two or three groups of the formula (4) are present, these may be the same or different. In a preferred embodiment of the invention, when two or three groups of the formula (4) are present, these groups are the same and also have the same substitution.

For the A groups, preference is given to the following combinations:

all three A groups are the same group of the formula (4), especially the same group of the formula (4a);

two A groups are the same group of the formula (4), especially the same group of the formula (4a), and the third A group is $CR_2$—$CR_2$, one A group is a group of the formula (4), especially the same group of the formula (4a), and the two other A groups are the same $CR_2$—$CR_2$ group; or all three A groups are the same $CR_2$—$CR_2$ group.

What is meant here by "the same group of the formula (4)" or "the same group of the formula (4a)" is that these groups all have the same base skeleton and the same substitution. Moreover, what is meant by "the same $CR_2$—$CR_2$ group" is that these groups have the same substitution.

Preferred R radicals on the —$CR_2$—$CR_2$— group are selected from the group consisting of H, D, F and an alkyl group having 1 to 5 carbon atoms, where hydrogen atoms may also be replaced by D or F and where adjacent R together may form a ring system. Particularly preferred R radicals on these groups are selected from H, D, CHs and CD3, or two R radicals bonded to the same carbon atom, together with the carbon atom to which they are bonded, form a cyclopentane or cyclohexane ring. Very particularly preferred R radicals on this group are selected from H and D, especially H.

For the A groups, particular preference is therefore given to the following combinations:

all three A groups are the group of the formula (4a) with R=H;

two A groups are the group of the formula (4a) with R=H, and the third A group is $CH_2$—$CH_2$, one A group is a group of the formula (4a) with R=H, and the two other A groups are the $CH_2$—$CH_2$ group; or all three A groups are the $CH_2$—$CH_2$ group.

More preferably, the structures of the formulae (2) and (3) are selected from the structures of the following formulae (2a) to (2d) and (3a) to (3d):

Formula (2a)

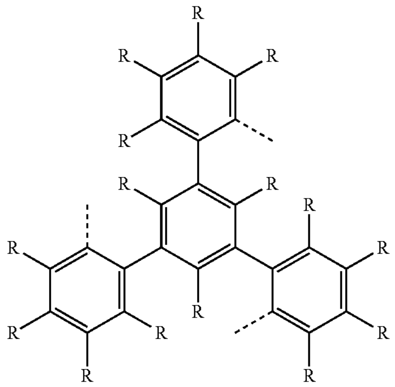

-continued

Formula (2b)

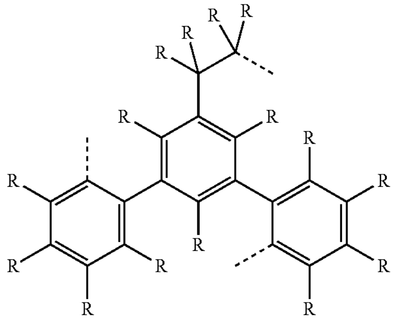

Formula (2c)

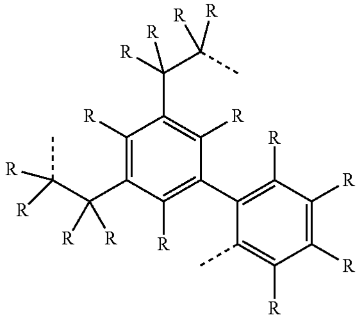

Formula (2d)

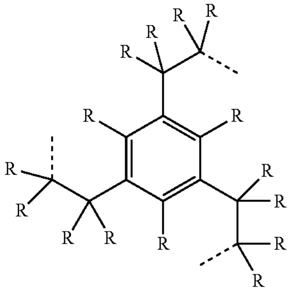

Formula (3a)

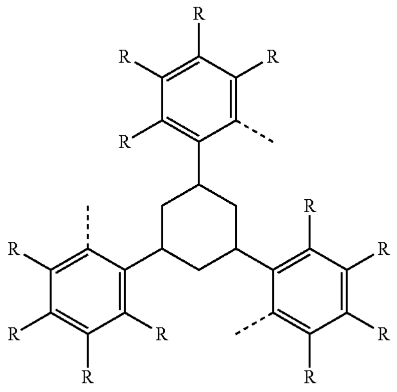

-continued

Formula (3b)

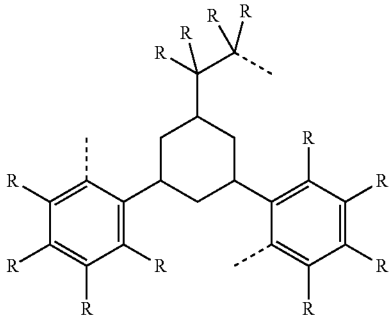

Formula (3c)

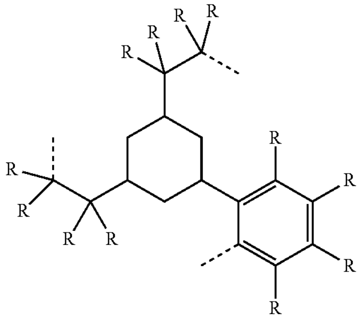

Formula (3d)

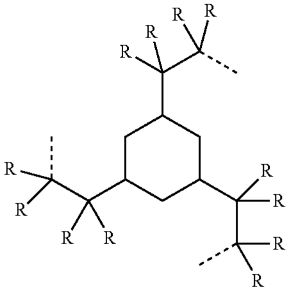

where the symbols used have the definitions given above. R here in the central benzene ring of the formulae (2a) to (2d) is preferably H or D, especially H. Particular preference is given to the formulae (2a) and (2c).

More preferably, the substituents R in the formulae (2a) to (2d) and (3a) to (3d) are the same or different at each instance and are H, D or an alkyl group having 1 to 4 carbon atoms. Most preferably, R=H or D, especially H. Particularly preferred embodiments of the formulae (2a) to (2d) and (3a) to (3d) are therefore the structures of the following formulae (2a-1) to (2d-1) and (3a-1) to (3d-1):

Formula (2a-1)

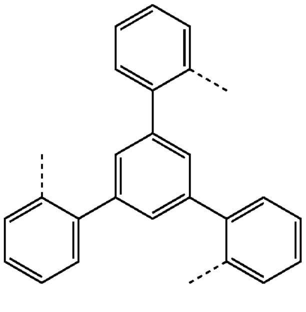

-continued

Formula (2b-1)

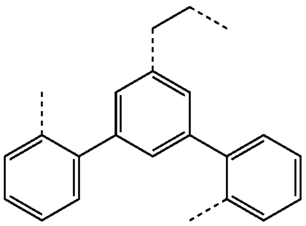

Formula (2c-1)

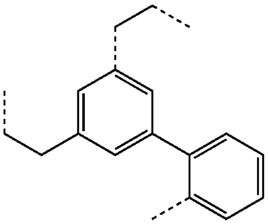

Formula (2d-1)

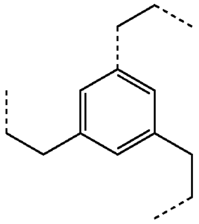

Formula (3a-1)

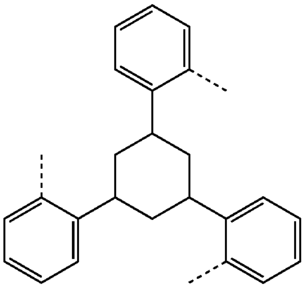

Formula (3b-1)

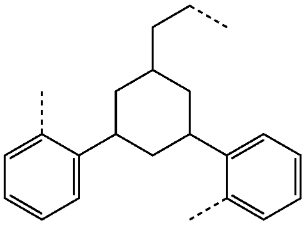

Formula (3c-1)

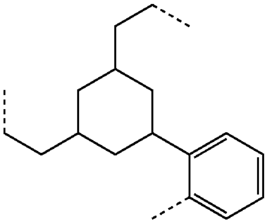

-continued

Formula (3d-1)

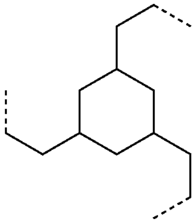

where the symbols used have the definitions given above.

There follows a description of the bidentate subligand $L^1$. As described above, $L^1$ coordinates to the iridium via one carbon atom and one nitrogen atom or via two carbon atoms. In a preferred embodiment, the subligand $L^1$ coordinates to the iridium via one carbon atom and one nitrogen atom.

It is further preferable when the metallacycle which is formed from the iridium and the subligand $L^1$ is a five-membered ring. The formation of a five-membered ring is shown in schematic form below:

Five-membered ring where N is a coordinating nitrogen atom and C is a coordinating carbon atom, and the carbon atoms shown are atoms of the subligand $L^1$.

In a preferred embodiment of the invention, the subligand $L^1$ is a structure of one of the following formulae ($L^1$-1) or ($L^1$-2):

Formula ($L^1$-1)

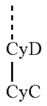

Formula ($L^1$-2)

where the dotted bond represents the bond of the subligand $L^1$ to V or to the bridge of the formula (2) or (3) and the other symbols used are as follows:

CyC is the same or different at each instance and is a substituted or unsubstituted aryl or heteroaryl group which has 5 to 14 aromatic ring atoms and coordinates in each case to the iridium via a carbon atom and which is bonded to CyD via a covalent bond;

CyD is the same or different at each instance and is a substituted or unsubstituted heteroaryl group which has 5 to 14 aromatic ring atoms or a substituted or unsubstituted heteroalicyclic group having 5 to 7 ring atoms, each of which coordinates to the iridium via a nitrogen atom or via a carbene carbon atom and which is bonded to CyC via a covalent bond;

at the same time, two or more of the optional substituents together may form a ring system; the optional radicals are preferably selected from the abovementioned R radicals.

CyD coordinates here via an uncharged or anionic nitrogen atom or via a carbene carbon atom, preferably via an uncharged nitrogen atom or via a carbene carbon atom. In addition, CyC coordinates via an anionic carbon atom.

When two or more of the substituents, especially two or more R radicals, together form a ring system, it is possible for a ring system to be formed from substituents bonded to directly adjacent carbon atoms. In addition, it is also possible that the substituents on CyC and CyD together form a ring, as a result of which CyC and CyD may also together form a single fused aryl or heteroaryl group as bidentate subligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, which coordinates to the iridium via a carbon atom, which may be substituted by one or more R radicals and which is bonded to CyD via a covalent bond.

Preferred embodiments of the CyC group are the structures of the following formulae (CyC-1) to (CyC-20) where the CyC group binds in each case at the position identified by # to CyD and coordinates at the position identified by * to the iridium, (CyC-1)

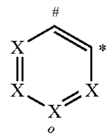

(CyC-2)

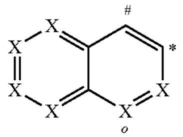

(CyC-3)

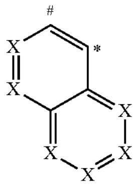

(CyC-4)

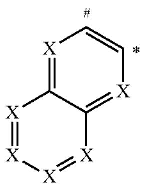

(CyC-5)

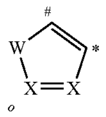

(CyC-6)

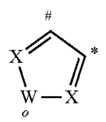

-continued (CyC-7)

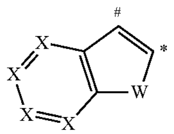

(CyC-8)

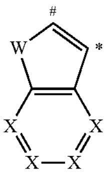

(CyC-9)

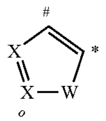

(CyC-10)

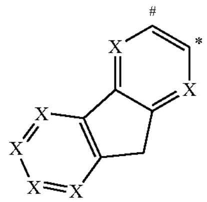

(CyC-11)

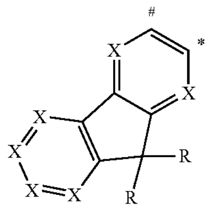

(CyC-12)

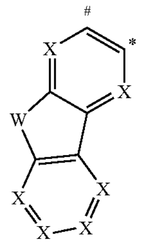

(CyC-13)

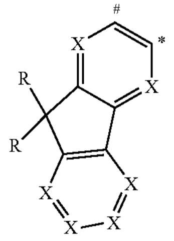

-continued (CyC-14)

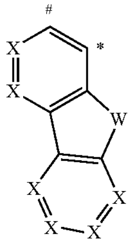

(CyC-15)

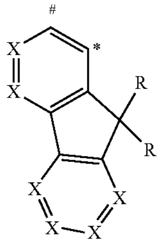

(CyC-16)

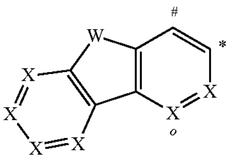

(CyC-17)

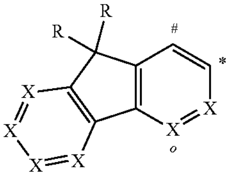

(CyC-18)

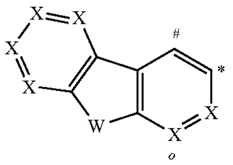

(CyC-19)

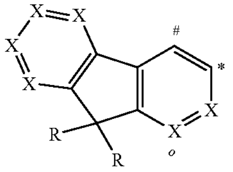

(CyC-20)

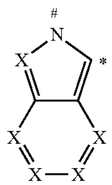

where R has the definitions given above and the other symbols used are as follows:

X is the same or different at each instance and is CR or N, with the proviso that at most two symbols X per ring are N;

W is the same or different at each instance and is NR, O or S;

with the proviso that, when the bridge V or the bridge of the formula (2) or (3) is bonded to CyC, one symbol X is C and the bridge of the formula (2) or (3) is bonded to that carbon atom. When the CyC group is bonded to the bridge V or the bridge of the formula (2) or (3), the bond is preferably via the position marked “o” in the formulae depicted above, and so the symbol X marked “o” in that case is preferably C. The above-depicted structures which do not contain any symbol X marked “o” are preferably not bonded directly to the bridge V or the bridge of the formula (2) or (3), since such a bond to the bridge is not advantageous for steric reasons.

Preferably not more than one symbol X in CyC is N and more preferably all symbols X are CR, with the proviso that, when the bridge V or the bridge of the formula (2) or (3) is bonded to CyC, one symbol X is C and the bridge V or the bridge of the formula (2) or (3) is bonded to that carbon atom.

Particularly preferred CyC groups are the groups of the following formulae (CyC-1a) to (CyC-20a):

(CyC-1a)

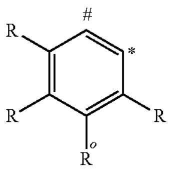

(CyC-1b)

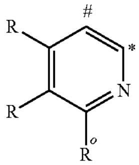

(CyC-1c)

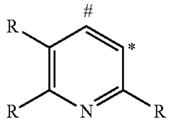

(CyC-1d)

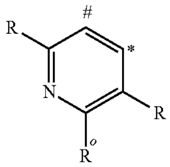

(CyC-1e)

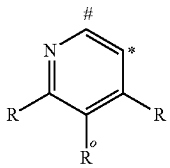

(CyC-1f)

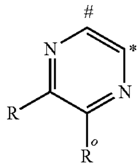

-continued
(CyC-1g)
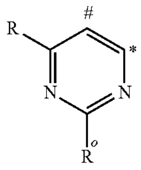
(CyC-1h)
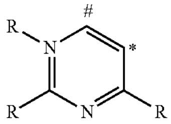
(CyC-2a)
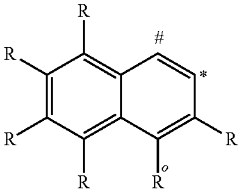
(CyC-2b)
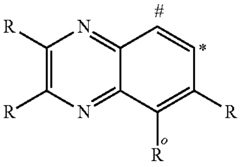
(CyC-3a)
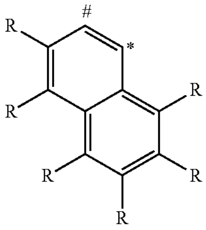
(CyC-3b)
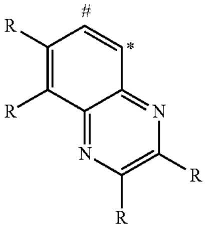
(CyC-4a)
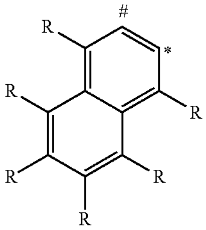
-continued
(CyC-4b)
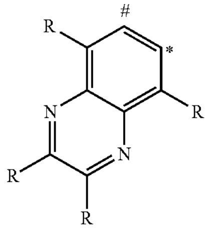
(CyC-5a)
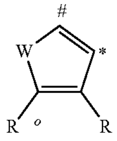
(CyC-6a)
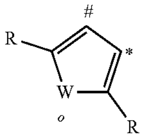
(CyC-7a)
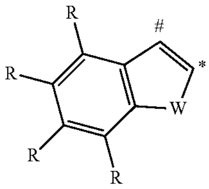
(CyC-8a)
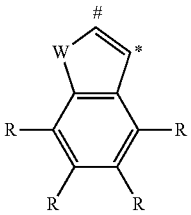
(CyC-9a)
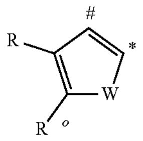
(CyC-10a)
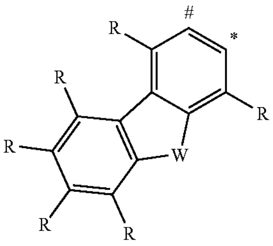
(CyC-11a)
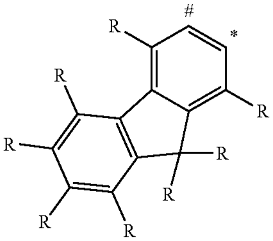

-continued
(CyC-12a)
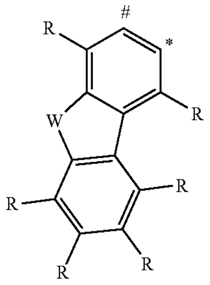
(CyC-13a)
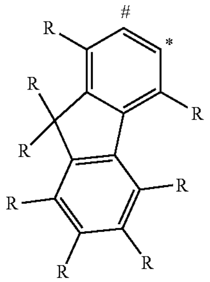
(CyC-14a)
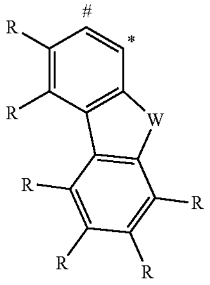
(CyC-15a)
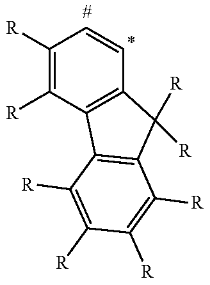
(CyC-16a)
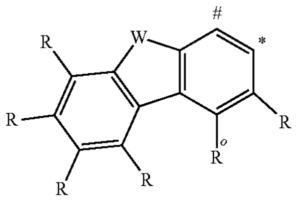
(CyC-16b)
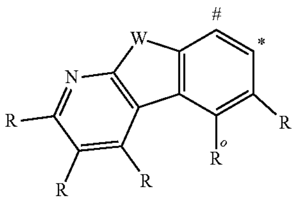
-continued
(CyC-16c)
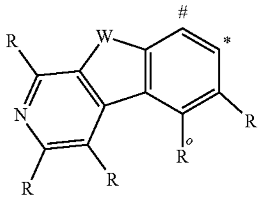
(CyC-16d)
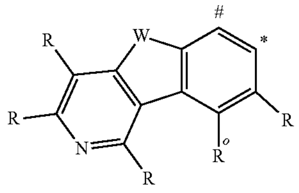
(CyC-16e)
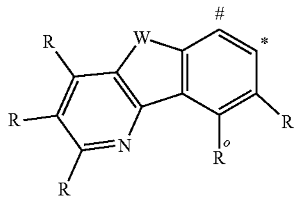
(CyC-16f)
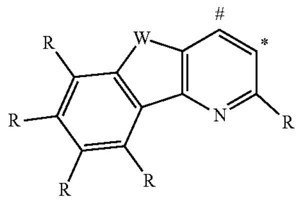
(CyC-16g)
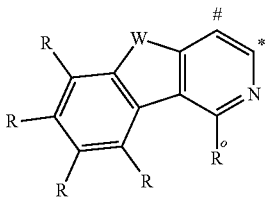
(CyC-17a)
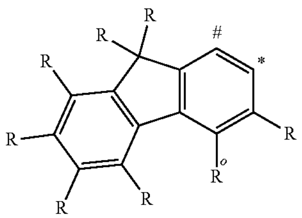
(CyC-18a)
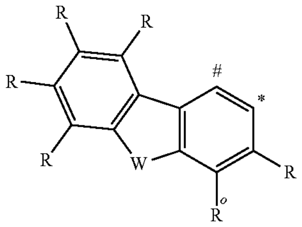

-continued (CyC-19a)

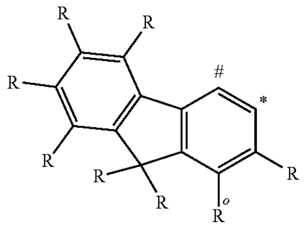

(CyC-20a)

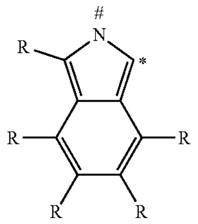

where the symbols used have the definitions given above and, when the bridge V or the bridge of the formula (2) or (3) is bonded to CyC, one R radical is absent and the bridge V or the bridge of the formula (2) or (3) is bonded to the corresponding carbon atom. When the CyC group is bonded to the bridge V or the bridge of the formula (2) or (3), the bond is preferably via the position marked “o” in the formulae depicted above, and so the R radical in this position is absent in that case. The above-depicted structures which do not contain any carbon atom marked “o” are preferably not bonded directly to the bridge V or the bridge of the formula (2) or (3). Preferably not more than three substituents R here are not H or D, more preferably not more than two substituents R and most preferably not more than one substituent.

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, or a heteroalicyclic group having 5 or 6 ring atoms, preferably having 5 ring atoms, which each coordinate to the iridium via an uncharged or anionic nitrogen atom or via a carbene carbon atom and which may be substituted by one or more R radicals and which is bonded via a covalent bond to CyC.

Preferred embodiments of the CyD group are the structures of the following formulae (CyD-1) to (CyD-23) where the CyD group binds in each case at the position identified by # to CyC and coordinates at the position identified by * to the iridium:

(CyD-1)

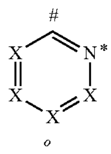

-continued (CyD-2)

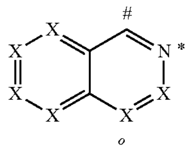

(CyD-3)

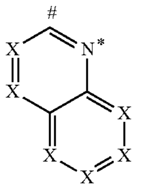

(CyD-4)

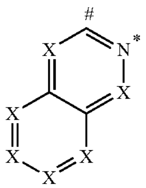

(CyD-5)

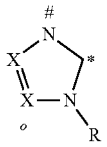

(CyD-6)

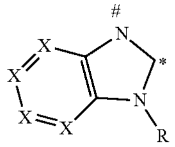

(CyD-7)

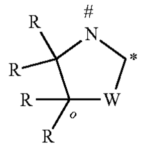

(CyD-8)

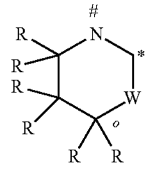

(CyD-9)

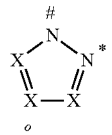

(CyD-10)

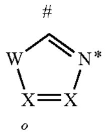

-continued (CyD-11)

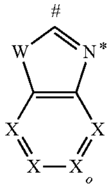

(CyD-12)

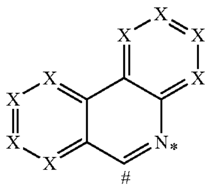

(CyD-13)

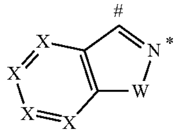

(CyD-14)

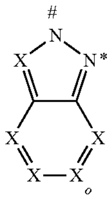

(CyD-15)

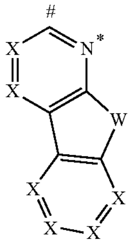

(CyD-16)

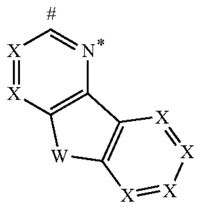

(CyD-17)

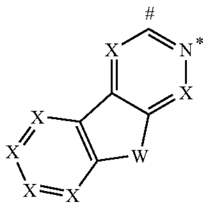

-continued (CyD-18)

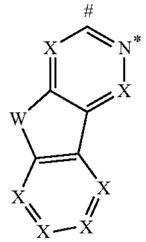

(CyD-19)

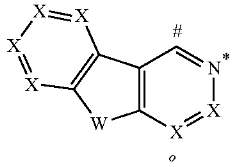

(CyD-20)

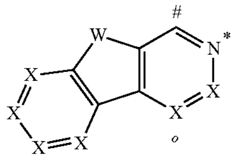

(CyD-21)

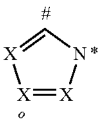

(CyD-22)

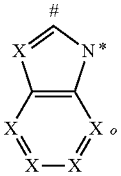

(CyD-23)

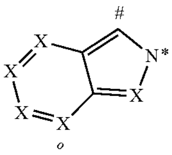

where X and R have the definitions given above and W is $CR_2$, NR, O or S, with the proviso that, when the bridge V or the bridge of the formula (2) or (3) is bonded to CyD, one symbol X is C and the bridge V or the bridge of the formula (2) or (3) is bonded to that carbon atom, or, when the bridge V or the bridge of the formula (2) or (3) is bonded to CyD, one R group in formula (CyD-7) and (CyD-8) is absent and the bridge V is bonded in that position. When the CyD group is bonded to the bridge V or the bridge of the formula (2) or (3), the bond is preferably via the position marked "o" in the formulae depicted above, and so the symbol X marked "o" in that case is preferably C. The above-depicted structures which do not contain any symbol X marked "o" are preferably not bonded directly to the bridge V or the bridge of the formula (2) or (3), since such a bond to the bridge is not advantageous for steric reasons.

In this case, the (CyD-1) to (CyD-4) and (CyD-9) to (CyD-20) groups coordinate to the iridium via an uncharged nitrogen atom, the (CyD-5) to (CyD-8) groups via a carbene carbon atom, and the (CyD-21) to (CyD-23) groups via an anionic nitrogen atom.

Preferably not more than one symbol X in CyD is N and more preferably all symbols X are CR, with the proviso that, when the bridge V or the bridge of the formula (2) or (3) is bonded to CyD, one symbol X is C and the bridge V or the bridge of the formula (2) or (3) is bonded to that carbon atom.

Particularly preferred CyD groups are the groups of the following formulae (CyD-1a) to (CyD-23a):

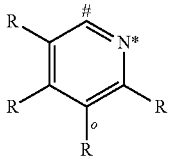

(CyD-1a)

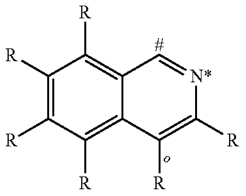

(CyD-2a)

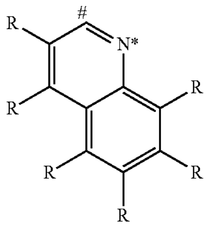

(CyD-3a)

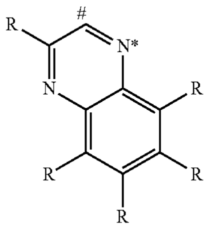

(CyD-3b)

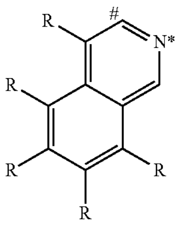

(CyD-4a)

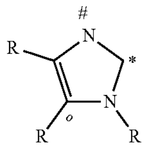

(CyD-5a)

-continued

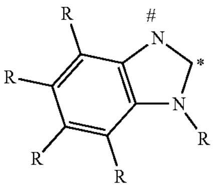

(CyD-6a)

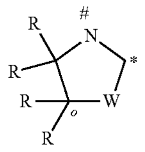

(CyD-7a)

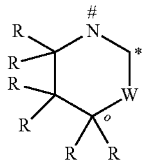

(CyD-8a)

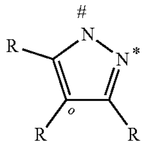

(CyD-9a)

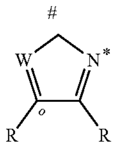

(CyD-10a)

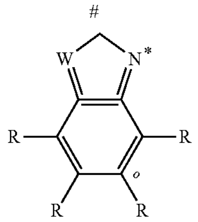

(CyD-11a)

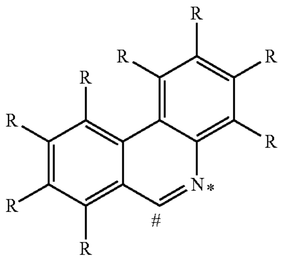

(CyD-12a)

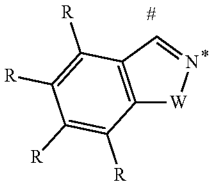

(CyD-13a)

-continued (CyD-14a)

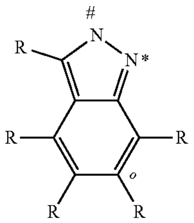

(CyD-14b)

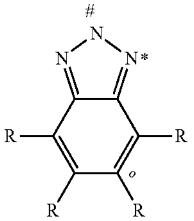

(CyD-15a)

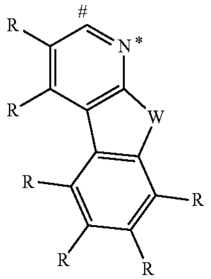

(CyD-16a)

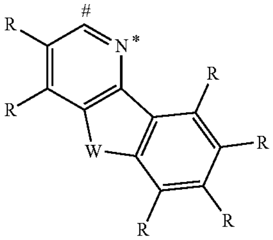

(CyD-17a)

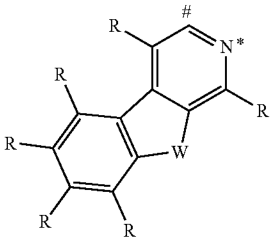

(CyD-18a)

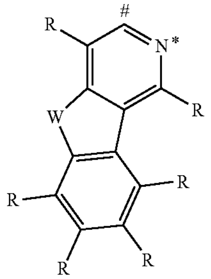

-continued (CyD-19a)

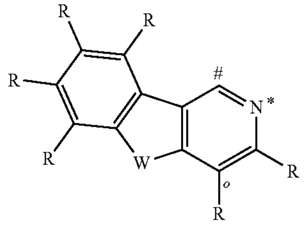

(CyD-20a)

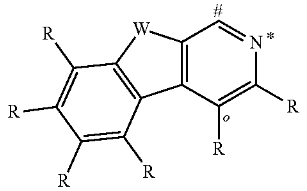

(CyD-21a)

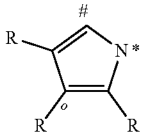

(CyD-21b)

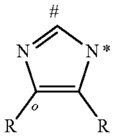

(CyD-22a)

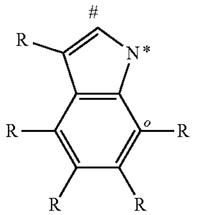

(CyD-22b)

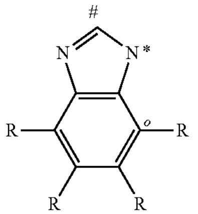

(CyD-23a)

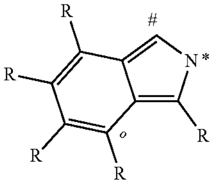

where the symbols used have the definitions given above and, when the bridge V or the bridge of the formula (2) or (3) is bonded to CyD, one R radical is absent and the bridge V or the bridge of the formula (2) or (3) is bonded to the corresponding carbon atom. When the CyD group is bonded to the bridge V or the bridge of the formula (2) or (3), the bond is preferably via the position marked "o" in the formulae depicted above, and so the R radical in this position is absent in that case. The above-depicted structures which do not contain any carbon atom marked "o" are preferably not bonded directly to the bridge V or the bridge of the formula (2) or (3). Preferably not more than three substituents R here are not H or D, more preferably not more than two substituents R and most preferably not more than one substituent.

Preferred groups among the (CyD-1) to (CyD-12) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, and CyD is a heteroaryl group having 6 to 10 aromatic ring atoms. At the same time, CyC and CyD may be substituted by one or more R radicals.

The abovementioned preferred (CyC-1) to (CyC-20) and (CyD-1) to (CyD-21) groups may be combined with one another as desired, provided that at least one of the CyC or CyD groups has a suitable attachment site to the bridge V or a bridge of the formula (2) or (3), suitable attachment sites being identified by "o" in the formulae given above.

It is especially preferable when the CyC and CyD groups specified above as particularly preferred, i.e. the groups of the formulae (CyC-1a) to (CyC-20a) and the groups of the formulae (CyD1-a) to (CyD-21a), are combined with one another, provided that at least one of the preferred CyC or CyD groups has a suitable attachment site to the bridge V or the bridge of the formula (2) or (3), suitable attachment sites being identified by "o" in the formulae given above. Combinations in which neither CyC nor CyD has such a suitable attachment site for the bridge V or the bridge of the formula (2) or (3) are therefore not preferred.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred subligands ($L^1$-1) are the structures of the formulae ($L^1$-1-1) to ($L^1$-1-3), and preferred subligands ($L^1$-2) are the structures of the formulae ($L^1$-2-1) to ($L^1$-2-5), which coordinate to the iridium via the two positions identified by *:

($L^1$-1-1

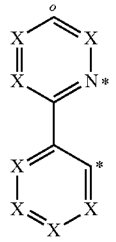

-continued ($L^1$-1-2)

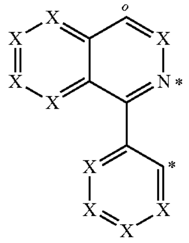

($L^1$-1-3)

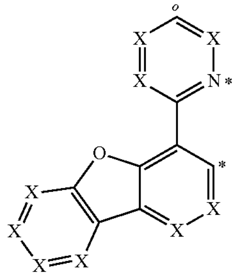

($L^1$-2-1)

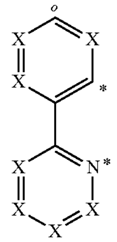

($L^1$-2-2)

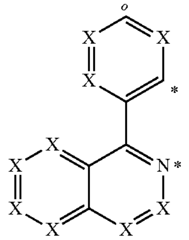

($L^1$-2-3)

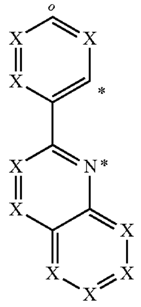

-continued ($L^1$-2-4)

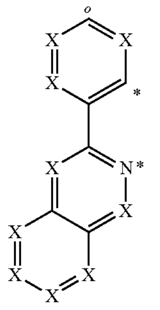

($L^1$-2-5)

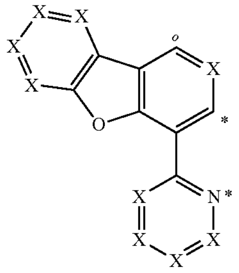

where the symbols used have the definitions given above and "o" represents the position of the bond to the bridge V or the bridge of the formula (2) or (3).

Particularly preferred subligands ($L^1$-1) are the structures of the formulae ($L^1$-1-1a) to ($L^1$-1-3b), and particularly preferred subligands ($L^1$-2) are the structures of the formulae ($L^1$-2-1a) to ($L^1$-2-5a), which coordinate to the iridium via the two positions identified by *:

($L^1$-1-1a)

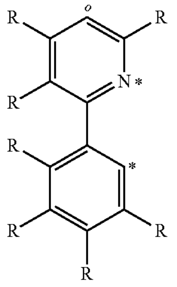

($L^1$-1-2a)

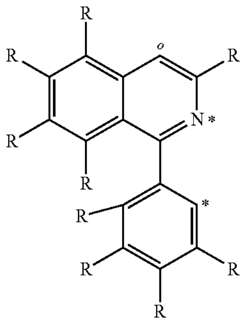

-continued ($L^1$-1-3a)

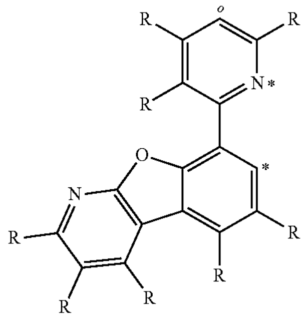

($L^1$-2-1a)

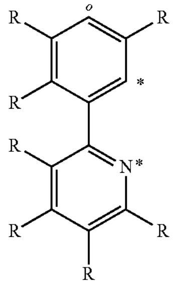

($L^1$-2-2a)

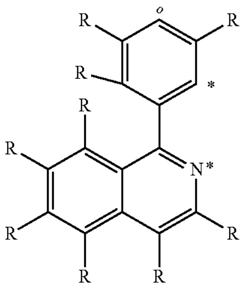

($L^1$-2-3a)

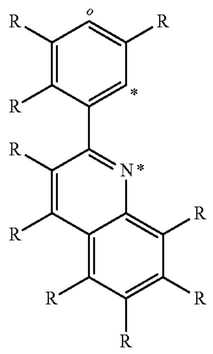

-continued ($L^1$-2-4a)

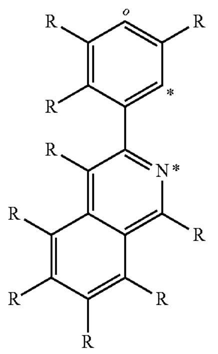

($L^1$-2-5a)

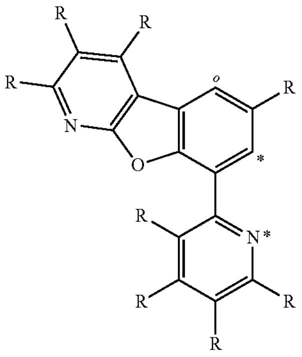

where the symbols used have the definitions given above and "o" represents the position of the bond to the bridge V or the bridge of the formula (2) or (3). Preferably not more than three substituents R here are not H or D, more preferably not more than two substituents R and most preferably not more than one substituent.

When two R radicals of which one is bonded to CyC and the other to CyD together form an aromatic ring system, this can result in bridged subligands and also in subligands which overall constitute a single larger heteroaryl group. The ring between the substituents on CyC and CyD is preferably formed by a group of one of the following formulae (5) to (14):

Formula (5)

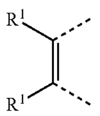

Formula (6)

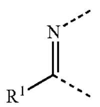

Formula (7)

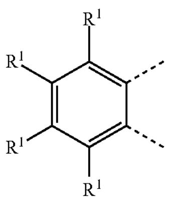

-continued

Formula (8)

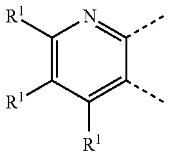

Formula (9)

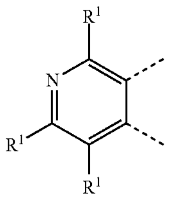

Formel (10)

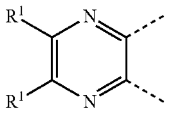

Formel (11)

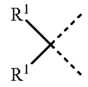

Formel (12)

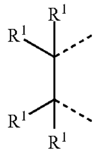

Formel (13)

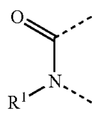

Formel (14)

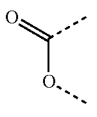

where $R^1$ has the definitions given above and the dotted bonds indicate the bonds to CyC and CyD. It is possible here for the unsymmetric groups among those mentioned above to be incorporated in either of the two ways. For example, in the case of the group of the formula (14), the oxygen atom may bind to the CyC group and the carbonyl group to the CyD group, or the oxygen atom may bind to the CyD group and the carbonyl group to the CyC group.

At the same time, the group of the formula (11) is preferred particularly when this results in ring formation to give a six-membered ring, as shown below, for example, by the formulae ($L^1$-21) and ($L^1$-22).

Preferred ligands which result from ring formation between two R radicals in CyC and CyD are the structures of the formulae ($L^1$-3) to ($L^1$-30) shown below:

-continued
($L^1$-3)
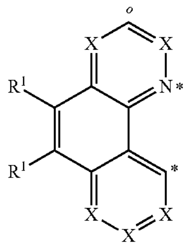
($L^1$-4)
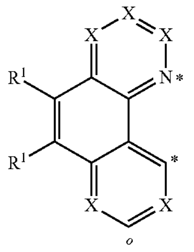
($L^1$-5)
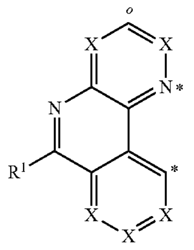
($L^1$-6)
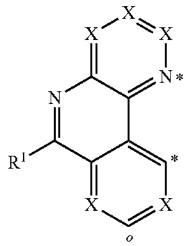
($L^1$-7)
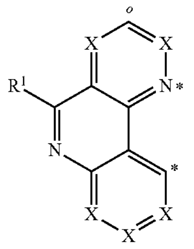
($L^1$-8)
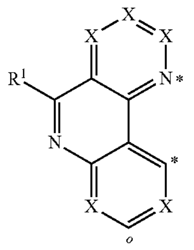
($L^1$-9)
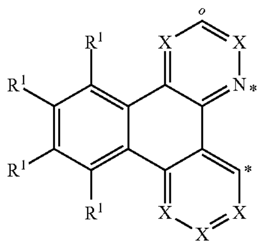
($L^1$-10)
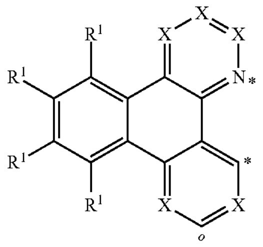
($L^1$-11)
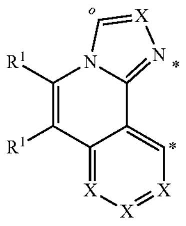
($L^1$-12)
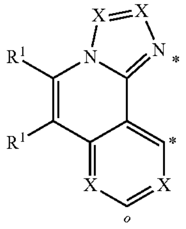
($L^1$-13)
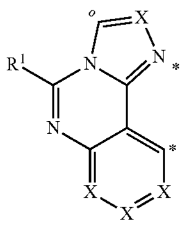
($L^1$-14)
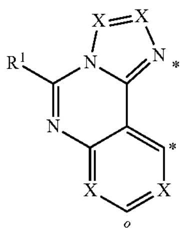

-continued
(L¹-15)
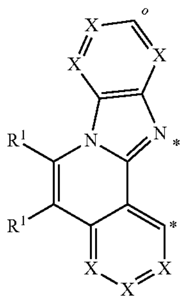
(L¹-16)
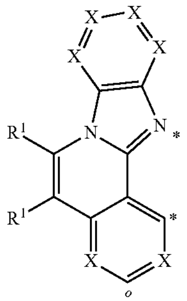
(L¹-17)
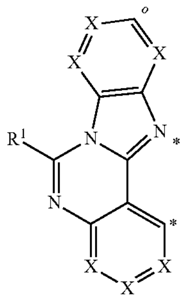
(L¹-18)
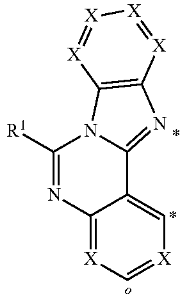
(L¹-19)
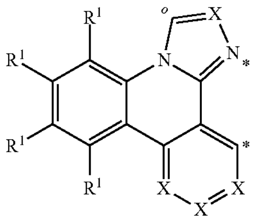
-continued
(L¹-20)
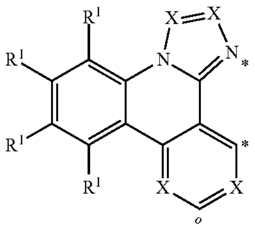
(L¹-21)
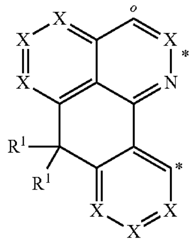
(L¹-22)
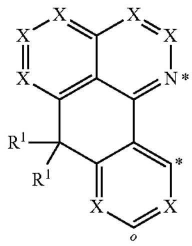
(L¹-23)
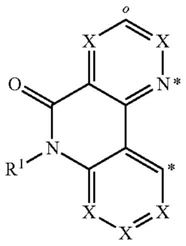
(L¹-24)
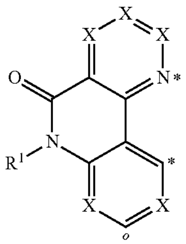
(L¹-25)
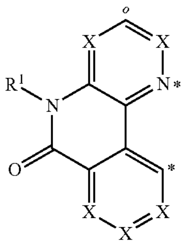

-continued ($L^1$-26)

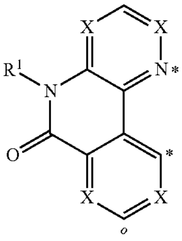

($L^1$-27)

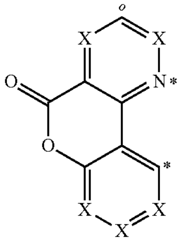

($L^1$-28)

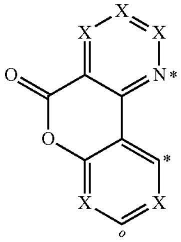

($L^1$-29)

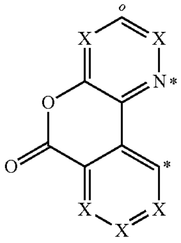

($L^1$-30)

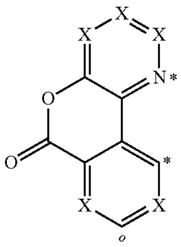

where the symbols used have the definitions given above and "o" indicates the position at which this subligand is joined to the bridge V or the group of the formula (2) or (3).

In a preferred embodiment of the subligands of the formulae ($L^1$-3) to ($L^1$-30), all symbols X are CR, or one symbol X is N and the other symbols X are CR.

In a further embodiment of the invention, it is preferable if, in the groups (CyC-1) to (CyC-20) or (CyD-1) to (CyD-21) or in the subligands ($L^1$-3) to ($L^1$-30), one of the atoms X is N when an R group bonded as a substituent adjacent to that nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. In this case, this substituent R is preferably a group selected from $CF_3$, $OCF_3$, alkyl groups having 1 to 10 carbon atoms, especially branched or cyclic alkyl groups having 3 to 10 carbon atoms, $OR^1$ where $R^1$ is an alkyl group having 1 to 10 carbon atoms, especially a branched or cyclic alkyl group having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate subligand $L^1$ is a structure of one of the following formulae ($L^1$-31) and ($L^1$-32):

($L^1$-31)

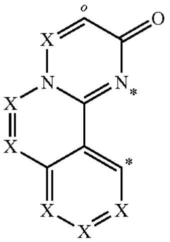

($L^1$-32)

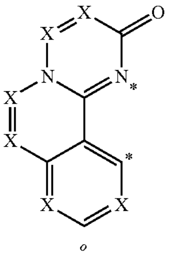

where R has the definitions given above, * represents the position of coordination to the metal, "o" represents the position of linkage of the subligand to the bridge V or the bridge of the formula (2) or (3), and in addition:

X is the same or different at each instance and is CR or N, with the proviso that not more than one X symbol per cycle is N.

When two R radicals bonded to adjacent carbon atoms in the sub-ligands ($L^1$-31) and ($L^1$-32) form an aromatic cycle with one another, this cycle together with the two adjacent carbon atoms is preferably a structure of the formula (15):

Formula (15)

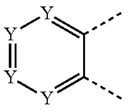

where the dotted bonds symbolize the linkage of this group within the subligand and Y is the same or different at each instance and is $CR^1$ or N and preferably not more than one symbol Y is N.

In a preferred embodiment of the sub-ligand ($L^1$-31) or ($L^1$-32), not more than one group of the formula (15) is present. The subligands are thus preferably subligands of the following formulae ($L^1$-33) to ($L_1$-38):

(L¹-33)

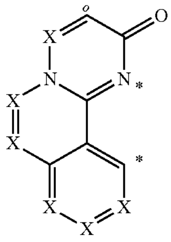

(L¹-34)

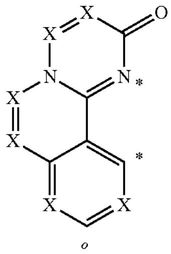

(L¹-35)

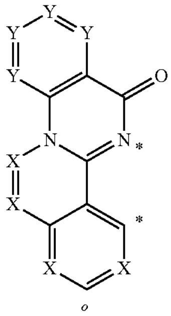

(L¹-36)

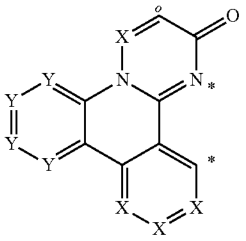

(L¹-37)

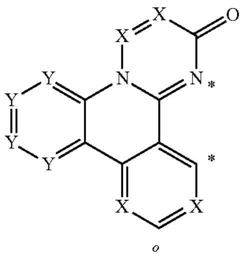

-continued (L¹-38)

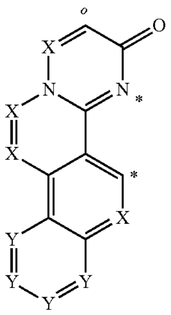

where X has the definitions given above, but the R radicals, when X is CR, do not form an aromatic or heteroaromatic ring system with one another and the further symbols have the definitions given above.

In a preferred embodiment of the invention, in the subligand of the formulae (L¹-31) to (L¹-38), a total of 0, 1 or 2 of the symbols X and, if present, Y are N. More preferably, a total of 0 or 1 of the symbols X and, if present, Y are N.

Preferred embodiments of the formulae (L¹-33) to (L¹-38) are the structures of the following formulae (L¹-33a) to (L¹-38f):

(L¹-33a)

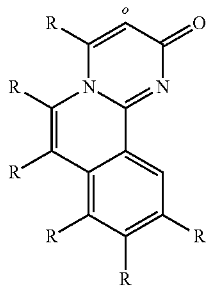

(L¹-33b)

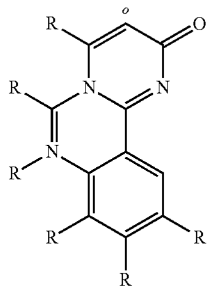

(L¹-33c)

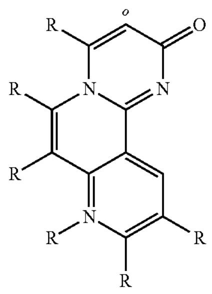

-continued
(L$^1$-33d)
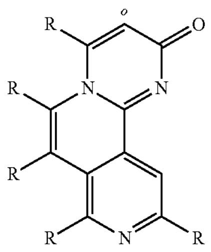
(L$^1$-34a)
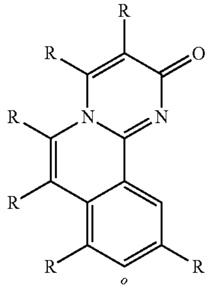
(L$^1$-34b)
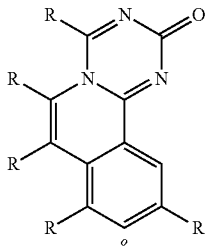
(L$^1$-34c)
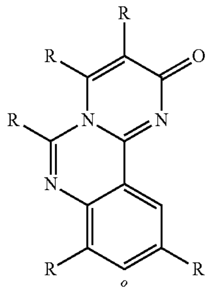
(L$^1$-34d)
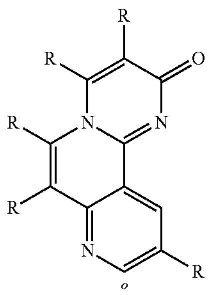
-continued
(L$^1$-35a)
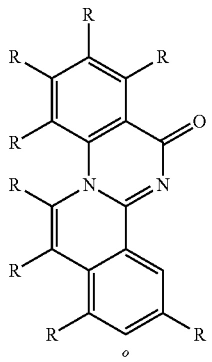
(L$^1$-35b)
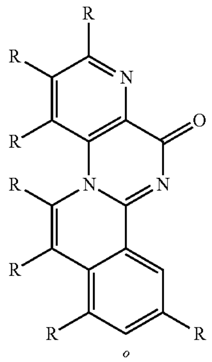
(L$^1$-35c)
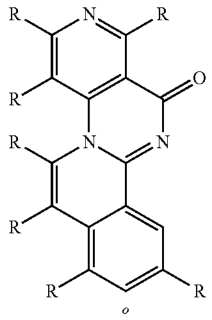
(L$^1$-35d)
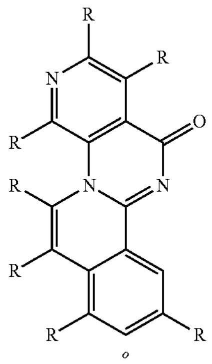

-continued
(L¹-35e)
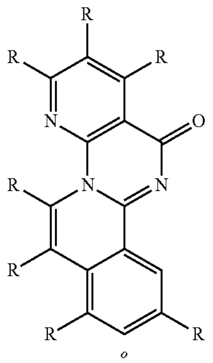
(L¹-35f)
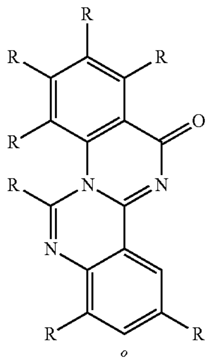
(L¹-35g)
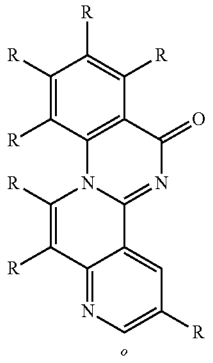
(L¹-36a)
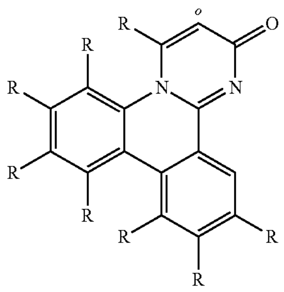
-continued
(L¹-36b)
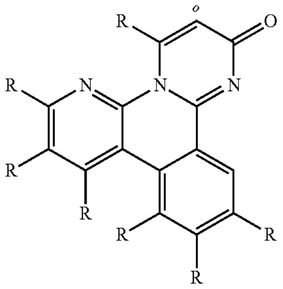
(L¹-36c)
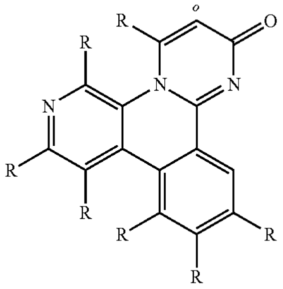
(L¹-36d)
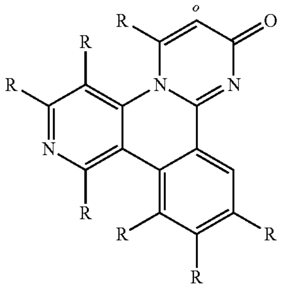
(L¹-36e)
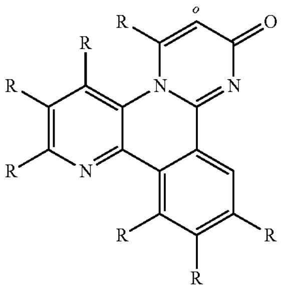
(L¹-36f)
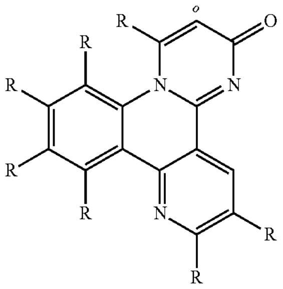

-continued
(L1-36g)
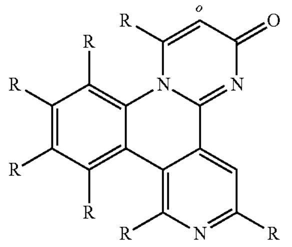
(L1-37a)
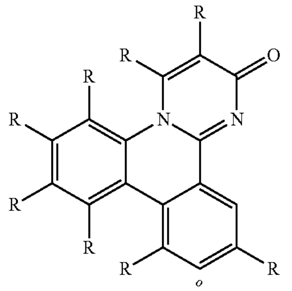
(L1-37b)
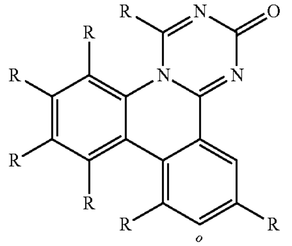
(L1-37c)
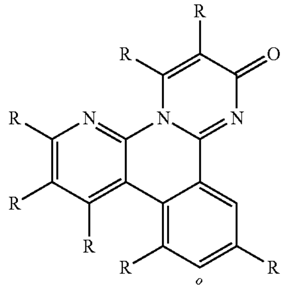
(L1-37d)
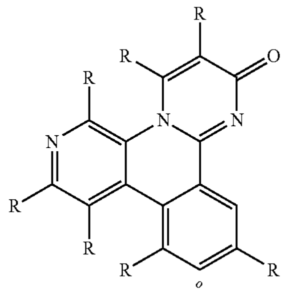
-continued
(L1-37e)
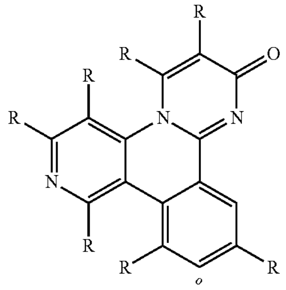
(L1-37f)
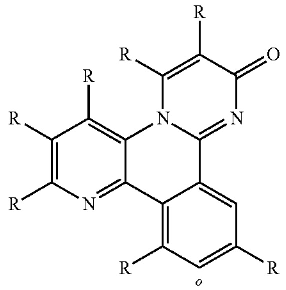
(L1-37g)
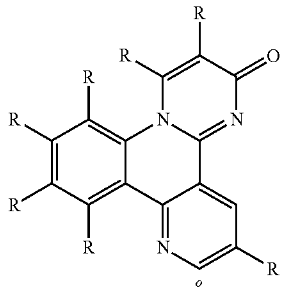
(L1-38a)
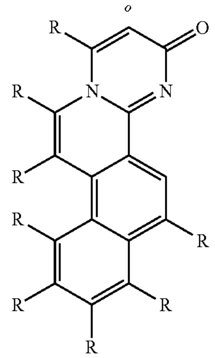
(L1-38b)
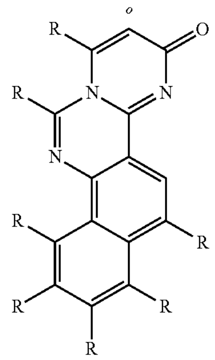

-continued (L$^1$-38c)

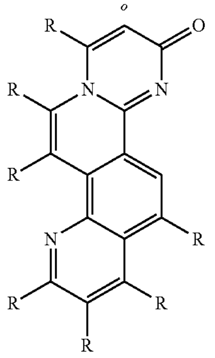

(L$^1$-38d)

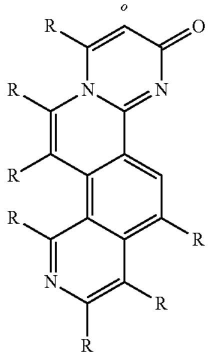

(L$^1$-38e)

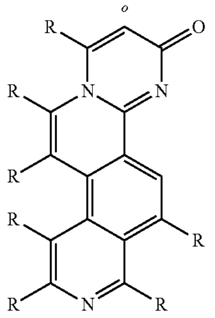

(L$^1$-38f)

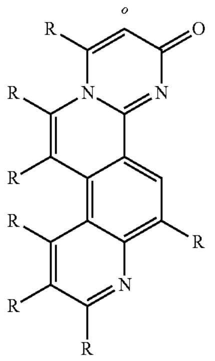

where the symbols used have the definitions given above and "o" represents the position of the linkage to the bridge V or to the bridge of the formula (2) or (3). Preferably not more than three substituents R here are not H or D, more preferably not more than two substituents R and most preferably not more than one substituent.

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not hydrogen or deuterium. In this case, this substituent R is preferably a group selected from $CF_3$, $OCF_3$, alkyl groups having 1 to 10 carbon atoms, especially branched or cyclic alkyl groups having 3 to 10 carbon atoms, $OR^1$ where $R^1$ is an alkyl group having 1 to 10 carbon atoms, especially a branched or cyclic alkyl group having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

In a preferred embodiment of the invention, $L^1$ is a subligand of one of the following formulae ($L^1$-39) and ($L^1$-40) that coordinates to the iridium via the two positions identified by *:

(L$^1$-39)

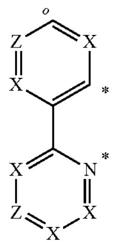

(L$^1$-40)

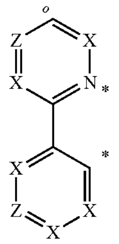

where "o" denotes the position of linkage to the bridge V, and in addition:

X is the same or different at each instance and is CR or N;

Z is CR', CR or N, with the proviso that exactly one Z is CR' and the other Z is CR or N;

where a maximum of one symbol X or Z in total per cycle is N;

R' is a group of the following formula (16) or (17):

Formula (16)

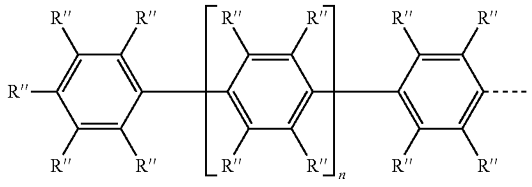

-continued

Formula (17)

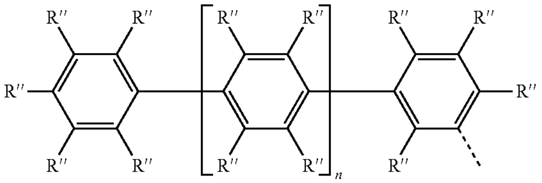

where the dotted bond indicates the linkage of the group to the subligands of the formula ($L^1$-39) or ($L^1$-40);

R" is the same or different at each instance and is H, D, F, CN, a straight-chain alkyl group having 1 to 10 carbon atoms in which one or more hydrogen atoms may also be replaced by D or F, or a branched or cyclic alkyl group having 3 to 10 carbon atoms in which one or more hydrogen atoms may also be replaced by D or F, or an alkenyl group having 2 to 10 carbon atoms in which one or more hydrogen atoms may also be replaced by D or F; at the same time, two adjacent R" radicals or two R" radicals on adjacent phenyl groups together may also form a ring system; or two R" on adjacent phenyl groups together are a group selected from $C(R^1)_2$, $NR^1$, O and S, such that the two phenyl rings together with the bridging group are a carbazole, fluorene, dibenzofuran or dibenzothiophene, and the further R" are as defined above;

n is 0, 1, 2, 3, 4 or 5.

In this case, the $R^1$ radical on the nitrogen is as defined above and is preferably an alkyl group having 1 to 10 carbon atoms or an aromatic or heteroaromatic ring system which has 6 to 24 aromatic ring atoms and may be substituted by one or more $R^2$ radicals, more preferably an aromatic or heteroaromatic ring system which has 6 to 18 aromatic ring atoms and may be substituted by one or more $R^2$ radicals, but is preferably unsubstituted.

In a preferred embodiment of the invention, n=0, 1 or 2, preferably 0 or 1 and most preferably 0.

In a further preferred embodiment of the invention, both substituents R' bonded in the ortho positions to the carbon atom by which the group of the formula (16) or (17) is bonded to the subligands $L^1$ are the same or different and are H or D.

In a preferred embodiment of the invention, X is the same or different at each instance and is CR. Further preferably, one Z group is CR and the other Z group is CR'. More preferably, in the subligand of the formula ($L^1$-39) or ($L^1$-40), the X groups are the same or different at each instance and are CR, and at the same time one Z group is CR and the other Z group is CR'. The subligand $L^1$ preferably has a structure of one of the following formulae ($L^1$-39a) or ($L^1$-40a), where the linkage to the bridge V or the bridge of the formula (2) or (3) is by the position identified by "o":

($L^1$-39a)

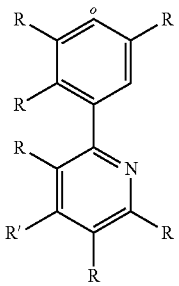

($L^1$-40a)

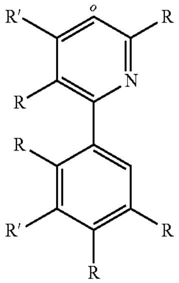

where the symbols used have the definitions given above.

More preferably, the subligand of the formula ($L^1$-39) or ($L^1$-40) has a structure of one of the following formulae ($L^1$-39a') and ($L^1$-40a'):

($L^1$-39a')

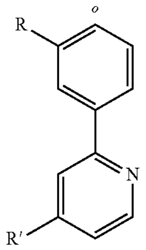

($L^1$-40a')

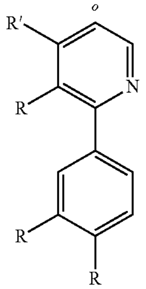

where the symbols used have the definitions given above.

The R radicals in the subligand $L^1$ of the formula ($L^1$-39) or ($L^1$-40) or the preferred embodiments are preferably selected from the group consisting of H, D, CN, $OR^1$, a straight-chain alkyl group having 1 to 6 carbon atoms, preferably having 1, 2 or 3 carbon atoms, or a branched or cyclic alkyl group having 3, 4, 5 or 6 carbon atoms or an alkenyl group having 2 to 6 carbon atoms, preferably 2, 3 or 4 carbon atoms, each of which may be substituted by one or more $R^1$ radicals, or a phenyl group which may be substituted by one or more nonaromatic $R^1$ radicals. It is also possible here for two or more adjacent R radicals together to form a ring system.

In this case, the substituent R bonded to the coordinating atom in the ortho position is preferably selected from the group consisting of H, D, F and methyl, more preferably H, D and methyl and especially H and D.

In addition, it is preferable when all substituents R that are in the ortho position to R' are H or D.

When the R radicals in the subligand $L^1$ of the formula ($L^1$-39) or ($L^1$-40) together form a ring system, it is preferably an aliphatic, heteroaliphatic or heteroaromatic ring system. In addition, preference is given to ring formation between two R radicals on the two rings of the subligand $L^1$, preferably forming a phenanthridine, or a phenanthridine which may contain still further nitrogen atoms. When R radicals together form a heteroaromatic ring system, this preferably forms a structure selected from the group consisting of quinoline, isoquinoline, dibenzofuran, dibenzothiophene and carbazole, each of which may be substituted by one or more $R^1$ radicals, and where individual carbon atoms in the dibenzofuran, dibenzothiophene and carbazole may also be replaced by N. Particular preference is given to quinoline, isoquinoline, dibenzofuran and azadibenzofuran. It is possible here for the fused-on structures to be bonded in any possible position. Preferred subligands $L^1$ with fused-on benzo groups are the structures of the formulae ($L^1$-39b) to ($L^1$-40e) shown below, where the linkage to the bridge V is via the position identified by "o":

($L^1$-39b)

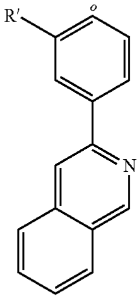

($L^1$-39c)

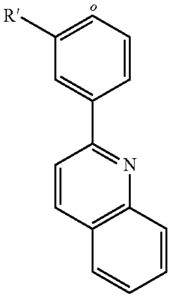

($L^1$-39d)

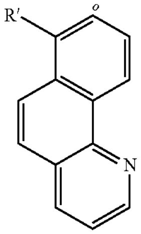

-continued ($L^1$-39e)

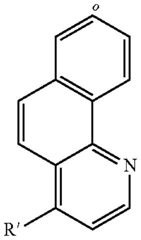

($L^1$-40b)

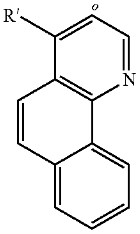

($L^1$-40c)

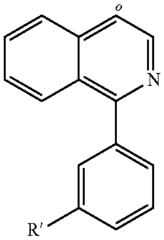

($L^1$-40d)

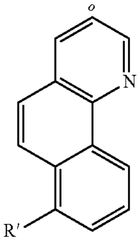

($L^1$-40e)

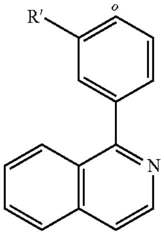

where the subligands may each also be substituted by one or more further R radicals and the fused-on structure may be substituted by one or more $R^1$ radicals. Preferably, there are no further R or $R^1$ radicals present.

Preferred subligands $L^1$ of the formula ($L^1$-39) or ($L^1$-40) with a fused-on benzofuran or azabenzofuran group are the structures formulae ($L^1$-39f) to ($L^1$-40m) shown below, where the linkage to the bridge V is via the position identified by "o":

(L[1]-39f)
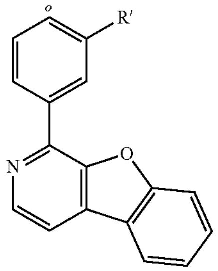
(L[1]-39g)
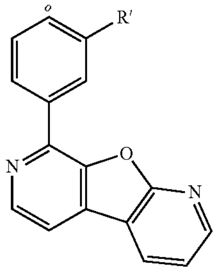
(L[1]-39h)
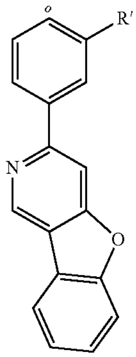
(L[1]-39i)
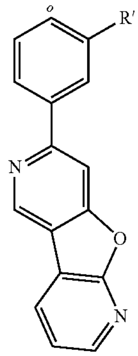
-continued
(L[1]-39j)
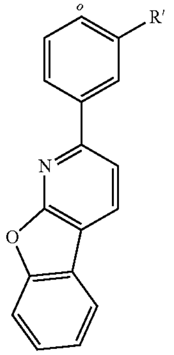
(L[1]-39k)
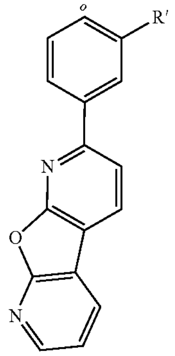
(L[1]-39l)
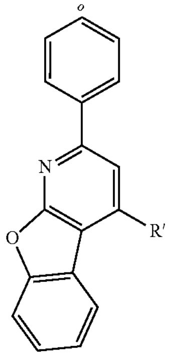
(L[1]-39m)
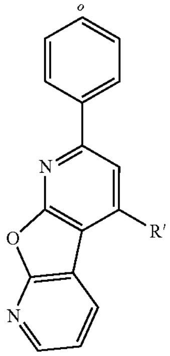

-continued
(L[1]-40f)
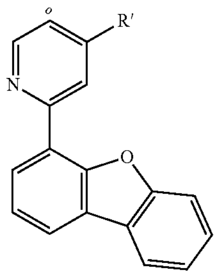
(L[1]-40g)
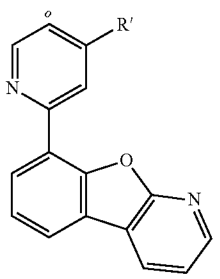
(L[1]-40h)
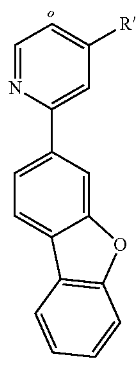
(L[1]-40i)
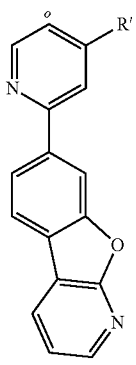
-continued
(L[1]-40j)
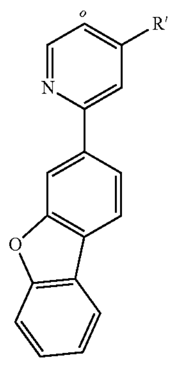
(L[1]-40k)
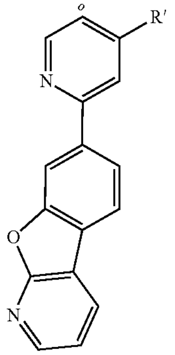
(L[1]-40l)
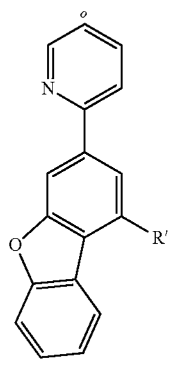
(L[1]-40m)
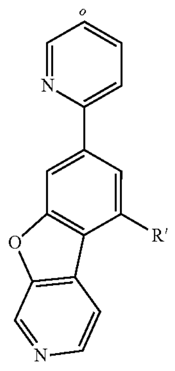
where the ligands may each also be substituted by one or more further R radicals and the fused-on structure may be substituted by one or more $R^1$ radicals. Preferably, there are no further R or $R^1$ radicals present. It is likewise possible for O in these structures to be replaced by S or $NR^1$.

As described above, R' is a group of the formula (16) or (17). The two groups here differ merely in that the group of the formula (16) is bonded to the subligand $L^1$ in the para position and the group of the formula (17) in the meta position.

In a preferred embodiment of the invention, n=0, 1 or 2, preferably 0 or 1 and most preferably 0.

In a further preferred embodiment of the invention, both substituents R" bonded in the ortho positions to the carbon atom by which the group of the formula (16) or (17) is bonded to the phenylpyridine ligands are the same or different and are H or D.

Preferred embodiments of the structure of the formula (16) are the structures of the formulae (16a) to (16h), and preferred embodiments of the structure of the formula (17) are the structures of the formulae (17a) to (17h):

Formula (16a)

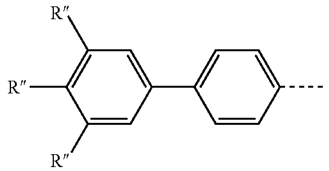

Formula (16b)

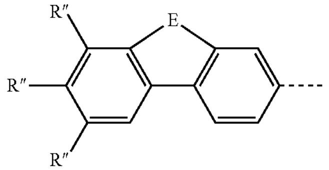

Formula (16c)

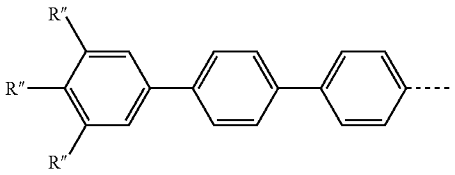

Formula (16d)

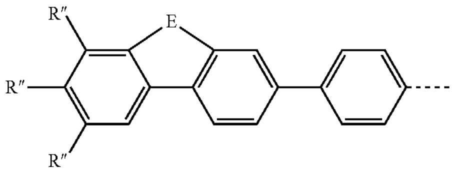

Formula (16e)

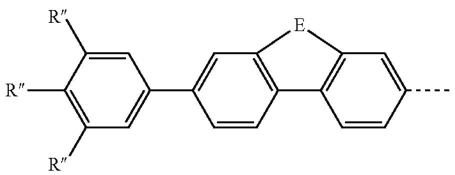

Formula (16f)

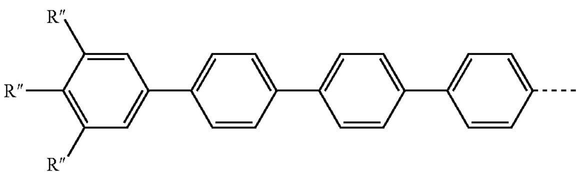

-continued

Formula (16g)

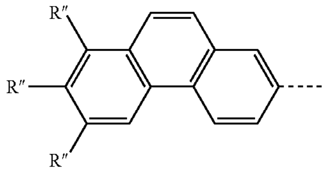

Formula (16h)

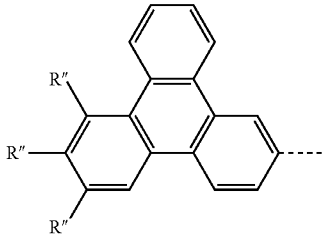

Formula (17a)

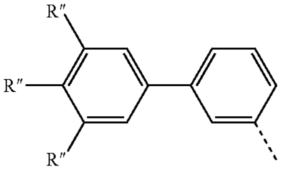

Formula (17b)

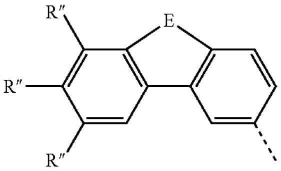

Formula (17c)

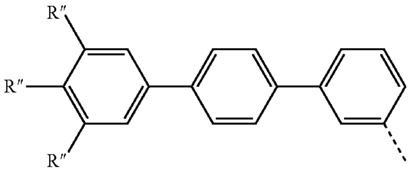

Formula (17d)

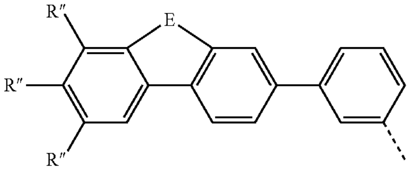

Formula (17e)

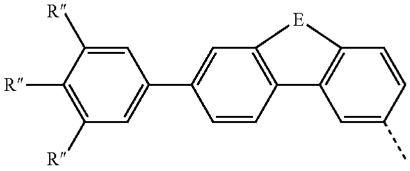

Formula (17f)

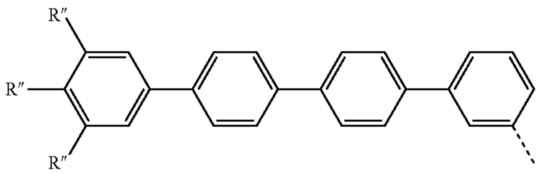

-continued

Formula (17g)

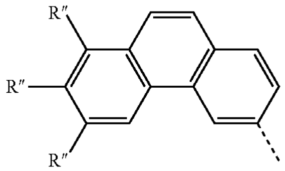

Formula (17h)

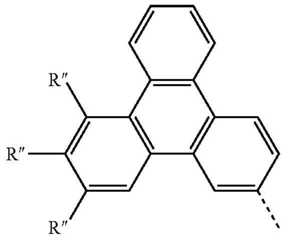

where E is O, S, $C(R^1)_2$ or $NR^1$ and the further symbols used have the definitions given above. In this case, $R^1$, when $E{=}NR^1$, is preferably an aromatic or heteroaromatic ring system which has 6 to 18 aromatic ring atoms and may be substituted by one or more $R^2$ radicals, but is preferably unsubstituted. In addition, $R^1$, when $E{=}C(R^1)_2$, is preferably the same or different at each instance and is an alkyl group having 1 to 6 carbon atoms, preferably having 1 to 4 carbon atoms, more preferably methyl groups.

Preferred substituents R' on the groups of the formula (16) or (17) or the preferred embodiments are selected from the group consisting of H, D, CN and an alkyl group having 1 to 4 carbon atoms, more preferably H, D, methyl, cyclopentyl, 1-methylcyclopentyl, cyclohexyl or 1-methylcyclohexyl, especially H, D or methyl.

There follows a description of the monodentate subligands $L^2$ and $L^3$. $L^2$ and $L^3$ here may be the same or different at each instance and are an uncharged or monoanionic subligand.

In a preferred embodiment of the present invention, $L^2$ and $L^3$ are the same or different at each instance and are an aryl or heteroaryl group having 5 to 13 aromatic ring atoms, more preferably having 6 to 13 aromatic ring atoms, most preferably having 6 to 10 aromatic ring atoms, which coordinates to the iridium via one carbon atom or one nitrogen atom that are each part of the aryl or heteroaryl group, and which may be substituted by one or more R radicals. When the group coordinates to the iridium via a carbon atom, this may be anionic or an uncharged carbene carbon atom. When the group coordinates to the iridium via a nitrogen atom, this may be uncharged or anionic.

Preferred embodiments of $L^2$ and $L^3$ are the same or different at each instance and are the structures of the following formulae ($L^2$-1)/($L^3$-1) to ($L^2$-55)/($L^3$-55), where the group in each case coordinates to the iridium at the position identified by * and to the bridgehead V or to the group of the formula (2) or (3) at the position identified by "o":

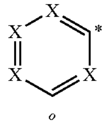

($L^2$-1)

($L^3$-1)

-continued

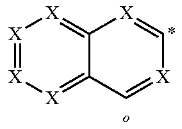

($L^2$-2)

($L^3$-2)

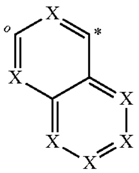

($L^2$-3)

($L^3$-3)

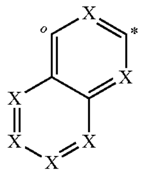

($L^2$-4)

($L^3$-4)

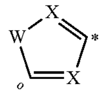

($L^2$-5)

($L^3$-5)

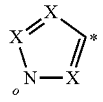

($L^2$-6)

($L^3$-6)

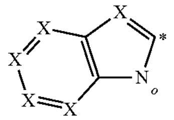

($L^2$-7)

($L^3$-7)

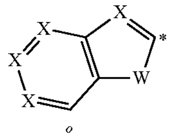

($L^2$-8)

($L^3$-8)

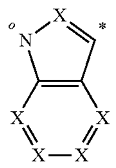

($L^2$-9)

($L^3$-9)

-continued
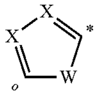
($L^2$-10)
($L^3$-10)
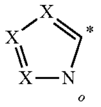
($L^2$-11)
($L^3$-11)
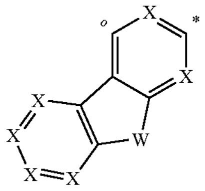
($L^2$-12)
($L^3$-12)
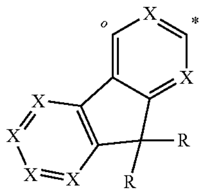
($L^2$-13)
($L^3$-13)
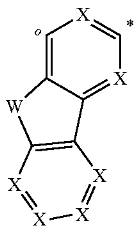
($L^2$-14)
($L^3$-14)
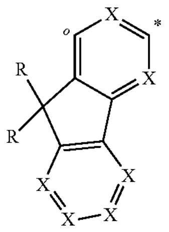
($L^2$-15)
($L^3$-15)
-continued
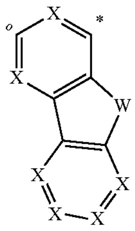
($L^2$-16)
($L^3$-16)
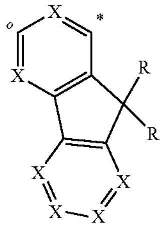
($L^2$-17)
($L^3$-17)
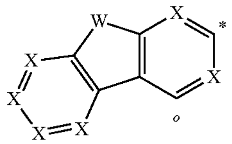
($L^2$-18)
($L^3$-18)
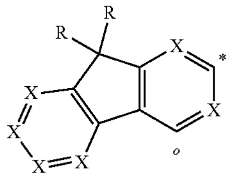
($L^2$-19)
($L^3$-19)
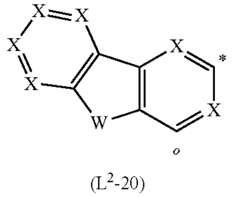
($L^2$-20)
($L^3$-20)
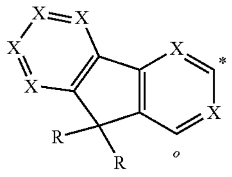
($L^2$-21)
($L^3$-21)

-continued
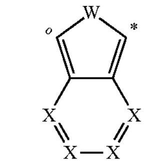
($L^2$-22)
($L^3$-22)
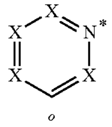
($L^2$-23)
($L^3$-23)
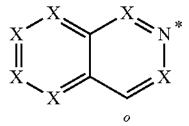
($L^2$-24)
($L^3$-24)
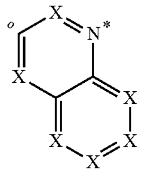
($L^2$-25)
($L^3$-25)
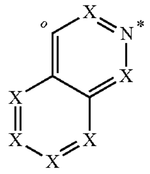
($L^2$-26)
($L^3$-26)
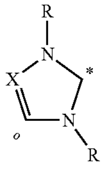
($L^2$-27)
($L^3$-27)
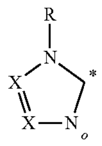
($L^2$-28)
($L^3$-28)
-continued
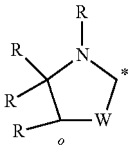
($L^2$-29)
($L^3$-29)
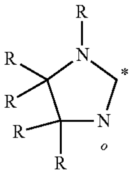
($L^2$-30)
($L^3$-30)
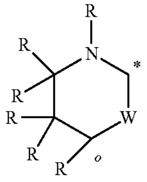
($L^2$-31)
($L^3$-31)
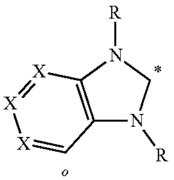
($L^2$-32)
($L^3$-32)
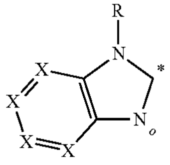
($L^2$-33)
($L^3$-33)
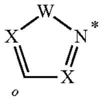
($L^2$-34)
($L^3$-34)
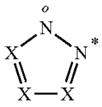
($L^2$-35)
($L^3$-35)

-continued
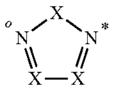
(L$^2$-36)
(L$^3$-36)
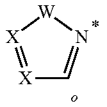
(L$^2$-37)
(L$^3$-37)
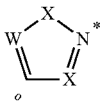
(L$^2$-38)
(L$^3$-38)
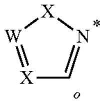
(L$^2$-39)
(L$^3$-39)
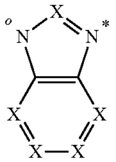
(L$^2$-40)
(L$^3$-40)
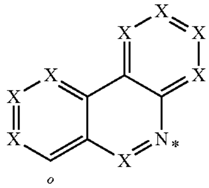
(L$^2$-41)
(L$^3$-41)
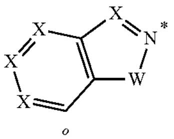
(L$^2$-42)
(L$^3$-42)
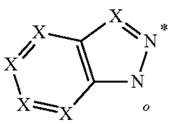
(L$^2$-43)
(L$^3$-43)
-continued
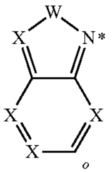
(L$^2$-44)
(L$^3$-44)
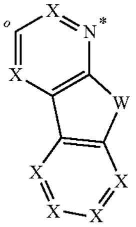
(L$^2$-45)
(L$^3$-45)
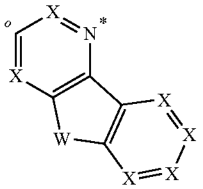
(L$^2$-46)
(L$^3$-46)
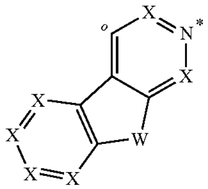
(L$^2$-47)
(L$^3$-47)
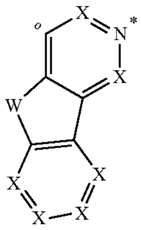
(L$^2$-48)
(L$^3$-48)
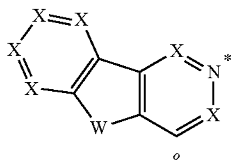
(L$^2$-49)
(L$^3$-49)

-continued

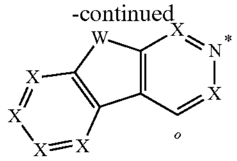

($L^2$-50)

($L^3$-50)

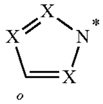

($L^2$-51)

($L^3$-51)

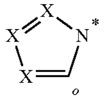

($L^2$-52)

($L^3$-52)

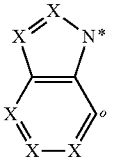

($L^2$-53)

($L^3$-53)

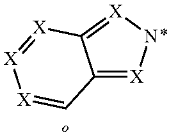

($L^2$-54)

($L^3$-54)

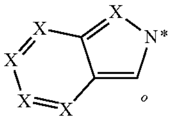

($L^2$-55)

($L^3$-55)

where R has the definitions given above and the other symbols used are as follows:

X is the same or different at each instance and is CR or N, with the proviso that at most two symbols X per ring are N;

W is the same or different at each instance and is NR, O or S.

The ($L^2$-1)/($L^3$-1) to ($L^2$-22)/($L^3$-22) groups here coordinate to the iridium via an anionic carbon atom, the ($L^2$-23)/($L^3$-23) to ($L^2$-26)/($L^3$-26) and ($L^2$-34)/($L^3$-34) to ($L^2$-50)/($L^3$-50) groups via an uncharged nitrogen atom, the ($L^2$-27)/($L^3$-27) to ($L^2$-33)/($L^3$-33) groups via an uncharged carbene carbon atom, and the ($L^2$-51)/($L^3$-51) to ($L^2$-55)/($L^3$-55) groups via an anionic nitrogen atom.

Preferably, not more than one symbol X is N, and most preferably all symbols X are CR.

Particularly preferred $L^2$ and $L^3$ groups are the groups of the following formulae ($L^2$-1a)/($L^3$-1a) to ($L^2$-55a)/($L^3$-55a):

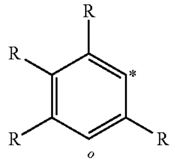

($L^2$-1a)

($L^3$-1a)

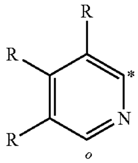

($L^2$-1b)

($L^3$-1b)

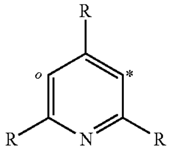

($L^2$-1c)

($L^3$-1c)

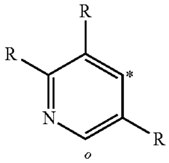

($L^2$-1d)

($L^3$-1d)

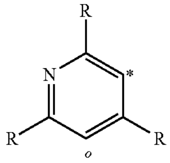

($L^2$-1e)

($L^3$-1e)

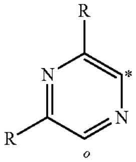

($L^2$-1f)

($L^3$-1f)

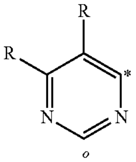

($L^2$-1g)

($L^3$-1g)

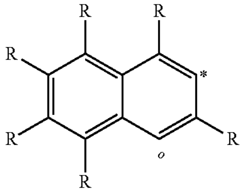

($L^2$-2a)

($L^3$-2a)

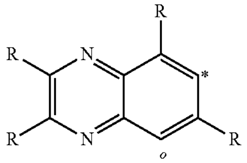

($L^2$-2b)

($L^3$-2b)

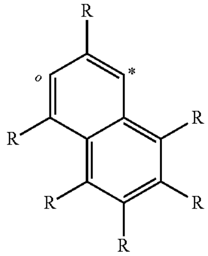

($L^2$-3a)

($L^3$-3a)

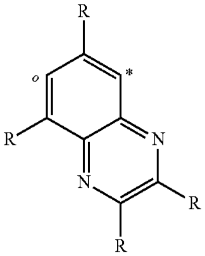

($L^2$-3b)

($L^3$-3b)

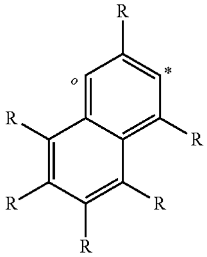

($L^2$-4a)

($L^3$-4a)

-continued
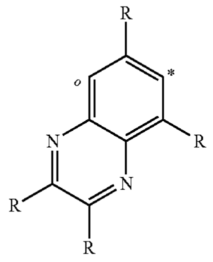
($L^2$-4b)
($L^3$-4b)
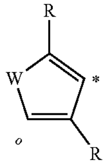
($L^2$-5a)
($L^3$-5a)
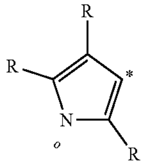
($L^2$-6a)
($L^3$-6a)
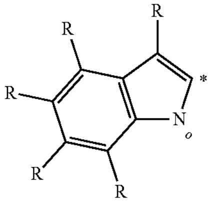
($L^2$-7a)
($L^3$-7a)
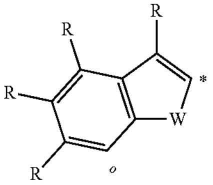
($L^2$-8a)
($L^3$-8a)
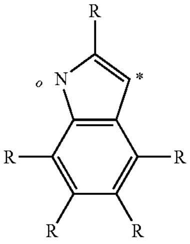
($L^2$-9a)
($L^3$-9a)
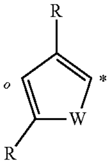
($L^2$-10a)
($L^3$-10a)
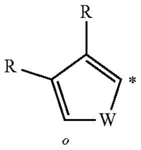
($L^2$-11a)
($L^3$-11a)
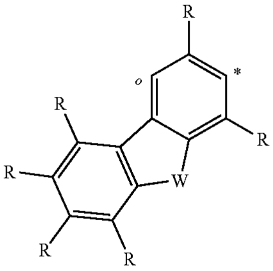
($L^2$-12a)
($L^3$-12a)
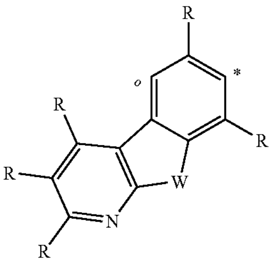
($L^2$-12b)
($L^3$-12b)
-continued
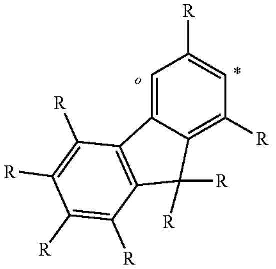
($L^2$-13a)
($L^3$-13a)
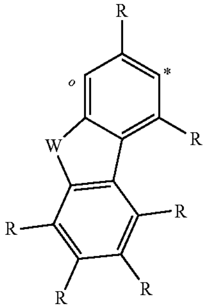
($L^2$-14a)
($L^3$-14a)
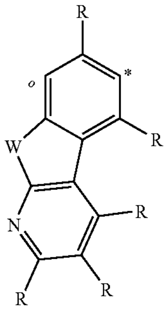
($L^2$-14b)
($L^3$-14b)
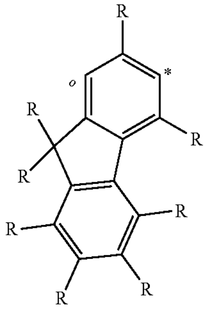
($L^2$-15a)
($L^3$-15a)
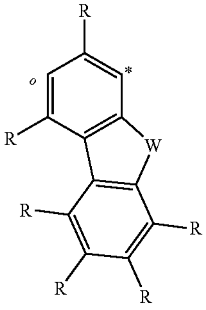
($L^2$-16a)
($L^3$-16a)
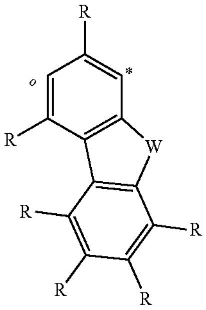
($L^2$-16b)
($L^3$-16b)
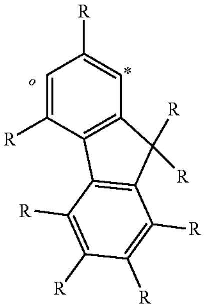
($L^2$-17a)
($L^3$-17a)
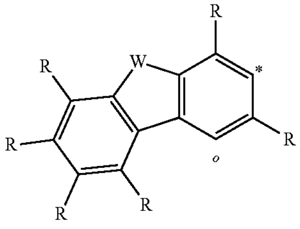
($L^2$-18a)
($L^3$-18a)

-continued
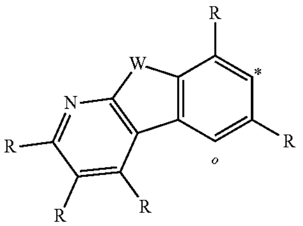
($L^2$-18b)
($L^3$-18b)
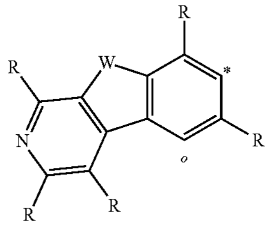
($L^2$-18c)
($L^3$-18c)
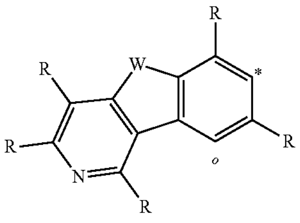
($L^2$-18d)
($L^3$-18d)
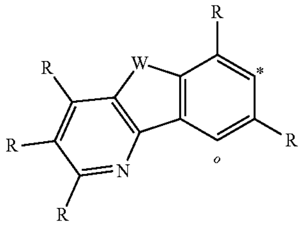
($L^2$-18e)
($L^3$-18e)
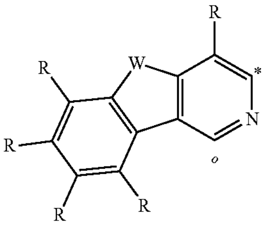
($L^2$-18f)
($L^3$-18f)
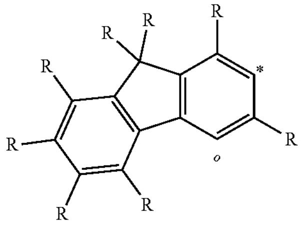
($L^2$-19a)
($L^3$-19a)
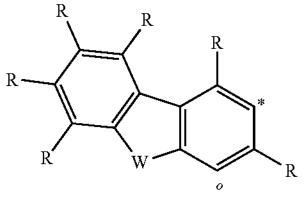
($L^2$-20a)
($L^3$-20a)
-continued
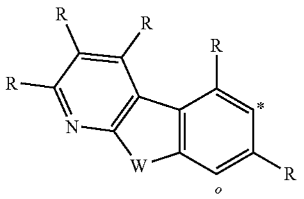
($L^2$-20b)
($L^3$-20b)
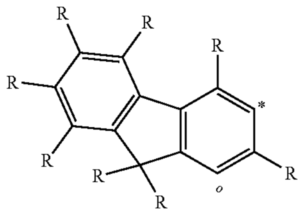
($L^2$-21a)
($L^3$-21a)
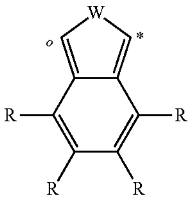
($L^2$-22a)
($L^3$-22a)
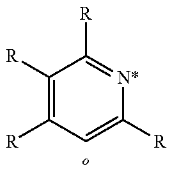
($L^2$-23a)
($L^3$-23a)
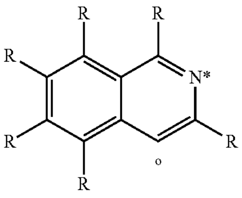
($L^2$-24a)
($L^3$-24a)
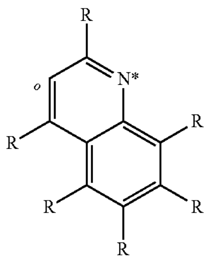
($L^2$-25a)
($L^3$-25a)
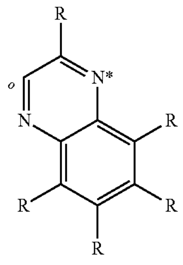
($L^2$-25b)
($L^3$-25b)
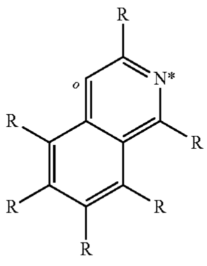
($L^2$-26a)
($L^3$-26a)
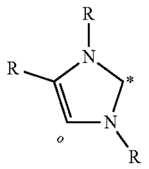
($L^2$-27a)
($L^3$-27a)

-continued
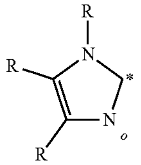
($L^2$-28a)
($L^3$-28a)
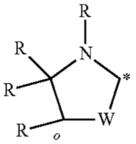
($L^2$-29a)
($L^3$-29a)
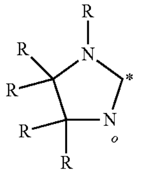
($L^2$-30a)
($L^3$-30a)
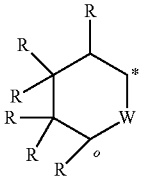
($L^2$-31a)
($L^3$-31a)
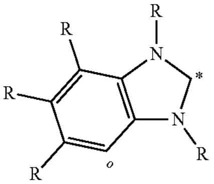
($L^2$-32a)
($L^3$-32a)
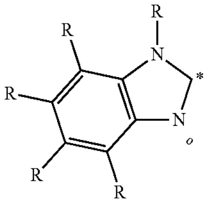
($L^2$-33a)
($L^3$-33a)
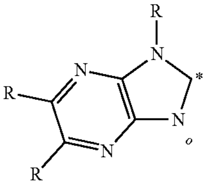
($L^2$-33b)
($L^3$-33b)
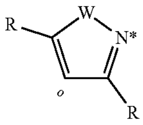
($L^2$-34a)
($L^3$-34a)
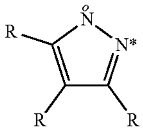
($L^2$-35a)
($L^3$-35a)
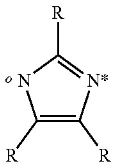
($L^2$-36a)
($L^3$-36a)
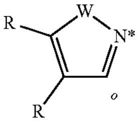
($L^2$-37a)
($L^3$-37a)
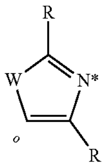
($L^2$-38a)
($L^3$-38a)
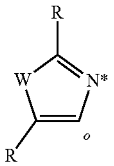
($L^2$-39a)
($L^3$-39a)
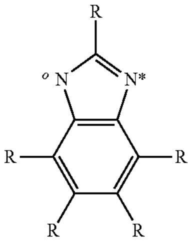
($L^2$-40a)
($L^3$-40a)
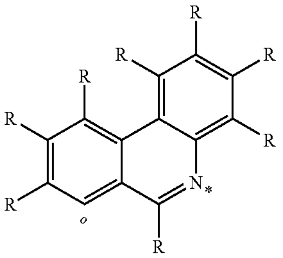
($L^2$-41a)
($L^3$-41a)
-continued
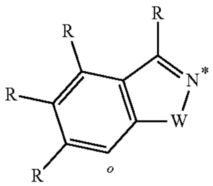
($L^2$-42a)
($L^3$-42a)
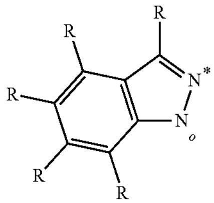
($L^2$-43a)
($L^3$-43a)
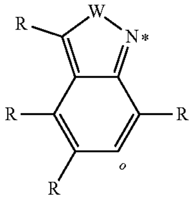
($L^2$-44a)
($L^3$-44a)
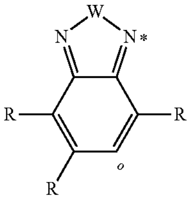
($L^2$-45b)
($L^3$-45b)
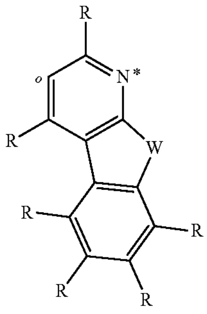
($L^2$-45a)
($L^3$-45a)
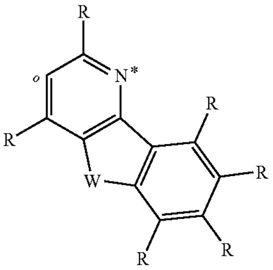
($L^2$-46a)
($L^3$-46a)
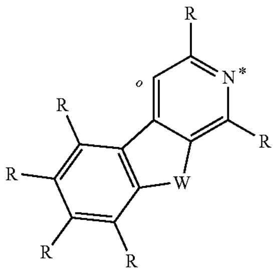
($L^2$-47a)
($L^3$-47a)
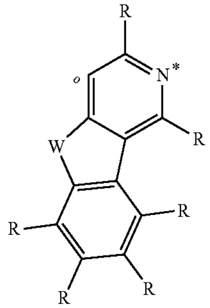
($L^2$-48a)
($L^3$-48a)
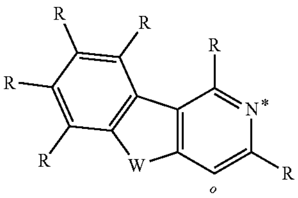
($L^2$-49a)
($L^3$-49a)

-continued

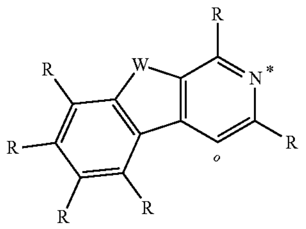

($L^2$-50a)
($L^3$-50a)

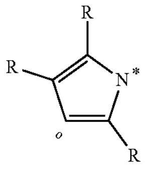

($L^2$-51a)
($L^3$-51a)

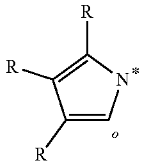

($L^2$-52a)
($L^3$-52a)

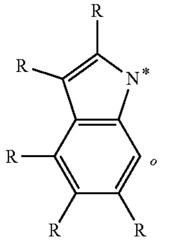

($L^2$-53a)
($L^3$-53a)

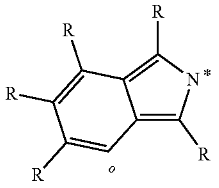

($L^2$-54a)
($L^3$-54a)

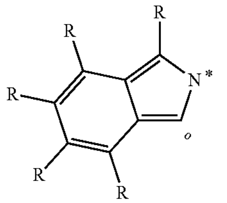

($L^2$-55a)
($L^3$-55a)

where the symbols used have the definitions given above. Preferably not more than three substituents R here are not H or D, more preferably not more than two substituents R and most preferably not more than one substituent R.

Preferred monodentate subligands $L^2$ and $L^3$ are the structures ($L^2$-1), ($L^3$-1), ($L^2$-23), ($L^3$-23), ($L^2$-27), ($L^3$-27), ($L^2$-28), ($L^3$-28), ($L^2$-32), ($L^3$-32), ($L^2$-33) and ($L^3$-33). Particularly preferred monodentate subligands $L^2$ and $L^3$ are the structures ($L^2$-1a), ($L^3$-1a), ($L^2$-23a), ($L^3$-23a), ($L^2$-27a), ($L^3$-27a), ($L^2$-28a), ($L^3$-28a), ($L^2$-32a), ($L^3$-32a), ($L^2$-33a), ($L^3$-33a), ($L^2$-33b) and ($L^3$-33b).

There follows a description of preferred embodiments of the ligand $L^4$. As described above, $L^4$ may be monodentate or bidentate. When the ligand $L^4$ is monodentate, it may be uncharged or monoanionic. When the ligand $L^4$ is bidentate, it may be uncharged, monoanionic or dianionic. When the ligands $L^4$ are monodentate, they preferably coordinate via atoms that are the same or different selected from the group consisting of carbon, nitrogen, oxygen, sulfur and phosphorus. When the ligand $L^4$ is bidentate, it preferably coordinates via two atoms that are the same or different selected from the group consisting of carbon, nitrogen, oxygen, sulfur and phosphorus.

Suitable uncharged monodentate ligands $L^4$ are the same or different at each instance and are selected from the group consisting of carbon monoxide (CO), nitrogen monoxide (NO), alkyl cyanides, for example acetonitrile, aryl cyanides, for example benzonitrile, alkyl isocyanides, for example methyl isonitrile, tert-butyl isonitrile, adamantyl isonitrile, aryl isocyanides, for example phenyl isonitrile, amines, for example trimethylamine, triethylamine, morpholine, phosphines, especially halophosphines, trialkylphosphines, triarylphosphines or alkylarylphosphines, for example trifluorophosphine, trimethylphosphine, tricyclohexylphosphine, tri-tert-butylphosphine, triphenylphosphine, tris(pentafluorophenyl)phosphine, dimethylphenylphosphine, methyldiphenylphosphine, bis(tert-butyl)phenylphosphine, phosphites, for example trimethyl phosphite, triethyl phosphite, arsines, for example trifluoroarsine, trimethylarsine, tricyclohexylarsine, tri-tert-butylarsine, triphenylarsine, tris(pentafluorophenyl)arsine, stibines, for example trifluorostibine, trimethylstibine, tricyclohexylstibine, tri-tert-butylstibine, triphenylstibine, tris(pentafluorophenyl)stibine, nitrogen-containing heterocycles, for example pyridine, pyridazine, pyrazine, pyrimidine, triazine, and carbenes, especially Arduengo carbenes. Preferred monodentate uncharged ligands $L^4$ are selected from the group consisting of CO, $PF_3$ and trialkylphosphines, where the alkyl groups are the same or different at each instance and have 1 to 10 carbon atoms.

Suitable monoanionic monodentate ligands $L^4$ are the same or different at each instance and are selected from hydride, deuteride, the halides $F^-$, $Cl^-$, $Br^-$ and $I^-$, alkylacetylides, for example methyl-$C{\equiv}C^-$, tert-butyl-$C{\equiv}C^-$, arylacetylides, for example phenyl-$C{\equiv}C^-$, cyanide, cyanate, isocyanate, thiocyanate, isothiocyanate, aliphatic or aromatic alkoxides, for example methoxide, ethoxide, propoxide, iso-propoxide, tert-butoxide, phenoxide, aliphatic or aromatic thioalkoxides, for example methanethiolate, ethanethiolate, propanethiolate, iso-propanethiolate, tert-thiobutoxide, thiophenoxide, amides, for example dimethylamide, diethylamide, di-iso-propylamide, morpholide, carboxylates, for example acetate, trifluoroacetate, propionate, benzoate, aryl groups, for example phenyl, naphthyl, and anionic nitrogen-containing heterocycles such as pyrrolide, imidazolide, pyrazolide. At the same time, the alkyl groups in these groups are preferably $C_1$-$C_{20}$-alkyl groups, more preferably $C_1$-$C_{10}$-alkyl groups, most preferably $C_1$-$C_4$-alkyl groups. An aryl group is also understood to mean heteroaryl groups. These groups have the definitions given above. A preferred monodentate monoanionic ligand $L^4$ is CN.

Preferred uncharged or mono- or dianionic, bidentate ligands $L^4$ are selected from diamines, for example ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, for example 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)ethyl]pyridine, 2-[(1-(iso-propylimino)ethyl]pyridine, 2-[1-(tert-butylimino)ethyl]pyridine, diimines, for example 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-di-iso-propylphenylimino)butane, 2,3-bis(2,6-di-tert-butylphenylimino)butane, heterocycles containing two nitrogen atoms, for example 2,2'-bipyridine, o-phenanthroline, diphosphines, for example bis(diphenylphosphino)methane, bis(diphenylphosphino)ethane, bis(diphenylphosphino)propane, bis(diphenylphosphino)butane, bis(dimethylphosphino)methane, bis(dimethylphosphino)

ethane, bis(dimethylphosphino)propane, bis(diethylphosphino)methane, bis(diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, for example acetylacetone, benzoylacetone, 1,5-diphenylacetylacetone, dibenzoylmethane, bis(1,1,1-trifluoroacetyl)methane, 3-ketonates derived from 3-keto esters, for example ethyl acetoacetate, carboxylates derived from aminocarboxylic acids, for example pyridine-2-carboxylic acid, quinoline-2-carboxylic acid, glycine, N,N-dimethylglycine, alanine, N,N-dimethylaminoalanine, salicyliminates derived from salicylimines, for example methylsalicylimine, ethylsalicylimine, phenylsalicylimine, dialkoxides derived from dialcohols, for example ethylene glycol, 1,3-propylene glycol, dithiolates derived from dithiols, for example ethylene-1,2-dithiol, propylene-1,3-dithiol, bis(pyrazolylborates), bis(imidazolyl)borates, 3-(2-pyridyl)diazoles or 3-(2-pyridyl)triazoles.

Preference is further given to bidentate monoanionic, uncharged or dianionic ligands $L^4$, especially monoanionic ligands, having, together with the iridium, a cyclometalated five-membered ring or six-membered ring having at least one iridium-carbon bond, especially a cyclometalated five-membered ring. These are especially ligands as generally used in the field of phosphorescent metal complexes for organic electroluminescent devices, i.e. ligands of the phenylpyridine, naphthylpyridine, phenylquinoline, phenylisoquinoline type, etc., each of which may be substituted by one or more R radicals. The person skilled in the art in the field of phosphorescent electroluminescent devices is aware of a multitude of such ligands, and will be able without exercising inventive skill to select further ligands of this kind as ligand $L^4$ for compounds of formula (1).

Suitable bidentate ligands $L^4$ are selected from the ligands of the following formulae ($L^4$-1), ($L^4$-2) and ($L^4$-3):

Formula($L^4$-1)

Formula($L^4$-2)

Formula($L^4$-3)

where the symbols used are as follows:

CyC is the same or different at each instance and is a substituted or unsubstituted aryl or heteroaryl group which has 5 to 14 aromatic ring atoms and coordinates in each case to the metal via a carbon atom and which is bonded to CyD via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system; the optional radicals are preferably selected from the abovementioned R radicals.

CyD here coordinates via an uncharged or anionic nitrogen atom or via a carbene carbon atom. In addition, CyC coordinates via an anionic carbon atom.

When two or more of the substituents, especially two or more R radicals, together form a ring system, it is possible for a ring system to be formed from substituents bonded to directly adjacent carbon atoms. In addition, it is also possible that the substituents on CyC and CyD together form a ring, as a result of which CyC and CyD may also together form a single fused aryl or heteroaryl group as bidentate subligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, which coordinates to the metal via a carbon atom, which may be substituted by one or more R radicals and which is bonded to CyD via a covalent bond.

Preferred embodiments of the CyC group are the structures of the following formulae (CyC-1) to (CyC-20) where the CyC group binds in each case at the position identified by # to CyD and coordinates at the position identified by * to the iridium, (CyC-1)

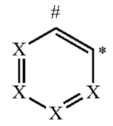

(CyC-2)

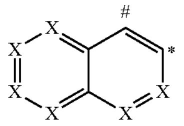

(CyC-3)

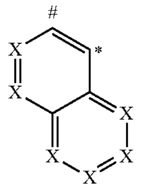

(CyC-4)

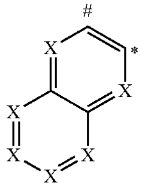

(CyC-5)

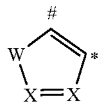

(CyC-6)

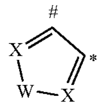

(CyC-7)

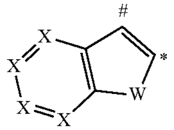

-continued (CyC-8)

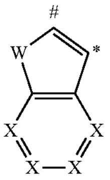

(CyC-9)

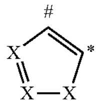

(CyC-10)

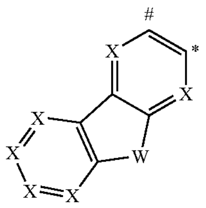

(CyC-11)

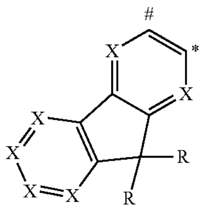

(CyC-12)

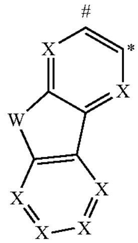

(CyC-13)

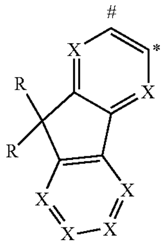

(CyC-14)

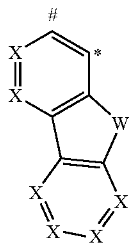

-continued (CyC-15)

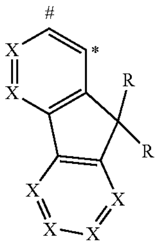

(CyC-16)

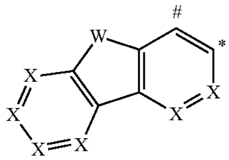

(CyC-17)

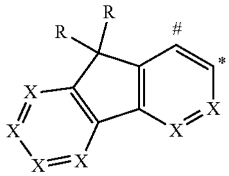

(CyC-18)

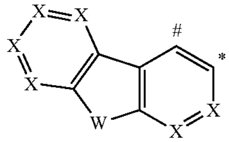

(CyC-19)

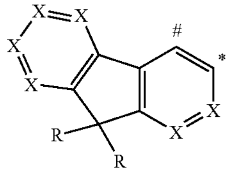

(CyC-20)

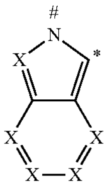

where R has the definitions given above and the other symbols used are as follows:

X is the same or different at each instance and is CR or N, with the proviso that at most two symbols X per ring are N;

W is the same or different at each instance and is NR, O or S.

Preferably not more than one symbol X in CyC is N, and more preferably all symbols X are CR.

Particularly preferred CyC groups are the groups of the following formulae (CyC-1a) to (CyC-20a):

(CyC-1a)
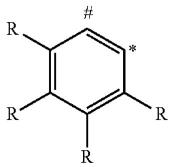
(CyC-1b)
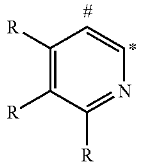
(CyC-1c)
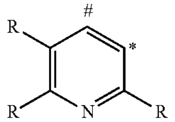
(CyC-1d)
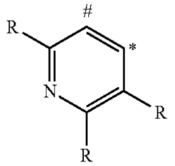
(CyC-1e)
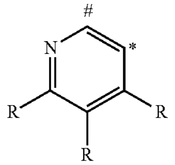
(CyC-1f)
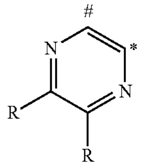
(CyC-1g)
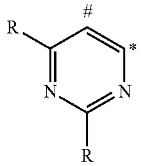
(CyC-1h)
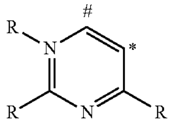
(CyC-2a)
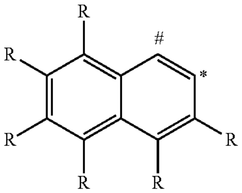
-continued
(CyC-2b)
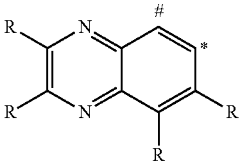
(CyC-3a)
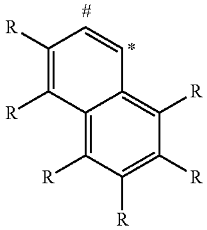
(CyC-3b)
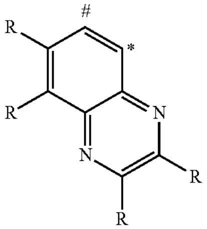
(CyC-4a)
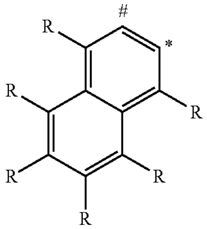
(CyC-4b)
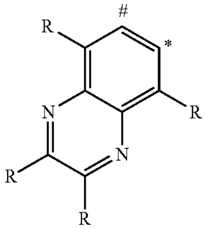
(CyC-5a)
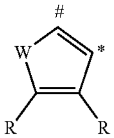
(CyC-6a)
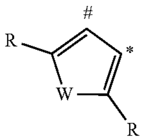

-continued
(CyC-7a)
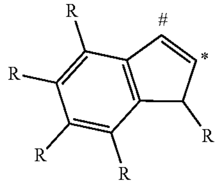
(CyC-8a)
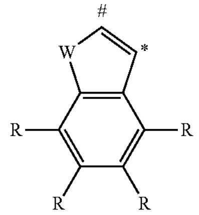
(CyC-9a)
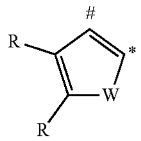
(CyC-10a)
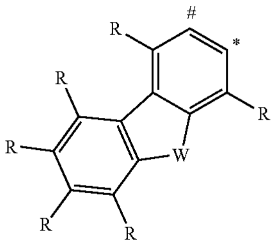
(CyC-11a)
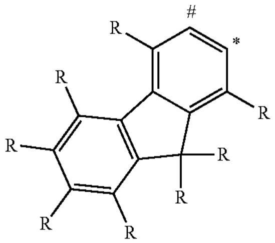
(CyC-12a)
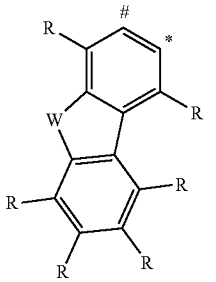
-continued
(CyC-13a)
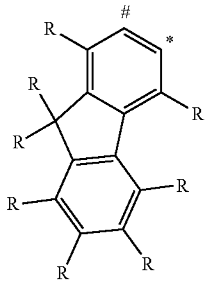
(CyC-14a)
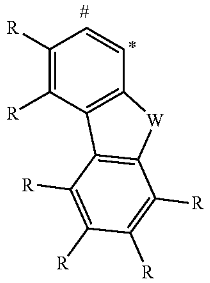
(CyC-15a)
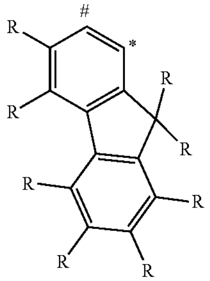
(CyC-16a)
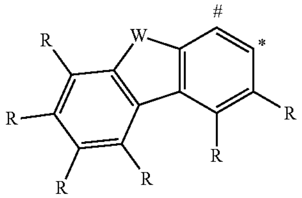
(CyC-16b)
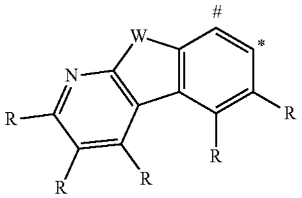
(CyC-16c)
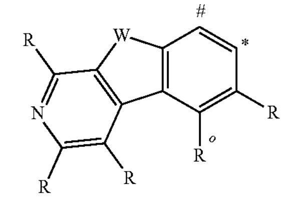

-continued (CyC-16d)

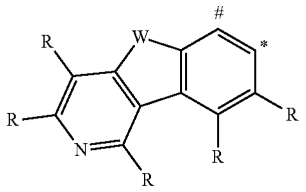

(CyC-16e)

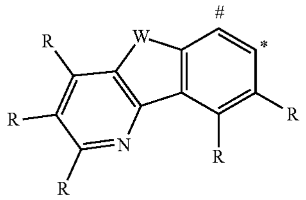

(CyC-16e)

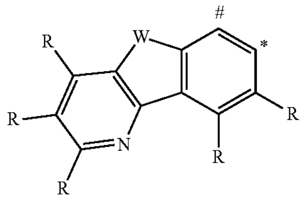

(CyC-16f)

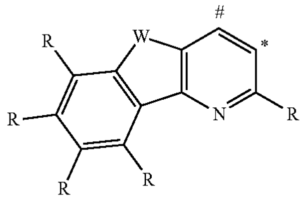

(CyC-16g)

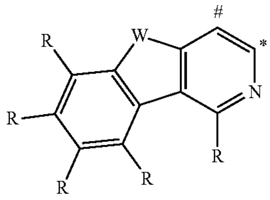

(CyC-17a)

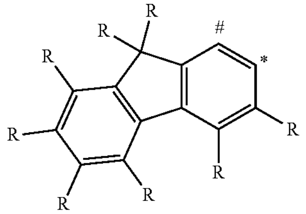

(CyC-18a)

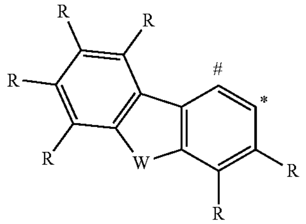

-continued (CyC-19a)

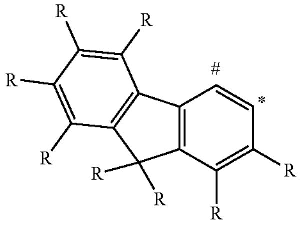

(CyC-20a)

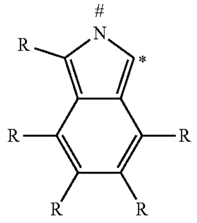

where the symbols used have the definitions given above. Preferably not more than three substituents R here are not H or D, more preferably not more than two substituents R and most preferably not more than one substituent.

Preferred groups among the (CyC-1) to (CyC-20) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-21) where the CyD group binds in each case at the position identified by # to CyC and coordinates at the position identified by * to the iridium:

(CyD-1)

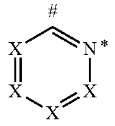

(CyD-2)

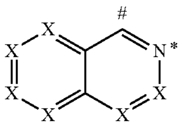

(CyD-3)

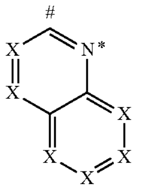

-continued
(CyD-4)
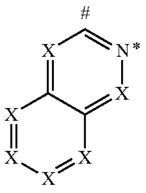
(CyD-5)
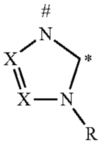
(CyD-6)
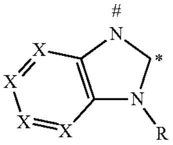
(CyD-7)
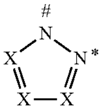
(CyD-8)
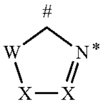
(CyD-9)
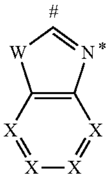
(CyD-10)
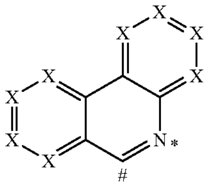
(CyD-11)
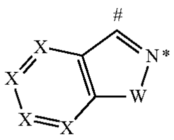
(CyD-12)
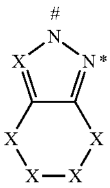
-continued
(CyD-13)
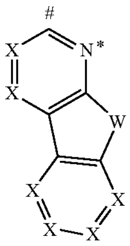
(CyD-14)
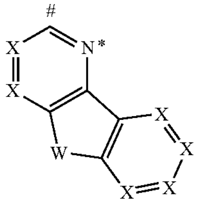
(CyD-15)
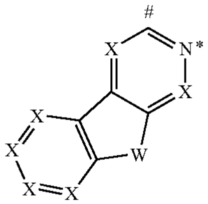
(CyD-16)
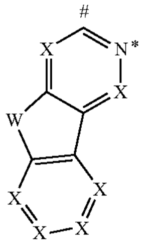
(CyD-17)
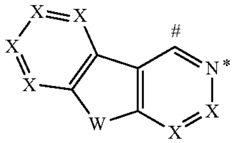
(CyD-18)
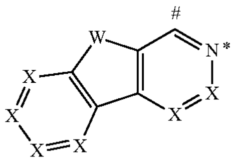
(CyD-19)
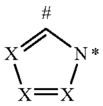
(CyD-20)
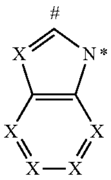

-continued (CyD-21)

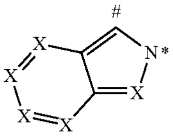

where X, W and R have the definitions given above.

The (CyD-1) to (CyD-4) and (CyD-7) to (CyD-18) groups here coordinate to the metal via an uncharged nitrogen atom, the (CyD-5) to (CyD-6) groups via a carbene carbon atom, and the (CyD-19) to (CyD-21) groups via an anionic nitrogen atom.

Preferably not more than one symbol X in CyD is N, and more preferably all symbols X are CR.

Particularly preferred CyD groups are the groups of the following formulae (CyD-1a) to (CyD-21a):

(CyD-1a)

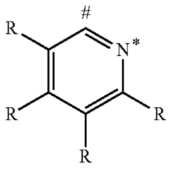

(CyD-2a)

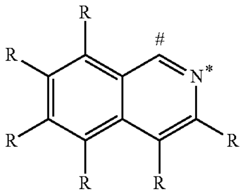

(CyD-3a)

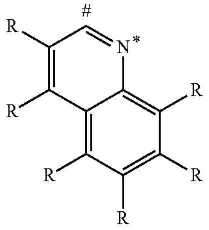

(CyD-3b)

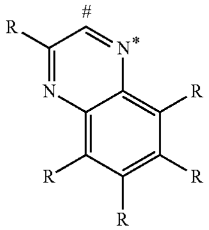

(CyD-4a)

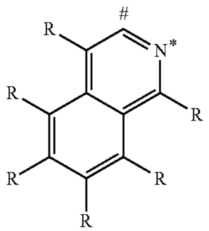

-continued (CyD-5a)

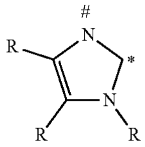

(CyD-6a)

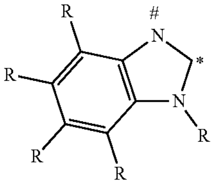

(CyD-7a)

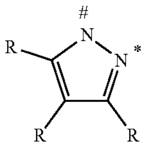

(CyD-8a)

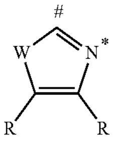

(CyD-9a)

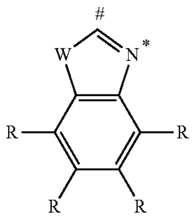

(CyD-10a)

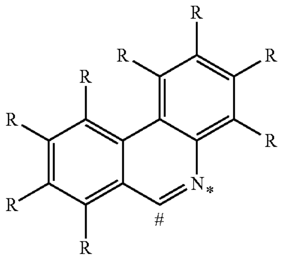

(CyD-11a)

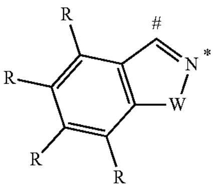

(CyD-12a)

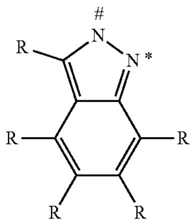

-continued (CyD-12b)

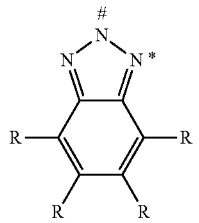

(CyD-13a)

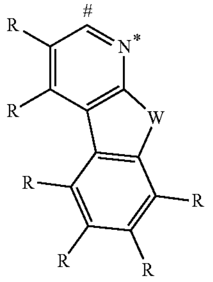

(CyD-14a)

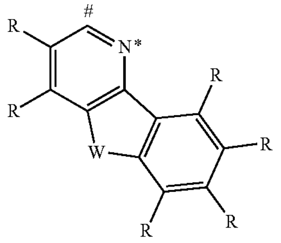

(CyD-15a)

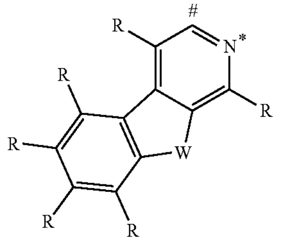

(CyD-16a)

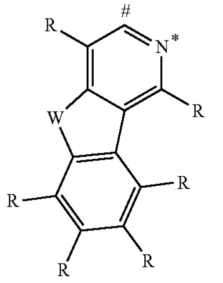

(CyD-17a)

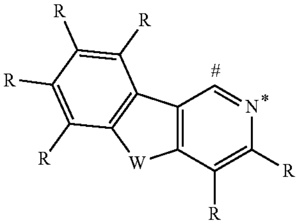

-continued (CyD-18a)

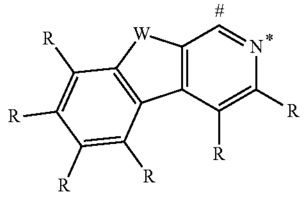

(CyD-19a)

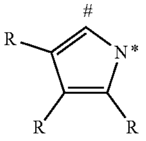

(CyD-20b)

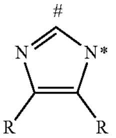

(CyD-21a)

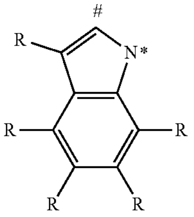

(CyD-21b)

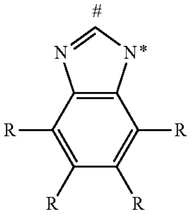

(CyD-22a)

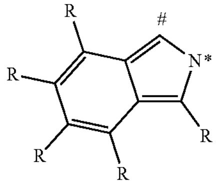

where the symbols used have the definitions given above. Preferably not more than three substituents R here are not H or D, more preferably not more than two substituents R and most preferably not more than one substituent.

Preferred groups among the (CyD-1) to (CyD-12) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, and CyD is a heteroaryl group having 6 to 10 aromatic ring atoms. At the same time, CyC and CyD may be substituted by one or more R radicals.

The abovementioned preferred groups (CyC-1) to (CyC-20) and (CyD-1) to (CyD-23) may be combined with one another as desired. It is especially preferable when the CyC and CyD groups mentioned as particularly preferred above, i.e. the groups of the formulae (CyC-1a) to (CyC-20a) and the groups of the formulae (CyD1-a) to (CyD-14b), are combined with one another. It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred ligands ($L^4$-1) are the structures of the formulae ($L^4$-1-1) to ($L^4$-1-5):

($L^4$-1-1)

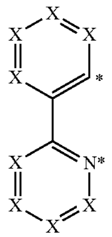

($L^4$-1-2)

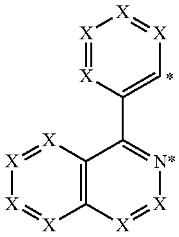

($L^4$-1-3)

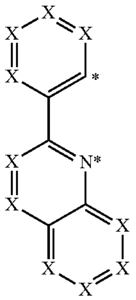

($L^4$-1-4)

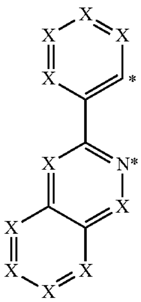

-continued ($L^4$-1-5)

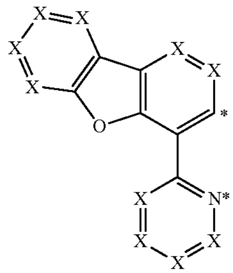

where the symbols used have the definitions given above.

Particularly preferred subligands ($L^4$-1) are the structures of the formulae ($L^4$-1-1a) to ($L^4$-1-5a):

($L^4$-1-1a)

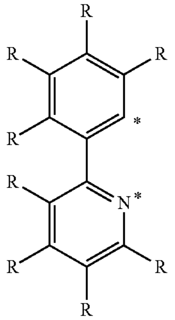

($L^4$-1-2a)

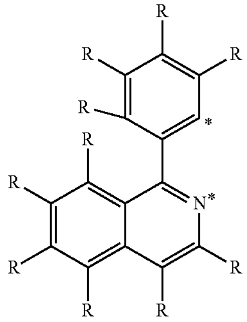

($L^4$-1-3a)

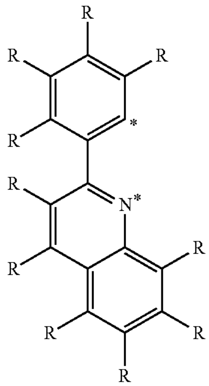

(L4-1-4a)

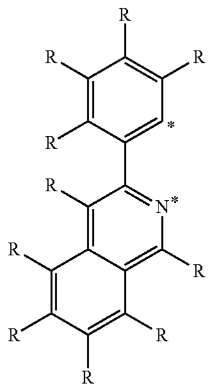

(L4-1-5a)

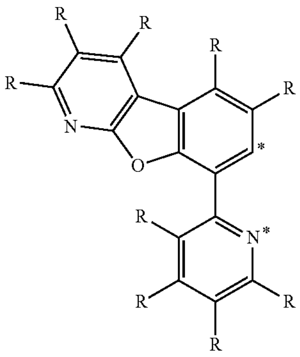

where the symbols used have the definitions given above. Preferably not more than three substituents R here are not H or D, more preferably not more than two substituents R and most preferably not more than one substituent.

When two R radicals of which one is bonded to CyC and the other to CyD together form an aromatic ring system, this can result in bridged ligands and also in ligands which overall constitute a single larger heteroaryl group. The ring between the substituents on CyC and CyD is preferably formed by a group of one of the formulae (5) to (14), as shown above for the subligand $L^1$.

Preferred ligands $L^4$ which result from ring formation between two R radicals in the different cycles are the structures of the formulae ($L^4$-3) to ($L^4$-16) shown below:

(L4-3)

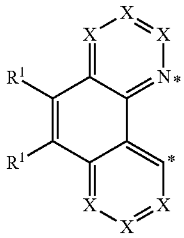

(L4-4)

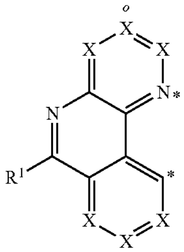

(L4-5)

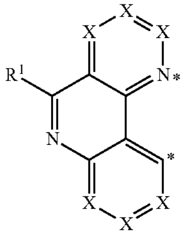

(L4-6)

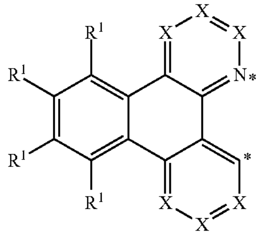

(L4-7)

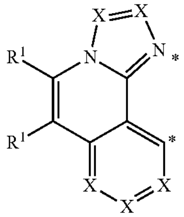

(L4-8)

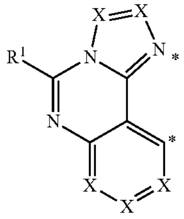

(L4-9)

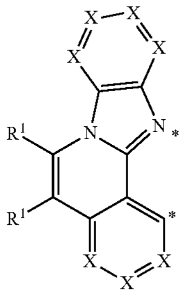

-continued ($L^4$-10)

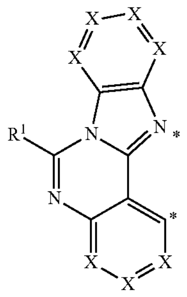

($L^4$-11)

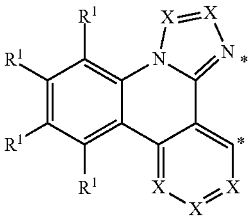

($L^4$-12)

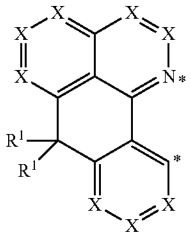

($L^4$-13)

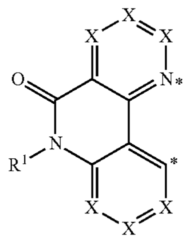

($L^4$-14)

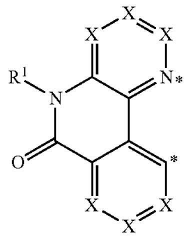

($L^4$-15)

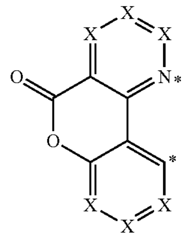

-continued ($L^4$-16)

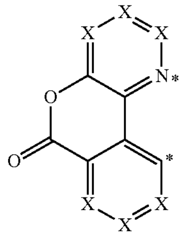

where the symbols used have the definitions given above.

In a preferred embodiment of the sub-ligands of the formulae ($L^4$-4) to ($L^4$-16), a total of one symbol X is N, and the other symbols X are CR, or all symbols X are CR.

In a further embodiment of the invention, it is preferable if, in the groups (CyC-1) to (CyC-20) or (CyD-1) to (CyD-14) or in the subligands ($L^4$-4) to ($L^4$-16), one of the atoms X is N when an R group bonded as a substituent adjacent to that nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. In this case, this substituent R is preferably a group selected from $CF_3$, $OCF_3$, alkyl groups having 1 to 10 carbon atoms, especially branched or cyclic alkyl groups having 3 to 10 carbon atoms, OR' where $R^1$ is an alkyl group having 1 to 10 carbon atoms, especially a branched or cyclic alkyl group having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate ligand $L^4$ is a structure of the following formula ($L^4$-17):

($L^4$-17)

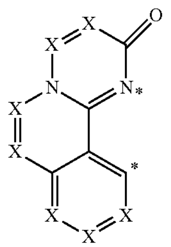

where R has the definitions given above, * represents the position of coordination to the iridium and the further symbols used are as follows:

X is the same or different at each instance and is CR or N, with the proviso that not more than one X symbol per cycle is N.

Preferred embodiments of the ligand ($L^4$-17) can be found in applications WO 2011/044988, WO 2014/094962, WO 2014/094961 and WO 2014/094960.

In a further embodiment of the invention, L is a ligand of the following formula ($L^4$-18) that coordinates to the iridium via the two positions identified by *:

(L$^4$-18)

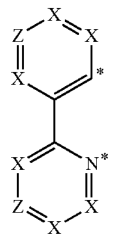

where the symbols X, Z, R', R" and n have the same definitions as described above for the subligand (L$^1$-39) and (L$^1$-40).

Preferred embodiments for the ligand (L$^4$-18) are the same as described above for the subligands (L$^1$-39) and (L$^1$-40).

A preferred embodiment of the ligand (L$^4$-18) is the ligand of the following formula (L$^4$-18a):

(L$^4$-18a)

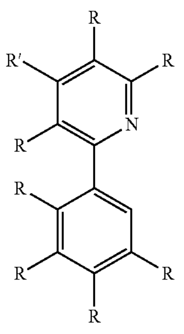

where the symbols used have the definitions given above.

More preferably, the ligand of the formula (L$^4$-18) has a structure of one of the following formula (L$^4$-18b):

(L$^4$-18b)

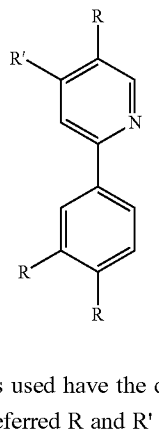

where the symbols used have the definitions given above.

In respect of preferred R and R' radicals on the ligand of the formula (L$^4$-18) or the preferred embodiments, the same applies as set out above for the subligands (L$^1$-39) and (L$^1$-40).

Preferred ligands L$^4$ with fused-on benzo groups are the structures formulae (L$^4$-18c) to (L$^4$-18h) shown below:

(L$^4$-18c)

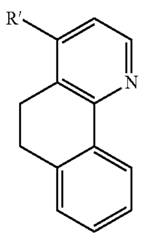

(L$^4$-18d)

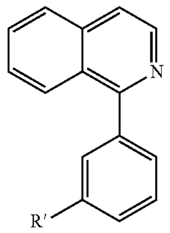

(L$^4$-18e)

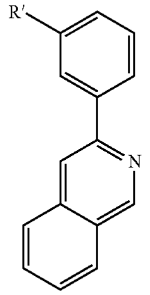

(L$^4$-18f)

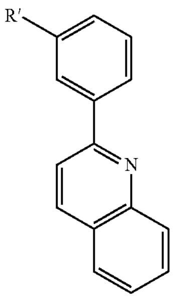

(L$^4$-18g)

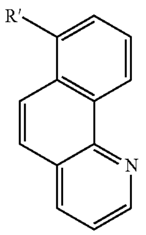

(L$^4$-18h)

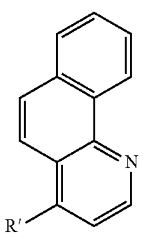

where the ligands may each also be substituted by one or more further R radicals and the fused-on structure may be substituted by one or more $R^1$ radicals. Preferably, there are no further R or $R^1$ radicals present.
Preferred ligands $L^4$ of the formula ($L^4$-18) with fused-on benzofuran or azabenzofuran groups are the structures of the formulae ($L^4$-18i) to ($L^4$-18y) shown below:
($L^4$-18i)
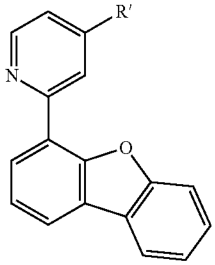
($L^4$-18j)
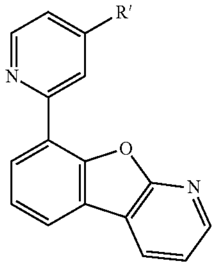
($L^4$-18k)
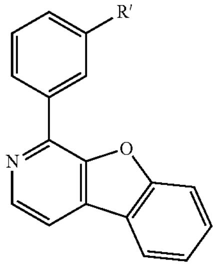
($L^4$-18l)
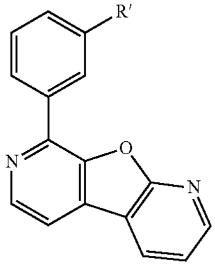
($L^4$-18m)
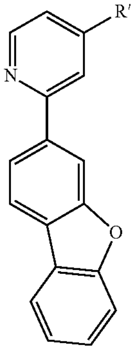
-continued
($L^4$-18n)
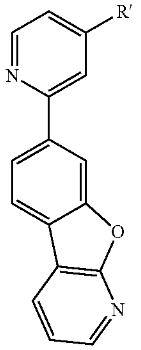
($L^4$-18o)
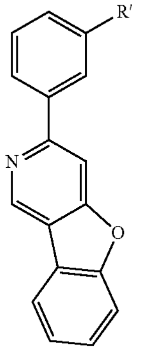
($L^4$-18q)
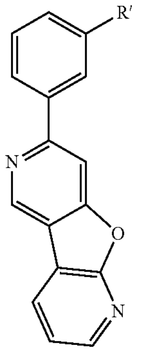
($L^4$-18r)
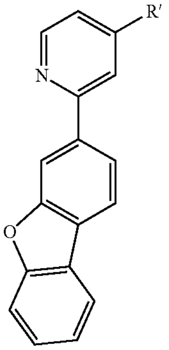

-continued (L4-18s)

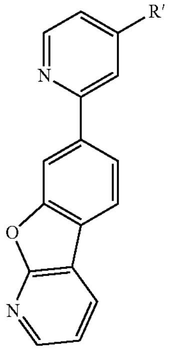

(L4-18t)

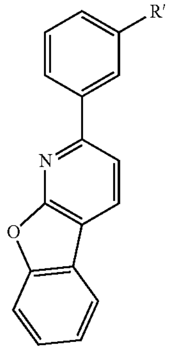

(L4-18u)

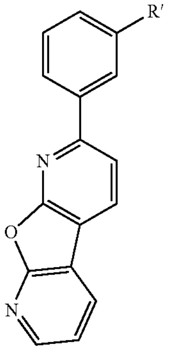

(L4-18v)

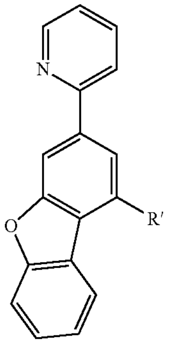

-continued (L4-18w)

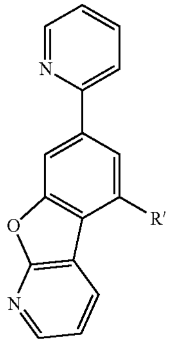

(L4-18x)

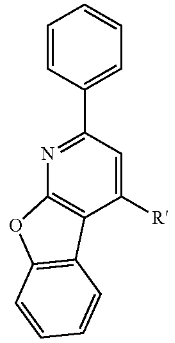

(L4-18y)

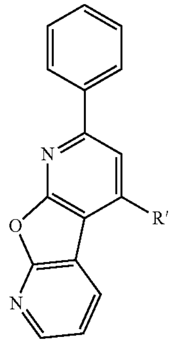

where the ligands may each also be substituted by one or more further R radicals and the fused-on structure may be substituted by one or more $R^1$ radicals. Preferably, there are no further R or $R^1$ radicals present. It is likewise possible for O in these structures to be replaced by S or $NR^1$.

Preferred embodiments of the substituents R' of the formula (16) or (17) in the ligand $L^4$ correspond to the preferred embodiments described above for ($L^1$-39) and ($L^1$-40).

Further embodiments of $L^4$ are the bidentate dianionic ligands ($L^4$-19) and ($L^4$-20) and the bidentate monoanionic ligands ($L^4$-21) to ($L^4$-24), each of which coordinate to the iridium via the two atoms identified by *:

($L^4$-19)

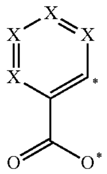

-continued ($L^4$-20)

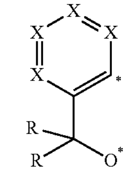

($L^4$-21)

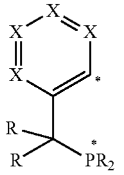

($L^4$-22)

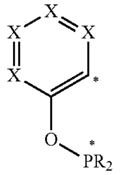

($L^4$-23)

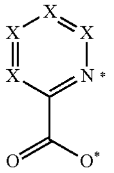

($L^4$-24)

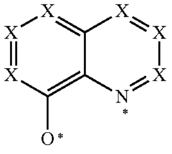

where R has the definitions given above and X is the same or different at each instance and is CR or N, with the proviso that not more than two X are N. Preferably not more than one X is N, and more preferably all X are the same or different at each instance and are CR.

Preference is given to the ligands ($L^4$-19a) to ($L^4$-24a):

($L^4$-19a)

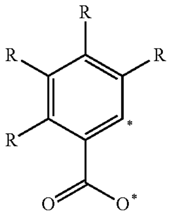

($L^4$-20a)

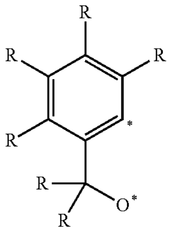

-continued ($L^4$-21a)

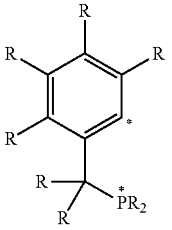

($L^4$-22a)

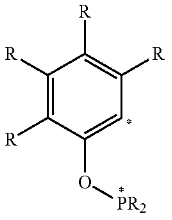

($L^4$-23a)

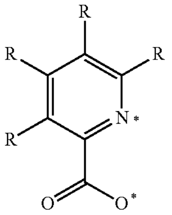

($L^4$-24a)

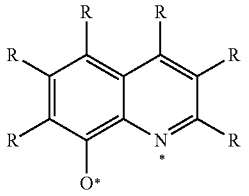

where R has the meanings given above. Preferably not more than three substituents R here are not H or D, more preferably not more than two substituents R and most preferably not more than one substituent.

There follows a description of preferred substituents as may be present on the above-describe subligands $L^1$, $L^2$ and/or $L^3$ or the above-described ligand $L^4$. These substituents may also be present on the bivalent arylene or heteroarylene group in the structures of the formula (4).

In a preferred embodiment of the invention, the metal complex of the invention contains two R substituents or two $R^1$ substituents which are bonded to adjacent carbon atoms and together form an aliphatic ring according to one of the formulae described hereinafter. In this case, the two R substituents which form this aliphatic ring may be present on the bridge V or the bridge of the formula (2) or (3) and/or on the bidentate subligand and/or on one of the monodentate subligands. The aliphatic ring which is formed by the ring formation by two R substituents together or by two $R^1$ substituents together is preferably described by one of the following formulae (18) to (24):

Formula (18)

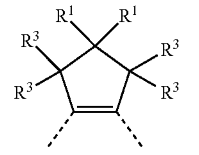

Formula (19)

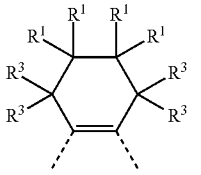

Formula (20)

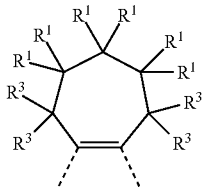

Formula (21)

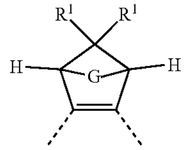

Formula (22)

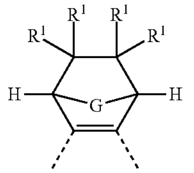

Formula (23)

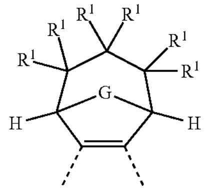

Formula (24)

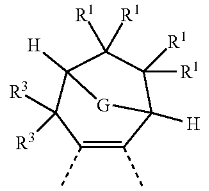

where $R^1$ and $R^2$ have the definitions given above, the dotted bonds indicate the attachment of the two carbon atoms in the ligand, and in addition:

G is an alkylene group which has 1, 2 or 3 carbon atoms and may be substituted by one or more $R^2$ radicals, $—CR^2═CR^2—$ or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C═CR^2$, C≡C, $Si(R^2)_2$, C═O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. For instance, the absence of acidic benzylic protons in the formulae (18) to (24) is achieved in that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention. Thus, the absence of acidic benzylic protons in formulae (21) to (24) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (21) to (24) is H, this is therefore a non-acidic proton in the context of the present application. In a preferred embodiment of the invention, $R^3$ is not H.

Preferred embodiments of the groups of the formulae (18) to (24) can be found in applications WO 2014/023377, WO 2015/104045 and WO 2015/117718.

When the compounds of the invention have R radicals that do not correspond to the above-described R radicals, these R radicals are the same or different at each instance and are preferably selected from the group consisting of H, D, F, Br, I, $N(R^1)_2$, CN, $Si(R^1)_3$, $B(OR^1)_2$, $C(═O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

The abovementioned preferred embodiments can be combined with one another as desired. In a particularly preferred embodiment of the invention, the abovementioned preferred embodiments apply simultaneously.

Examples of suitable structures of the invention are the compounds depicted below.

1

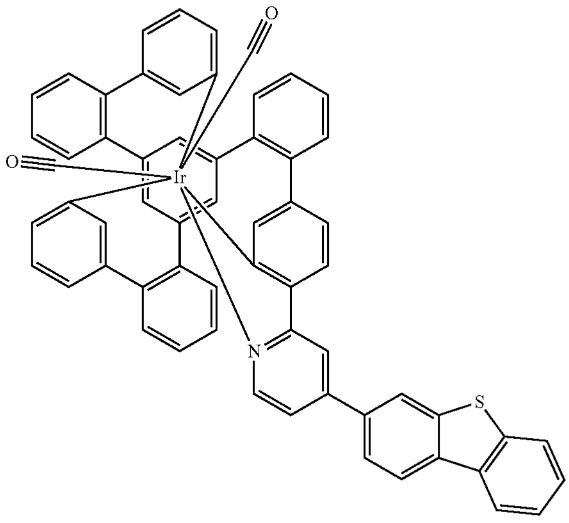

-continued

2

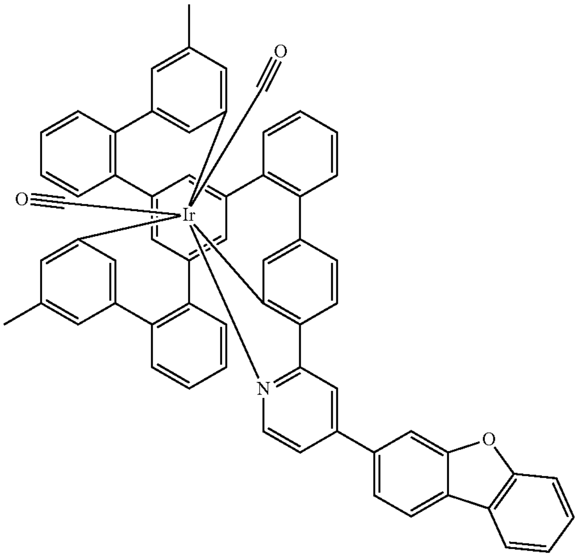

3

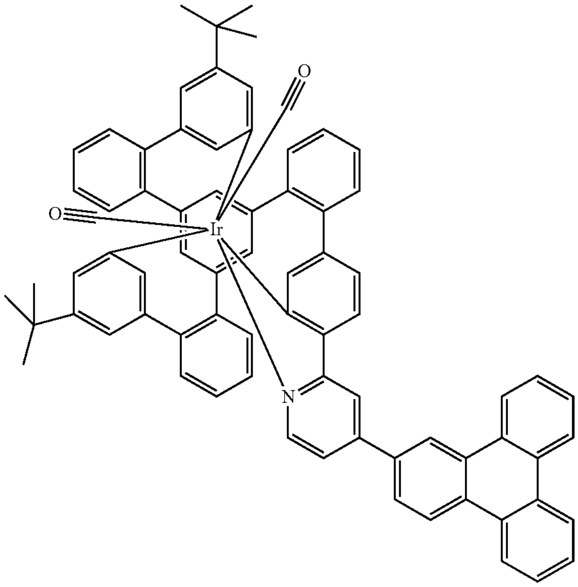

4

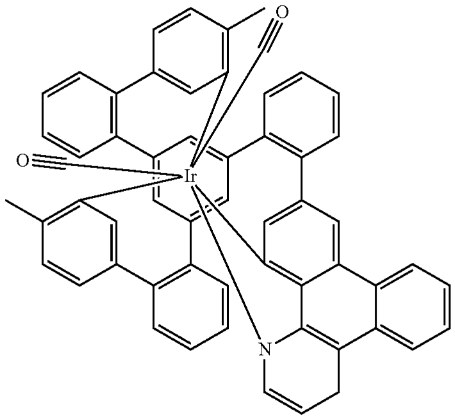

-continued
5
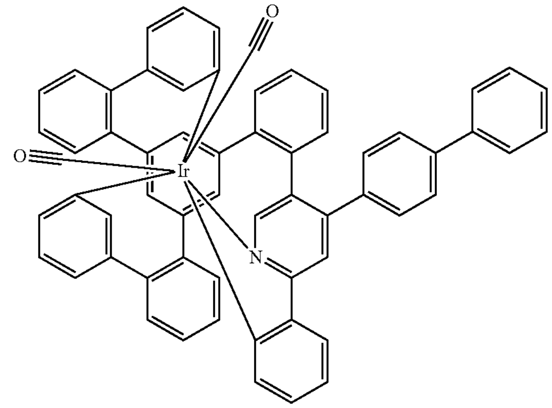
6
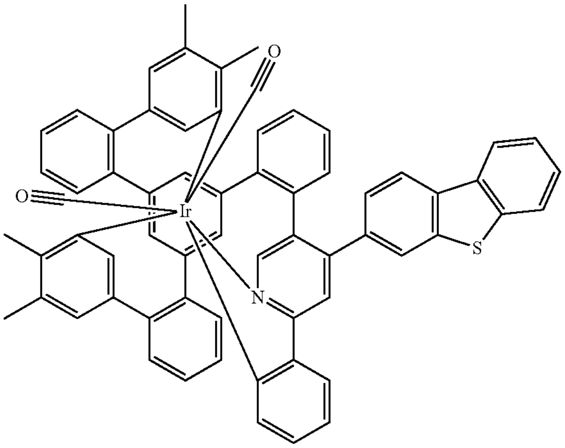
7
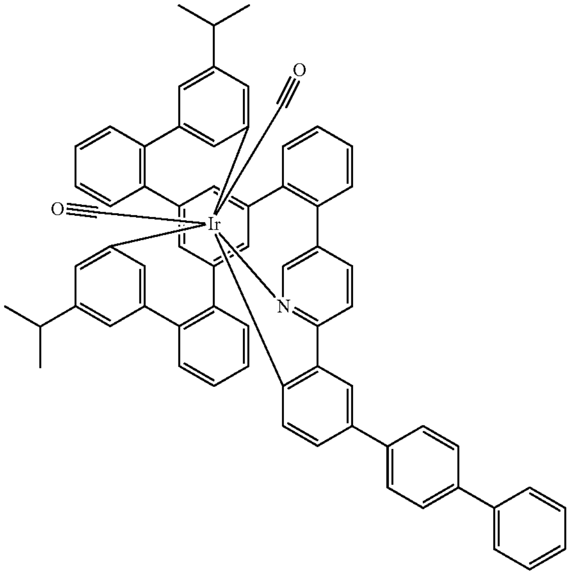
-continued
8
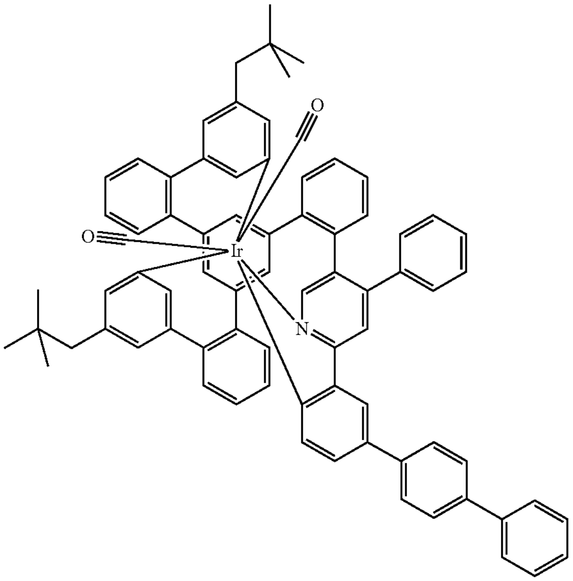
9
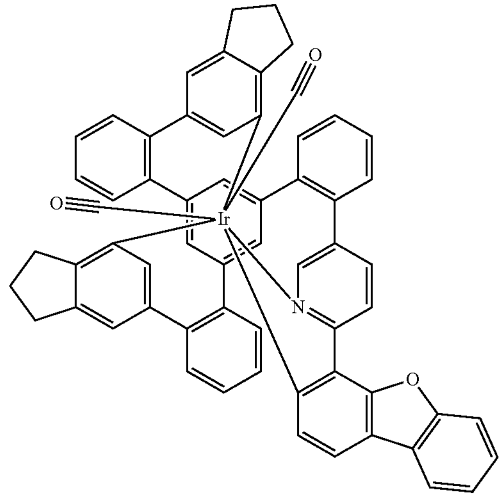
10
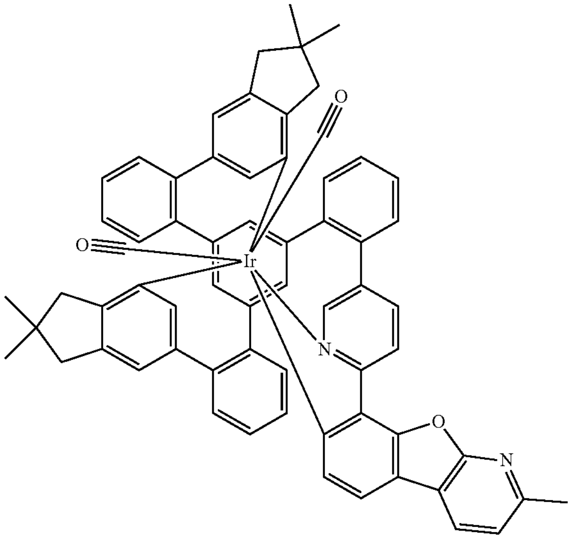

-continued
11
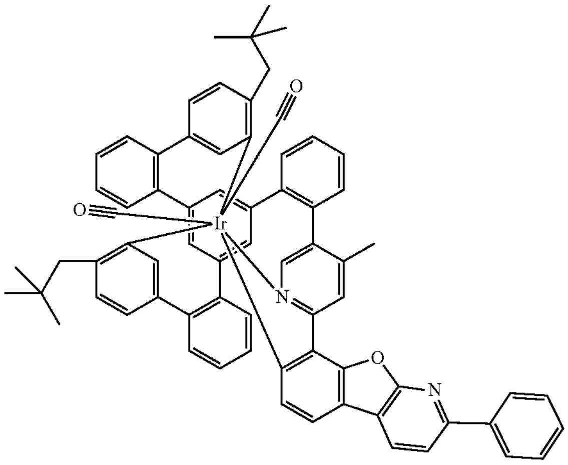
12
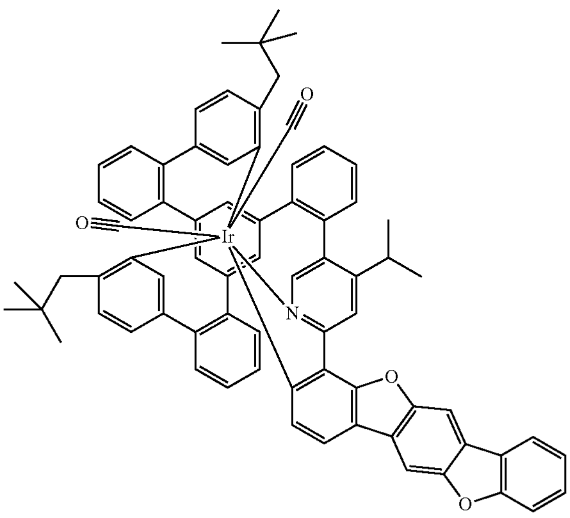
13
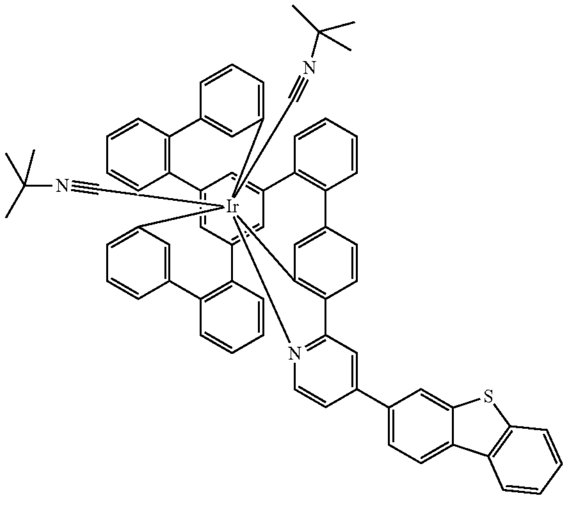
-continued
14
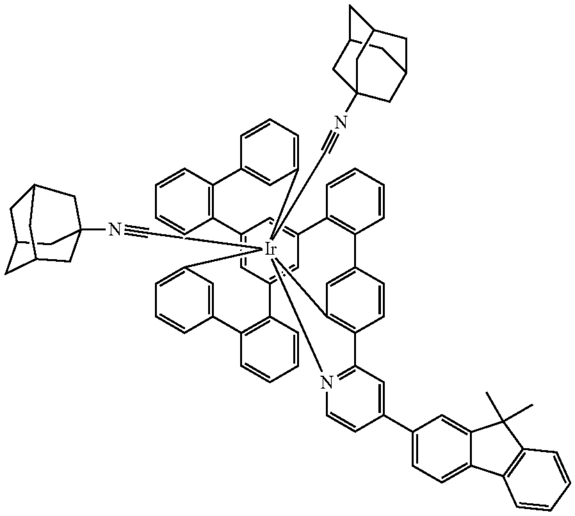
15
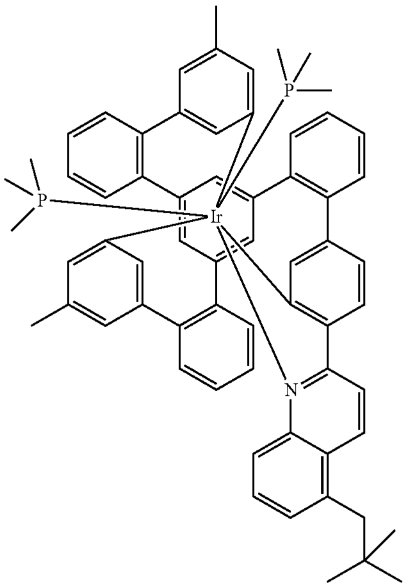
16
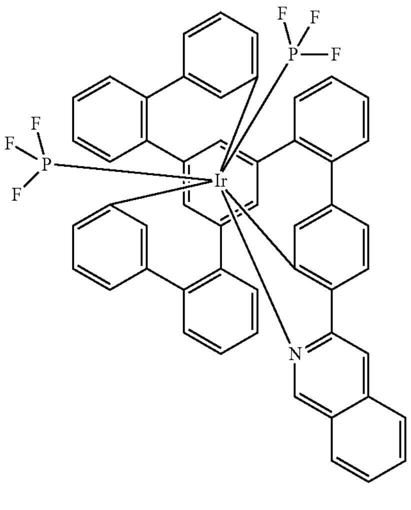

-continued
17
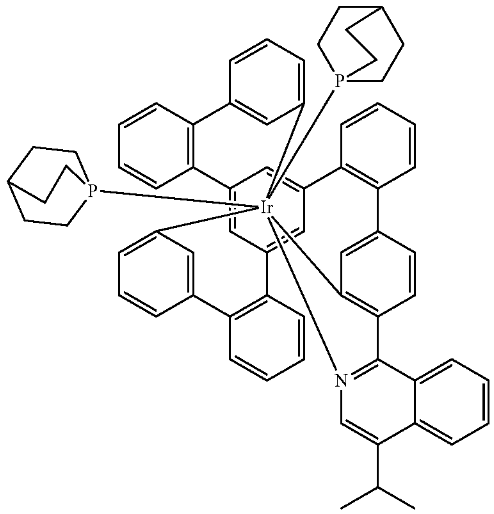
18
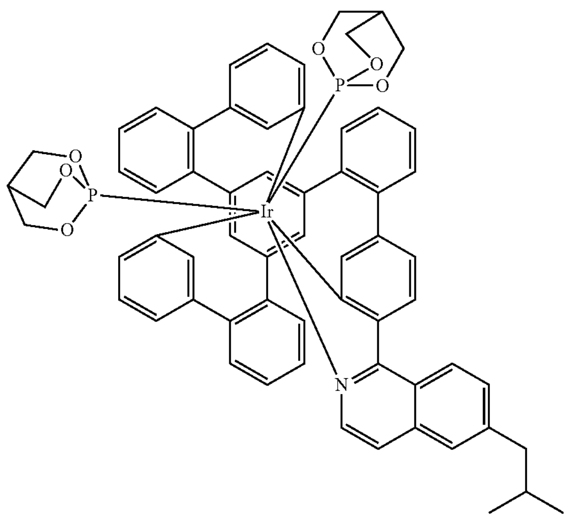
19
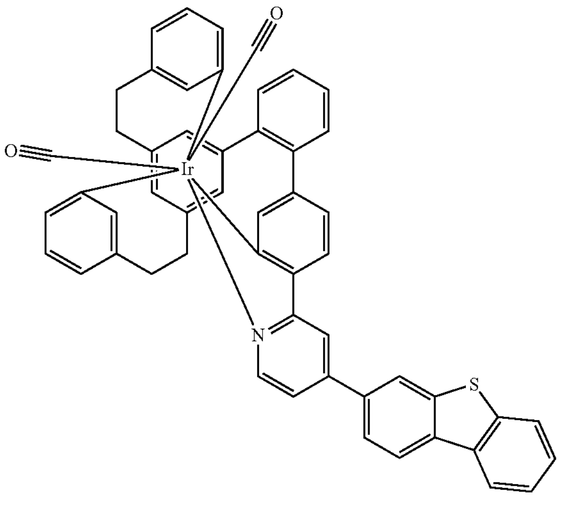
-continued
20
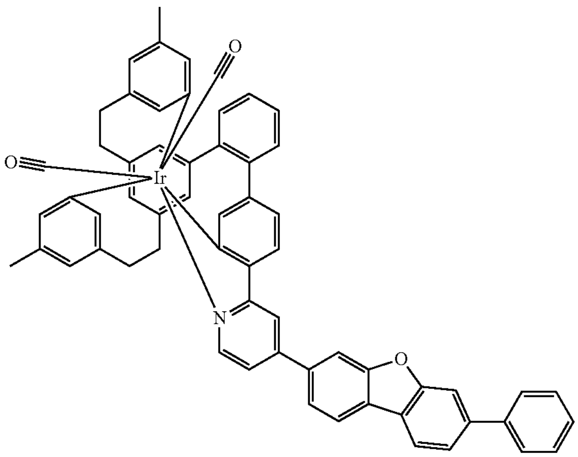
21
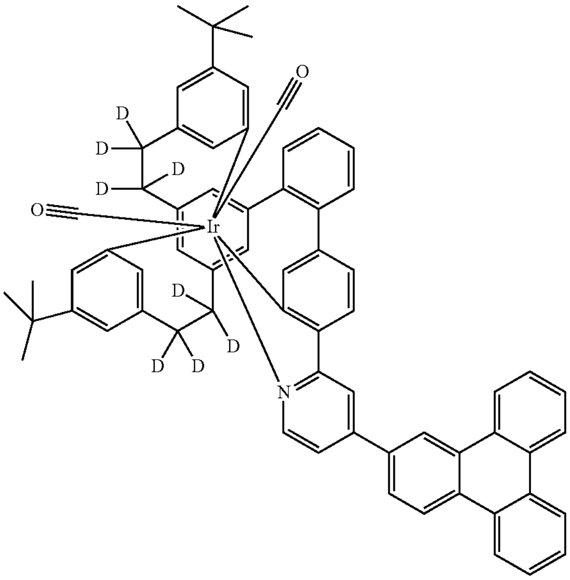
22
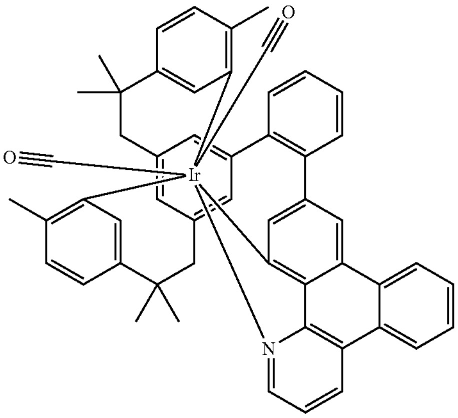

23
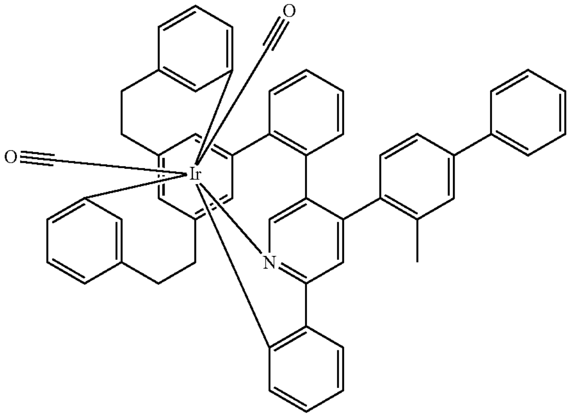
24
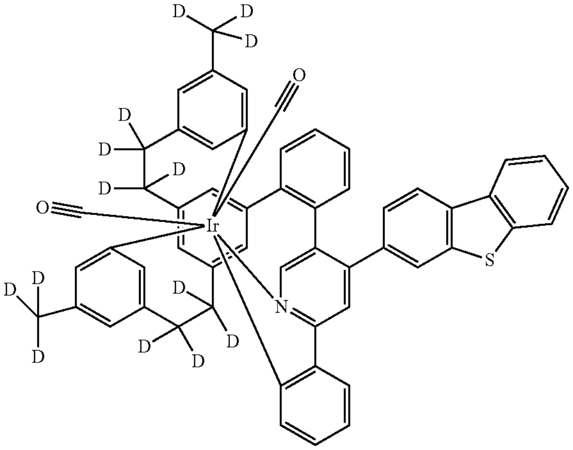
25
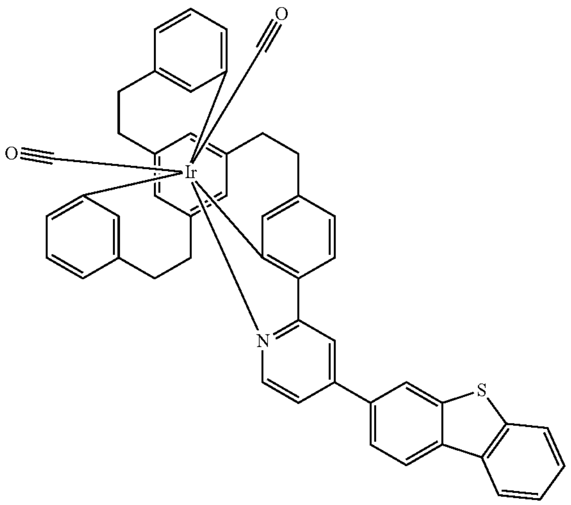
26
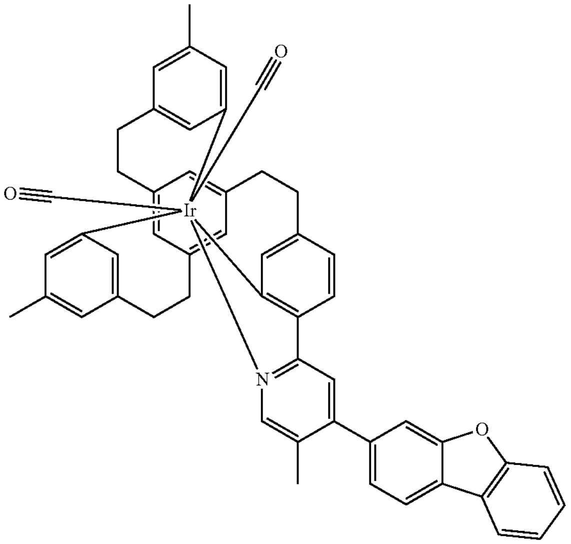
27
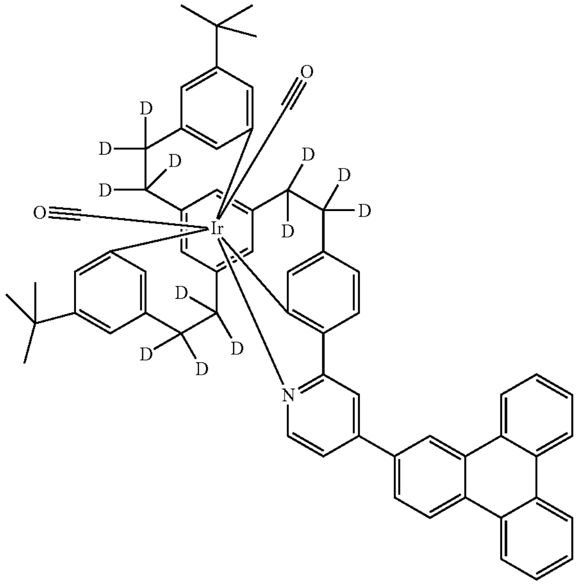

-continued
28
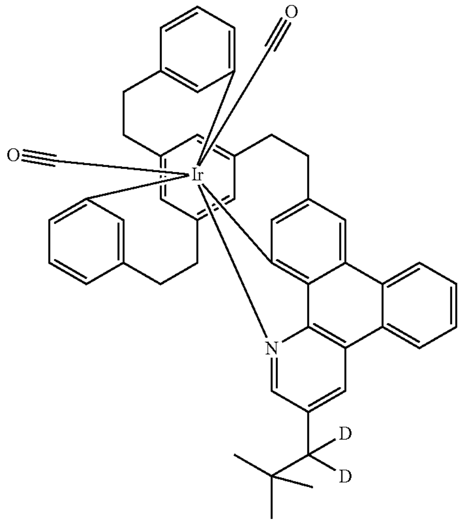
29
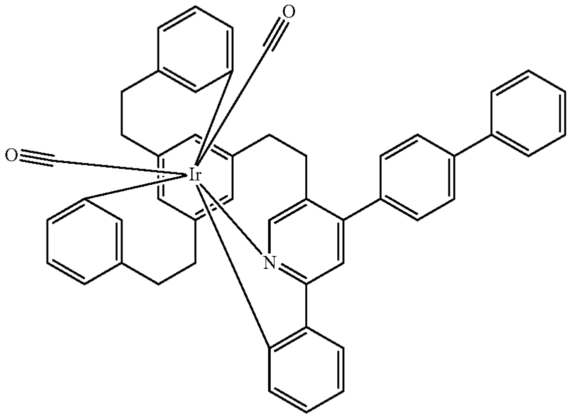
30
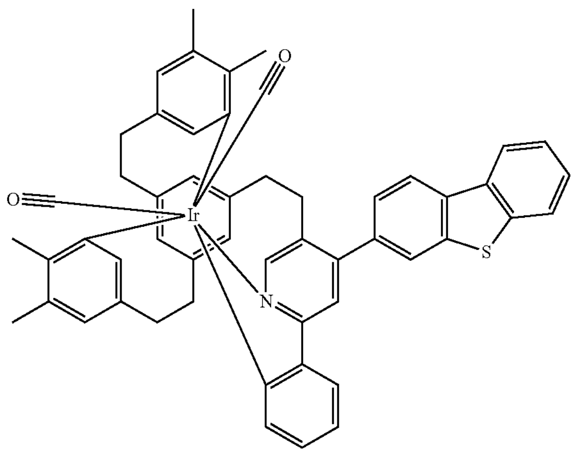
-continued
31
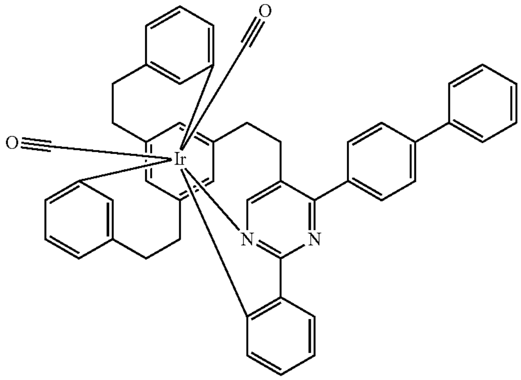
32
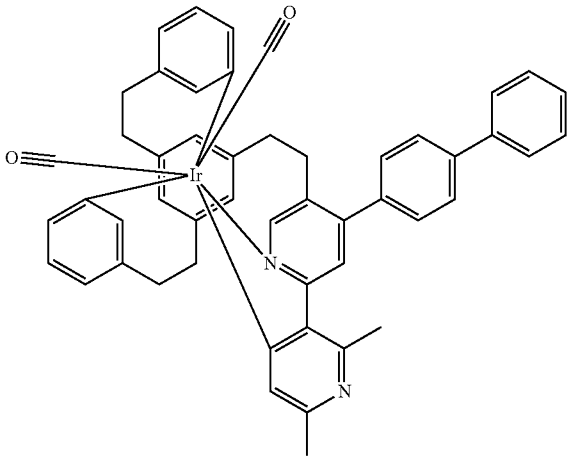
33
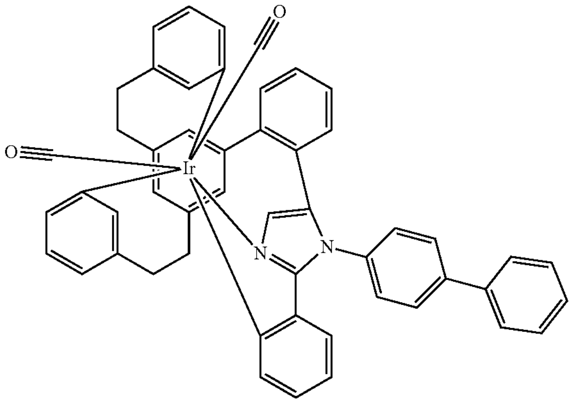

-continued
34
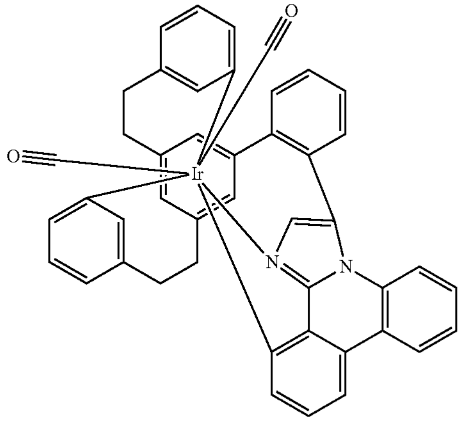
35
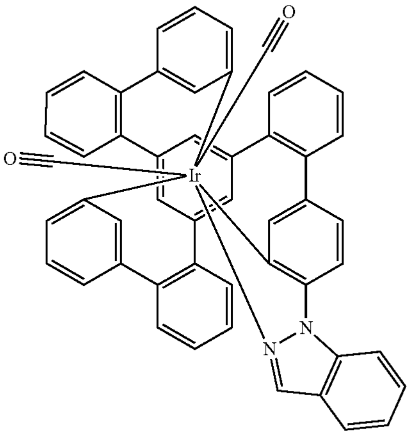
36
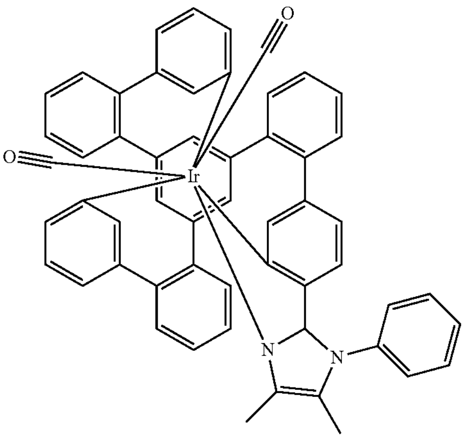
-continued
37
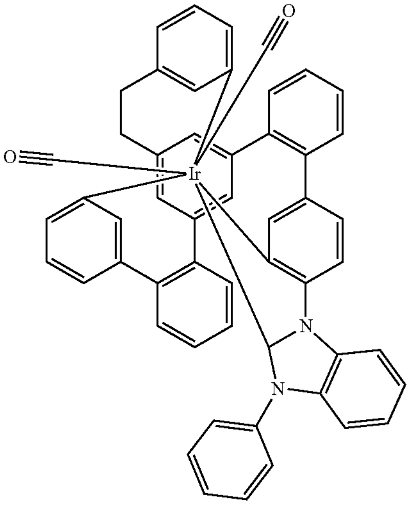
38
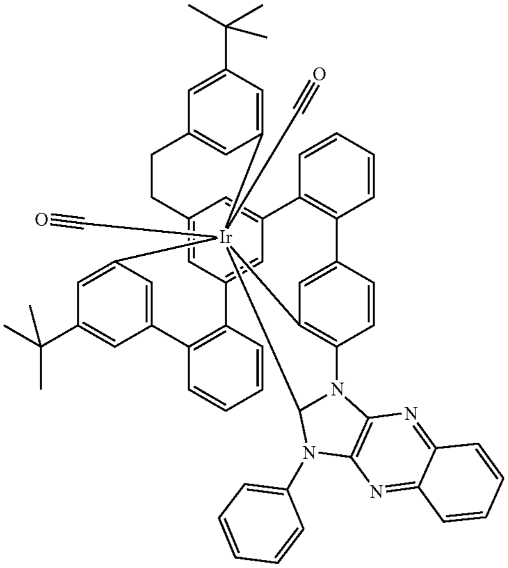
39
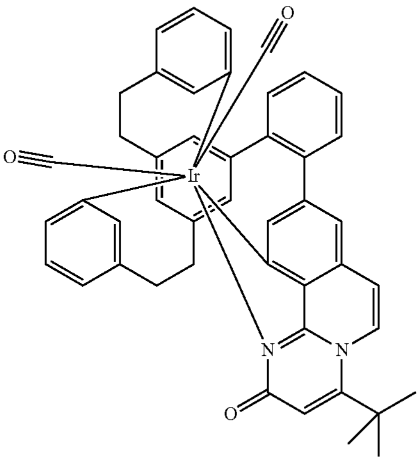

-continued
40
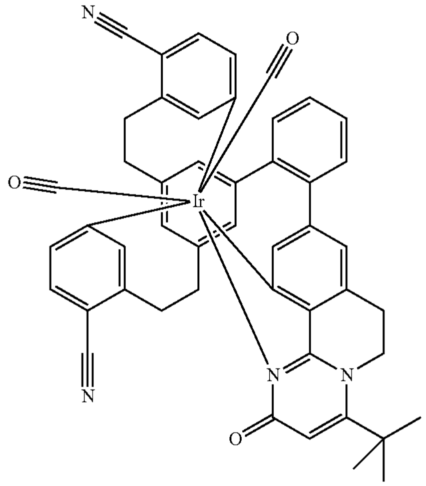
41
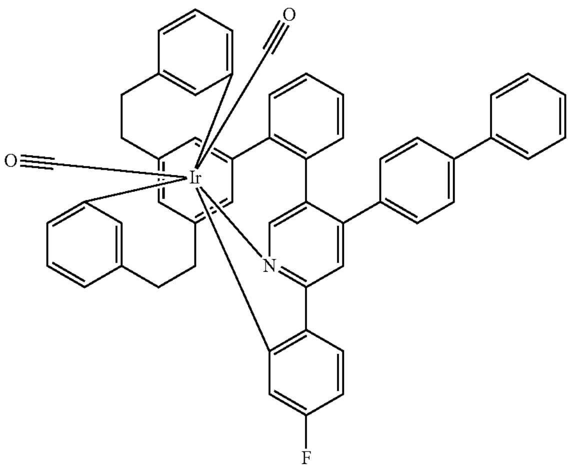
42
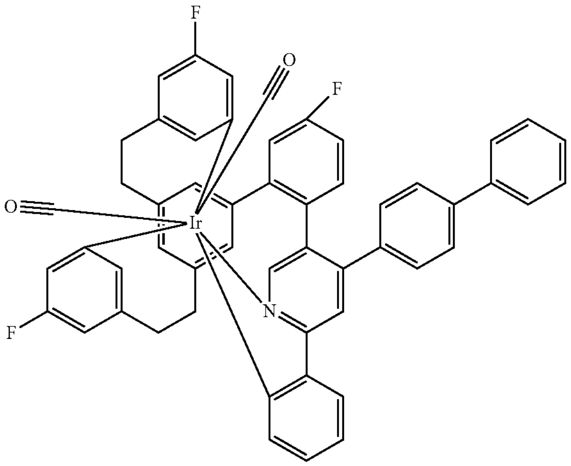
-continued
43
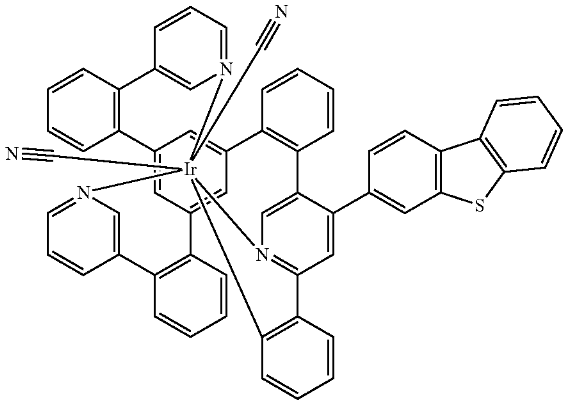
44
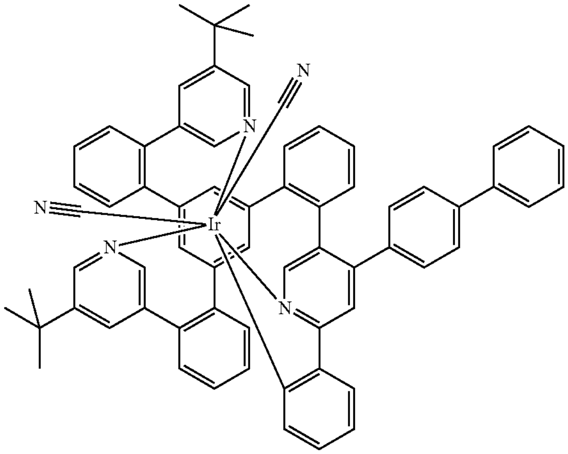
45
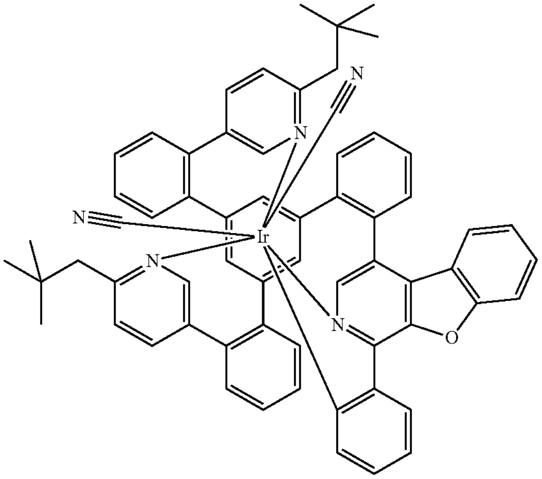

-continued
46
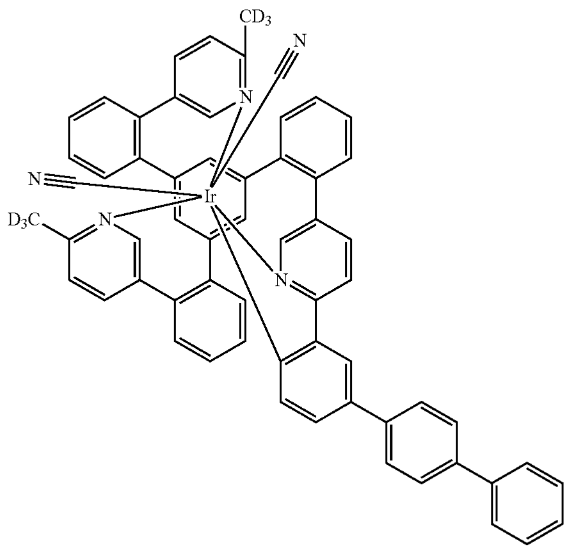
47
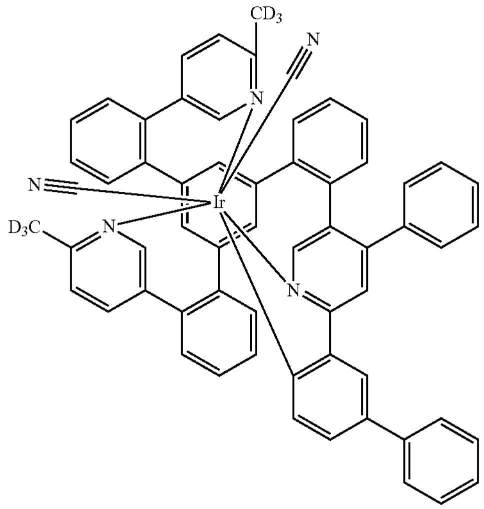
48
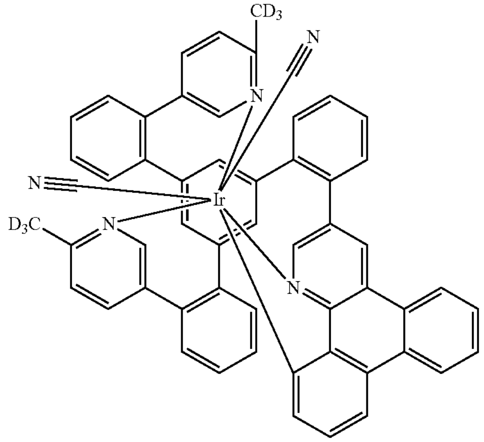
-continued
49
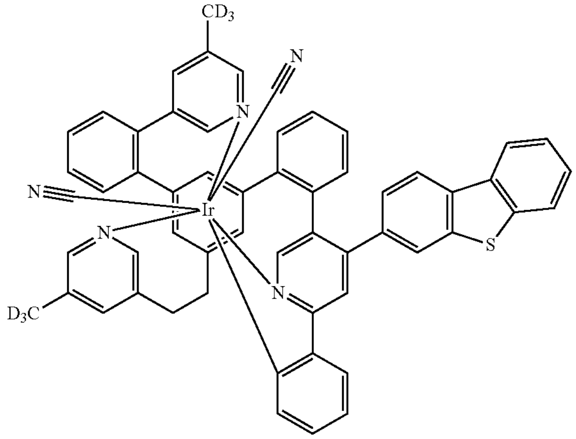
50
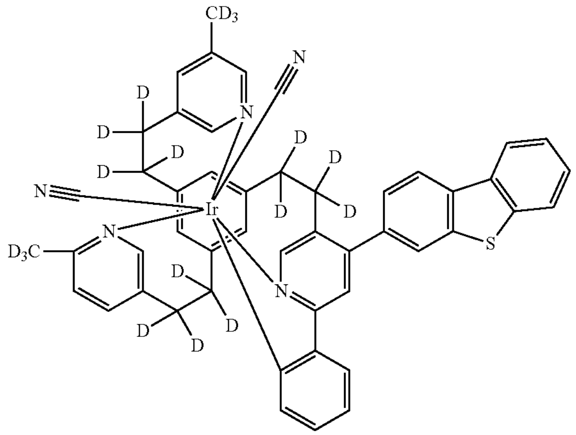
51
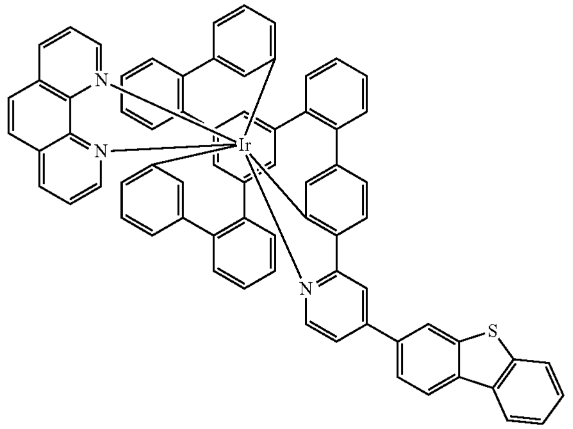

-continued
52
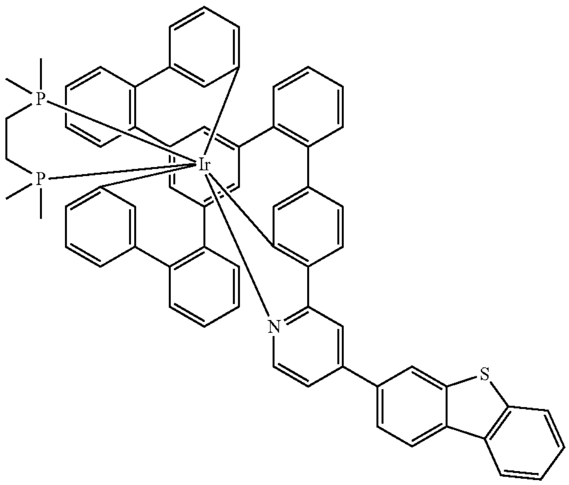
53
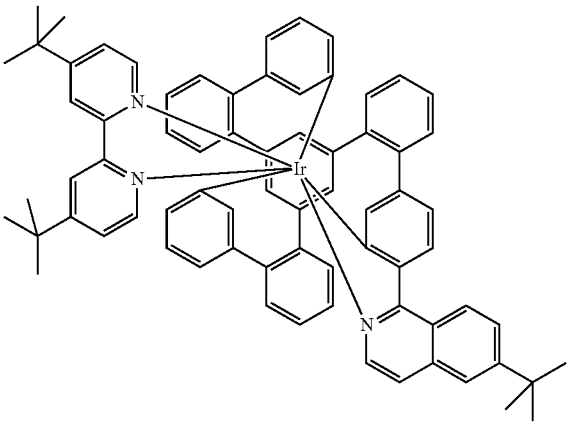
54
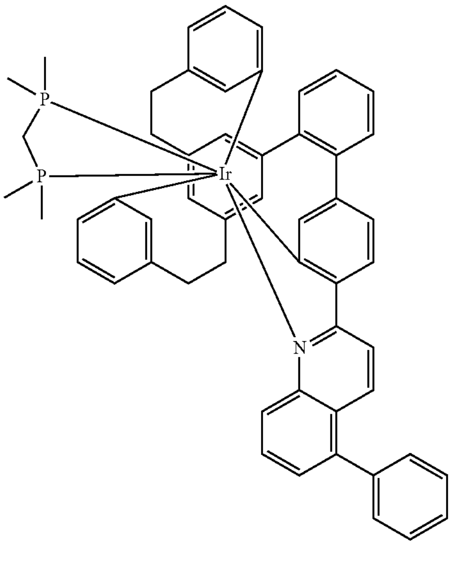
-continued
55
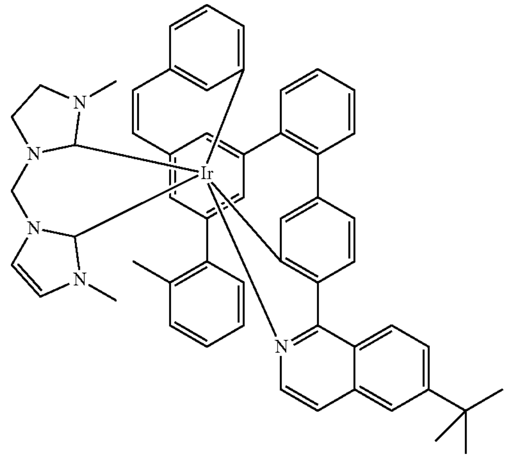
56
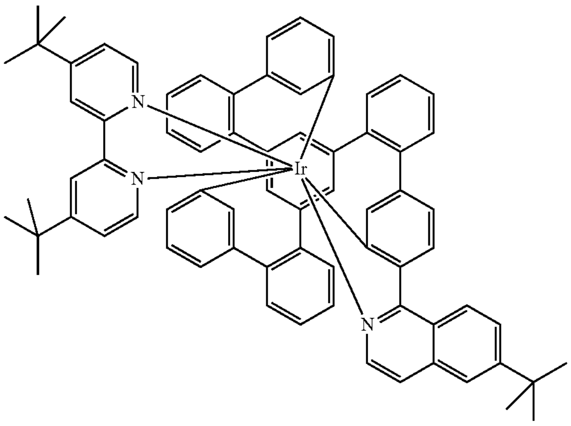
57
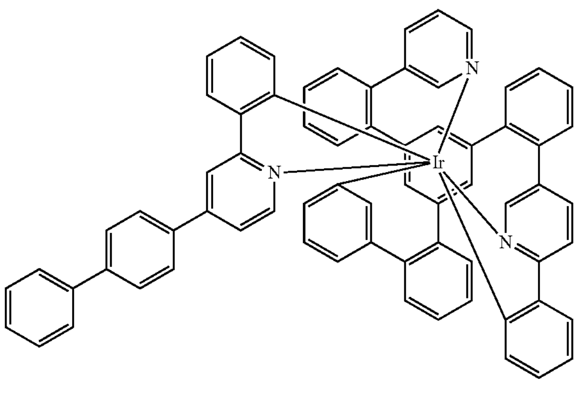

-continued
58
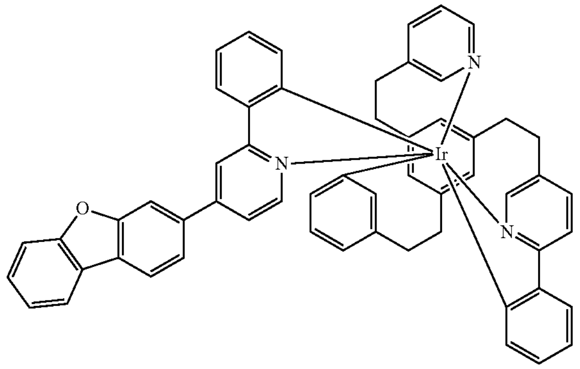
59
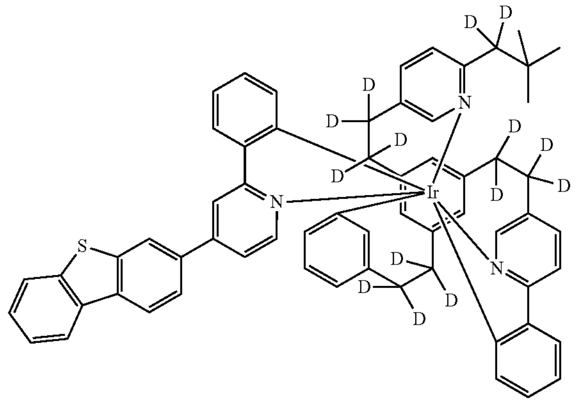
60
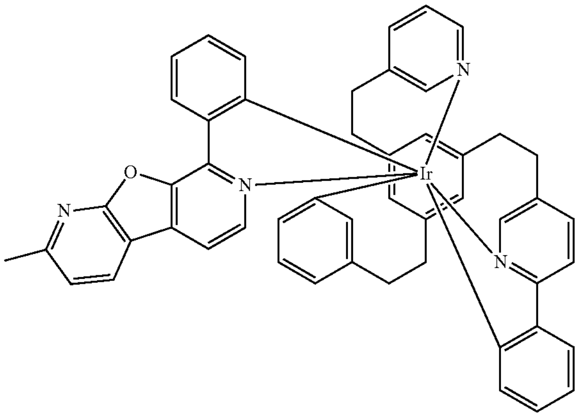
-continued
61
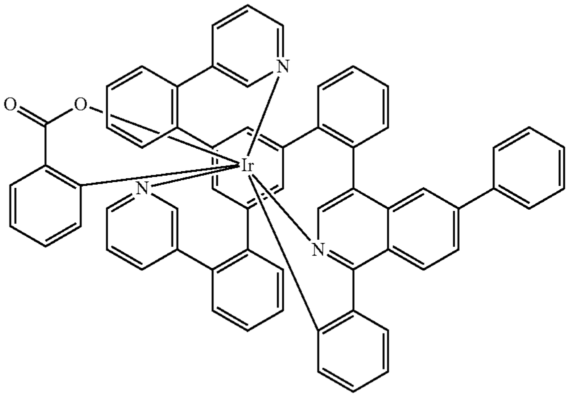
62
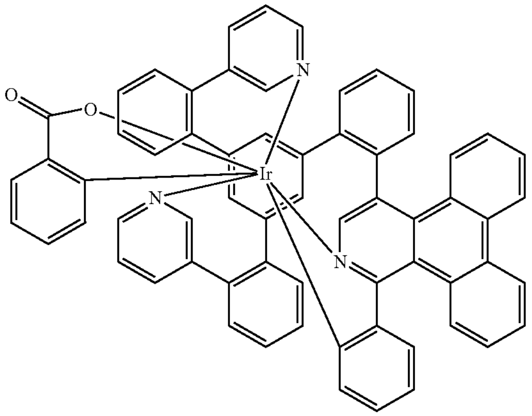
63
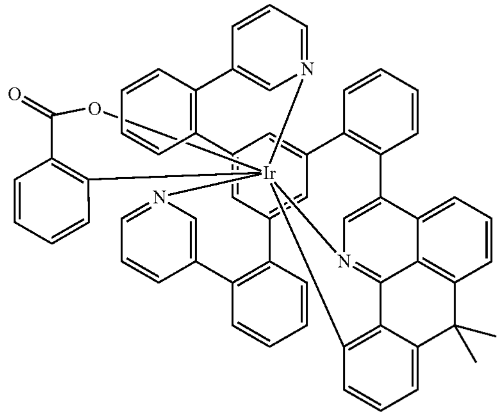

-continued
64
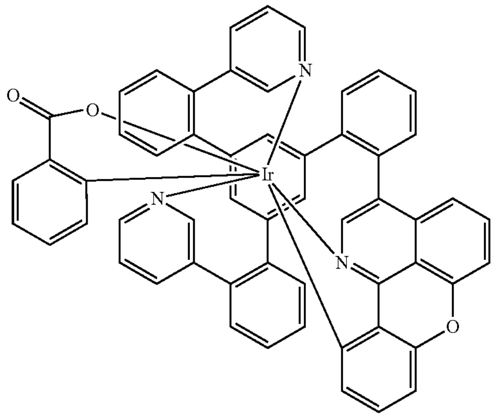
65
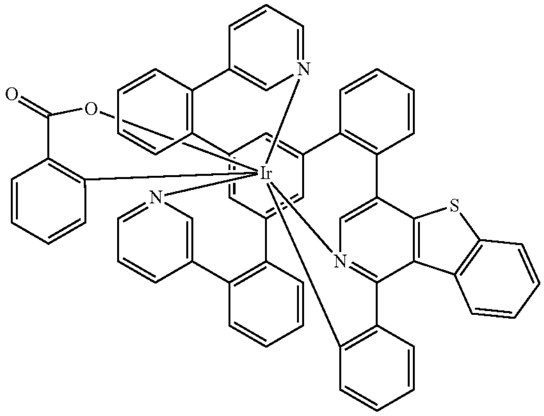
66
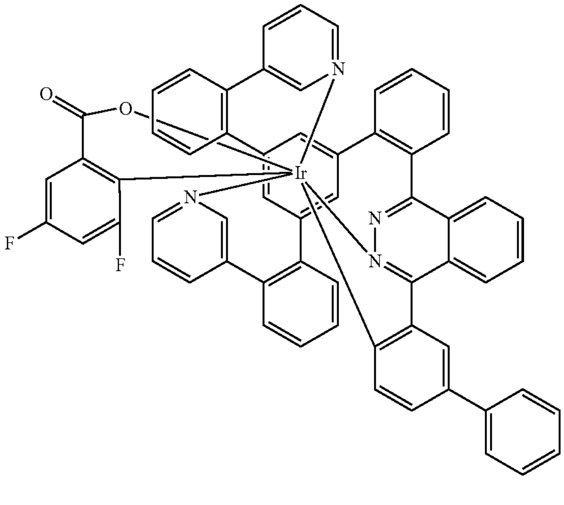
-continued
67
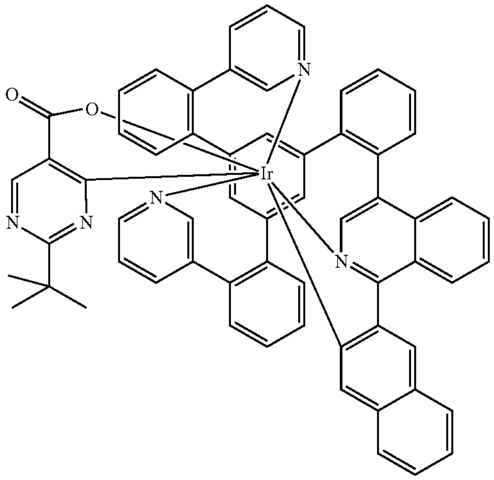
68
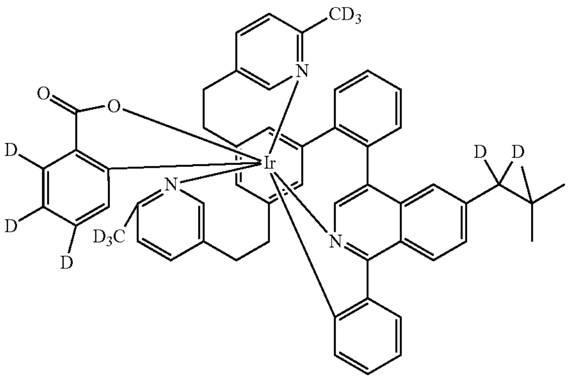
69
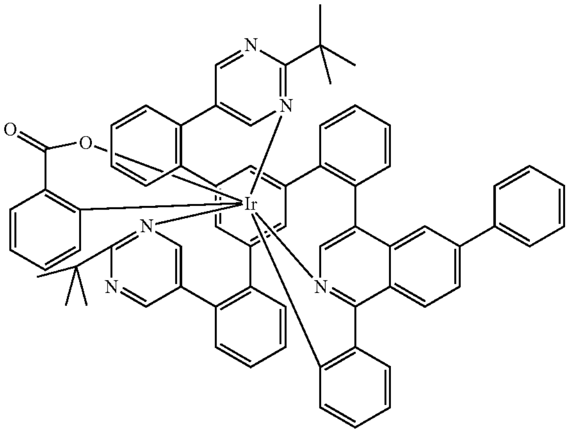

-continued
79
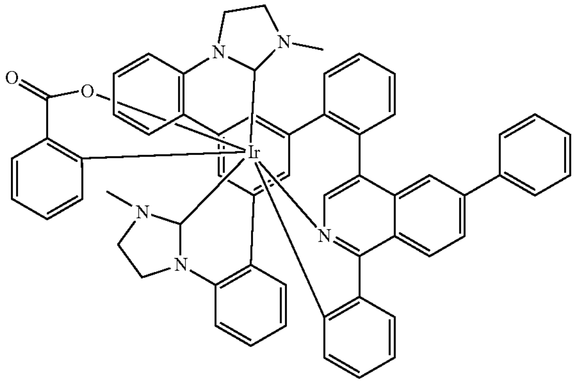
71
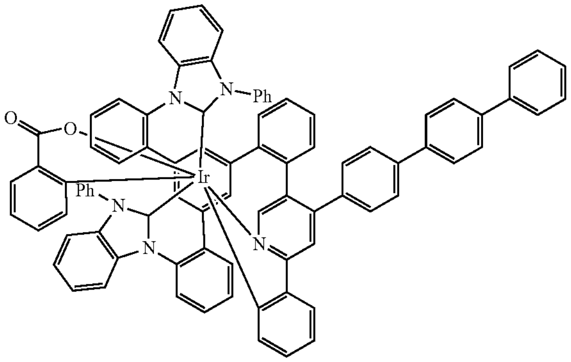
72
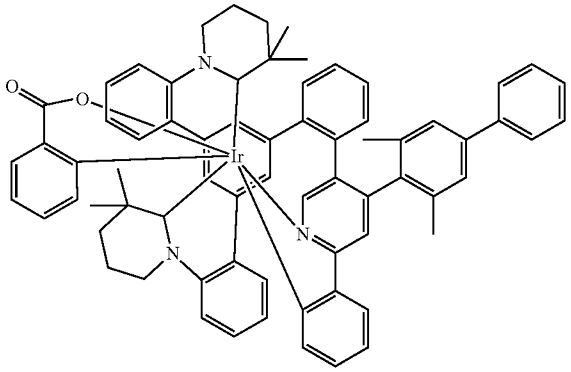
73
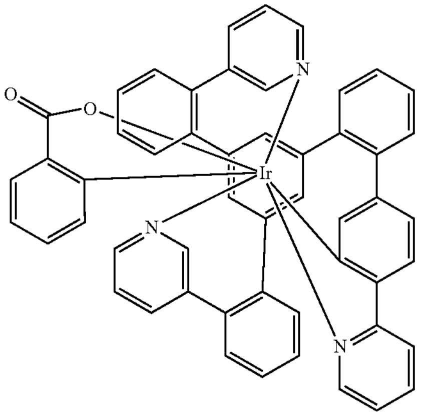
-continued
74
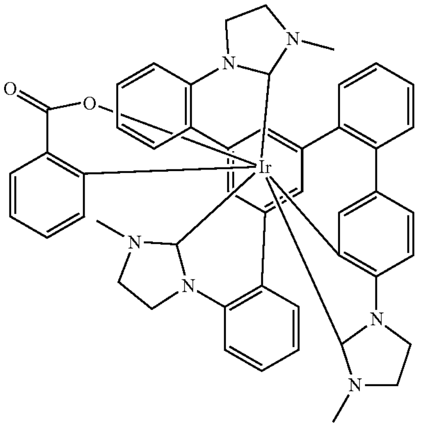
75
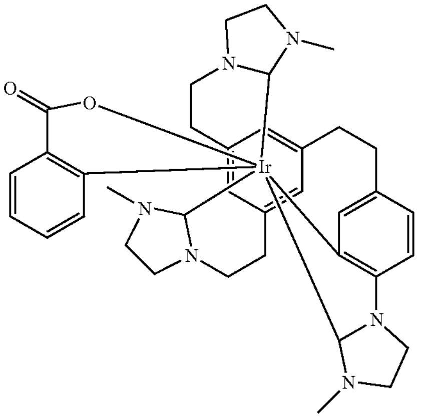
76
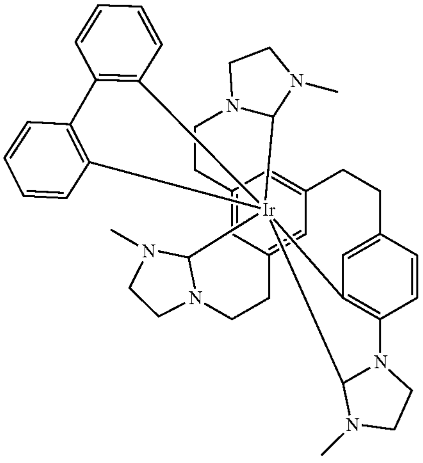

-continued

77

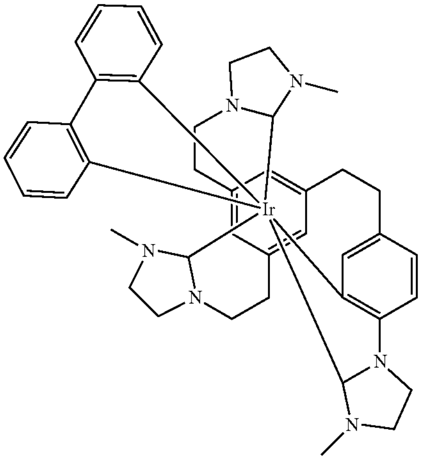

78

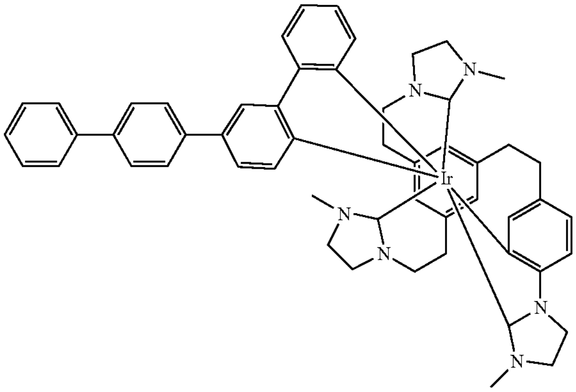

79

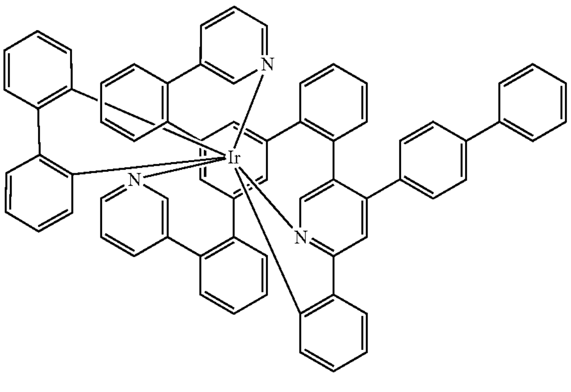

-continued

80

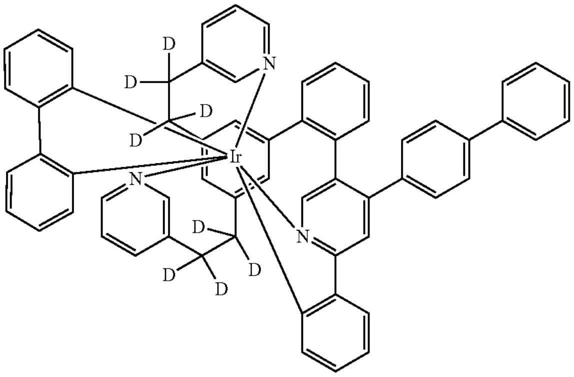

81

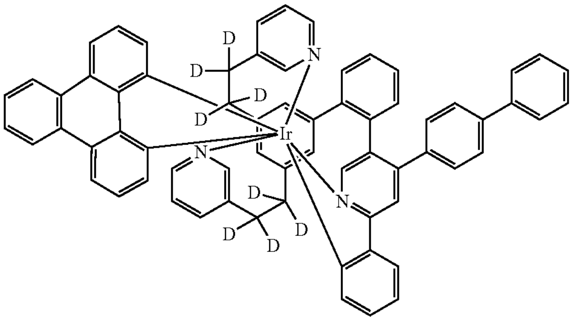

82

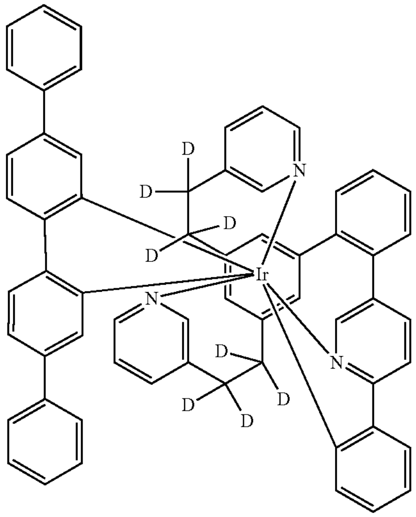

The compounds of the invention are preparable in principle by various processes. In general, for this purpose, an iridium compound is reacted in a first step with the appropriate free tetradentate ligand. The intermediate thus obtained is then reacted with the monodentate ligands or the bidentate ligand to give the product. This is shown below using the example of a simple tetradentate ligand with a monoanionic subligand $L^1$ and two uncharged subligands $L^2$ and $L^3$ in combination with two monoanionic ligands $L^4$ or one dianionic ligand $L^4$.

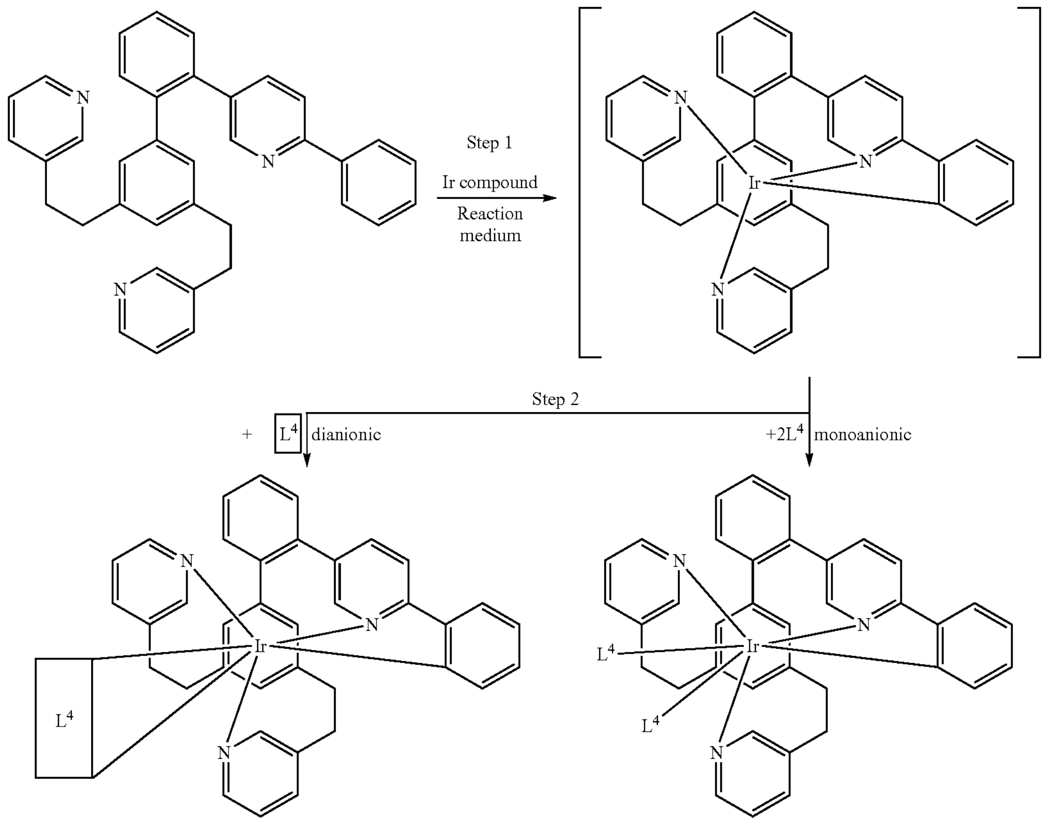

Therefore, the present invention further provides a process for preparing the compounds of the invention by reacting the appropriate free tetradentate ligands with iridium alkoxides of the formula (25), with iridium ketoketonates of the formula (26), with iridium halides of the formula (27), with iridium carboxylates of the formula (28), iridium-olefin-cyclopentadienyl complexes of the formula (29), or with iridium carboxylates of the formula (30):

Formula (25)

$Ir(OR)_3$

Formula (26)

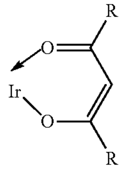

Formula (27)

$IrHal_3$

Formula (28)

$Ir(OOCR)_3$

Formula (29)

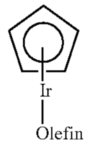

-continued

Formula (30)

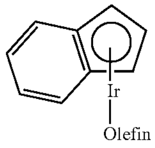

followed by reaction of the intermediate thus obtained with the ligand(s) $L^4$. R here has the definitions given above, Hal=F, Cl, Br or I, and the iridium reactants may also be present as the corresponding hydrates. R is preferably an alkyl group having 1 to 4 carbon atoms. Olefin in formula (29) and (30) is a diolefin, typically 1,5-cyclooctadiene, but also other diolefins such as cyclohexadiene or norbornadiene.

It is likewise possible to use iridium compounds bearing both alkoxide and/or halide and/or hydroxyl and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato)iridium, and $IrCl_3 \cdot xH_2O$ where x is typically a number from 2 to 4.

The synthesis of the complexes is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be ortho-metalated. It is optionally also possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, catechol, resorcinol, etc. Particular preference is given here to the use of hydroquinone.

In addition, the synthesis can preferably be conducted in anhydrous medium in the presence of a carboxylic acid, as described by as yet unpublished application EP19187468.4, wherein the iridium reactant used is preferably an iridium halide, an iridium carboxylate, a COD-iridium(I) compound, an iridium ketoketonate or a compound of one of the abovementioned formulae (25) to (30). Particularly suitable carboxylic acids are selected from the group consisting of acetic acid, propionic acid, pivalic acid, benzoic acid, phenylacetic acid, adipic acid or mixtures thereof. When the iridium reactant used is a hydrate, preference is given to adding a water scavenger, especially a carboxylic anhydride, a carbonyl halide, a trialkyl orthocarboxylate, a carbodiimide, phosphorus pentoxide, thionyl chloride or phosphoryl chloride. When the iridium reactant used is a halide, preference is given to adding a halide scavenger, especially an alkali metal, alkaline earth metal, ammonium or zinc salt of a carboxylic acid.

If ligands having two identical subligands $L^2$ and $L^3$ are used in the ortho-metalation, what is obtained is typically a racemic mixture of the $C_1$-symmetric complexes, i.e. of the $\Delta$ and $\Lambda$ enantiomers. These may be separated by standard methods (chromatography on chiral materials/columns or optical resolution by crystallization).

If ligands having different subligands $L^2$ and $L^3$ are used in the complexation, what is typically obtained is a diastereomer mixture of the complexes which can be separated by standard methods (chromatography, crystallization, etc.).

It is possible by these processes, if necessary followed by purification, for example recrystallization or sublimation, to obtain the inventive compounds of formula (1) in high purity, preferably more than 99% (determined by means of $^1$H NMR and/or HPLC).

The compounds of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (44) to (50) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

For the processing of the iridium complexes of the invention from a liquid phase, for example by spin-coating or by printing methods, formulations of the iridium complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one compound of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The compound of the invention can be used in the electronic device as active component, preferably as emitter in the emissive layer or as hole or electron transport material in a hole- or electron-transporting layer, or as oxygen sensitizers or as photoinitiator or photocatalyst. The present invention thus further provides for the use of a compound of the invention in an electronic device or as oxygen sensitizer or as photoinitiator or photocatalyst. Enantiomerically pure iridium complexes of the invention are suitable as photocatalysts for chiral photoinduced syntheses.

The present invention still further provides an electronic device comprising at least one compound of the invention.

An electronic device is understood to mean any device comprising anode, cathode and at least one layer, said layer comprising at least one organic or organometallic compound. The electronic device of the invention thus comprises anode, cathode and at least one layer containing at least one iridium complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one compound of the invention in at least one layer. Compounds that emit in the infrared are suitable for use in organic infrared electroluminescent devices and infrared sensors. Particular preference is given to organic electroluminescent devices. Active components are generally the organic or inorganic materials introduced between the anode and cathode, for example charge injection, charge transport or charge blocker materials, but especially emission materials and matrix materials. The compounds of the invention exhibit particularly good properties as emission material in organic electroluminescent devices. A preferred embodiment of the invention is therefore organic electroluminescent devices. In addition, the compounds of the invention can be used for production of singlet oxygen or in photocatalysis.

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. In this case, it is possible that one or more hole transport layers are p-doped, for example with metal oxides such as $MoO_3$ or $WO_3$, or with (per)fluorinated electron-deficient aromatics or with electron-deficient cyano-substituted heteroaromatics (for example according to JP 4747558, JP 2006-135145, US 2006/0289882, WO 2012/095143), or with quinoid systems (for example according to EP1336208) or with Lewis acids, or with boranes (for example according to US 2003/0006411, WO 2002/051850, WO 2015/049030) or with carboxylates of the elements of main group 3, 4 or 5 (WO 2015/018539), and/or that one or more electron transport layers are n-doped.

It is likewise possible for interlayers to be introduced between two emitting layers, which have, for example, an exciton-blocking function and/or control charge balance in the electroluminescent device and/or generate charges (charge generation layer, for example in layer systems having two or more emitting layers, for example in white-emitting OLED components). However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. A preferred embodiment is tandem OLEDs. White-emitting organic electroluminescent devices may be used for lighting applications or else with color filters for full-color displays.

In a preferred embodiment of the invention, the organic electroluminescent device comprises the iridium complex of the invention as emitting compound in one or more emitting layers.

When the iridium complex of the invention is used as emitting compound in an emitting layer, it is preferably used in combination with one or more matrix materials. The mixture of the iridium complex of the invention and the matrix material contains between 0.1% and 99% by volume, preferably between 1% and 90% by volume, more preferably between 3% and 40% by volume and especially between 5% and 15% by volume of the iridium complex of the invention, based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

Suitable matrix materials for the compounds of the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, bridged carbazole derivatives, for example according to US 2009/0136779, WO 2010/050778, WO 2011/042107 or WO 2011/088877, biscarbazole derivatives, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015, dibenzothiophene derivatives or triphenylene derivatives.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579.

Preferred biscarbazoles that can be used as matrix materials for the compounds of the invention are the structures of the following formulae (31) and (32):

Formula (31)

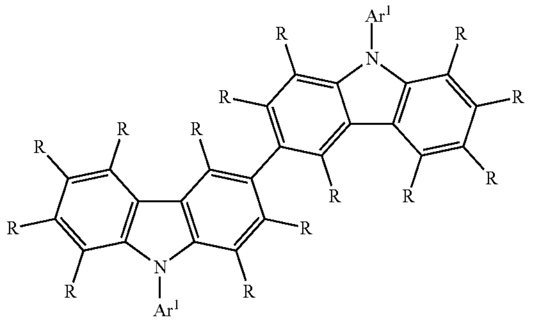

Formula (32)

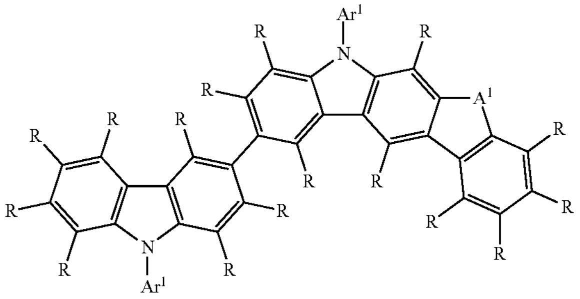

where $Ar^1$ is the same or different and is an aromatic or heteroaromatic ring system which has 5 to 40 aromatic ring atoms, preferably 6 to 30 aromatic ring atoms, and may be substituted in each case by one or more R radicals, $A^1$ is NR, $CR_2$, O or S, and R has the definitions given above. In a preferred embodiment of the invention, $A^1$ is $CR_2$.

Preferred embodiments of the compounds of the formulae (31) and (32) are the compounds of the following formulae (31a) and (32a):

Formula (31a)

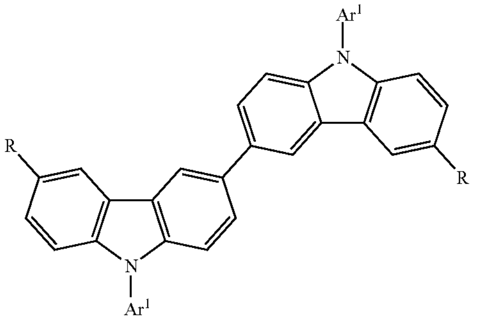

-continued

Formula (32a)

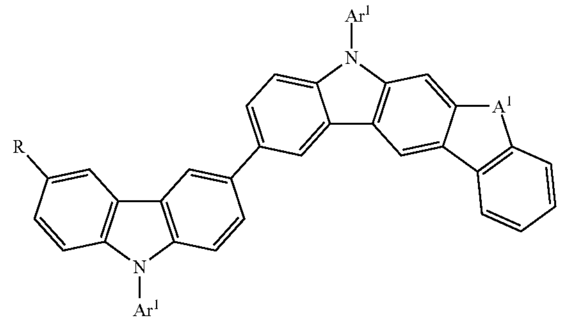

where the symbols used have the definitions given above.

Examples of suitable compounds of formulae (31) and (32) are the compounds depicted below:

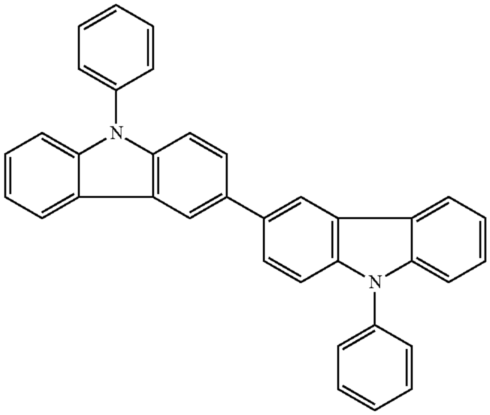

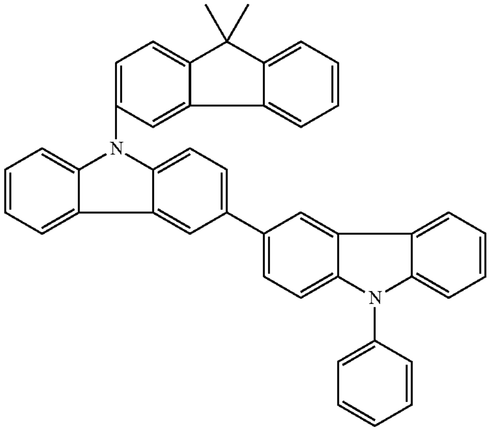

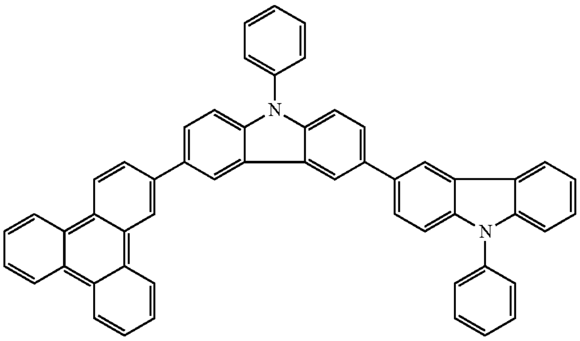

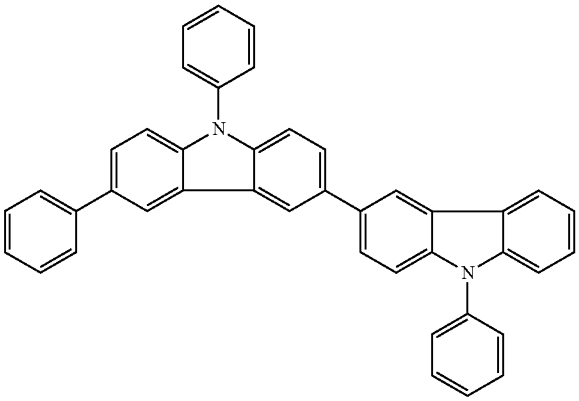
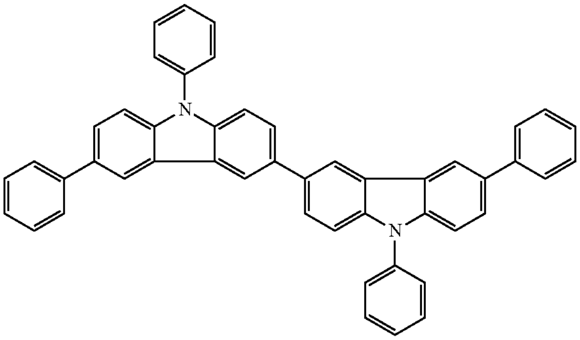
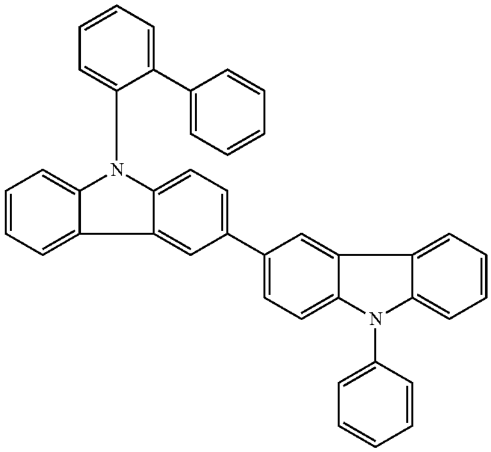
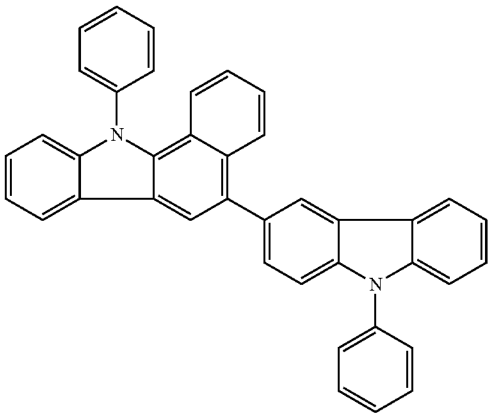
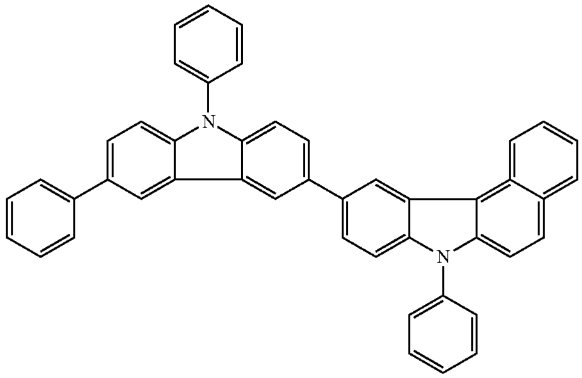
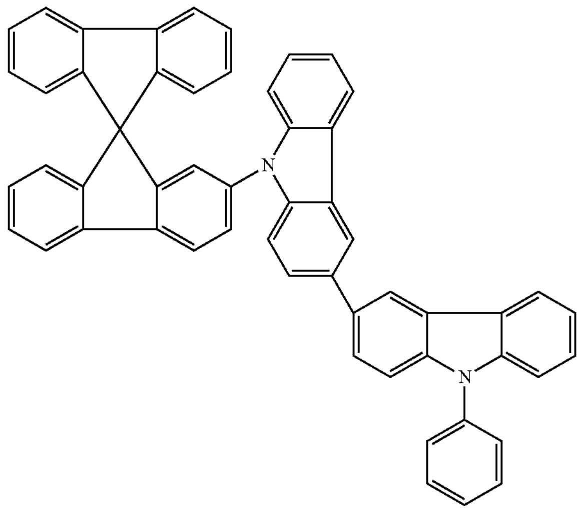
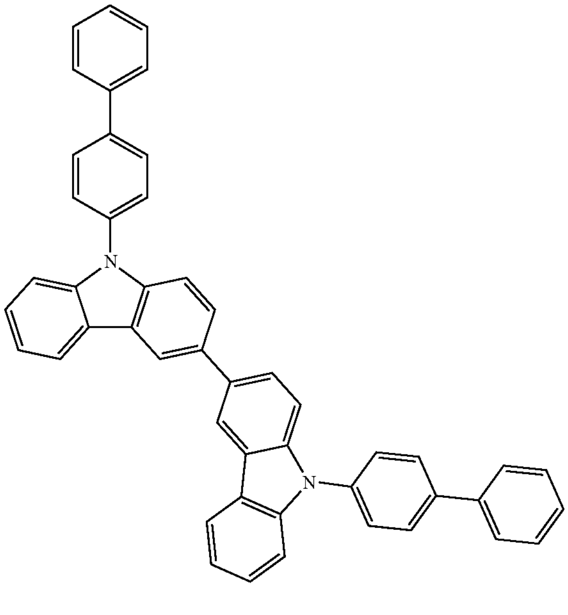

-continued
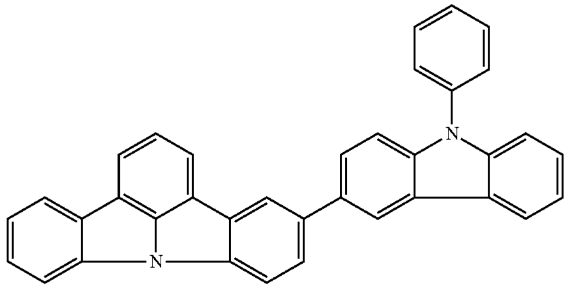
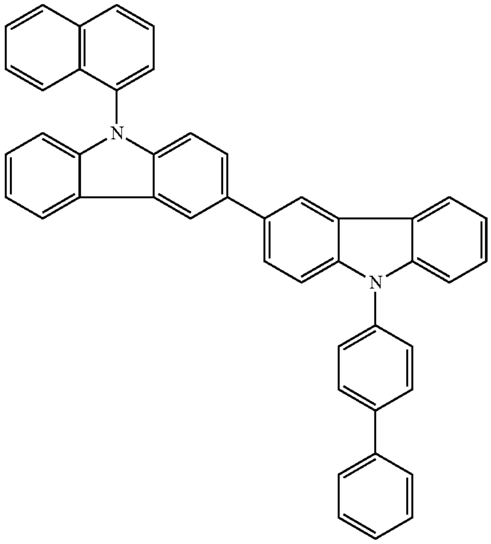
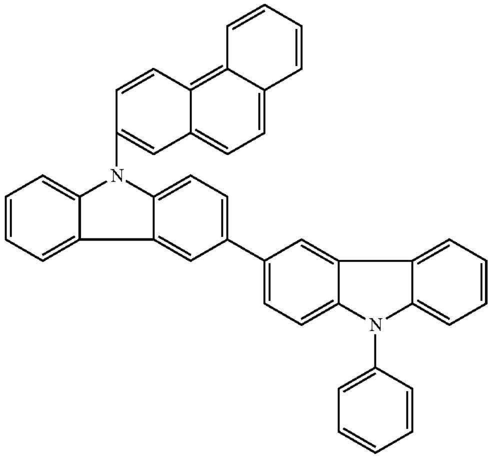
-continued
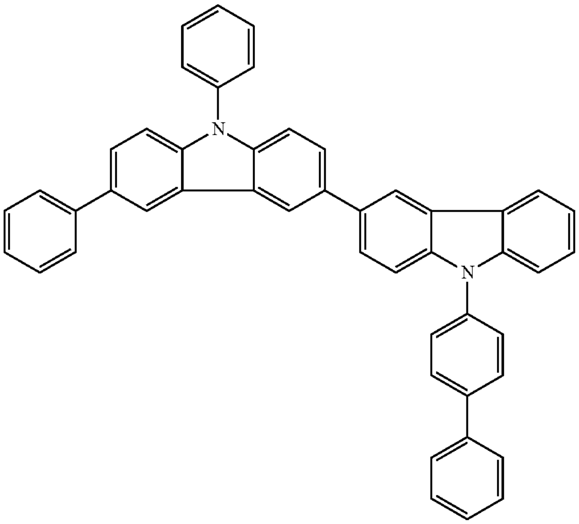
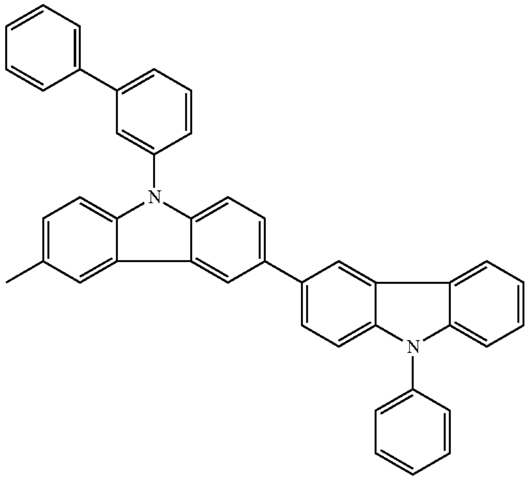
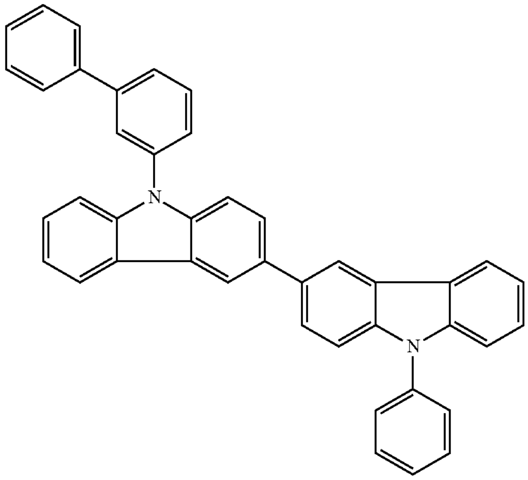

-continued
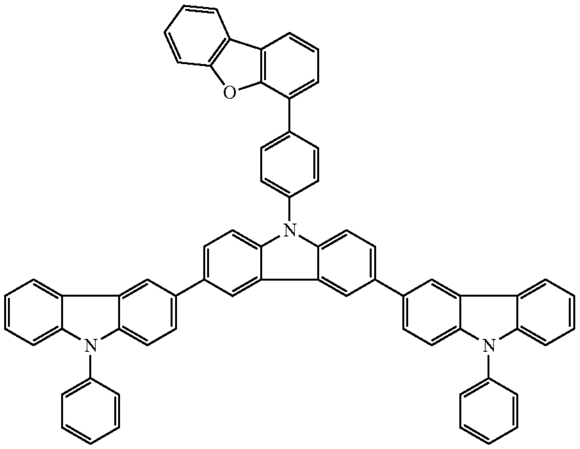
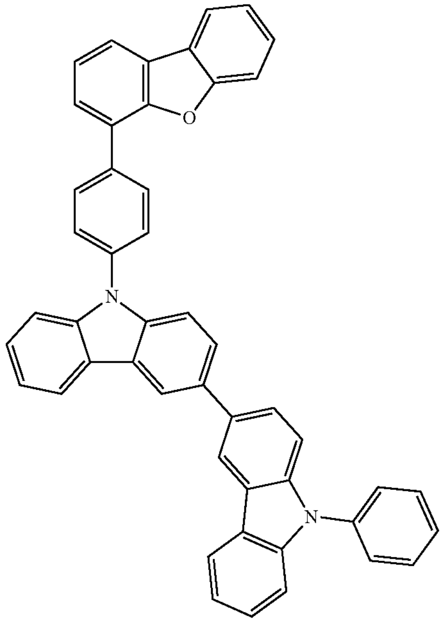
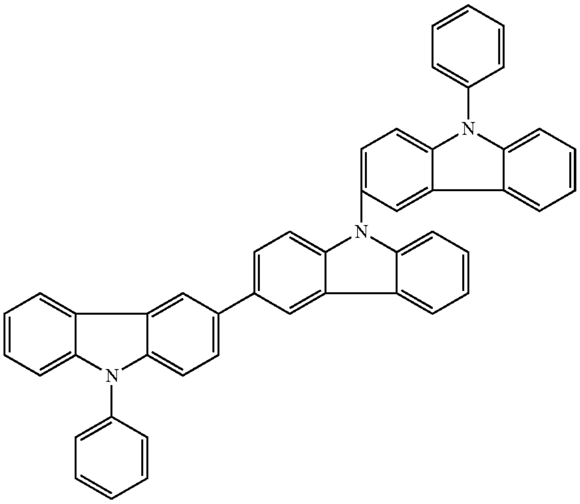
-continued
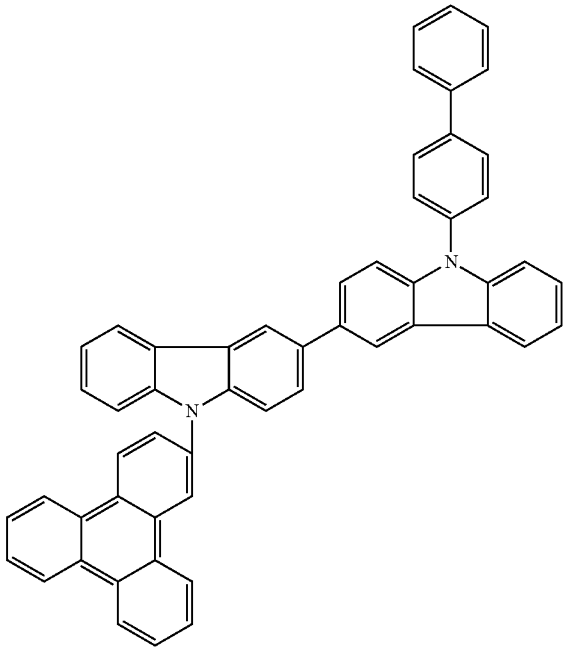
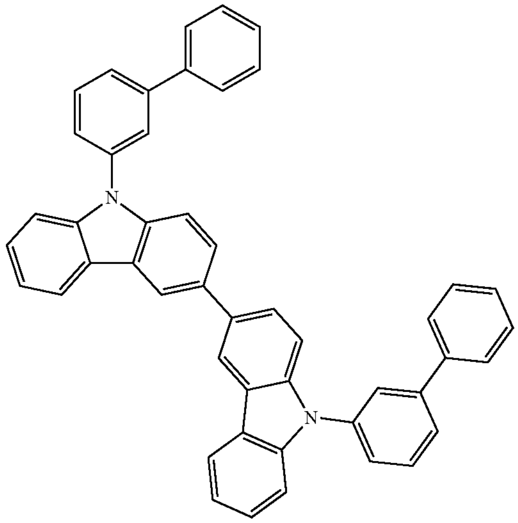
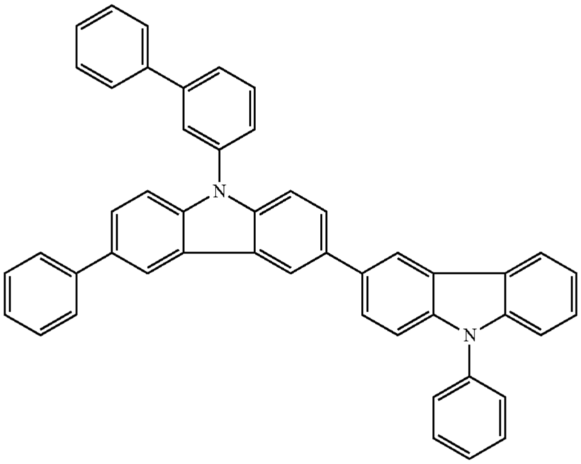

-continued
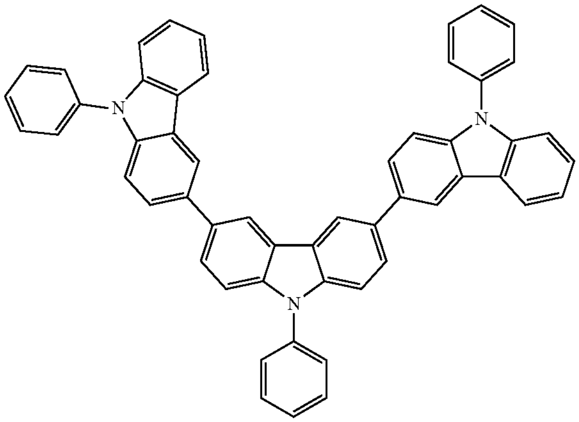
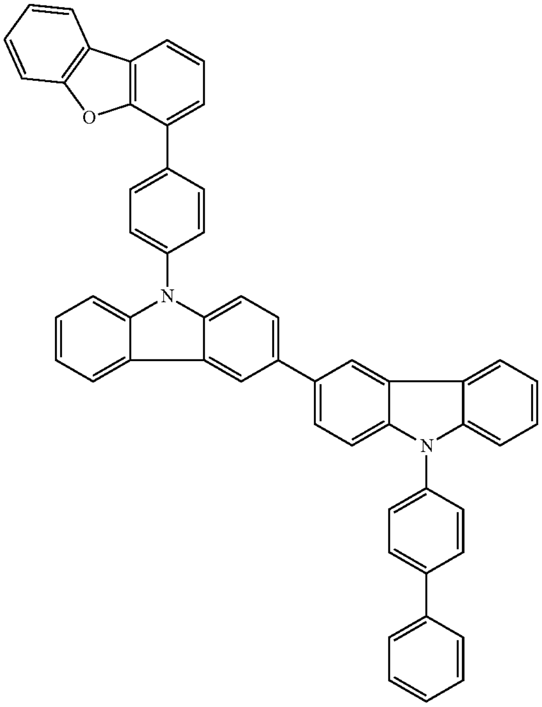
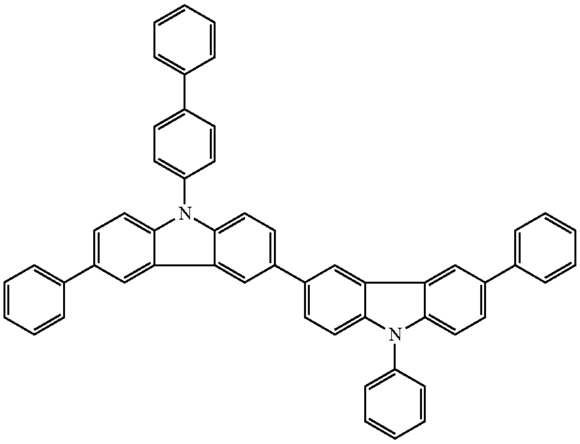
-continued
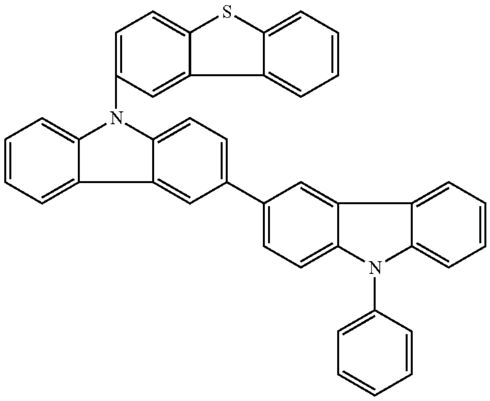
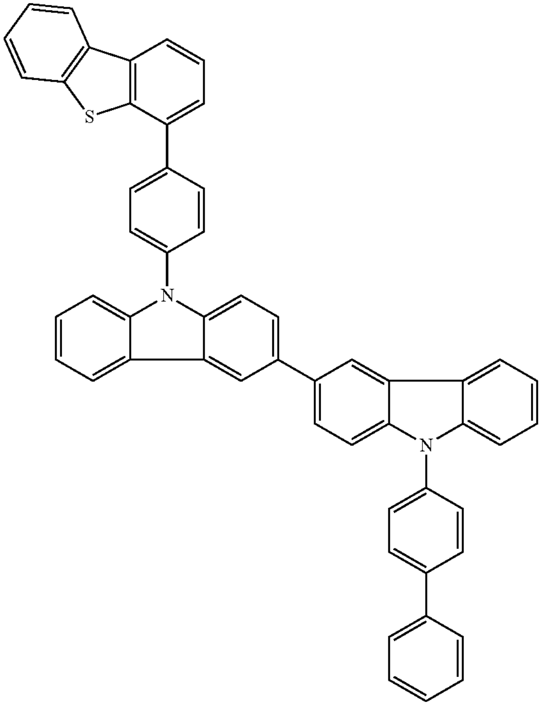
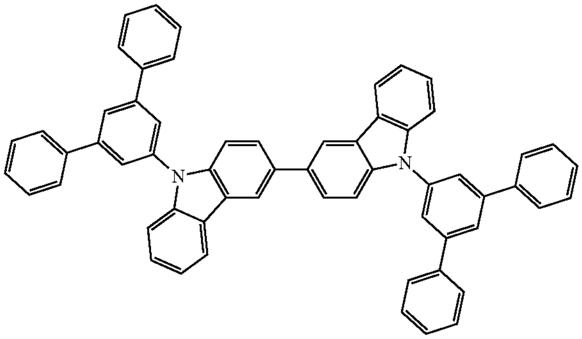

-continued

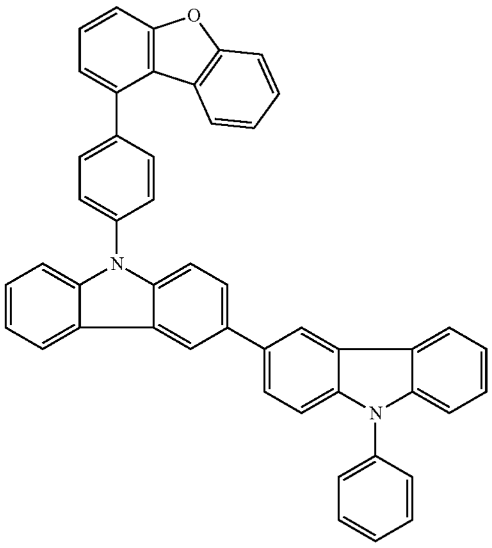

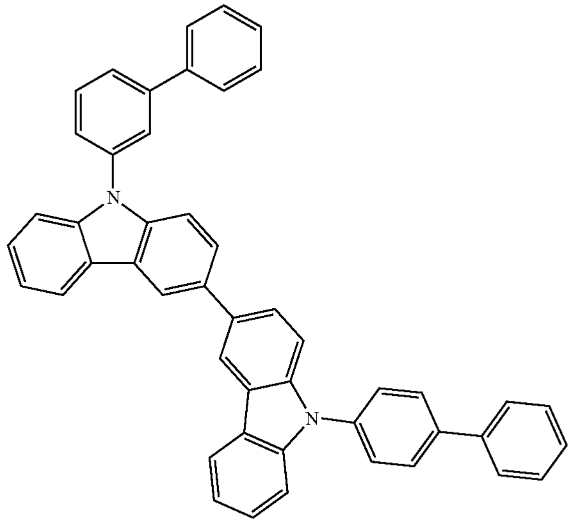

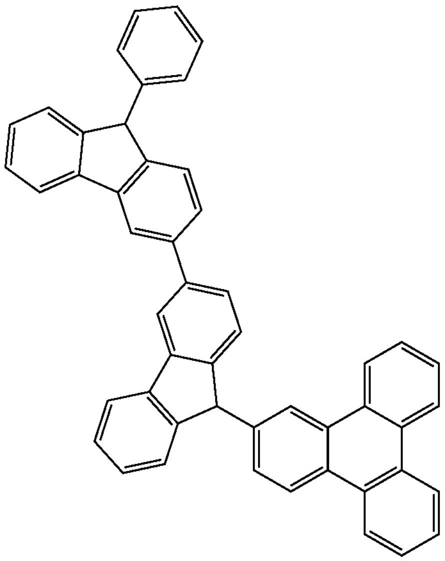

-continued

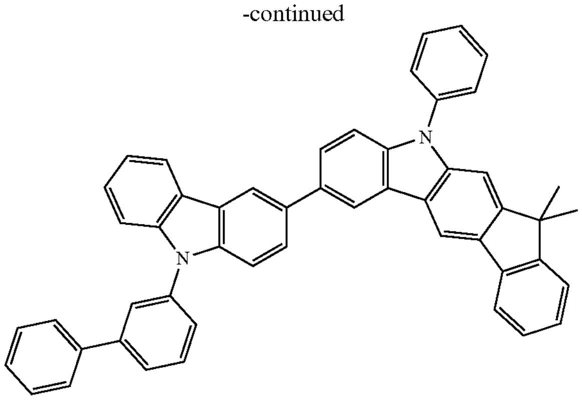

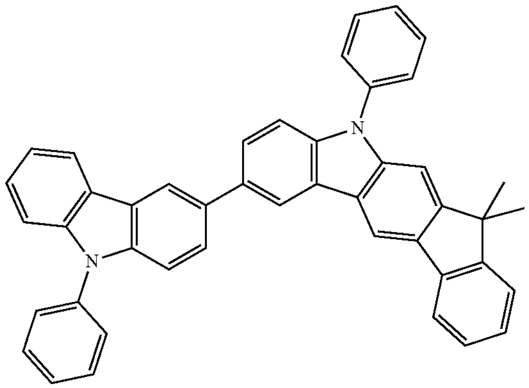 [SMILES: CC1(C)c2ccccc2-c2cc3c4cc(-c5ccc6c(c5)c5ccccc5n6-c5ccccc5)ccc4n(-c4ccccc4)c3cc21]

Preferred dibenzofuran derivatives are the compounds of the following formula (33):

Formula (33)

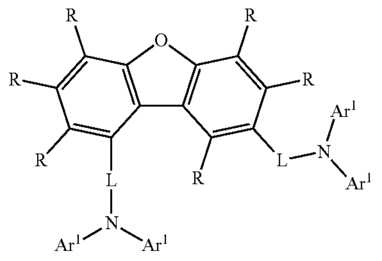

where the oxygen may also be replaced by sulfur so as to form a dibenzothiophene, L is a single bond or an aromatic or heteroaromatic ring system which has 5 to 30 aromatic ring atoms and may also be substituted by one or more R radicals, and R and $Ar^1$ have the definitions given above. It is also possible here for the two $Ar^1$ groups that bind to the same nitrogen atom, or for one $Ar^1$ group and one L group that bind to the same nitrogen atom, to be bonded to one another, for example to give a carbazole.

Preferred carbazoleamines are the structures of the following formulae (34), (35) and (36):

Formula (34)

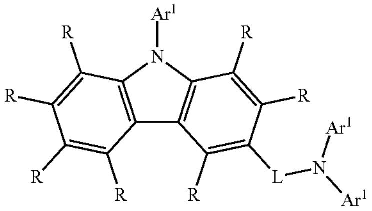

Formula (35)

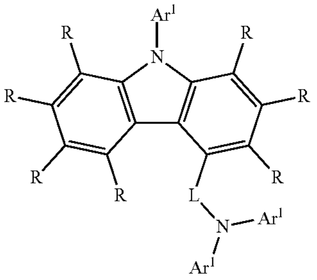

Formula (36)

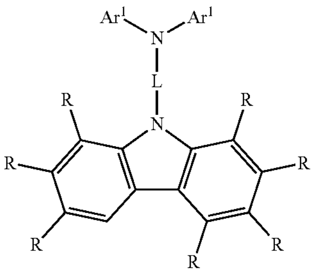

where L is an aromatic or heteroaromatic ring system which has 5 to 30 aromatic ring atoms and may be substituted by one or more R radicals, and R and $Ar^1$ have the definitions given above.

Preferred triazine, quinazoline or pyrimidine derivatives that can be used as a mixture together with the compounds of the invention are the compounds of the following formulae (37), (38) and (39):

Formula (37)

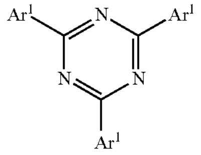

Formula (38)

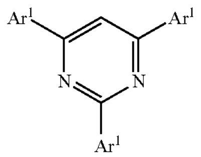

Formula (39)

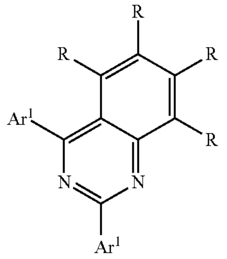

where $Ar^1$ and R have the definitions given above.

Particular preference is given to the triazine derivatives of the formula (37) and the quinazoline derivatives of the formula (39), especially the triazine derivatives of the formula (37).

In a preferred embodiment of the invention, $Ar^1$ in the formulae (37), (38) and (39) is the same or different at each instance and is an aromatic or heteroaromatic ring system which has 6 to 30 aromatic ring atoms, especially 6 to 24 aromatic ring atoms, and may be substituted by one or more R radicals. Suitable aromatic or heteroaromatic ring systems $Ar^1$ here are the same as set out above as embodiments for $Ar^1$, $Ar^2$ and $Ar^3$, especially the structures Ar-1 to Ar-76.

Examples of suitable triazine compounds that may be used as matrix materials together with the compounds of the invention are the compounds depicted in the following table:

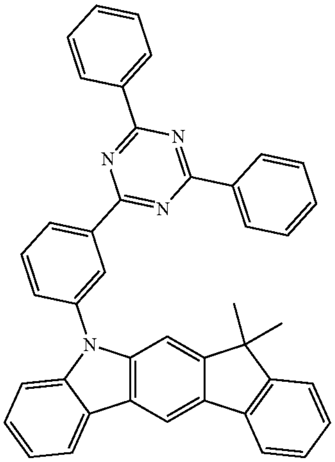 [SMILES: CC1(C)c2ccccc2-c2cc3c4ccccc4n(-c4cccc(-c5nc(-c6ccccc6)nc(-c6ccccc6)n5)c4)c3cc21]

-continued
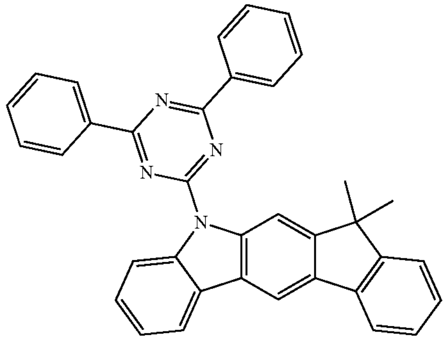 [SMILES: CC1(C)c2ccccc2-c2cc3c4ccccc4n(-c4nc(-c5ccccc5)nc(-c5ccccc5)n4)c3cc21]
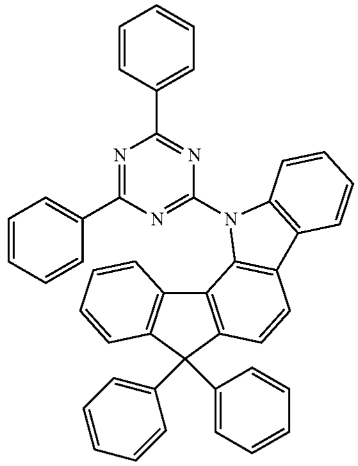 [SMILES: c1ccc(-c2nc(-c3ccccc3)nc(-n3c4ccccc4c4ccc5c(c43)-c3ccccc3C5(c3ccccc3)c3ccccc3)n2)cc1]
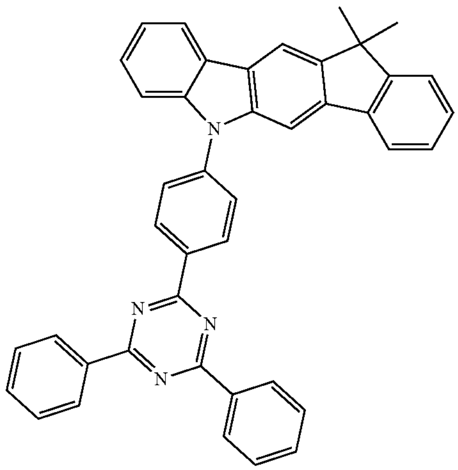 [SMILES: CC1(C)c2ccccc2-c2cc3c(cc21)c1ccccc1n3-c1ccc(-c2nc(-c3ccccc3)nc(-c3ccccc3)n2)cc1]

-continued
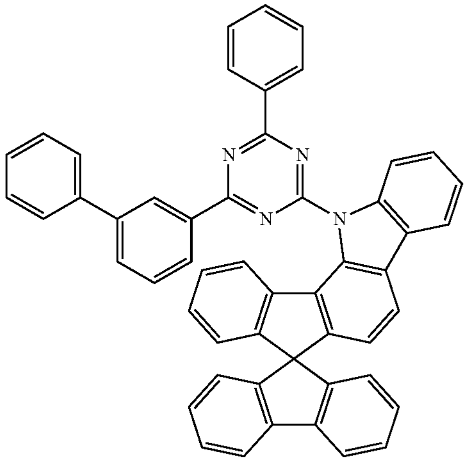 [SMILES: c1ccc(-c2cccc(-c3nc(-c4ccccc4)nc(-n4c5ccccc5c5ccc6c(c54)-c4ccccc4C64c5ccccc5-c5ccccc54)n3)c2)cc1]
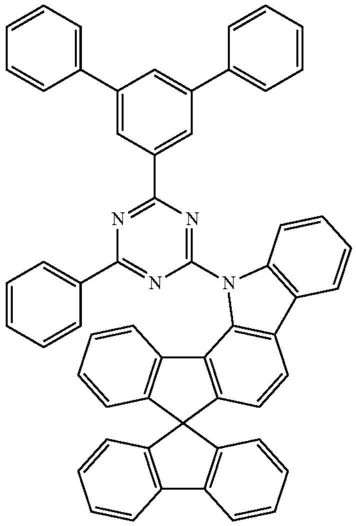 [SMILES: c1ccc(-c2cc(-c3ccccc3)cc(-c3nc(-c4ccccc4)nc(-n4c5ccccc5c5ccc6c(c54)-c4ccccc4C64c5ccccc5-c5ccccc54)n3)c2)cc1]
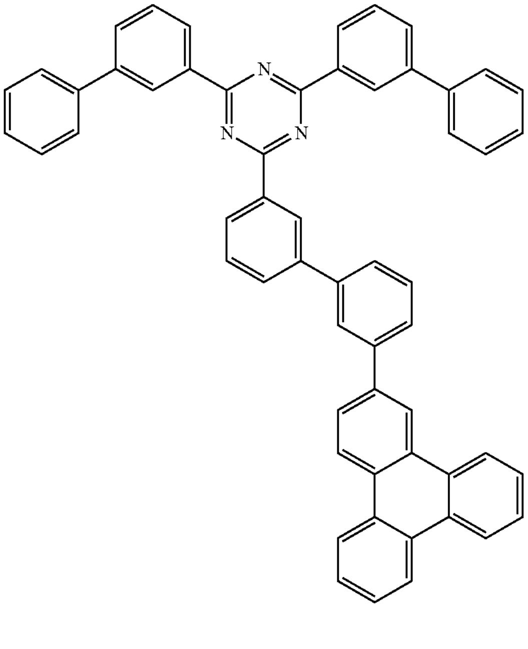 [SMILES: c1ccc(-c2cccc(-c3nc(-c4cccc(-c5ccccc5)c4)nc(-c4cccc(-c5cccc(-c6ccc7c8ccccc8c8ccccc8c7c6)c5)c4)n3)c2)cc1]

-continued
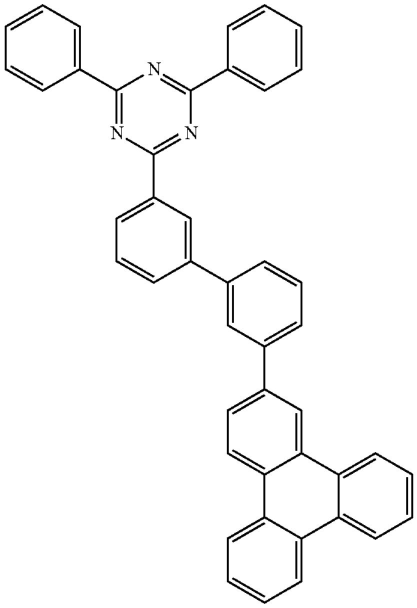 [SMILES: c1ccc(-c2nc(-c3ccccc3)nc(-c3cccc(-c4cccc(-c5ccc6c7ccccc7c7ccccc7c6c5)c4)c3)n2)cc1]
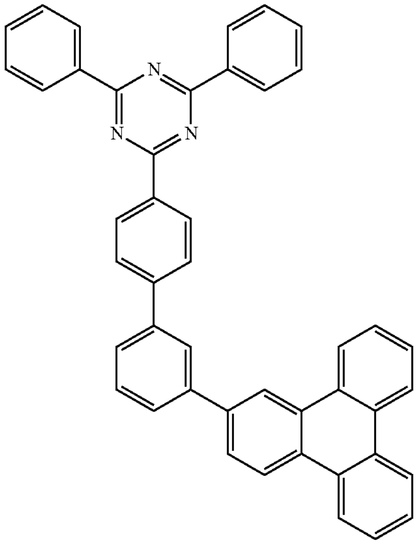 [SMILES: c1ccc(-c2nc(-c3ccccc3)nc(-c3ccc(-c4cccc(-c5ccc6c7ccccc7c7ccccc7c6c5)c4)cc3)n2)cc1]
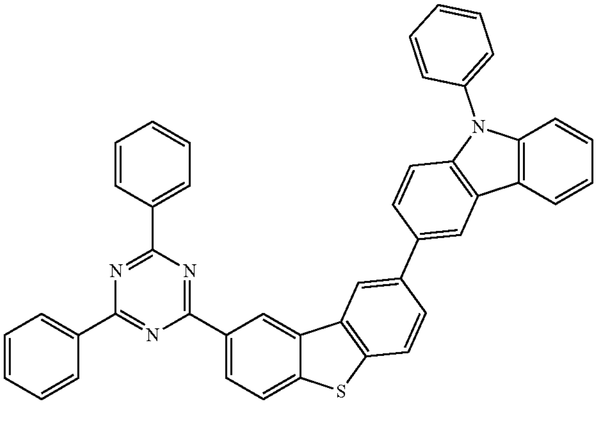 [SMILES: c1ccc(-c2nc(-c3ccccc3)nc(-c3ccc4sc5ccc(-c6ccc7c(c6)c6ccccc6n7-c6ccccc6)cc5c4c3)n2)cc1]

-continued
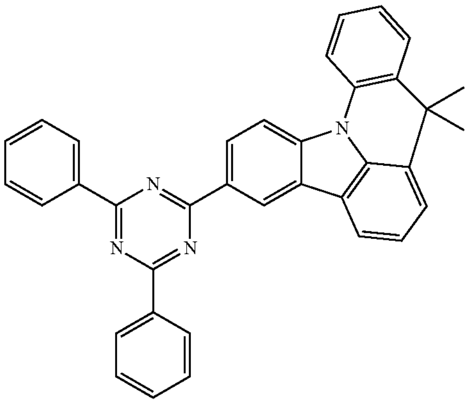 [SMILES: CC1(C)c2ccccc2-n2c3ccc(-c4nc(-c5ccccc5)nc(-c5ccccc5)n4)cc3c3cccc1c32]
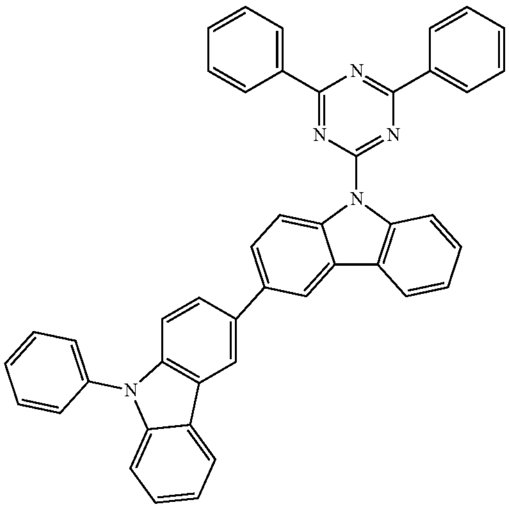 [SMILES: c1ccc(-c2nc(-c3ccccc3)nc(-n3c4ccccc4c4cc(-c5ccc6c(c5)c5ccccc5n6-c5ccccc5)ccc43)n2)cc1]
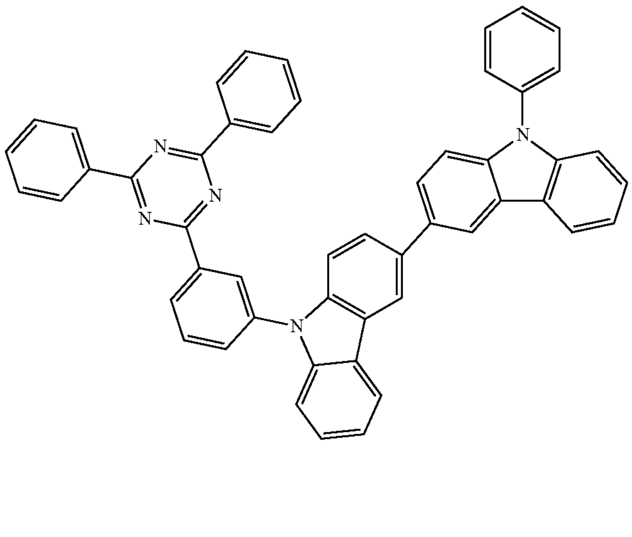 [SMILES: c1ccc(-c2nc(-c3ccccc3)nc(-c3cccc(-n4c5ccccc5c5cc(-c6ccc7c(c6)c6ccccc6n7-c6ccccc6)ccc54)c3)n2)cc1]

-continued
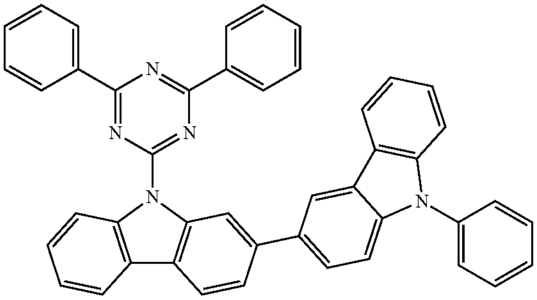 [SMILES: c1ccc(-c2nc(-c3ccccc3)nc(-n3c4ccccc4c4ccc(-c5ccc6c(c5)c5ccccc5n6-c5ccccc5)cc43)n2)cc1]
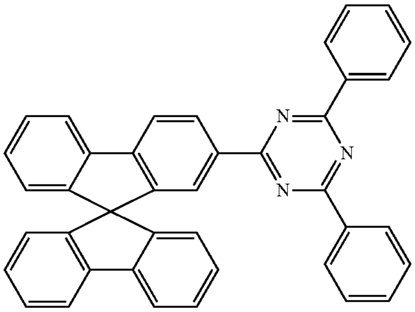 [SMILES: c1ccc(-c2nc(-c3ccccc3)nc(-c3ccc4c(c3)C3(c5ccccc5-c5ccccc53)c3ccccc3-4)n2)cc1]
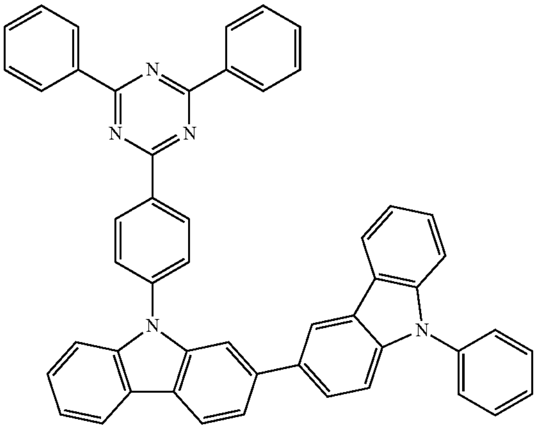 [SMILES: c1ccc(-c2nc(-c3ccccc3)nc(-c3ccc(-n4c5ccccc5c5ccc(-c6ccc7c(c6)c6ccccc6n7-c6ccccc6)cc54)cc3)n2)cc1]
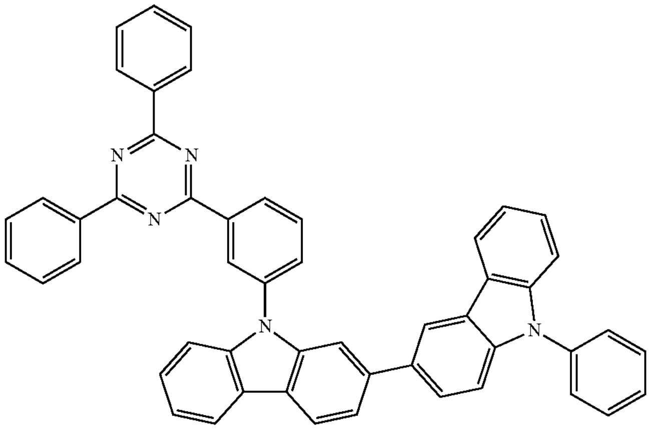 [SMILES: c1ccc(-c2nc(-c3ccccc3)nc(-c3cccc(-n4c5ccccc5c5ccc(-c6ccc7c(c6)c6ccccc6n7-c6ccccc6)cc54)c3)n2)cc1]

-continued
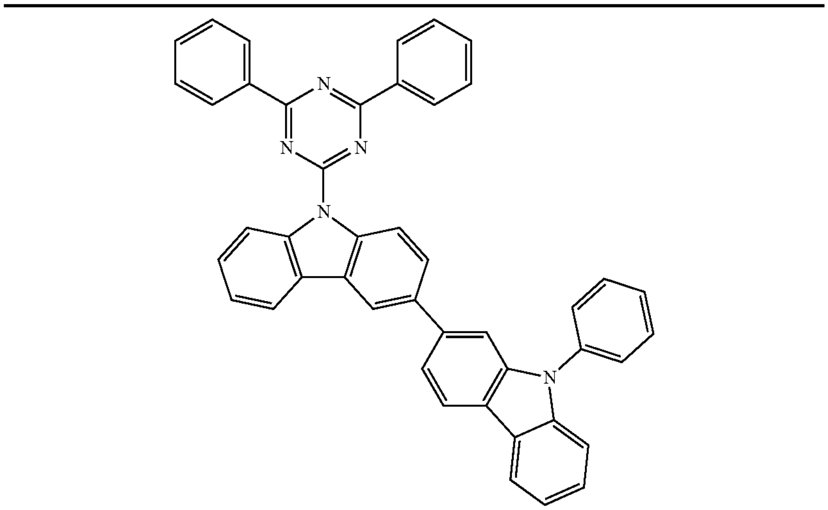
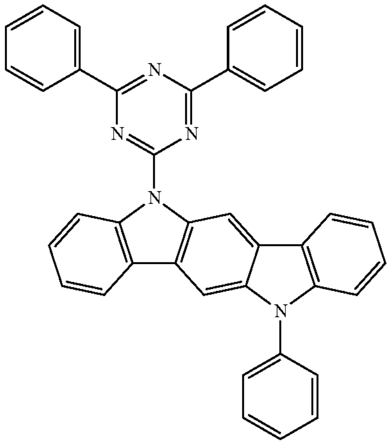 [SMILES: c1ccc(-c2nc(-c3ccccc3)nc(-n3c4ccccc4c4cc5c(cc43)c3ccccc3n5-c3ccccc3)n2)cc1]
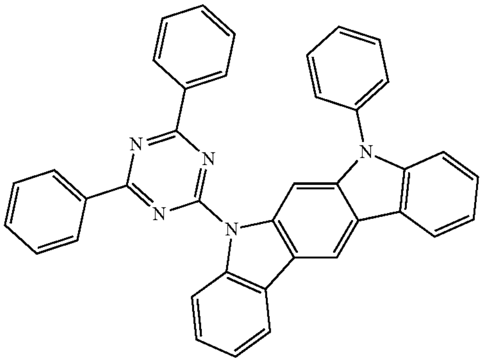 [SMILES: c1ccc(-c2nc(-c3ccccc3)nc(-n3c4ccccc4c4cc5c6ccccc6n(-c6ccccc6)c5cc43)n2)cc1]
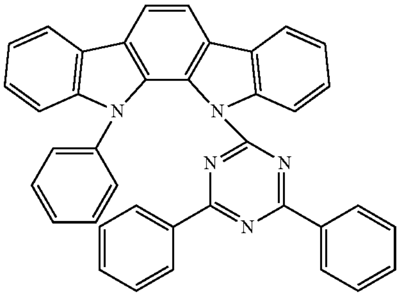 [SMILES: c1ccc(-c2nc(-c3ccccc3)nc(-n3c4ccccc4c4ccc5c6ccccc6n(-c6ccccc6)c5c43)n2)cc1]

-continued
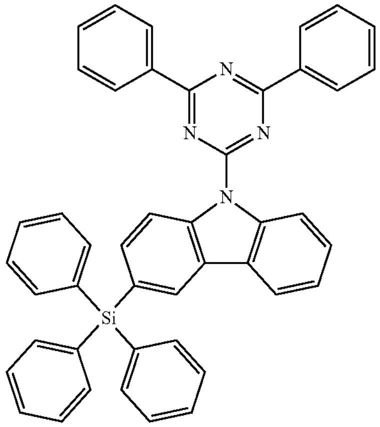 [SMILES: c1ccc(-c2nc(-c3ccccc3)nc(-n3c4ccccc4c4cc([Si](c5ccccc5)(c5ccccc5)c5ccccc5)ccc43)n2)cc1]
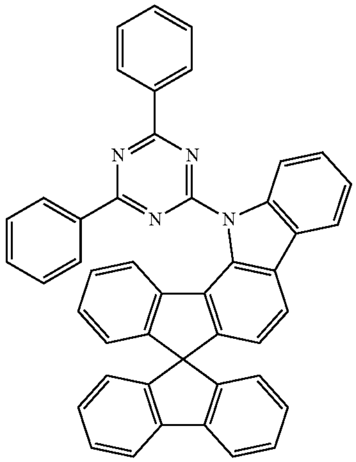 [SMILES: c1ccc(-c2nc(-c3ccccc3)nc(-n3c4ccccc4c4ccc5c(c43)-c3ccccc3C53c4ccccc4-c4ccccc43)n2)cc1]
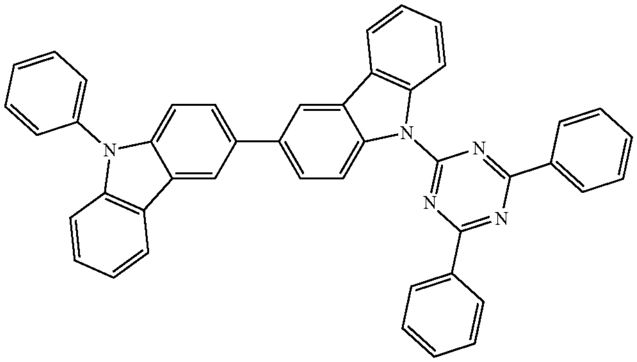 [SMILES: c1ccc(-c2nc(-c3ccccc3)nc(-n3c4ccccc4c4cc(-c5ccc6c(c5)c5ccccc5n6-c5ccccc5)ccc43)n2)cc1]

-continued
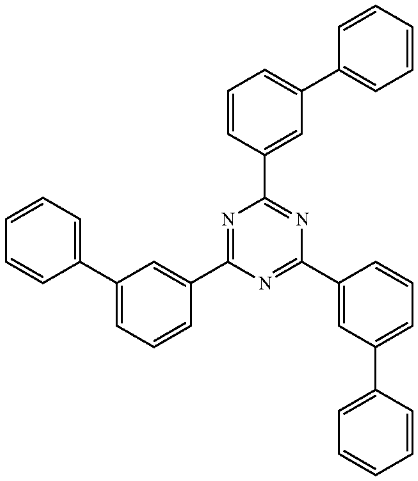 [SMILES: c1ccc(-c2cccc(-c3nc(-c4cccc(-c5ccccc5)c4)nc(-c4cccc(-c5ccccc5)c4)n3)c2)cc1]
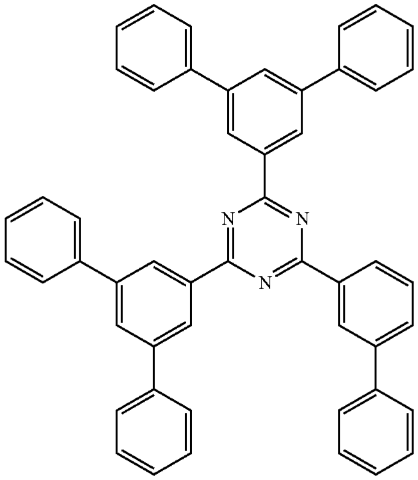 [SMILES: c1ccc(-c2cccc(-c3nc(-c4cc(-c5ccccc5)cc(-c5ccccc5)c4)nc(-c4cc(-c5ccccc5)cc(-c5ccccc5)c4)n3)c2)cc1]
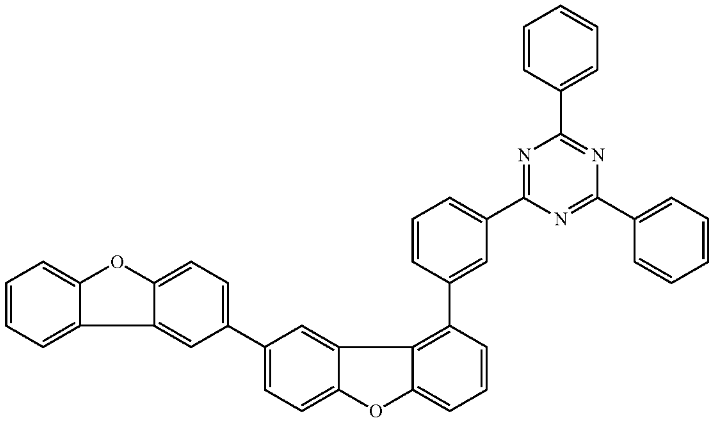 [SMILES: c1ccc(-c2nc(-c3ccccc3)nc(-c3cccc(-c4cccc5oc6ccc(-c7ccc8oc9ccccc9c8c7)cc6c45)c3)n2)cc1]

-continued
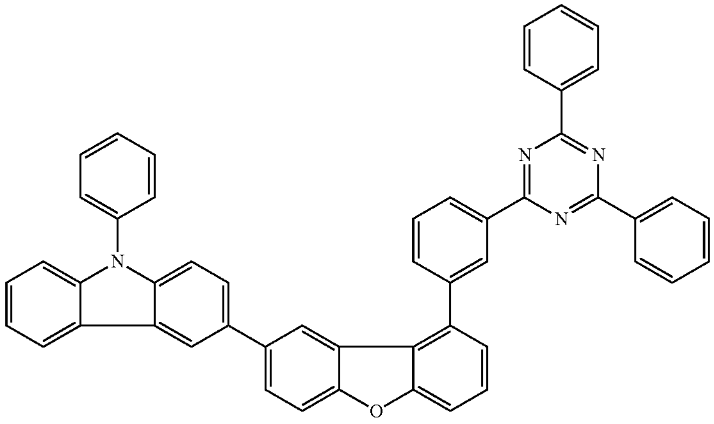 [SMILES: c1ccc(-c2nc(-c3ccccc3)nc(-c3cccc(-c4cccc5oc6ccc(-c7ccc8c(c7)c7ccccc7n8-c7ccccc7)cc6c45)c3)n2)cc1]
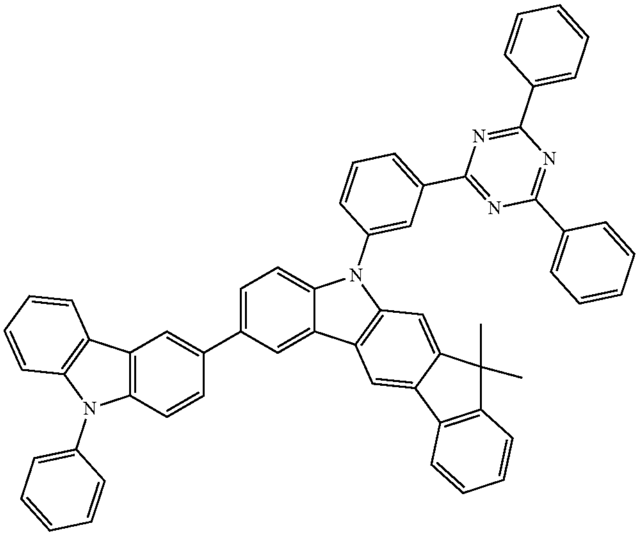 [SMILES: CC1(C)c2ccccc2-c2cc3c4cc(-c5ccc6c(c5)c5ccccc5n6-c5ccccc5)ccc4n(-c4cccc(-c5nc(-c6ccccc6)nc(-c6ccccc6)n5)c4)c3cc21]
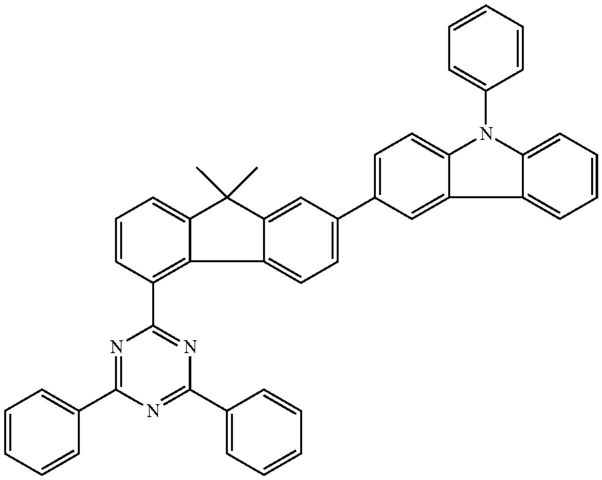 [SMILES: CC1(C)c2cc(-c3ccc4c(c3)c3ccccc3n4-c3ccccc3)ccc2-c2c(-c3nc(-c4ccccc4)nc(-c4ccccc4)n3)cccc21]

-continued
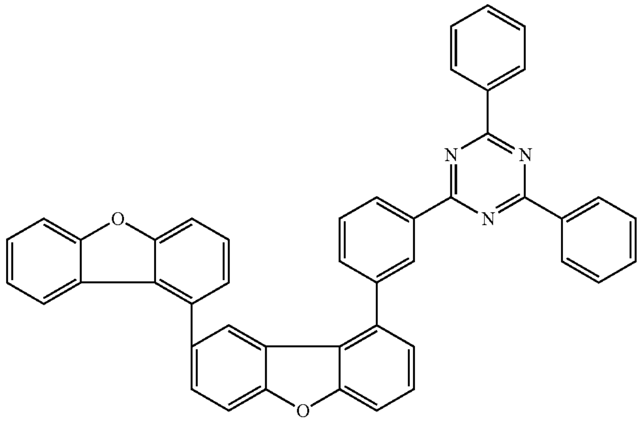 [SMILES: c1ccc(-c2nc(-c3ccccc3)nc(-c3cccc(-c4cccc5oc6ccc(-c7cccc8oc9ccccc9c78)cc6c45)c3)n2)cc1]
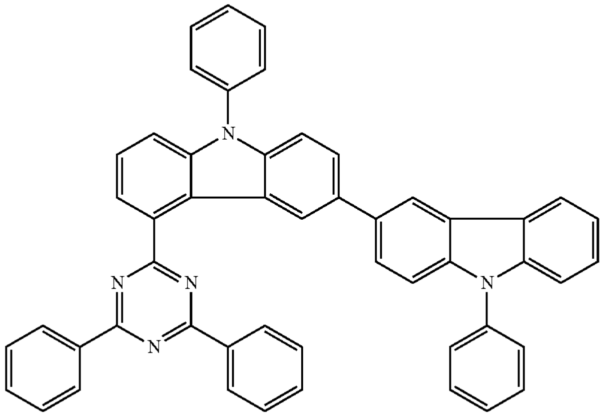 [SMILES: c1ccc(-c2nc(-c3ccccc3)nc(-c3cccc4c3c3cc(-c5ccc6c(c5)c5ccccc5n6-c5ccccc5)ccc3n4-c3ccccc3)n2)cc1]
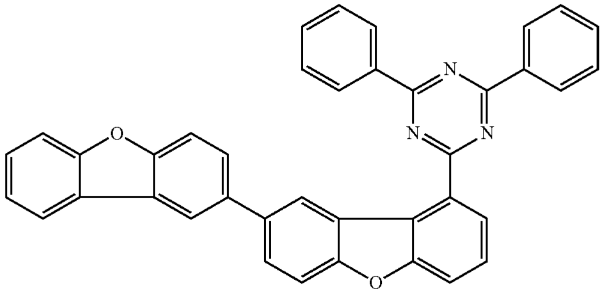 [SMILES: c1ccc(-c2nc(-c3ccccc3)nc(-c3cccc4oc5ccc(-c6ccc7oc8ccccc8c7c6)cc5c34)n2)cc1]
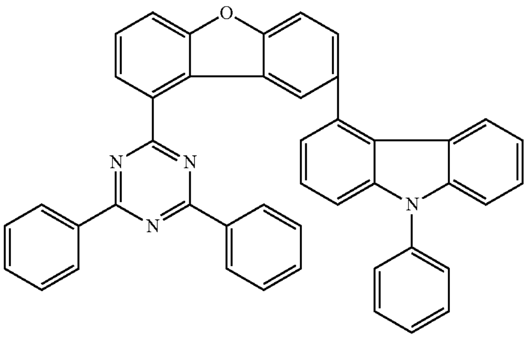 [SMILES: c1ccc(-c2nc(-c3ccccc3)nc(-c3cccc4oc5ccc(-c6cccc7c6c6ccccc6n7-c6ccccc6)cc5c34)n2)cc1]

-continued
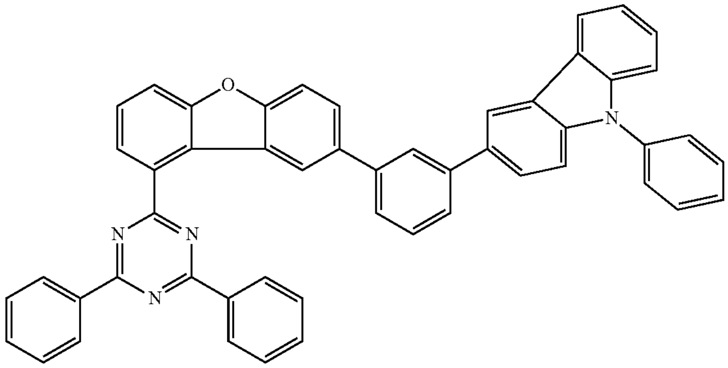 [SMILES: c1ccc(-c2nc(-c3ccccc3)nc(-c3cccc4oc5ccc(-c6cccc(-c7ccc8c(c7)c7ccccc7n8-c7ccccc7)c6)cc5c34)n2)cc1]
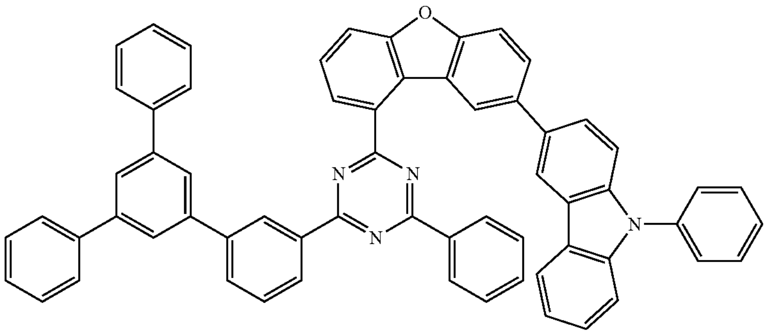 [SMILES: c1ccc(-c2cc(-c3ccccc3)cc(-c3cccc(-c4nc(-c5ccccc5)nc(-c5cccc6oc7ccc(-c8ccc9c(c8)c8ccccc8n9-c8ccccc8)cc7c56)n4)c3)c2)cc1]
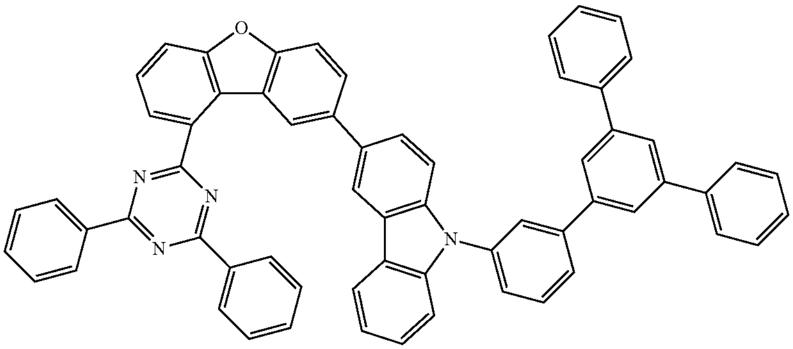 [SMILES: c1ccc(-c2cc(-c3ccccc3)cc(-c3cccc(-n4c5ccccc5c5cc(-c6ccc7oc8cccc(-c9nc(-c%10ccccc%10)nc(-c%10ccccc%10)n9)c8c7c6)ccc54)c3)c2)cc1]
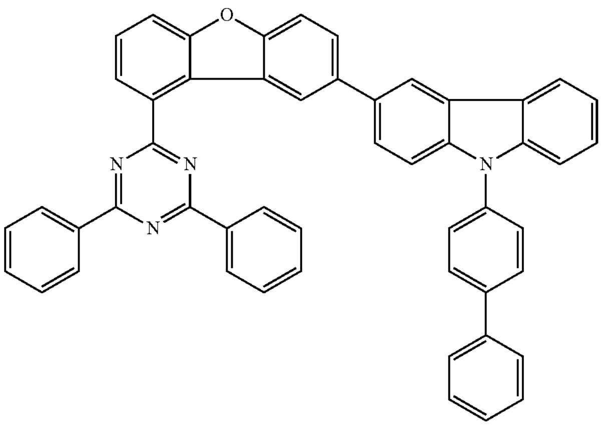 [SMILES: c1ccc(-c2ccc(-n3c4ccccc4c4cc(-c5ccc6oc7cccc(-c8nc(-c9ccccc9)nc(-c9ccccc9)n8)c7c6c5)ccc43)cc2)cc1]

-continued

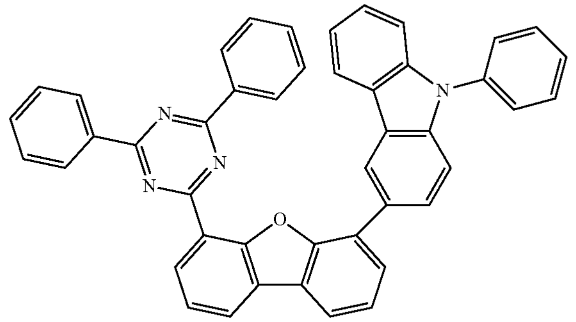 [SMILES: c1ccc(-c2nc(-c3ccccc3)nc(-c3cccc4c3oc3c(-c5ccc6c(c5)c5ccccc5n6-c5ccccc5)cccc34)n2)cc1]

It is further preferable to use a mixture of two or more triplet emitters, especially two or three triplet emitters, together with one or more matrix materials. In this case, the triplet emitter having the shorter-wave emission spectrum serves as co-matrix for the triplet emitter having the longer-wave emission spectrum. For example, the metal complexes of the invention can be combined with a metal complex emitting at shorter wavelength, for example a blue-, green- or yellow-emitting metal complex, as co-matrix. For example, it is also possible to use the metal complexes of the invention as co-matrix for triplet emitters that emit at longer wavelength, for example for red-emitting triplet emitters. In this case, it may also be preferable when both the shorter-wave- and the longer-wave-emitting metal complex is a compound of the invention. A preferred embodiment in the case of use of a mixture of three triplet emitters is when two are used as co-host and one as emitting material. These triplet emitters preferably have the emission colors of green, yellow and red or blue, green and orange.

A preferred mixture in the emitting layer comprises an electron-transporting host material, what is called a "wide bandgap" host material which, owing to its electronic properties, is not involved to a significant degree, if at all, in the charge transport in the layer, a co-dopant which is a triplet emitter which emits at a shorter wavelength than the compound of the invention, and a compound of the invention.

A further preferred mixture in the emitting layer comprises an electron-transporting host material, what is called a "wide bandgap" host material which, owing to its electronic properties, is not involved to a significant degree, if at all, in the charge transport in the layer, a hole-transporting host material, a co-dopant which is a triplet emitter which emits at a shorter wavelength than the compound of the invention, and a compound of the invention.

The compounds of the invention can also be used in other functions in the electronic device, for example as hole transport material in a hole injection or transport layer, as charge generation material, as electron blocker material, as hole blocker material or as electron transport material, for example in an electron transport layer. It is likewise possible to use the compounds of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

Suitable charge transport materials as usable in the hole injection or hole transport layer or electron blocker layer or in the electron transport layer of the organic electroluminescent device of the invention are, for example, the compounds disclosed in Y. Shirota et al., Chem. Rev. 2007, 107(4), 953-1010, or other materials as used in these layers according to the prior art. Preferred hole transport materials which can be used in a hole transport, hole injection or electron blocker layer in the electroluminescent device of the invention are indenofluoreneamine derivatives (for example according to WO 06/122630 or WO 06/100896), the amine derivatives disclosed in EP 1661888, hexaazatriphenylene derivatives (for example according to WO 01/049806), amine derivatives having fused aromatic systems (for example according to U.S. Pat. No. 5,061,569), the amine derivatives disclosed in WO 95/09147, monobenzoindenofluoreneamines (for example according to WO 08/006449), dibenzoindenofluoreneamines (for example according to WO 07/140847), spirobifluoreneamines (for example according to WO 2012/034627, WO 2014/056565), fluoreneamines (for example according to EP 2875092, EP 2875699 and EP 2875004), spirodibenzopyranamines (e.g. EP 2780325) and dihydroacridine derivatives (for example according to WO 2012/150001).

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapor deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapor phase deposition) method or with the aid of a carrier gas sublimation. In this case, the materials are applied at a pressure between $10^{-5}$ mbar and 1 bar. A special case of this method is the OVJP (organic vapor jet printing) method, in which the materials are applied directly by a nozzle and thus structured (for example M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapor deposition. For example, it is possible to apply an emitting layer comprising a metal complex of the invention and a matrix material from solution, and to apply a hole blocker layer and/or an electron transport layer thereto by vapor deposition under reduced pressure.

These methods are known in general terms to those skilled in the art and can be applied by those skilled in the art without difficulty to organic electroluminescent devices comprising compounds of formula (1) or the above-detailed preferred embodiments.

The electronic devices of the invention, especially organic electroluminescent devices, have high efficiency, good lifetime and low operating voltage. In addition, the compounds of the invention are thermally very stable and, in particular, the compounds of the invention that have not too high a molecular weight, especially a molecular weight of about 1200 g/mol, can be sublimed efficiently and without decomposition.

These abovementioned advantages are not accompanied by a deterioration in the further electronic properties.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

DESCRIPTION OF THE FIGURES

FIG. 1 shows the x-ray structure of the inventive complex Ir617, the synthesis of which is described in the examples that follow.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature. In the case of compounds that can display multiple tautomeric, isomeric, enantiomeric or diastereomeric forms, one form is shown in a representative manner.

A: Synthesis of the Synthons S:

Example S1

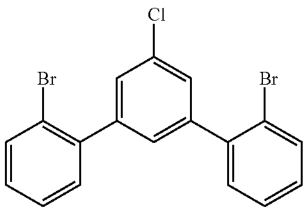 [SMILES: Clc1cc(-c2ccccc2Br)cc(-c2ccccc2Br)c1]

To a mixture of 18.2 g (50 mmol) of 2,2'-(5-chloro-1,3-phenylene)bis[4,4,5,5-tetramethyl-1,3,2-dioxaborolane [1417036-49-7], 28.3 g (100 mmol) of 1-bromo-2-iodobenzene, 31.8 g (300 mmol) of sodium carbonate, 200 ml of toluene, 100 ml of ethanol and 200 ml of water are added, with very good stirring, 788 g (3 mmol) of triphenylphosphine and then 225 mg (1 mmol) of palladium(II) acetate, and the mixture is heated under reflux for 48 h. After cooling, the organic phase is removed and washed once with 300 ml of water and once with 300 ml of saturated sodium chloride solution, and dried over magnesium sulfate. The desiccant is filtered off and the filtrate is concentrated fully under reduced pressure. The residue is flash-chromatographed (Torrent automatic column system from A. Semrau). Yield: 16.5 g (39 mmol), 78%; purity: about 97% by $^{1}H$ NMR.

Example S2

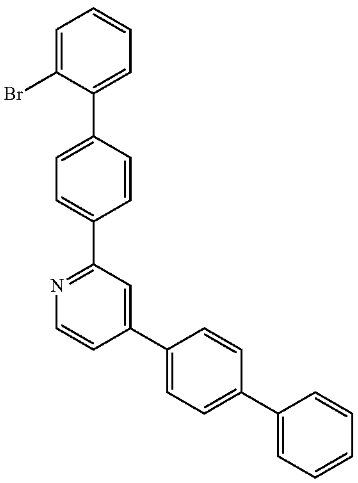 [SMILES: Brc1ccccc1-c1ccc(-c2cc(-c3ccc(-c4ccccc4)cc3)ccn2)cc1]

Stage S2a:

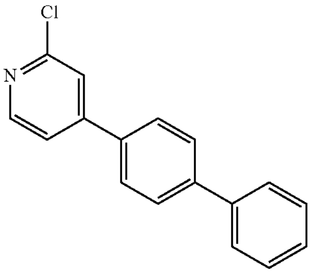 [SMILES: Clc1cc(-c2ccc(-c3ccccc3)cc2)ccn1]

A well-stirred mixture of 23.9 g (100 mmol) of 2-chloro-4-iodopyridine [153034-867], 19.8 g (100 mmol) of biphenylboronic acid [5122-8941], 21.2 g (200 mmol) of sodium carbonate, 1.16 g (1 mmol) of tetrakis(triphenylphosphino) palladium(0), 150 ml of toluene, 50 ml of dioxane and 100 ml of water is heated under reflux for 16 h. After cooling, the precipitated solids are filtered off with suction and washed three times with 100 ml each time of water and twice with 50 ml of methanol, and dried under reduced pressure. The solids are extracted by stirring in 150 ml of hot acetonitrile, filtered off with suction and dried under reduced pressure. Yield: 24.2 g (91 mmol), 91%; purity: about 97% by $^{1}$H NMR.

Stage S2b:

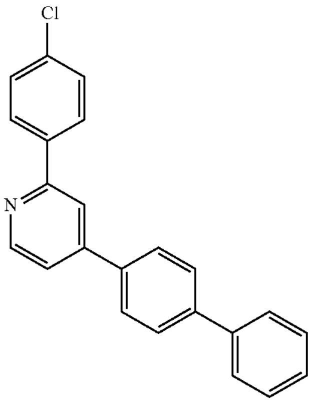 [SMILES: Clc1ccc(-c2cc(-c3ccc(-c4ccccc4)cc3)ccn2)cc1]

A well-stirred mixture of 26.6 g (100 mmol) of S2a, 15.6 g (100 mmol) of 4-chlorophenylboronic acid [1679-18-1], 27.6 g (200 mmol) of potassium carbonate, 702 mg (1 mmol) of bis(triphenylphosphino)palladium(II) chloride, 50 g of glass beads (diameter 3 mmol), 200 ml of acetonitrile and 100 ml of methanol is heated under reflux for 16 h. After cooling, the precipitated solids are filtered off with suction and washed three times with 100 ml each time of water and twice with 50 ml of methanol, and dried under reduced pressure. The solids are dissolved in 500 ml of dichloromethane (DCM) and 100 ml of ethyl acetate (EA) and filtered through a silica gel bed in the form of a DCM slurry. The filtrate is concentrated under reduced pressure. The remaining solids are extracted by stirring with 150 ml of hot ethanol, filtered off with suction and dried under reduced pressure. Yield: 27.3 g (80 mmol), 80%; purity: about 97% by $^{1}$H NMR.

Stage S2c:

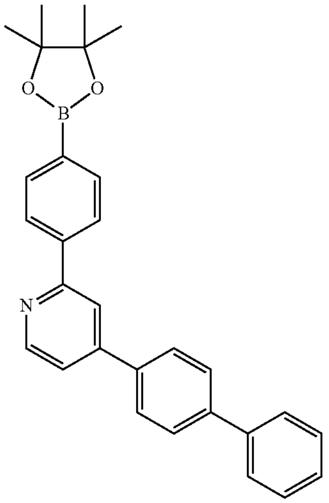 [SMILES: CC1(C)OB(c2ccc(-c3cc(-c4ccc(-c5ccccc5)cc4)ccn3)cc2)OC1(C)C]

To a mixture of 34.2 g (100 mmol) of S2b, 26.7 g (105 mmol) of bis(pinacolato)diborane, 29.4 g (300 mmol) of potassium acetate (anhydrous), 50 g of glass beads (diameter 3 mm) and 500 ml of THF are added, with good stirring, 821 mg (2 mmol) of S-Phos and then 225 mg (1 mmol) of palladium(II) acetate, and the mixture is heated under reflux for 16 h. While the mixture is still hot, the salts and glass beads are removed by suction filtration through a Celite bed in the form of a THF slurry, which is washed through with a little THF, and the filtrate is concentrated to dryness. The residue is taken up in 100 ml of MeOH and stirred in the warm solvent, and the crystallized product is filtered off with suction, washed twice with 30 ml each time of methanol and dried under reduced pressure. Yield: 36.4 g (84 mmol), 84%; purity: about 95% by $^1$H NMR.

Stage S2:

To a well-stirred mixture of 21.3 g (100 mmol) of S2c, 13.6 g (100 mmol) of 1-bromo-2-iodobenzene [583-55-1], 53.0 g (500 mmol) of sodium carbonate, 400 ml of toluene, 200 ml of ethanol and 400 ml of water are added 1.57 g (6 mmol) of triphenylphosphine and then 449 mg (2 mmol) of palladium(II) acetate, and the mixture is heated under reflux for 16 h. After cooling, the organic phase is removed and washed twice with 200 ml each time of water and once with 200 ml of saturated sodium chloride solution, and dried over magnesium sulfate. The filtrate is filtered through a celite bed in the form of a toluene slurry and concentrated to dryness, and the residue is recrystallized from about 50 ml of methanol with addition of a little ethyl acetate. Yield: 37.4 g (83 mmol), 83%; purity: about 95% by $^1$H NMR.

The following compounds can be prepared analogously:

| Ex. | Reactants | Product | Yield |
|---|---|---|---|
| S3 | 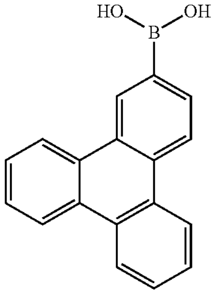 Stage a 654664-63-8 | 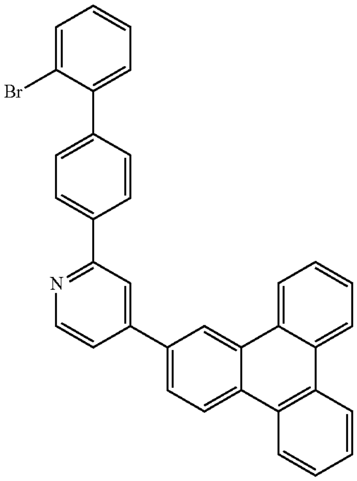 [SMILES: Brc1ccccc1-c1ccc(-c2cc(-c3ccc4c5ccccc5c5ccccc5c4c3)ccn2)cc1] | 54% |
| S4 | 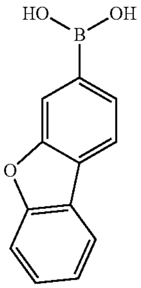 Stage a 395087-89-5 | 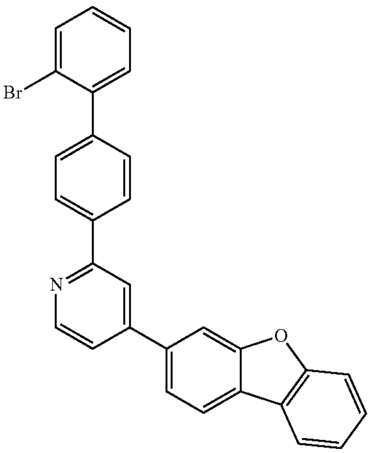 [SMILES: Brc1ccccc1-c1ccc(-c2cc(-c3ccc4c(c3)oc3ccccc34)ccn2)cc1] | 47% |

* over three stages

Example S20

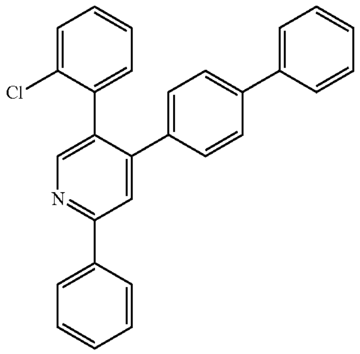

Stage S20a:

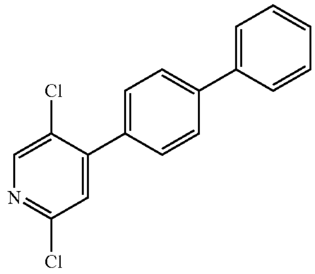 [SMILES: Clc1cc(-c2ccc(-c3ccccc3)cc2)c(Cl)cn1]

A well-stirred mixture of 27.4 g (100 mmol) of 2,5-dichloro-4-iodopyridine [796851-03-1], 19.8 g (100 mmol) of biphenylboronic acid [5122-94-1], 27.6 g (200 mmol) of potassium carbonate, 702 mg (1 mmol) of bis(triphenylphosphino)palladium(II) chloride, 50 g of glass beads (diameter 3 mmol), 150 ml of acetonitrile and 150 ml of methanol is heated under reflux for 16 h. After cooling, the reaction mixture is stirred into 1000 ml of water. The precipitated solids are filtered off with suction, washed three times with 100 ml each time of water and once with 50 ml of methanol, and dried under reduced pressure. Yield: 29.4 g (98 mmol), 98%: purity: about 97% by $^1$H NMR.

Stage S20b:

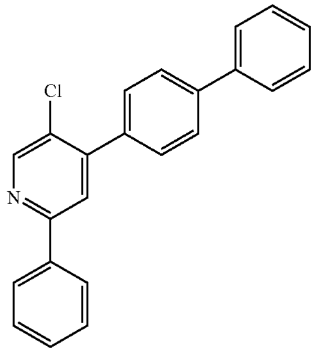 [SMILES: Clc1cnc(-c2ccccc2)cc1-c1ccc(-c2ccccc2)cc1]

Procedure analogous to 20a, except using, rather than biphenylboronic acid [5122-94-1], 12.2 g (100 mmol) of phenylboronic acid [98-80-6]. The crude product is dissolved in 300 ml of DCM and 100 ml of EA, and filtered through a silica gel bed. After the filtrate has been concentrated, the solids are extracted by hot stirring with 70 ml of acetonitrile. Yield: 27.3 g (80 mmol), 80%: purity: about 97% by $^1$H NMR.

Stage S20:

To a well-stirred mixture of 34.2 g (100 mmol) of S20b, 17.2 g (110 mmol) of 2-chlorophenylboronic acid [3900-89-8], 41.5 g (300 mmol) of potassium carbonate, 600 ml of THF and 200 ml of water are added 1.64 g (4 mmol) of S-Phos and 499 mg (2 mmol) of palladium(II) acetate, and then the mixture is heated under gentle reflux for 16 h. After cooling, the organic phase is removed, washed twice with 200 ml each time of saturated sodium chloride solution and concentrated to dryness. The residue is boiled in 100 ml of ethanol for 4 h. After cooling, the solids are filtered off with suction, washed with 50 ml of ethanol and dried. Further purification is effected by recrystallization from about 200 ml of ethyl acetate. Yield: 25.9 g (62 mmol), 62%; purity: about 95% by $^1$H NMR.

The following compounds can be prepared analogously:

| Ex. | Reactants | Product | Yield |
|---|---|---|---|
| S21 | 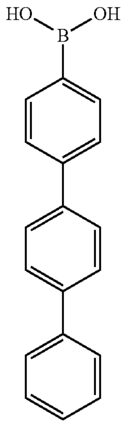 877993-09-4 Stage 20a | 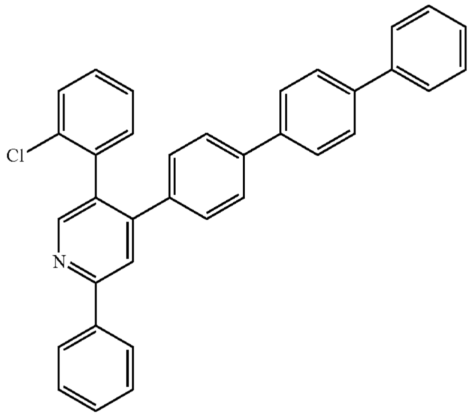 [SMILES: Clc1ccccc1-c1cnc(-c2ccccc2)cc1-c1ccc(-c2ccc(-c3ccccc3)cc2)cc1] | 50% |

-continued
| Ex. | Reactants | Product | Yield |
|---|---|---|---|
| S22 | 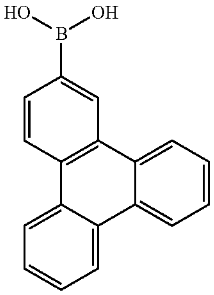 [SMILES: OB(O)c1ccc2c3ccccc3c3ccccc3c2c1] 654664-63-8 Stage 20a | 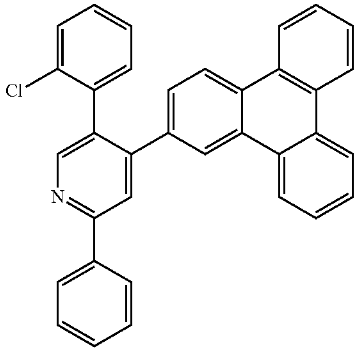 [SMILES: Clc1ccccc1-c1cnc(-c2ccccc2)cc1-c1ccc2c3ccccc3c3ccccc3c2c1] | 54% |
| S23 | 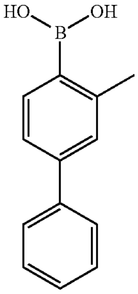 1383628-42-9 Stage 20a | 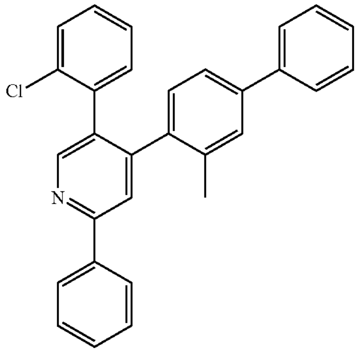 [SMILES: Cc1cc(-c2ccccc2)ccc1-c1cc(-c2ccccc2)ncc1-c1ccccc1Cl] | 46% |
| S24 | 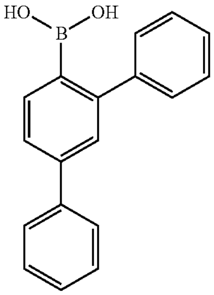 [SMILES: OB(O)c1ccc(-c2ccccc2)cc1-c1ccccc1] 364050-45-3 Stage 20a | 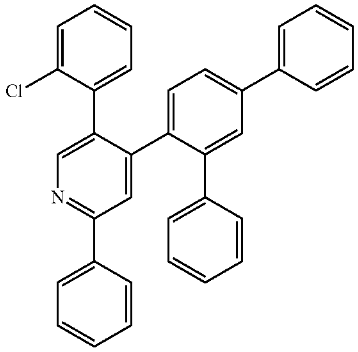 [SMILES: Clc1ccccc1-c1cnc(-c2ccccc2)cc1-c1ccc(-c2ccccc2)cc1-c1ccccc1] | 48% |
| S25 | 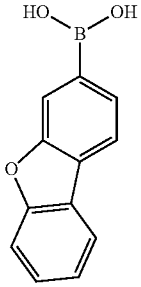 395087-89-5 Stage 20a | 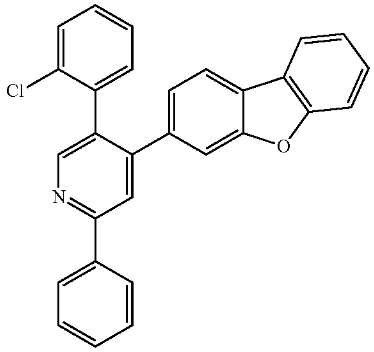 [SMILES: Clc1ccccc1-c1cnc(-c2ccccc2)cc1-c1ccc2c(c1)oc1ccccc12] | 50% |

-continued
| Ex. | Reactants | Product | Yield |
|---|---|---|---|
| S26 | 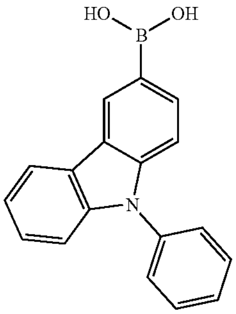 [SMILES: OB(O)c1ccc2c(c1)c1ccccc1n2-c1ccccc1] 845952-58-2 Stage 20a | 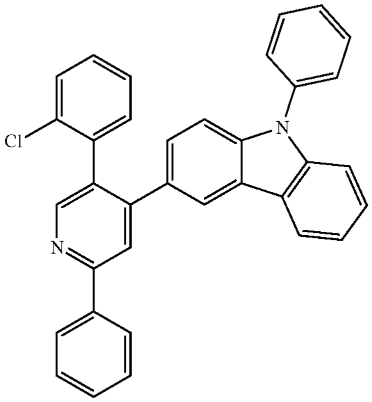 [SMILES: Clc1ccccc1-c1cnc(-c2ccccc2)cc1-c1ccc2c(c1)c1ccccc1n2-c1ccccc1] | 52% |
| S27 | 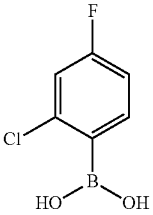 [SMILES: OB(O)c1ccc(F)cc1Cl] 313454-72-1 Stage 20 | 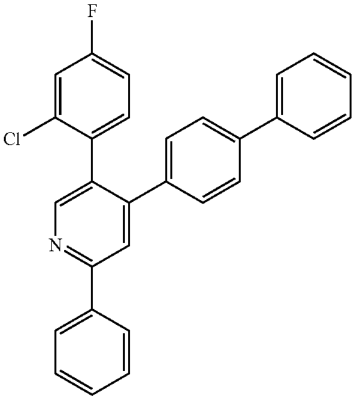 [SMILES: Fc1ccc(-c2cnc(-c3ccccc3)cc2-c2ccc(-c3ccccc3)cc2)c(Cl)c1] | 44% |
| S28 | 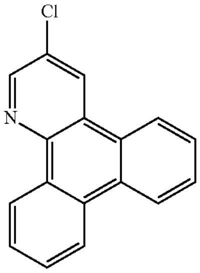 [SMILES: Clc1cnc2c3ccccc3c3ccccc3c2c1] Stage S20 only For preparation see KR 2018045695 | 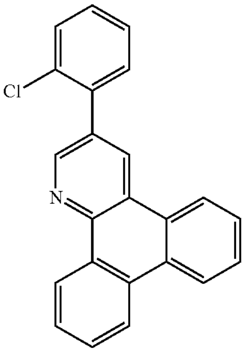 [SMILES: Clc1ccccc1-c1cnc2c3ccccc3c3ccccc3c2c1] | 81% |
| S29 | 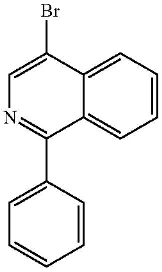 [SMILES: Brc1cnc(-c2ccccc2)c2ccccc12] 22960-25-4 Stage 20 only | 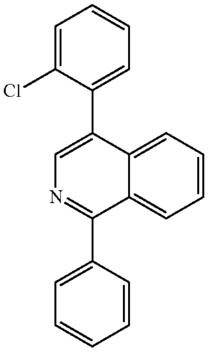 [SMILES: Clc1ccccc1-c1cnc(-c2ccccc2)c2ccccc12] | 87% |

-continued

| Ex. | Reactants | Product | Yield |
|---|---|---|---|
| S30 | 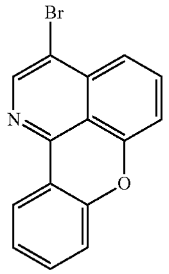 [SMILES: Brc1cnc2c3c(cccc13)Oc1ccccc1-2] 2222066-63-7 Stage 20 only | 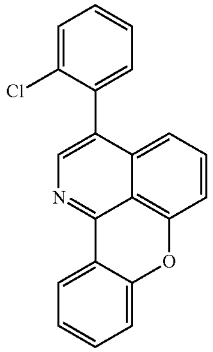 [SMILES: Clc1ccccc1-c1cnc2c3c(cccc13)Oc1ccccc1-2] | 85% |

* over three stages

Example S50

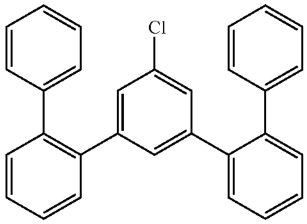 [SMILES: Clc1cc(-c2ccccc2-c2ccccc2)cc(-c2ccccc2-c2ccccc2)c1]

To a mixture of 21.1 g (50 mmol) of S1, 20.4 g (100 mmol) of 4,4,5,5-tetramethyl-2-phenyl-1,3,2-dioxaborolane [24388-23-6], 63.4 g (600 mmol) of sodium carbonate, 400 ml of toluene, 200 ml of ethanol and 400 ml of water are added, with very good stirring, 1.58 g (6 mmol) of triphenylphosphine and then 449 mg (2 mmol) of palladium(II) acetate, and the mixture is heated under reflux for 48 h. After cooling; the organic phase is removed and washed once with 300 ml of water and once with 300 ml of saturated sodium chloride solution, and dried over magnesium sulfate. The desiccant is filtered off and the filtrate is concentrated fully under reduced pressure. The residue is flash-chromatographed (Torrent automatic column system from A. Semrau). Yield: 17.1 g (41 mmol), 82%; purity: about 97% by $^1H$ NMR.

The following compounds can be prepared analogously:

| Ex. | Reactants | Product | Yield |
|---|---|---|---|
| S51 | 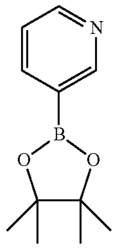 329214-79-1 | 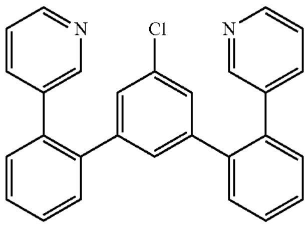 [SMILES: Clc1cc(-c2ccccc2-c2cccnc2)cc(-c2ccccc2-c2cccnc2)c1] | 73% |
| S52 | 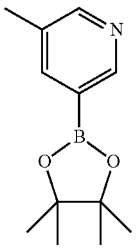 1171891-42-1 | 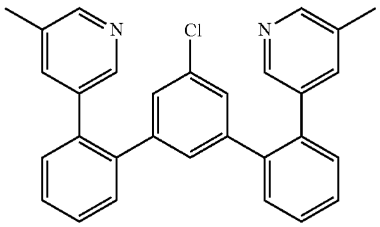 | 70% |

-continued
| Ex. | Reactants | Product | Yield |
| --- | --- | --- | --- |
| S53 | 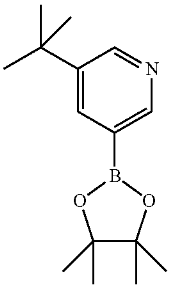 [SMILES: CC(C)(C)c1cncc(B2OC(C)(C)C(C)(C)O2)c1] 2225172-53-0 | 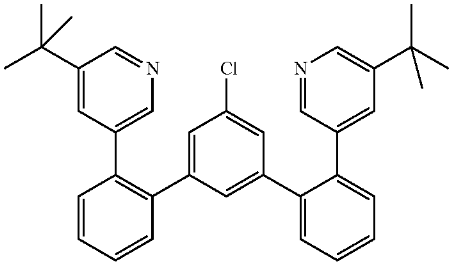 [SMILES: CC(C)(C)c1cncc(-c2ccccc2-c2cc(Cl)cc(-c3ccccc3-c3cncc(C(C)(C)C)c3)c2)c1] | 75% |
| S54 | 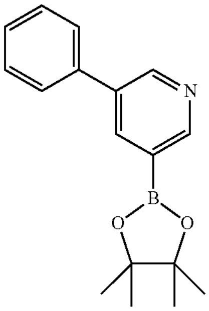 [SMILES: CC1(C)OB(c2cncc(-c3ccccc3)c2)OC1(C)C] 1171891-07-8 | 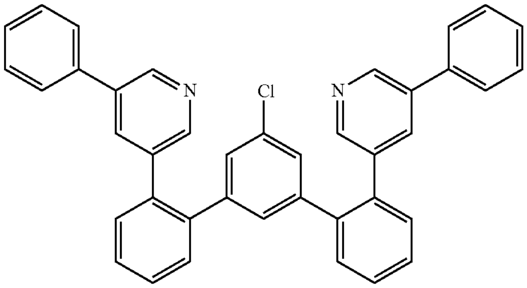 [SMILES: Clc1cc(-c2ccccc2-c2cncc(-c3ccccc3)c2)cc(-c2ccccc2-c2cncc(-c3ccccc3)c2)c1] | 77% |
| S55 | 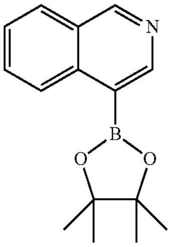 [SMILES: CC1(C)OB(c2cncc3ccccc23)OC1(C)C] 685103-98-4 | 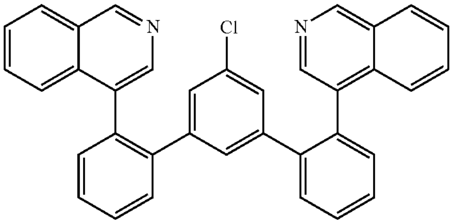 [SMILES: Clc1cc(-c2ccccc2-c2cncc3ccccc23)cc(-c2ccccc2-c2cncc3ccccc23)c1] | 70% |
| S56 | 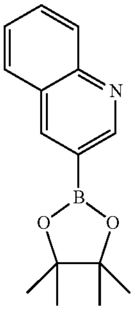 [SMILES: CC1(C)OB(c2cnc3ccccc3c2)OC1(C)C] 171364-85-5 | 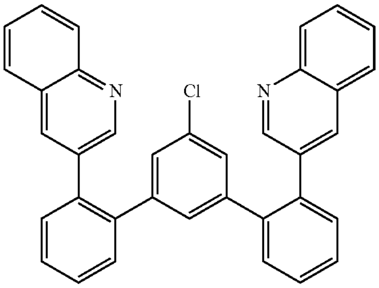 [SMILES: Clc1cc(-c2ccccc2-c2cnc3ccccc3c2)cc(-c2ccccc2-c2cnc3ccccc3c2)c1] | 67% |

-continued

| Ex. | Reactants | Product | Yield |
| --- | --- | --- | --- |
| S57 | 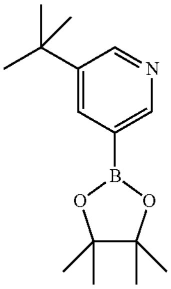 [SMILES: CC(C)(C)c1cncc(B2OC(C)(C)C(C)(C)O2)c1] 2225172-53-0, 50 mmol 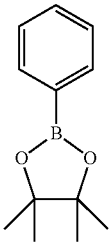 24388-23-6, 50 mmol | 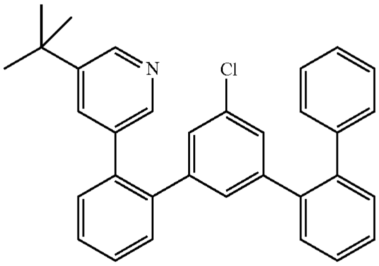 [SMILES: CC(C)(C)c1cncc(-c2ccccc2-c2cc(Cl)cc(-c3ccccc3-c3ccccc3)c2)c1] | 20% |

Example S100

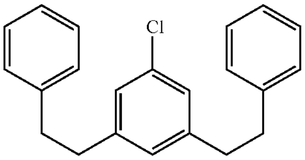 [SMILES: Clc1cc(CCc2ccccc2)cc(CCc2ccccc2)c1]

A well-stirred mixture of 31.4 g (200 mmol) of bromobenzene [108-86-1], 16.1 g (100 mmol) of 1-chloro-3,5-ethynylbenzene [1378482-52-0], 194.5 ml (1.5 mol) of triethylamine, 700 ml of DMF and 2.31 g (2 mmol) of tetrakis (triphenylphosphino)palladium(0) is stirred at 70° C. for 16 h. The triethylammonium hydrobromide formed is filtered out of the mixture with suction while it is still warm and washed once with 50 ml of DMF. The filtrate is concentrated to dryness and the residue is taken up in 1000 ml of dichloromethane. The organic phase is washed three times with 300 ml each time of water and once with 300 ml of saturated sodium chloride solution and dried over magnesium sulfate. The organic phase is concentrated to about 300 ml, 100 ml of ethyl acetate is added, the mixture is filtered through a silica gel bed, and the solvent is removed under reduced pressure. The solids thus obtained are extracted once by stirring with 150 ml of methanol and then dried under reduced pressure.

The solids are hydrogenated in a mixture of 500 ml of THF and 100 ml of MeOH with addition of 10.7 g (200 mmol) of ammonium chloride, 5 g of palladium (5%) on charcoal, at 40° C. under a 2 bar hydrogen atmosphere until uptake of hydrogen has ended (about 12 h). The catalyst is filtered off using a Celite bed in the form of a THF slurry, the solvent is removed under reduced pressure and the residue is flash-chromatographed using an automated column system (CombiFlashTorrent from A Semrau). Yield: 26.3 g (82 mmol), 82%; purity: about 97% by $^{1}$H NMR.

The following compounds can be prepared analogously:

| Ex. | Reactants Variant | Product | Yield |
| --- | --- | --- | --- |
| S101 | 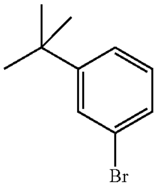 3972-64-3 | 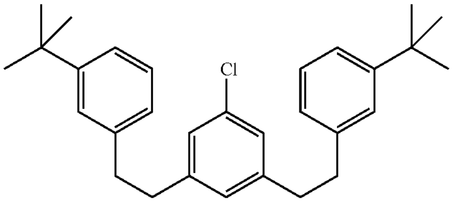 [SMILES: CC(C)(C)c1cccc(CCc2cc(Cl)cc(CCc3cccc(C(C)(C)C)c3)c2)c1] | 78% |

-continued

| Ex. | Reactants Variant | Product | Yield |
|---|---|---|---|
| S102 | 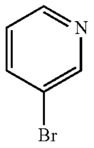 626-55-1 | 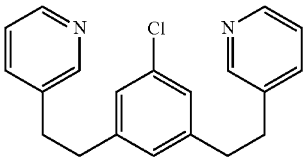 [SMILES: Clc1cc(CCc2cccnc2)cc(CCc2cccnc2)c1] | 80% |
| S103 | 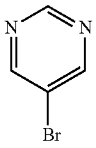 4595-59-9 | 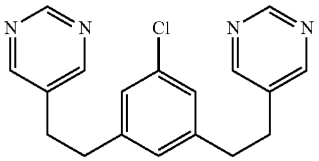 [SMILES: Clc1cc(CCc2cncnc2)cc(CCc2cncnc2)c1] | 75% |
| S104 | 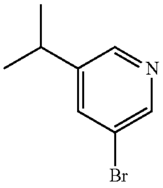 1209459-74-4 | 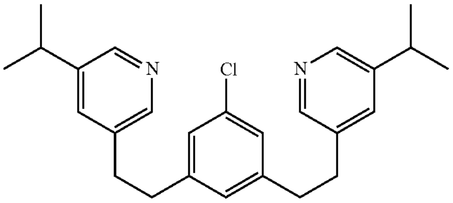 [SMILES: CC(C)c1cncc(CCc2cc(Cl)cc(CCc3cncc(C(C)C)c3)c2)c1] | 85% |
| S105 | 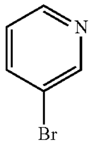 626-55-1 Use of: $MeOD/ND_4Cl/D_2$ | 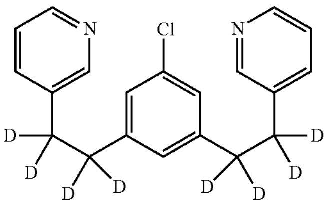 [SMILES: [2H]C([2H])(c1cccnc1)C([2H])([2H])c1cc(Cl)cc(C([2H])([2H])C([2H])([2H])c2cccnc2)c1] | 70% |

Example S200

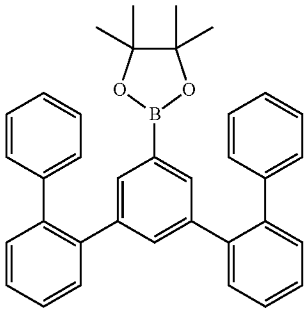 [SMILES: CC1(C)OB(c2cc(-c3ccccc3-c3ccccc3)cc(-c3ccccc3-c3ccccc3)c2)OC1(C)C]

To a mixture of 41.7 g (100 mmol) of S50, 26.7 g (105 mmol) of bis(pinacolato)diborane [73183-34-3], 29.4 g (300 mmol) of potassium acetate (anhydrous), 50 g of glass beads (diameter 3 mm) and 300 ml of THF are added, with good stirring, 821 mg (2 mmol) of S-Phos and then 225 mg (1 mmol) of palladium(II) acetate, and the mixture is heated under reflux for 16 h. After cooling, the salts and glass beads are removed by suction filtration through a Celite bed in the form of a THF slurry, which is washed through with a little THF, and the filtrate is concentrated to dryness. The residue is taken up in 100 ml of MeOH and stirred in the warm solvent, and the crystallized product is filtered off with suction, washed twice with 30 ml each time of methanol and dried under reduced pressure. Yield: 45.8 g (90 mmol), 90%; purity: about 95% by $^1H$ NMR.

The following compounds can be prepared analogously:
| Ex. | Reactants | Product | Yield |
|---|---|---|---|
| S201 | S51 | 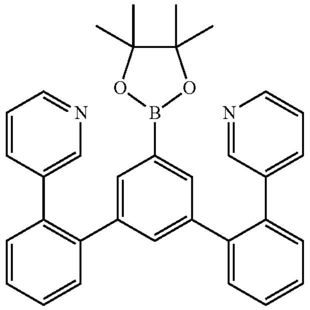 [SMILES: CC1(C)OB(c2cc(-c3ccccc3-c3cccnc3)cc(-c3ccccc3-c3cccnc3)c2)OC1(C)C] | 88% |
| S202 | S52 | 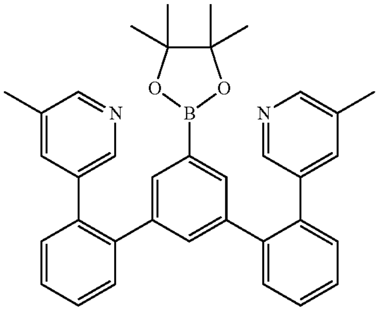 | 85% |
| S203 | S53 | 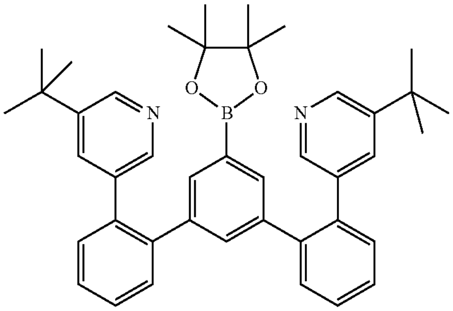 [SMILES: CC(C)(C)c1cncc(-c2ccccc2-c2cc(B3OC(C)(C)C(C)(C)O3)cc(-c3ccccc3-c3cncc(C(C)(C)C)c3)c2)c1] | 87% |
| S204 | S54 | 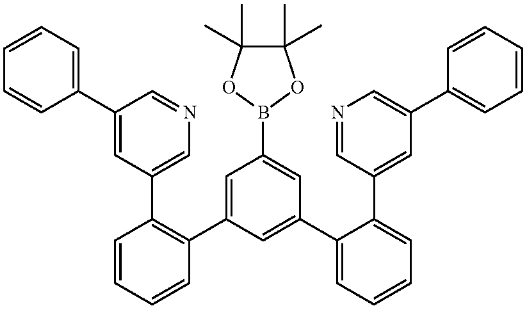 [SMILES: CC1(C)OB(c2cc(-c3ccccc3-c3cncc(-c4ccccc4)c3)cc(-c3ccccc3-c3cncc(-c4ccccc4)c3)c2)OC1(C)C] | 91% |
| S205 | S55 | 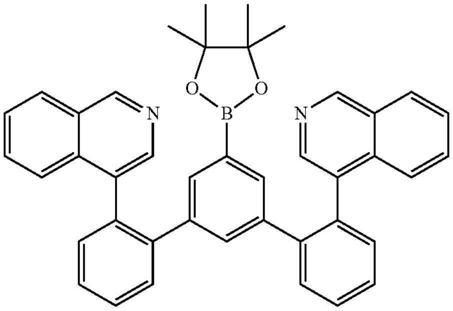 [SMILES: CC1(C)OB(c2cc(-c3ccccc3-c3cncc4ccccc34)cc(-c3ccccc3-c3cncc4ccccc34)c2)OC1(C)C] | 90% |

-continued
| Ex. | Reactants | Product | Yield |
|---|---|---|---|
| S206 | S56 | 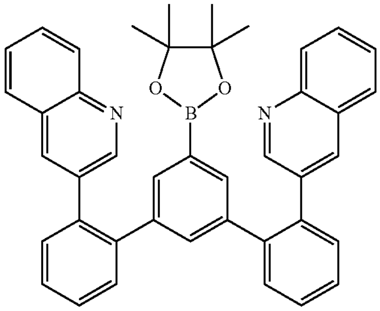 [SMILES: CC1(C)OB(c2cc(-c3ccccc3-c3cnc4ccccc4c3)cc(-c3ccccc3-c3cnc4ccccc4c3)c2)OC1(C)C] | 93% |
| S207 | S57 | 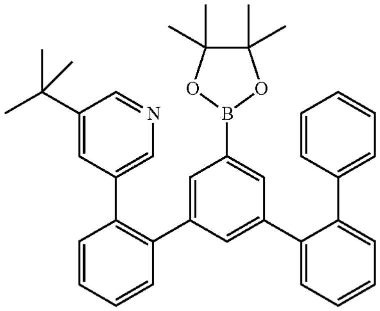 [SMILES: CC(C)(C)c1cncc(-c2ccccc2-c2cc(B3OC(C)(C)C(C)(C)O3)cc(-c3ccccc3-c3ccccc3)c2)c1] | 90% |
| S300 | S100 | 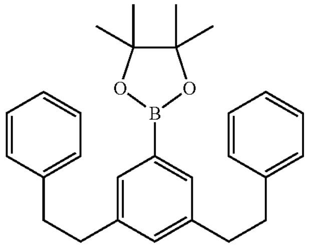 [SMILES: CC1(C)OB(c2cc(CCc3ccccc3)cc(CCc3ccccc3)c2)OC1(C)C] | 84% |
| S301 | S101 | 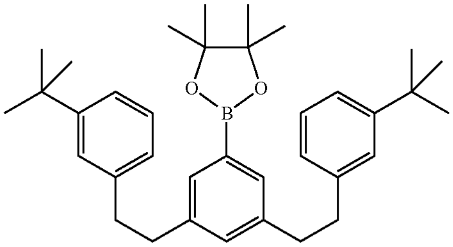 [SMILES: CC(C)(C)c1cccc(CCc2cc(CCc3cccc(C(C)(C)C)c3)cc(B3OC(C)(C)C(C)(C)O3)c2)c1] | 81% |
| S302 | S102 | 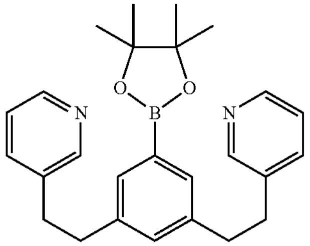 [SMILES: CC1(C)OB(c2cc(CCc3cccnc3)cc(CCc3cccnc3)c2)OC1(C)C] | 86% |

-continued

| Ex. | Reactants | Product | Yield |
|---|---|---|---|
| S303 | S103 | 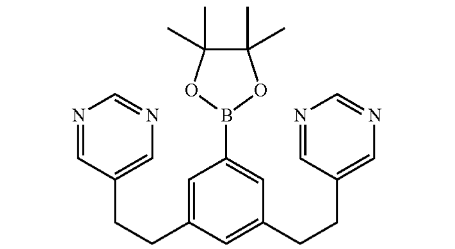 [SMILES: CC1(C)OB(c2cc(CCc3cncnc3)cc(CCc3cncnc3)c2)OC1(C)C] | 77% |
| S304 | S104 | 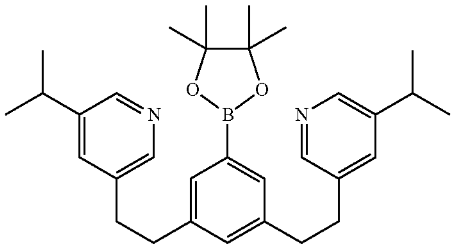 [SMILES: CC(C)c1cncc(CCc2cc(CCc3cncc(C(C)C)c3)cc(B3OC(C)(C)C(C)(C)O3)c2)c1] | 88% |
| S305 | S105 | 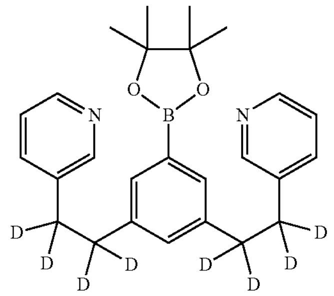 [SMILES: [2H]C([2H])(c1cccnc1)C([2H])([2H])c1cc(B2OC(C)(C)C(C)(C)O2)cc(C([2H])([2H])C([2H])([2H])c2cccnc2)c1] | 80% |

Example S400

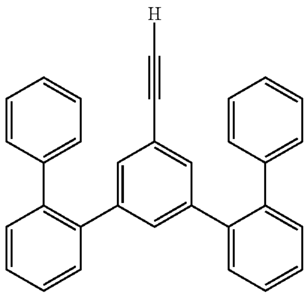 [SMILES: C#Cc1cc(-c2ccccc2-c2ccccc2)cc(-c2ccccc2-c2ccccc2)c1]

A well-stirred mixture of 50.8 g (100 mmol) of S200, 31.4 g (120 mmol) of triisopropylsilylethynyl bromide [111409-79-1], 26.5 g (250 mmol) of sodium carbonate, 2.31 g (2 mmol) of tetrakis(triphenylphosphino)palladium(0), 600 ml of toluene, 300 ml of ethanol and 100 ml of water is stirred at 80° C. for 24 h. After cooling, the organic phase is removed, washed twice with 200 ml each time of saturated sodium chloride solution and dried over magnesium sulfate. The desiccant is filtered off, the filtrate is concentrated at 30° C. under reduced pressure, the residue is taken up in 500 ml of dichloromethane, 110 ml of TBAF (1 M in THF) [10549-76-5] is added, and the mixture is stirred for a further 1 h, then washed twice with 300 ml each time of water and twice with 200 ml each time of saturated sodium chloride solution and concentrated at 30° C., and the residue is chromatographed using an automated column system (CombiFlash-Torrent from A Semrau). Storage of the product in a freezer. Yield: 29.4 g (72 mmol), 72%; purity: about 97% by $^1$H NMR.

The following compounds can be prepared analogously:
| Ex. | Reactants | Product | Yield |
|---|---|---|---|
| S401 | S201 | 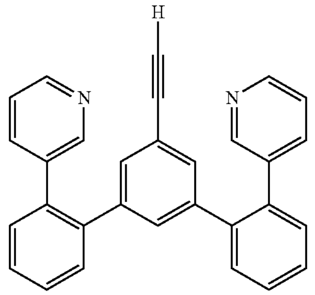 [SMILES: C#Cc1cc(-c2ccccc2-c2cccnc2)cc(-c2ccccc2-c2cccnc2)c1] | 68% |
| S402 | S202 | 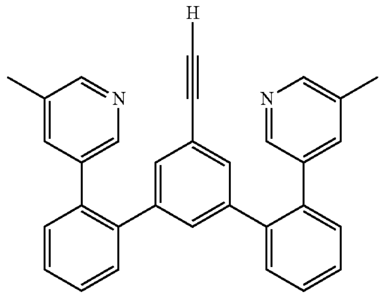 | 65% |
| S403 | S203 | 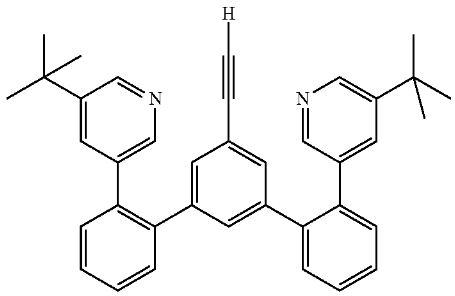 [SMILES: C#Cc1cc(-c2ccccc2-c2cncc(C(C)(C)C)c2)cc(-c2ccccc2-c2cncc(C(C)(C)C)c2)c1] | 71% |
| S500 | S301 | 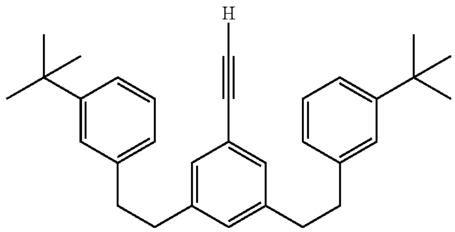 [SMILES: C#Cc1cc(CCc2cccc(C(C)(C)C)c2)cc(CCc2cccc(C(C)(C)C)c2)c1] | 70% |
| S501 | S302 | 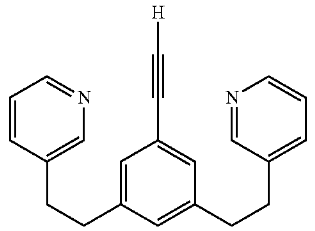 [SMILES: C#Cc1cc(CCc2cccnc2)cc(CCc2cccnc2)c1] | 67% |

B: Synthesis of the Ligands L:

Example L1

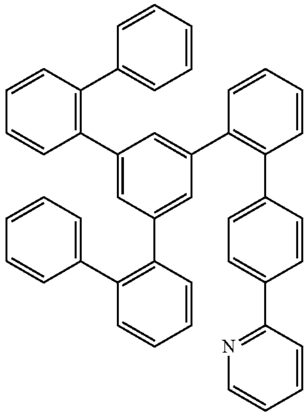 [SMILES: c1ccc(-c2ccccc2-c2cc(-c3ccccc3-c3ccccc3)cc(-c3ccccc3-c3ccc(-c4ccccn4)cc3)c2)cc1]

To a mixture of 50.9 g (100 mmol) of S200, 31.0 g (100 mmol) of 2-(2'-bromo[1,1'-biphenyl]-4-yl)pyridine [1374202-353], 63.7 g (300 mmol) of tripotassium phosphate, 400 ml of toluene, 200 ml of dioxane and 400 ml of water are added, with good stirring, 1.64 g (4 mmol) of S-Phos and then 449 mg (2 mmol) of palladium(II) acetate, and the mixture is heated under reflux for 24 h. After cooling, the organic phase is removed and washed twice with 300 ml each time of water and once with 300 ml of saturated sodium chloride solution, and dried over magnesium sulfate. The desiccant is filtered off, the filtrate is concentrated to dryness under reduced pressure and the glassy crude product is recrystallized at boiling from acetonitrile (~150 ml) and then for a second time from acetonitrile/ethyl acetate. Yield: 43.3 g (71 mmol), 71%; purity: about 95% by $^{1}$H NMR.

The following compounds can be prepared analogously:

| Ex. | Reactants Variant | Product | Yield |
|---|---|---|---|
| L2 | S2<br>S200 | 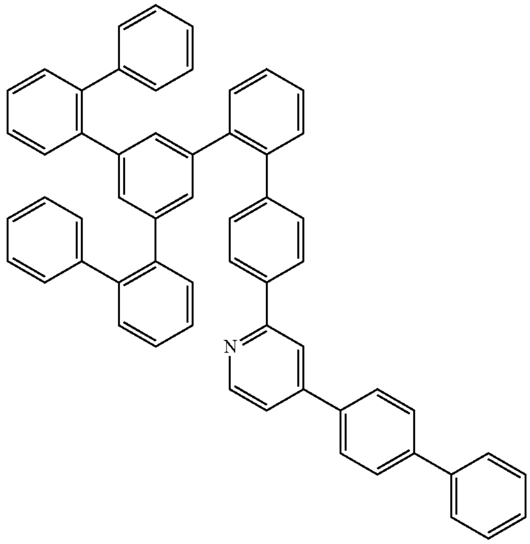 [SMILES: c1ccc(-c2ccc(-c3ccnc(-c4ccc(-c5ccccc5-c5cc(-c6ccccc6-c6ccccc6)cc(-c6ccccc6-c6ccccc6)c5)cc4)c3)cc2)cc1] | 75% |

-continued
| Ex. | Reactants Variant | Product | Yield |
|---|---|---|---|
| L3 | S3<br>S200 | 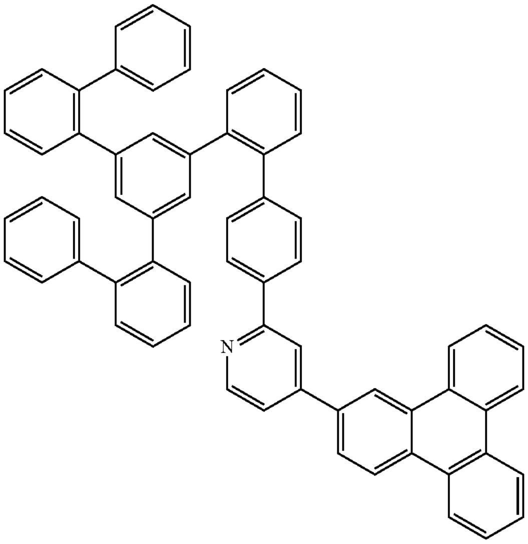 [SMILES: c1ccc(-c2ccccc2-c2cc(-c3ccccc3-c3ccccc3)cc(-c3ccccc3-c3ccc(-c4cc(-c5ccc6c7ccccc7c7ccccc7c6c5)ccn4)cc3)c2)cc1] | 79% |
| L4 | S4<br>S200 | 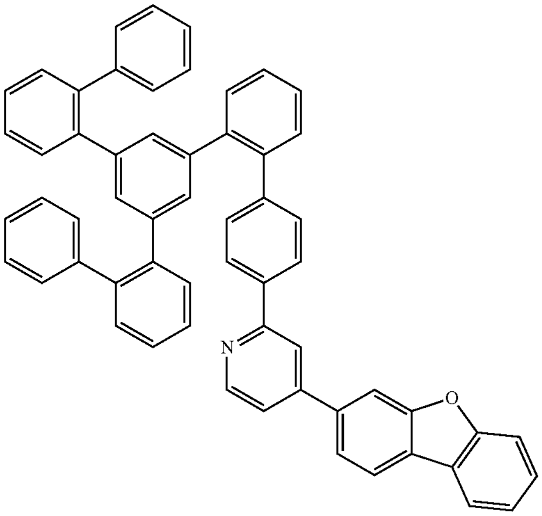 [SMILES: c1ccc(-c2ccccc2-c2cc(-c3ccccc3-c3ccccc3)cc(-c3ccccc3-c3ccc(-c4cc(-c5ccc6c(c5)oc5ccccc56)ccn4)cc3)c2)cc1] | 70% |
| L5 | 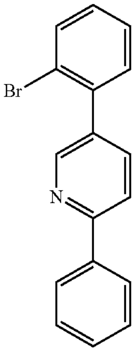<br>1989597-29-6<br>S201 | 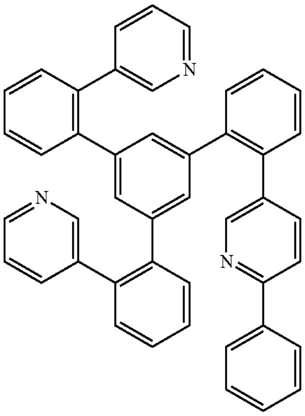 [SMILES: c1ccc(-c2ccc(-c3ccccc3-c3cc(-c4ccccc4-c4cccnc4)cc(-c4ccccc4-c4cccnc4)c3)cn2)cc1] | 73% |

-continued
| Ex. | Reactants Variant | Product | Yield |
|---|---|---|---|
| L6 | 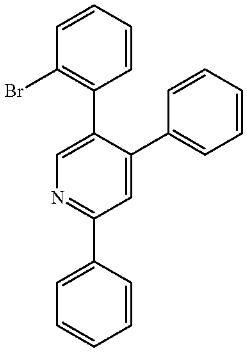 1989597-32-1 S201 | 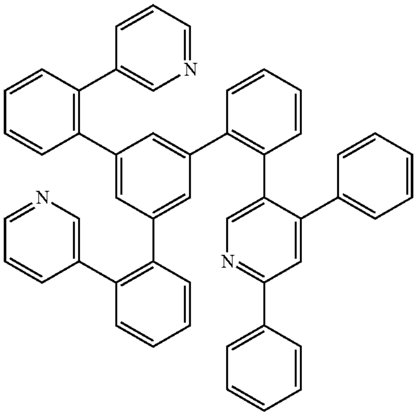 [SMILES: c1ccc(-c2cc(-c3ccccc3)c(-c3ccccc3-c3cc(-c4ccccc4-c4cccnc4)cc(-c4ccccc4-c4cccnc4)c3)cn2)cc1] | 70% |
| L7 | S20 S201 | 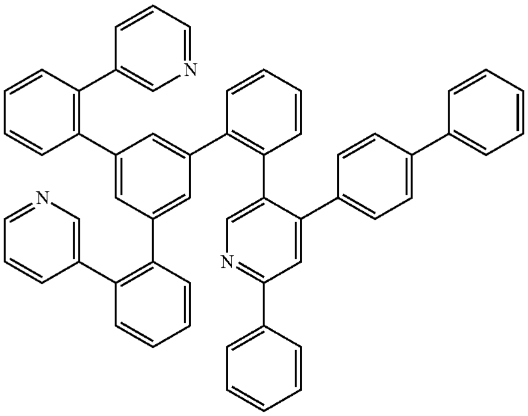 [SMILES: c1ccc(-c2ccc(-c3cc(-c4ccccc4)ncc3-c3ccccc3-c3cc(-c4ccccc4-c4cccnc4)cc(-c4ccccc4-c4cccnc4)c3)cc2)cc1] | 77% |
| L8 | S21 S202 | 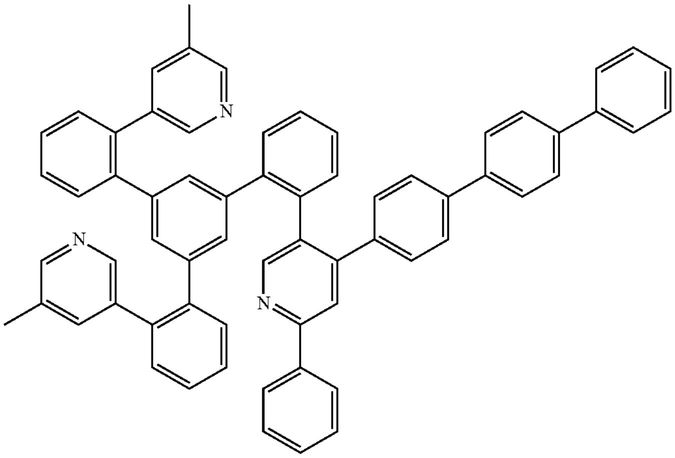 [SMILES: Cc1cncc(-c2ccccc2-c2cc(-c3ccccc3-c3cncc(C)c3)cc(-c3ccccc3-c3cnc(-c4ccccc4)cc3-c3ccc(-c4ccc(-c5ccccc5)cc4)cc3)c2)c1] | 72% |

-continued
| Ex. | Reactants Variant | Product | Yield |
|---|---|---|---|
| L9 | S22<br>S203 | 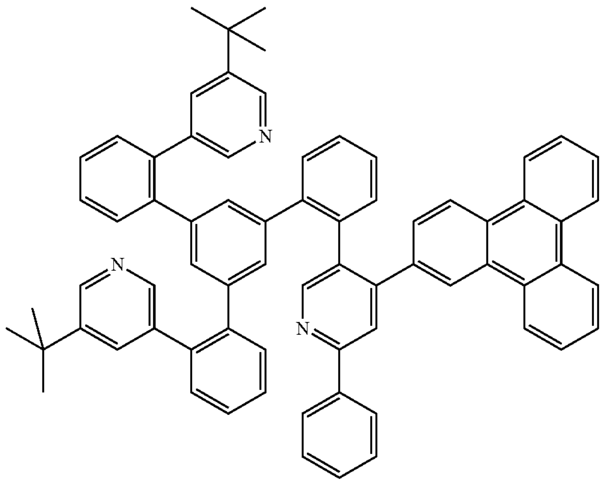 [SMILES: CC(C)(C)c1cncc(-c2ccccc2-c2cc(-c3ccccc3-c3cncc(C(C)(C)C)c3)cc(-c3ccccc3-c3cnc(-c4ccccc4)cc3-c3ccc4c5ccccc5c5ccccc5c4c3)c2)c1] | 67% |
| L10 | S26<br>S204 | 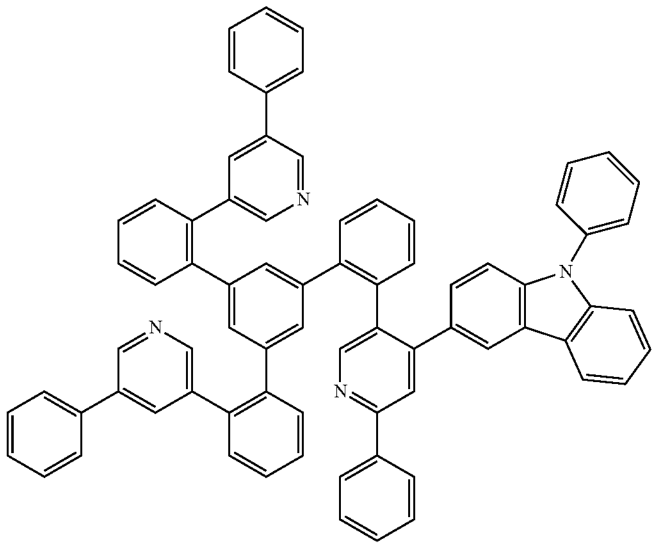 [SMILES: c1ccc(-c2cncc(-c3ccccc3-c3cc(-c4ccccc4-c4cncc(-c5ccccc5)c4)cc(-c4ccccc4-c4cnc(-c5ccccc5)cc4-c4ccc5c(c4)c4ccccc4n5-c4ccccc4)c3)c2)cc1] | 69% |
| L11 | S29<br>S205 | 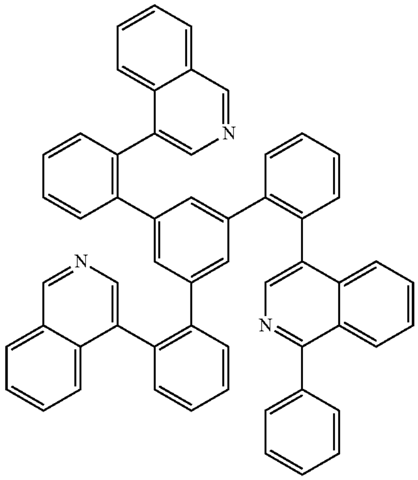 [SMILES: c1ccc(-c2ncc(-c3ccccc3-c3cc(-c4ccccc4-c4cncc5ccccc45)cc(-c4ccccc4-c4cncc5ccccc45)c3)c3ccccc23)cc1] | 76% |

-continued
| Ex. | Reactants Variant | Product | Yield |
| --- | --- | --- | --- |
| L12 | S30<br>S206 | 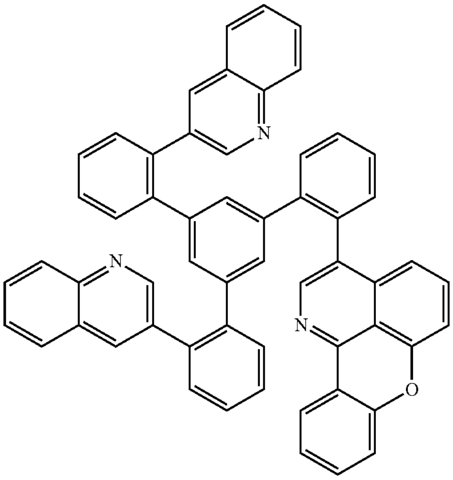 [SMILES: c1ccc2c(c1)Oc1cccc3c(-c4ccccc4-c4cc(-c5ccccc5-c5cnc6ccccc6c5)cc(-c5ccccc5-c5cnc6ccccc6c5)c4)cnc-2c13] | 75% |
| L13 | S20<br>S207 | 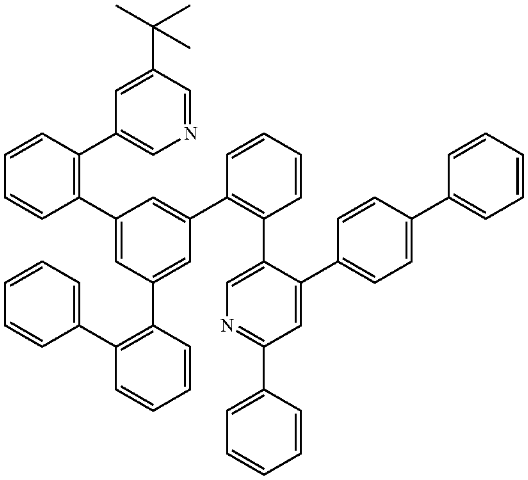 [SMILES: CC(C)(C)c1cncc(-c2ccccc2-c2cc(-c3ccccc3-c3ccccc3)cc(-c3ccccc3-c3cnc(-c4ccccc4)cc3-c3ccc(-c4ccccc4)cc3)c2)c1] | 65% |
| L100 | S24<br>S300 | 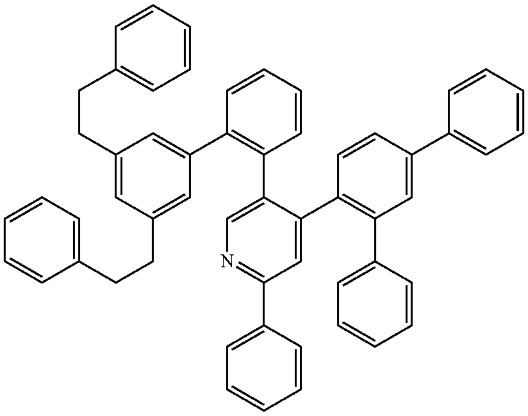 [SMILES: c1ccc(CCc2cc(CCc3ccccc3)cc(-c3ccccc3-c3cnc(-c4ccccc4)cc3-c3ccc(-c4ccccc4)cc3-c3ccccc3)c2)cc1] | 67% |

-continued
| Ex. | Reactants Variant | Product | Yield |
|---|---|---|---|
| L101 | S3<br>S301 | 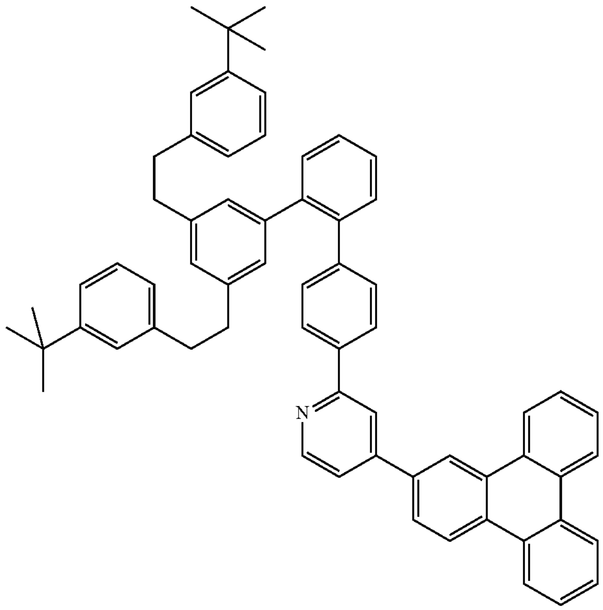 [SMILES: CC(C)(C)c1cccc(CCc2cc(CCc3cccc(C(C)(C)C)c3)cc(-c3ccccc3-c3ccc(-c4cc(-c5ccc6c7ccccc7c7ccccc7c6c5)ccn4)cc3)c2)c1] | 78% |
| L102 | S21<br>S302 | 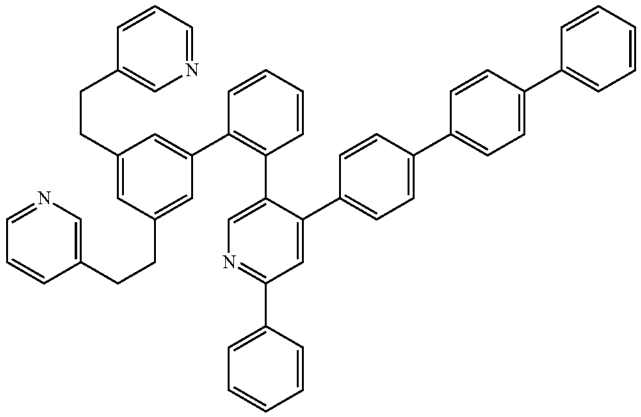 [SMILES: c1ccc(-c2ccc(-c3ccc(-c4cc(-c5ccccc5)ncc4-c4ccccc4-c4cc(CCc5cccnc5)cc(CCc5cccnc5)c4)cc3)cc2)cc1] | 74% |
| L103 | S25<br>S303 | 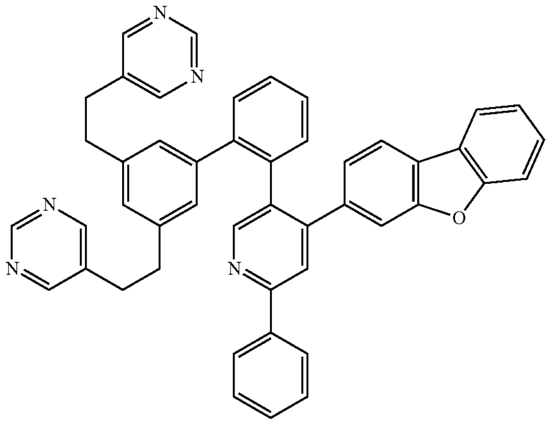 [SMILES: c1ccc(-c2cc(-c3ccc4c(c3)oc3ccccc34)c(-c3ccccc3-c3cc(CCc4cncnc4)cc(CCc4cncnc4)c3)cn2)cc1] | 70% |

-continued
| Ex. | Reactants Variant | Product | Yield |
|---|---|---|---|
| L104 | S23<br>S304 | 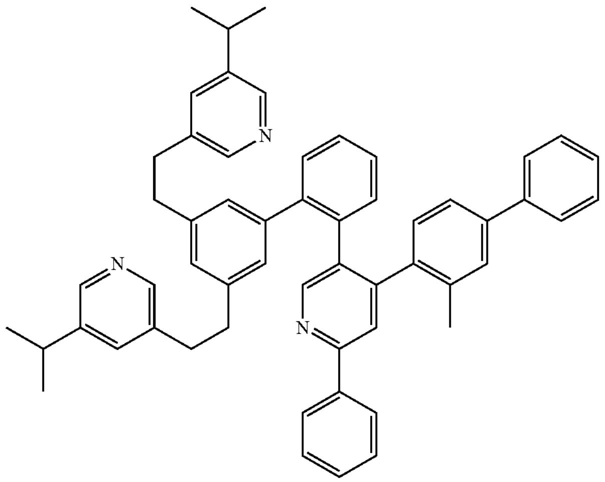 [SMILES: Cc1cc(-c2ccccc2)ccc1-c1cc(-c2ccccc2)ncc1-c1ccccc1-c1cc(CCc2cncc(C(C)C)c2)cc(CCc2cncc(C(C)C)c2)c1] | 69% |
| L105 | S27<br>S304 | 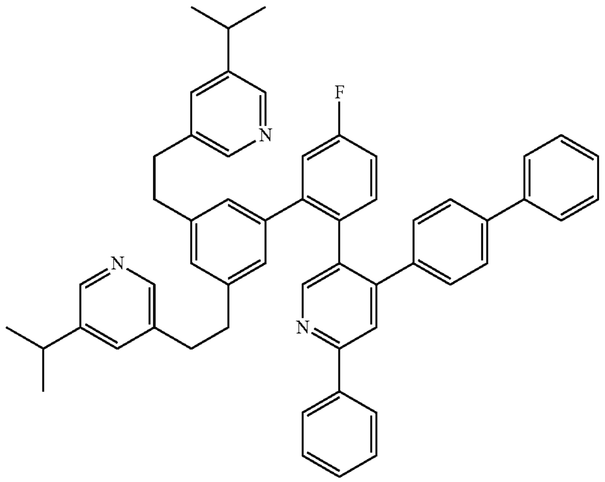 [SMILES: CC(C)c1cncc(CCc2cc(CCc3cncc(C(C)C)c3)cc(-c3cc(F)ccc3-c3cnc(-c4ccccc4)cc3-c3ccc(-c4ccccc4)cc3)c2)c1] | 72% |

-continued

| Ex. | Reactants Variant | Product | Yield |
|---|---|---|---|
| L106 | S28<br>S304 | 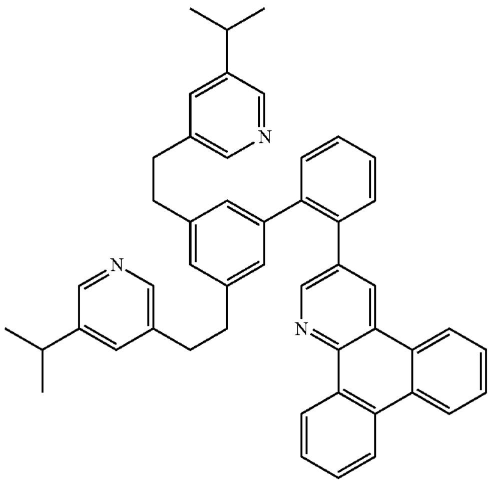 [SMILES: CC(C)c1cncc(CCc2cc(CCc3cncc(C(C)C)c3)cc(-c3ccccc3-c3cnc4c5ccccc5c5ccccc5c4c3)c2)c1] | 75% |
| L107 | S21<br>S305 | 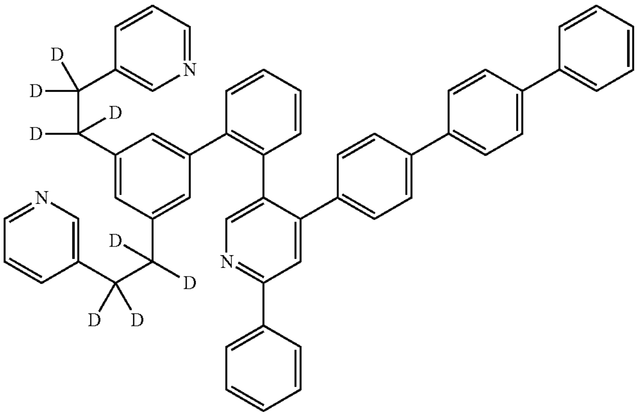 [SMILES: [2H]C([2H])(c1cccnc1)C([2H])([2H])c1cc(-c2ccccc2-c2cnc(-c3ccccc3)cc2-c2ccc(-c3ccc(-c4ccccc4)cc3)cc2)cc(C([2H])([2H])C([2H])([2H])c2cccnc2)c1] | 72% |

Example L200

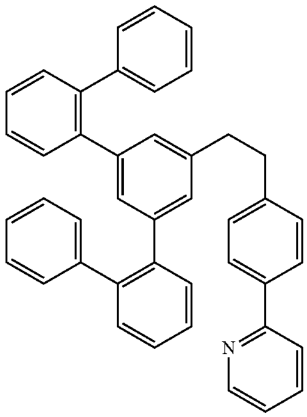 [SMILES: c1ccc(-c2ccccc2-c2cc(CCc3ccc(-c4ccccn4)cc3)cc(-c3ccccc3-c3ccccc3)c2)cc1]

A well-stirred mixture of 23.4 g (100 mmol) of 2-(4-bromophenyl)pyridine [63993-36-1], 40.7 g (100 mmol) of S400, 81.5 g (250 mmol) of cesium carbonate, 50 g of glass beads (diameter 3 mm), 787 mg (1 mmol) of XPhos-Pd-G2 [1310584-14-5], 477 mg (1 mmol) of XPhos [564483-18-7] and 500 ml of acetonitrile is stirred at 90° C. for 16 h. The salts are filtered off while the mixture is still warm and washed twice with 200 ml each time of DCM. The filtrate is concentrated to dryness. The residue is taken up in 1000 ml of dichloromethane. The organic phase is washed three times with 300 ml each time of water and once with 300 ml of saturated sodium chloride solution and dried over magnesium sulfate. The organic phase is concentrated to about 500 ml, 200 ml of ethyl acetate is added, the mixture is filtered through a silica gel bed, and the solvent is removed under reduced pressure. The solids thus obtained are extracted once by stirring with 150 ml of methanol and then dried under reduced pressure. The solids are hydrogenated in a mixture of 500 ml of THF and 100 ml of MeOH with addition of 10.7 g (200 mmol) of ammonium chloride, 5 g of palladium (5%) on charcoal, at 40° C. under a 2 bar hydrogen atmosphere until uptake of hydrogen has ended (about 12 h). The catalyst is filtered off using a Celite bed in the form of a THF slurry, the solvent is removed under reduced pressure and the residue is flash-chromatographed using an automated column system (CombiFlashTorrent from A Semrau). Yield: 35.6 g (63 mmol), 63%; purity: about 97% by $^1$H NMR.

The following compounds can be prepared analogously:
| Ex. | Reactants | Product | Yield |
| --- | --- | --- | --- |
| L201 | S20b<br>S201 | 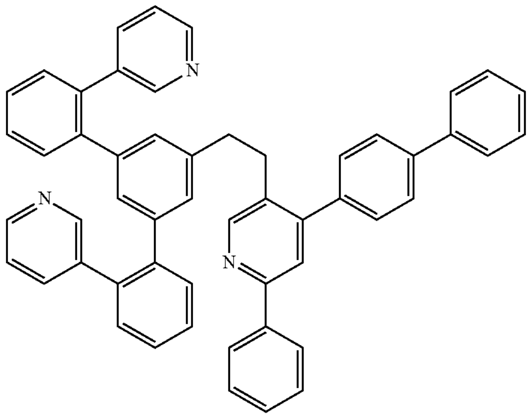 [SMILES: c1ccc(-c2ccc(-c3cc(-c4ccccc4)ncc3CCc3cc(-c4ccccc4-c4cccnc4)cc(-c4ccccc4-c4cccnc4)c3)cc2)cc1] | 55% |
| L202 | S22b<br>S202 | 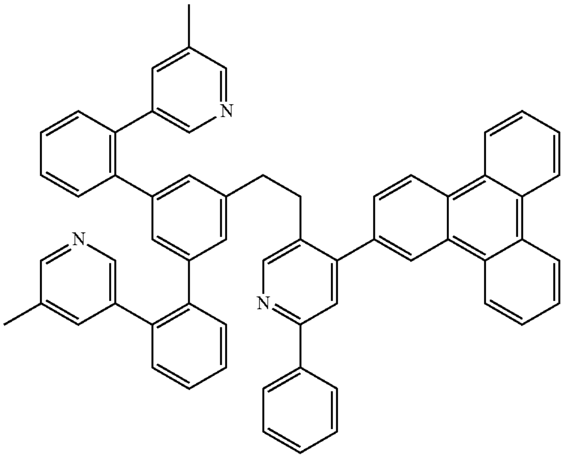 [SMILES: Cc1cncc(-c2ccccc2-c2cc(CCc3cnc(-c4ccccc4)cc3-c3ccc4c5ccccc5c5ccccc5c4c3)cc(-c3ccccc3-c3cncc(C)c3)c2)c1] | 58% |
| L203 | S28<br>reactant<br>S203 | 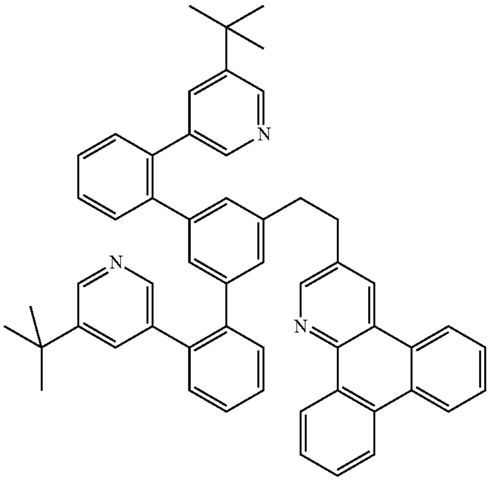 [SMILES: CC(C)(C)c1cncc(-c2ccccc2-c2cc(CCc3cnc4c5ccccc5c5ccccc5c4c3)cc(-c3ccccc3-c3cncc(C(C)(C)C)c3)c2)c1] | 61% |

-continued
| Ex. | Reactants | Product | Yield |
|---|---|---|---|
| L300 | S2b<br>S501 | 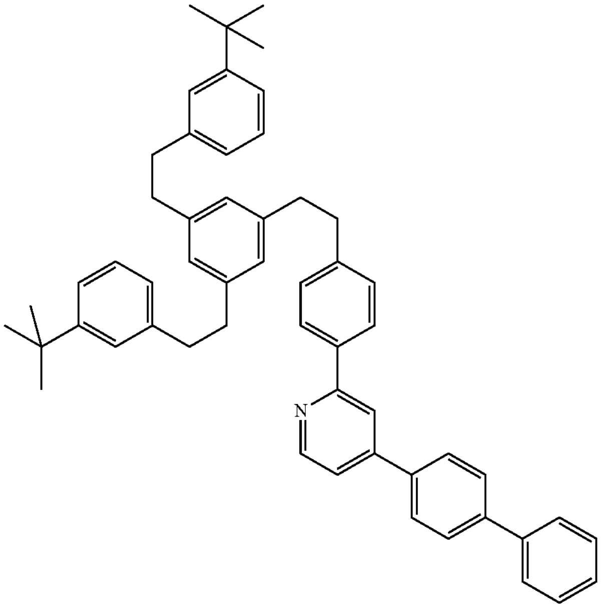 [SMILES: CC(C)(C)c1cccc(CCc2cc(CCc3ccc(-c4cc(-c5ccc(-c6ccccc6)cc5)ccn4)cc3)cc(CCc3cccc(C(C)(C)C)c3)c2)c1] | 57% |
| L301 | S21b<br>S502 | 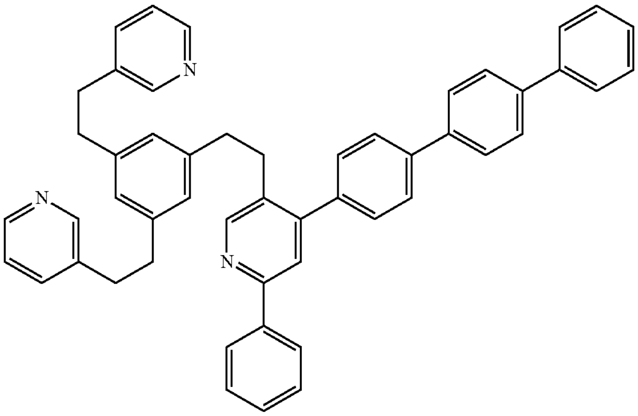 [SMILES: c1ccc(-c2ccc(-c3ccc(-c4cc(-c5ccccc5)ncc4CCc4cc(CCc5cccnc5)cc(CCc5cccnc5)c4)cc3)cc2)cc1] | 60% |

C: Synthesis of the Complexes:

C1: Uncharged Monodentate Co Ligands

Example Ir100

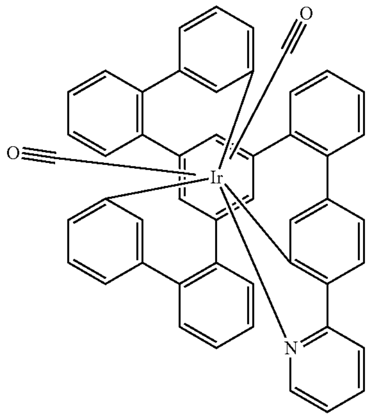

A mixture of 6.12 g (10 mmol) of L1, 4.15 g (10 mmol) of [(1,2,5,6-η)-1,5-cyclooctadiene][(1,2,3,3a,7a-η)-1H-inden-1-yl]iridium (=(Ind)Ir(COD)) [102525-11-1], 100 ml of glacial acetic acid and 100 ml of dioxane is stirred at 100° C. for 24 h. The red solution is concentrated to dryness, the residue is taken up in 1000 ml of DCM, 5 ml of triarylamine is added, and a carbon monoxide stream is passed through the solution at 25° C. with good stirring for 3 h. Then the DCM is distilled off, and the DCM distilled off is replaced continuously by methanol. Finally, the mixture is concentrated under reduced pressure to a volume of about 50 ml, and the product is filtered off with suction, washed three times with 30 ml each time of methanol and dried under reduced pressure. Purification is effected by two chromatography runs on silica gel with DCM/n-heptane (2:1, vv). The product thus obtained can, as described in WO 2016/124304, be purified further by means of hot extraction and heat treatment or fractional sublimation. Yield: 4.42 g (6.3 mmol); 63% of theory; purity: >99.5% by $^{1}$H NMR.

The following compounds can be prepared analogously:

| Ex. | Ligand | Product | Yield |
|---|---|---|---|
| Ir101 | L2 | 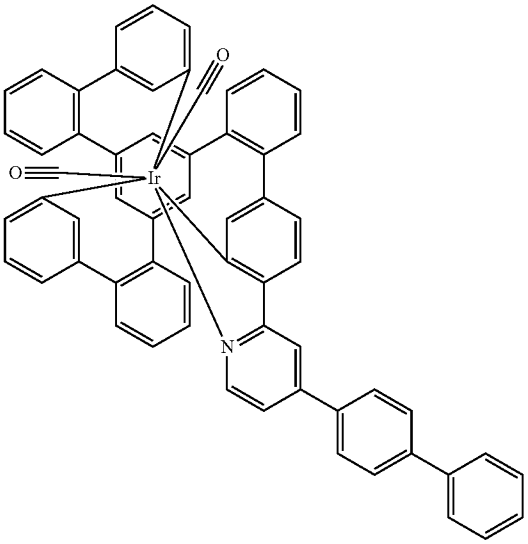 | 48% |

-continued
| Ex. | Ligand | Product | Yield |
|---|---|---|---|
| Ir102 | L3 | 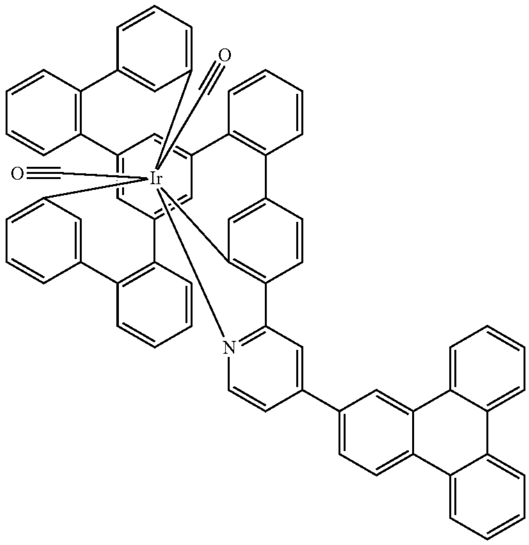 | 45% |
| Ir103 | L4<br>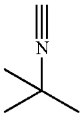<br>7188-38-7<br>25 mmol<br>Rather<br>than CO | 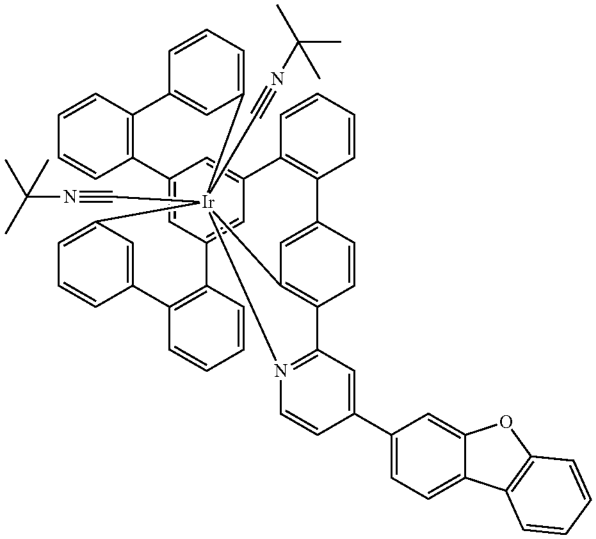 | 49% |
| Ir104 | L100<br>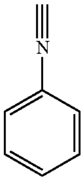<br>931-54-4<br>25 mmol<br>Rather<br>than CO | 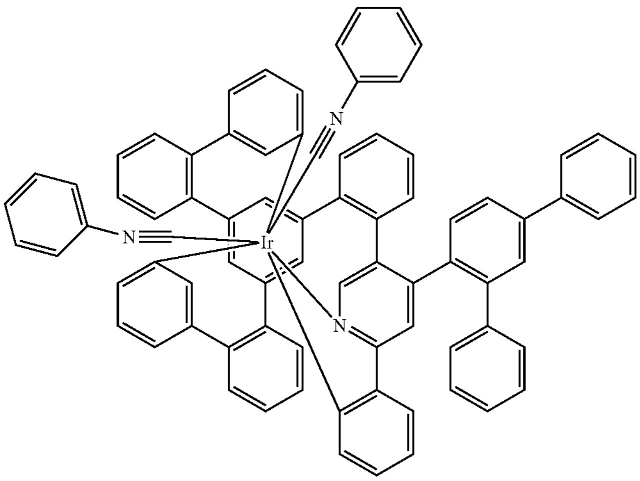 | 37% |

-continued
| Ex. | Ligand | Product | Yield |
|---|---|---|---|
| Ir105 | L101 | 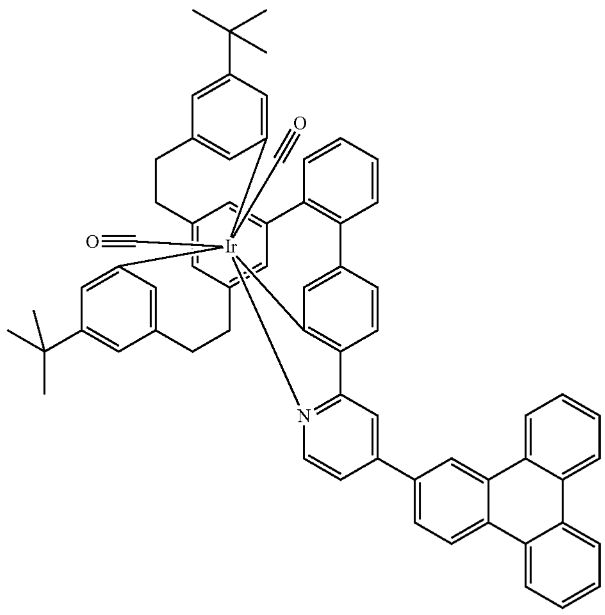 | 55% |
| Ir106 | L200 $PMe_3$ 504-09-2 25 mmol Rather than CO | 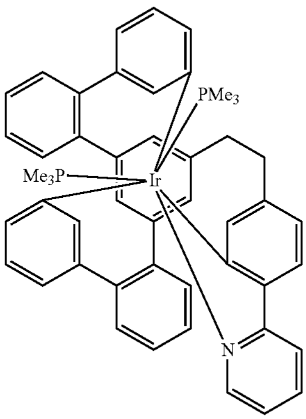 | 51% |

-continued

| Ex. | Ligand | Product | Yield |
|---|---|---|---|
| Ir107 | L300 $PF_3$ 7783-55-3 25 mmol Rather than CO | 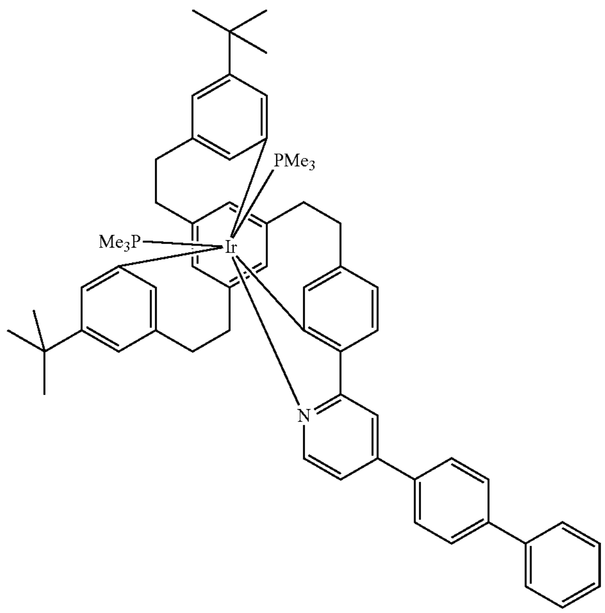 | 37% |

C2: Monoanionic Monodentate Co Ligands

Example Ir200

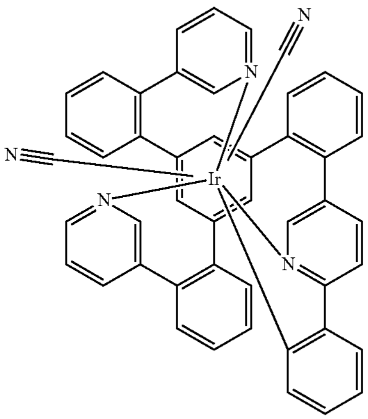

A mixture of 6.14 g (10 mmol) of $L^5$ and 3.53 g (10 mmol) of $IrCl_3 \times 3H_2O$ [13569-57-8], 150 ml of ethoxyethanol and 50 ml of water is heated under reflux for 24 h. The brown suspension is concentrated to dryness, the residue is taken up in 50 ml of DMSO, 1.08 g (22 mmol) of sodium cyanide [143-33-9] is added, and the mixture is stirred at 50° C. for 8 h. After the solvent has been removed under reduced pressure, the residue is taken up in 200 ml of DCM and chromatographed on silica gel. The yellow core fraction (Rf~0.8) is selected, and the DCM is distilled off on a rotary evaporator at water bath temperature 50° C. under standard pressure, continuously replacing the volume of DCM distilled off by addition of EtOH. After the DCM distillation has ended, the mixture is concentrated under reduced pressure to a volume of about 100 ml, the yellow solid is filtered off by means of a double-ended frit, and the solids are washed twice with 50 ml of ethanol each time and dried first in an argon stream and then under reduced pressure ($p \sim 10^{-3}$ mbar, T~100° C.). The product thus obtained can, as described in WO 2016/124304, be purified further by means of hot extraction and fractional sublimation. Yield: 4.06 g (4.7 mmol); 4.7% of theory; purity: >99.5% by $^1H$ NMR and HPLC.

The following compound can be obtained analogously:

| Ex. | Ligand | Product | Yield |
|---|---|---|---|
| Ir201 | L7 | 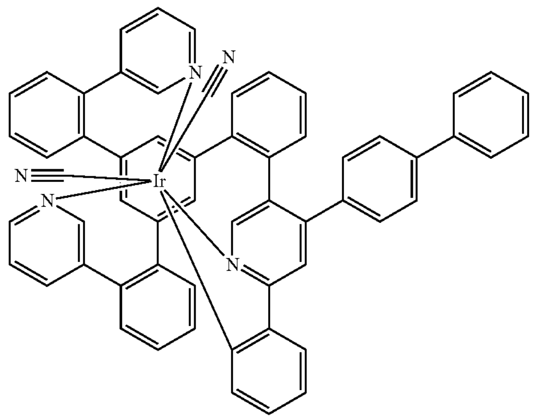 | 43% |

C3: Monoanionic and Uncharged Monodentate Co Ligands

Example Ir300

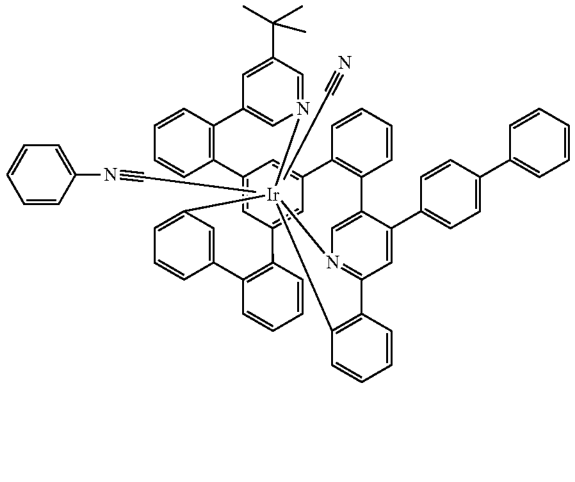

Preparation analogous to C2. Use of 8.21 g (10 mmol) of L13, 490 mg (10 mmol) of NaCN and 1.03 g (10 mmol) of phenylisonitrile [931-54-4]. Yield: 2.65 g (2.3 mmol); 23% of theory, diastereomer mixture; purity: >99.0% by $^{1}$H NMR.

C4: Uncharged Bidentate Co Ligands

Example Ir400

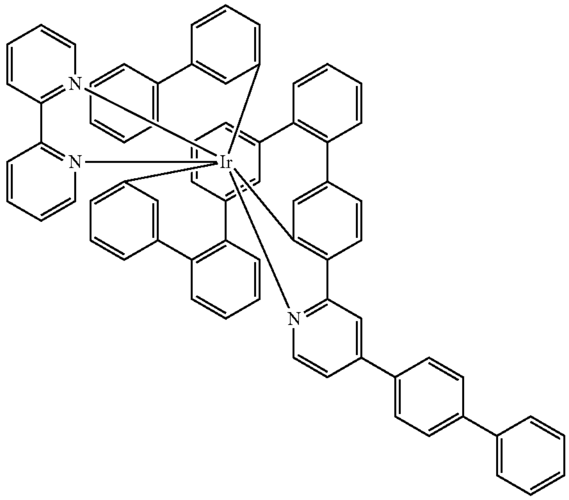

A mixture of 7.64 g (10 mmol) of L2, 4.15 g (10 mmol) of [(1,2,5,6-η)-1,5-cyclooctadiene][(1,2,3,3a,7a-η)-1H-inden-1-yl]iridium (=(Ind)Ir(COD)) [102525-11-1], 100 ml of glacial acetic acid and 100 ml of dioxane is stirred at 100° C. for 24 h. The red solution is concentrated to dryness, the residue is taken up in 100 ml of DCM, 5 ml of triarylamine and then 1.87 g (12 mmol) of 2,2'-bipyridine [366-18-7] are added, and the mixture is stirred for a further 12 h. Then the DCM is distilled off, and the DCM distilled off is replaced continuously by methanol. Finally, the mixture is concentrated under reduced pressure to a volume of about 50 ml, and the product is filtered off with suction, washed three times with 30 ml each time of methanol and dried under reduced pressure. Purification is effected by two chromatography runs on silica gel with DCM/EA (2:1, vv). The product thus obtained can, as described in WO 2016/124304, be purified further by means of hot extraction and heat treatment or fractional sublimation. Yield: 3.67 g (3.3 mmol); 33% of theory; purity: >99.5% by $^{1}$H NMR.

C5: Monoanionic Bidentate Co Ligands

Example Ir500

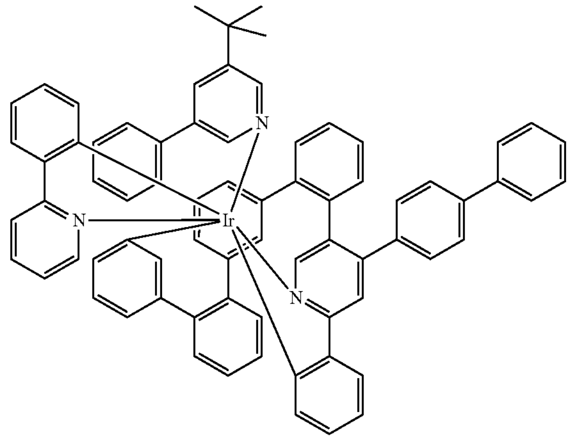

A mixture of 8.21 g (10 mmol) of L13 and 3.53 g (10 mmol) of $IrCl_3 x 3H_2O$ [13569-57-8], 150 ml of ethoxyethanol and 50 ml of water is heated under reflux for 24 h. The brown suspension is concentrated to dryness, the residue is taken up in 100 ml of 2-ethoxyethanol, 7.76 g (50 mmol) of 2-phenylpyridine [1008-89-5] and then 7.71 g (30 mmol) of silver trifluoromethanesulfonate [2923-28-6] are added, and the mixture is stirred at 130° C. for 16 h. The solvent is removed under reduced pressure, the residue is taken up in 300 ml of DCM and filtered through a Celite bed in the form of a DCM slurry, and the DCM is distilled off and replaced continuously with methanol. Finally, the mixture is concentrated to about 100 ml, and the precipitated product is filtered off with suction, washed three times with 30 ml each time of methanol and dried under reduced pressure. Purification is effected by two chromatography runs on silica gel with toluene/DCM (9:1, vv). The product thus obtained can, as described in WO 2016/124304, be purified further by means of hot extraction and heat treatment or fractional sublimation. Yield: Ir500a, Diastereomer1: 2.50 g (2.1 mmol); Ir500b, Diastereomer2: 2.24 g (1.9 mmol); purity: >99.5% by $^1H$ NMR.

C6: Dianionic Bidentate Co Ligands

Example Ir600

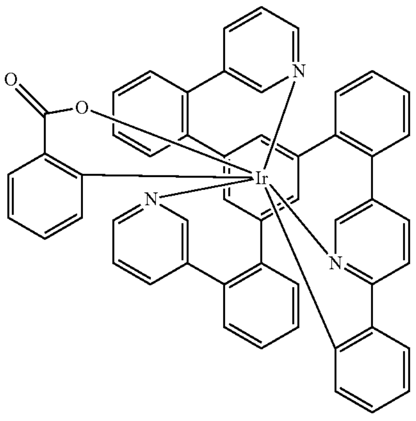

A 1000 ml three-neck flask with magnetic stirrer bar, water separator with reflux condenser and argon blanketing, internal thermometer (Pt-100 thermocouple) and dropping funnel is charged, under an argon atmosphere, with 6.14 g (10 mmol) of ligand L5, 3.53 g (10 mmol) of $IrCl_3 x 3H_2O$ [13569-57-8], 29.45 g (300 mmol) of potassium acetate (anhydrous) [127-08-2], 244 g (2 mol) of benzoic acid [65-85-0] and 9.47 ml (100 mmol) of acetic anhydride [108-24-7]. The reaction mixture is heated rapidly up to 250° C. and then stirred at that temperature for 3 h. The acetic acid distilled off is discharged via the water separator. After 3 h, the reaction mixture is allowed to cool to 130° C., and then 500 ml of methanol is added gradually (caution: delayed boiling possible!). The precipitated product is allowed to sediment, the supernatant is decanted off and transferred with methanol onto a double-ended frit, and the product is filtered off with suction, washed three times with 50 ml of hot methanol and dried under reduced pressure. The solids are suspended in 300 ml of warm DCM for 1 h and then chromatographed with DCM on 300 g of silica gel 60 (Merck). The yellow-orange core fraction (Rf~0.9) is selected, and the DCM is distilled off on a rotary evaporator at water bath temperature 50° C. under standard pressure, continuously replacing the volume of DCM distilled off by addition of EtOH. After the DCM distillation has ended, the mixture is concentrated under reduced pressure to a volume of about 100 ml, the yellow solid is filtered off by means of a double-ended frit, and the solids are washed twice with 50 ml of ethanol each time and dried first in an argon stream and then under reduced pressure ($p \sim 10^{-3}$ mbar, T~100° C.). The product thus obtained can, as described in WO 2016/124304, be purified further by means of hot extraction and fractional sublimation. Yield: 8.5 g (9.00 mmol); 90% of theory; purity: >99.5% by $^1H$ NMR and HPLC.

The following compounds can be prepared analogously:
| Ex. | Ligand | Product | Yield |
| --- | --- | --- | --- |
| Ir-601 | L6<br>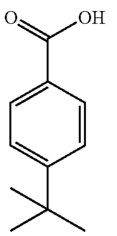<br>98-73-3 | 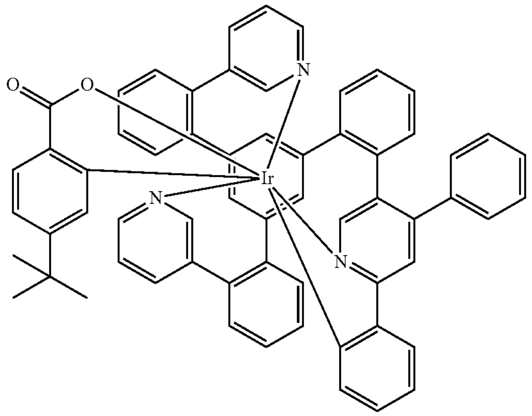 | 67% |
| Ir-602 | L7<br>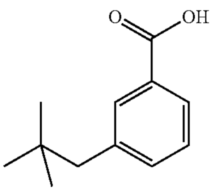<br>67688-80-6 | 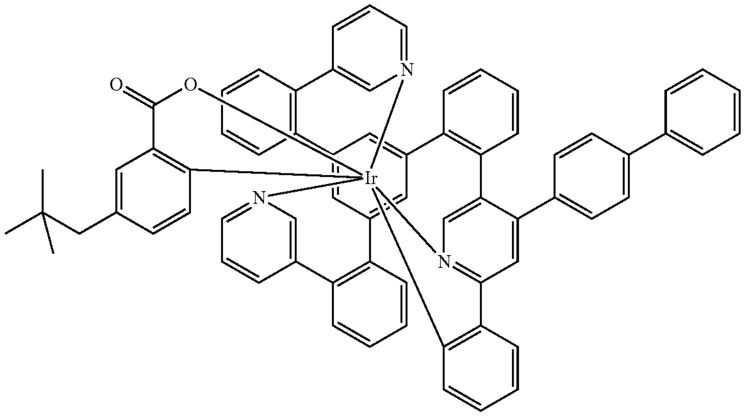 | 70% |
| Ir-603 | L8<br>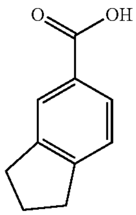<br>65898-38-6 | 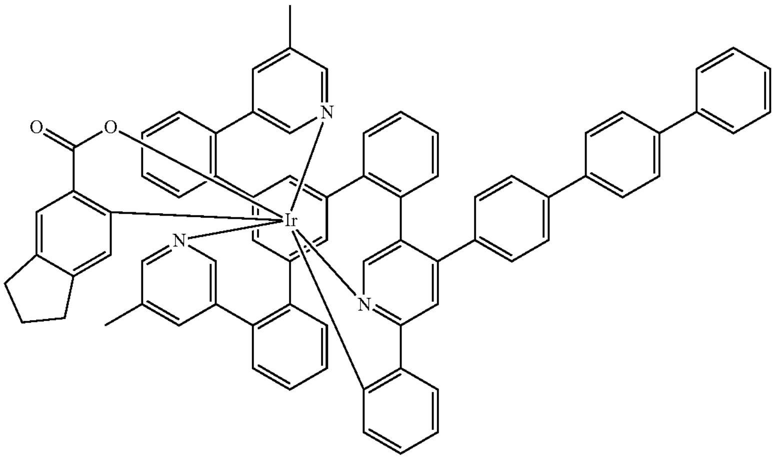 | 64% |

-continued
| Ex. | Ligand | Product | Yield |
|---|---|---|---|
| Ir-604 | L9 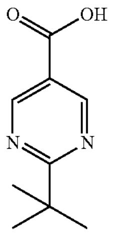 126230-73-7 | 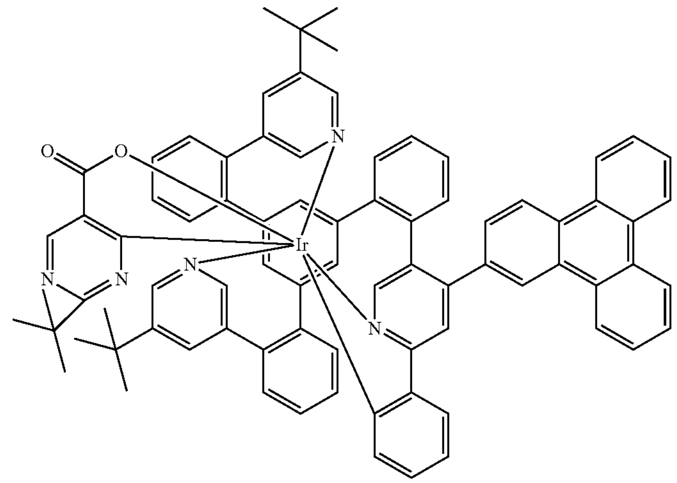 | 34% |
| Ir-605 | L10 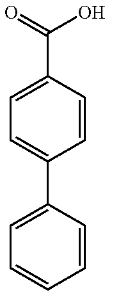 92-92-2 | 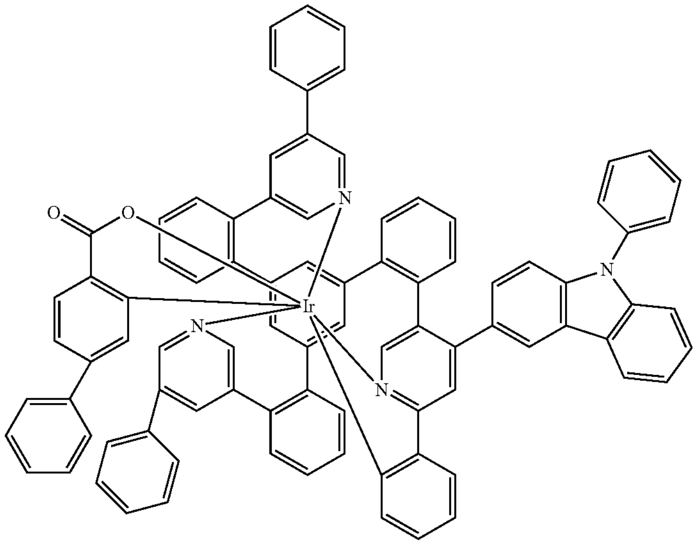 | 67% |
| Ir-606 | L11 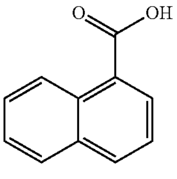 86-55-5 | 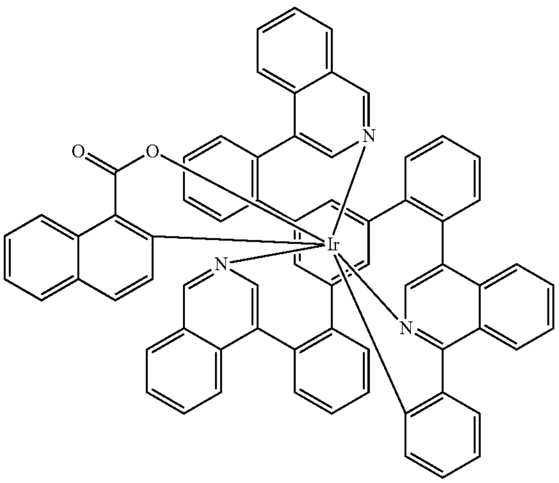 | 63% |

-continued
| Ex. | Ligand | Product | Yield |
|---|---|---|---|
| Ir-607 | L12<br>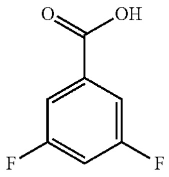<br>455-40-3 | 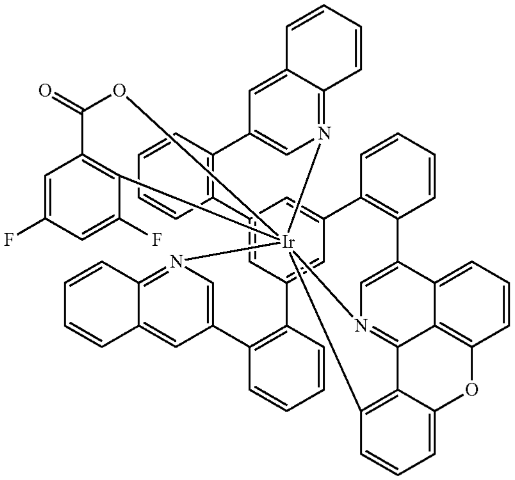 | 48% |
| Ir-608 | L102<br>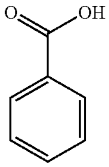<br>65-85-0 | 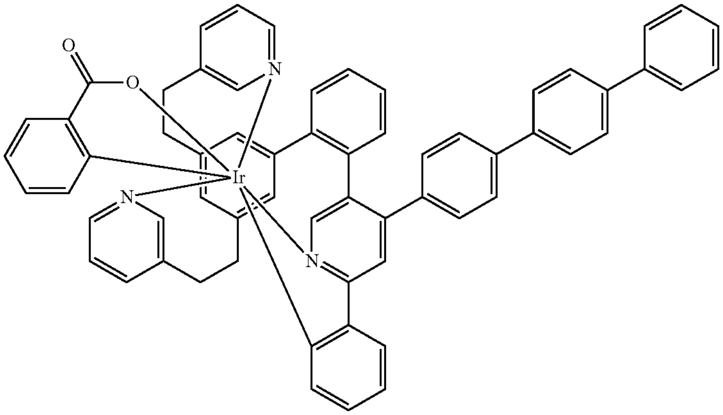 | 77% |
| Ir-609 | L103<br>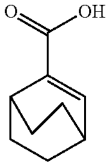<br>16317-22-9 | 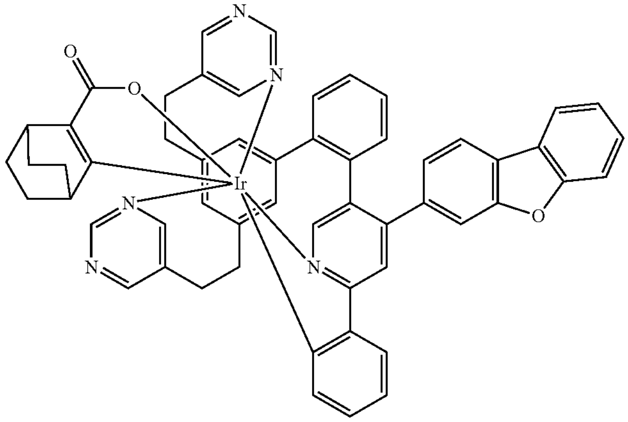 | 60% |

-continued
| Ex. | Ligand | Product | Yield |
|---|---|---|---|
| Ir-610 | L104<br>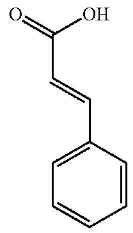<br>140-10-3 | 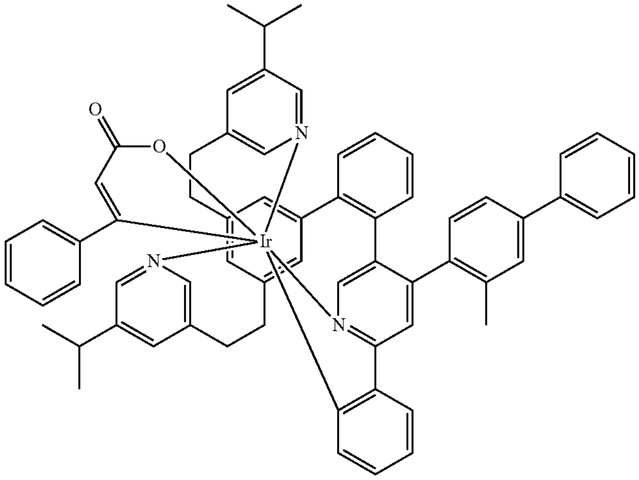 | 38% |
| Ir-611 | L105<br>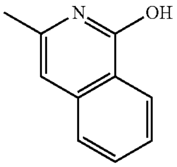<br>7114-80-9 | 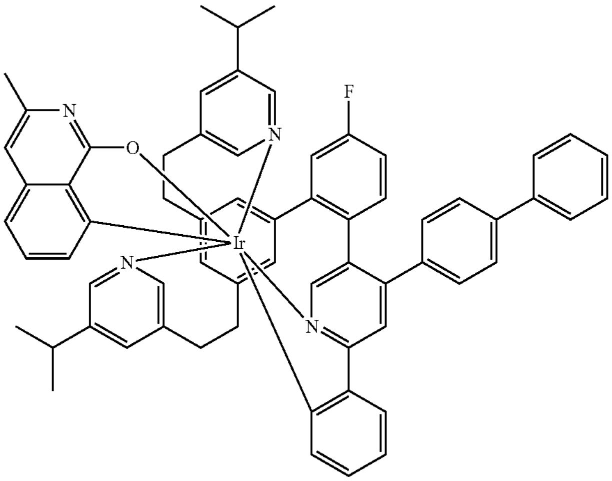 | 55% |
| Ir-612 | L106<br>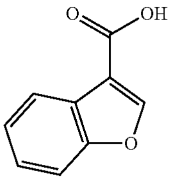<br>26537-68-8 | 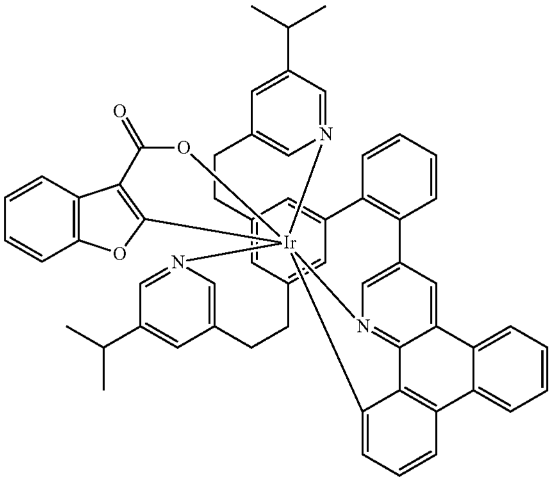 | 22% |

-continued
| Ex. | Ligand | Product | Yield |
|---|---|---|---|
| Ir-613 | L201 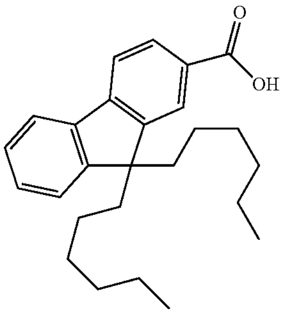 1877288-45-3 | 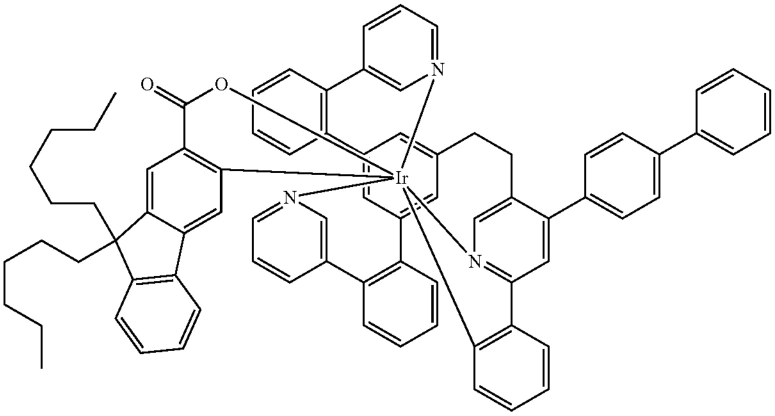 | 69% |
| Ir-614 | L202 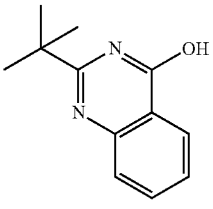 13182-65-5 | 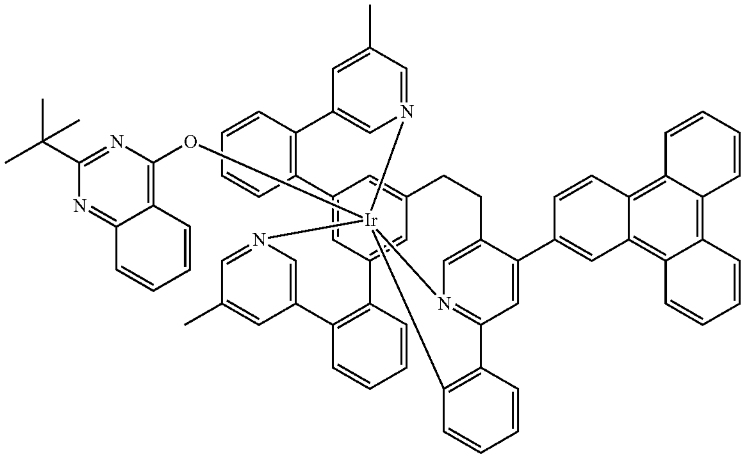 | 55% |
| Ir-615 | L203 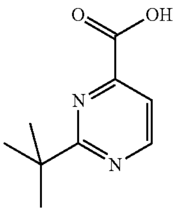 847955-90-2 | 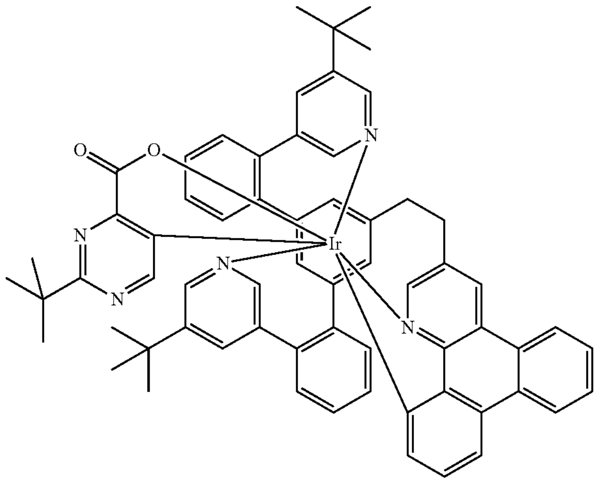 | 61% |

-continued

| Ex. | Ligand | Product | Yield |
|---|---|---|---|
| Ir-616 | L301 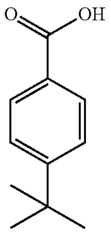 98-73-3 | 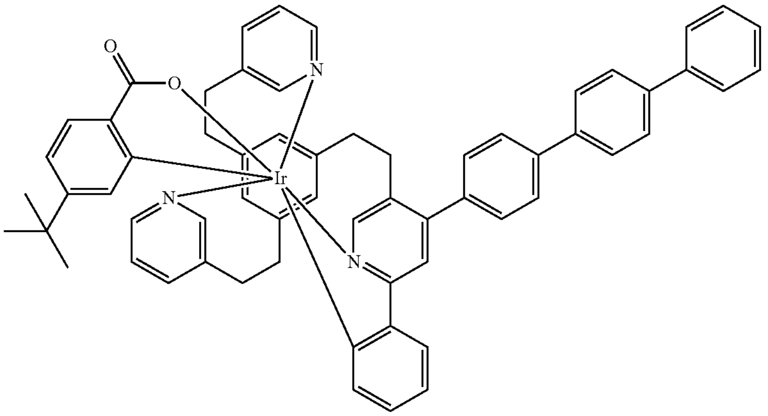 | 67% |
| Ir-617 | L7 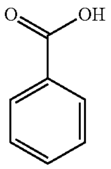 65-85-0 | 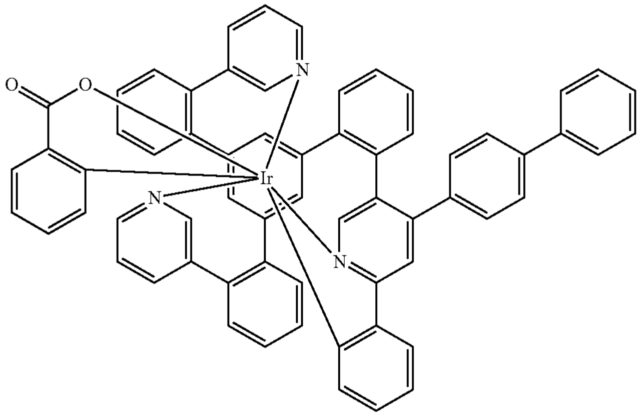 | 70% |
| Ir-618 | L107 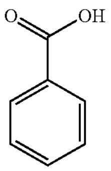 65-85-0 | 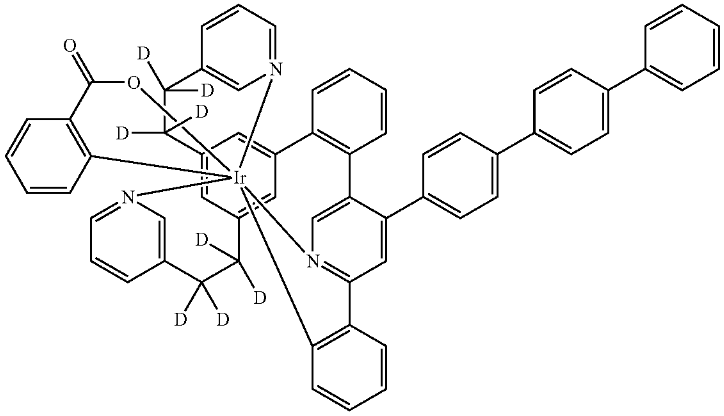 | 77% |

Example: Production of the OLEDs

1) Vacuum-Processed Devices:

OLEDs of the invention and OLEDs according to the prior art are produced by a general method according to WO 2004/058911, which is adapted to the circumstances described here (variation in layer thickness, materials used).

In the examples which follow, the results for various OLEDs are presented. Cleaned glass plates (cleaning in Miele laboratory glass washer, Merck Extran detergent) coated with structured ITO (indium tin oxide) of thickness 50 nm are pretreated with UV ozone for 25 minutes (PR-100 UV ozone generator from UVP) and, within 30 min, for improved processing, coated with 20 nm of PEDOT:PSS (poly(3,4-ethylenedioxythiophene) poly(styrenesulfonate), purchased as CLEVIOS™ P VP AI 4083 from Heraeus Precious Metals GmbH Deutschland, spun on from aqueous solution) and then baked at 180° C. for 10 min. These coated glass plates form the substrates to which the OLEDs are applied.

The OLEDs basically have the following layer structure: substrate/hole injection layer 1 (HIL1) consisting of HTM1 doped with 5% NDP-9 (commercially available from Novaled), 20 nm/hole transport layer 1 (HTL1) consisting of HTM1, 150 nm for blue devices, 215 nm for green/yellow devices, 110 nm for red devices/hole transport layer 2

(HTL2)/emission layer (EML)/hole blocker layer (HBL)/electron transport layer (ETL) and finally a cathode. The cathode is formed by an aluminum layer of thickness 100 nm.

First of all, vacuum-processed OLEDs are described. For this purpose, all the materials are applied by thermal vapor deposition in a vacuum chamber. In this case, the emission layer always consists of at least one matrix material (host material) and an emitting dopant (emitter) which is added to the matrix material(s) in a particular proportion by volume by co-evaporation. Details given in such a form as M1:M2:Ir(L1) (55%:35%:10%) mean here that the material M1 is present in the layer in a proportion by volume of 55%, M2 in a proportion by volume of 35% and Ir(L1) in a proportion by volume of 10%. Analogously, the electron transport layer may also consist of a mixture of two materials. The exact structure of the OLEDs can be found in table 1. The materials used for production of the OLEDs are shown in table 4.

The OLEDs are characterized in a standard manner. For this purpose, the electroluminescence spectra, the current efficiency (measured in cd/A), the power efficiency (measured in lm/W) and the external quantum efficiency (EQE, measured in percent) as a function of luminance, calculated from current-voltage-luminance characteristics (IUL characteristics) assuming Lambertian emission characteristics, and also the lifetime are determined. Electroluminescence spectra are determined at a luminance of 1000 cd/m$^2$, and these are used to calculate the CIE 1931 x and y color coordinates. The OLEDs can initially also be operated at different starting luminances. The values for the lifetime can then be converted to a figure for other starting luminances with the aid of conversion formulae known to those skilled in the art.

Use of Compounds of the Invention as Emitter Materials in Phosphorescent OLEDs

One use of the compounds of the invention is as phosphorescent emitter materials in the emission layer in OLEDs. The results for the OLEDs are collated in table 2.

TABLE 1

Structure of the OLEDs

| Ex. | HTL2 thickness | EML thickness | HBL thickness | ETL thickness |
|---|---|---|---|---|
| D1 | HTM3 20 nm | M3:M4:Ir101 (30%:60%:10%) 30 nm | ETM1 10 nm | ETM1:ETM2 (50%:50%) 30 nm |
| D2 | HTM2 10 nm | M1:M2:Ir201 (30%:60%:10%) 30 nm | ETM1 10 nm | ETM1:ETM2 (50%:50%) 30 nm |
| D3 | HTM2 10 nm | M1:M2:Ir500a (60%:30%:10%) 30 nm | ETM1 10 nm | ETM1:ETM2 (50%:50%) 30 nm |
| D4 | HTM2 10 nm | M1:M2:Ir608 (45%:45%:10%) 30 nm | ETM1 10 nm | ETM1:ETM2 (50%:50%) 30 nm |
| D5 | HTM2 10 nm | M1:M2:Ir617 (45%:45%:10%) 30 nm | ETM1 10 nm | ETM1:ETM2 (50%:50%) 30 nm |

TABLE 2

Results for the vacuum-processed OLEDs

| Ex. | EQE (%) 1000 cd/m$^2$ | Voltage (V) 1000 cd/m$^2$ | CIE x/y 1000 cd/m$^2$ |
|---|---|---|---|
| D1 | 23.2 | 3.6 | 0.16/0.35 |
| D2 | 25.7 | 3.1 | 0.32/0.63 |
| D3 | 23.8 | 3.0 | 0.51/0.48 |
| D4 | 27.3 | 3.1 | 0.52/0.48 |
| D5 | 27.9 | 3.0 | 0.56/0.43 |

Solution-Processed Devices:

A: From Soluble Functional Materials of Low Molecular Weight

The iridium complexes of the invention can also be processed from solution and lead therein to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer (PEDOT:PSS from Clevios™) is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport, with use of HL-X from Merck in this case. The interlayer may alternatively also be replaced by one or more layers which merely have to fulfill the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/l when, as here, the layer thickness of 60 nm which is typical of a device is to be achieved by means of spin-coating. The solution-processed devices contain an emission layer composed of M5:M6:IrL (20%:55%:25%). The emission layer is spun on in an inert gas atmosphere, argon in the present case, and baked at 160° C. for 10 min. Vapor-deposited above the latter are the hole blocker layer (10 nm ETM1) and the electron transport layer (40 nm ETM1 (50%)/ETM2 (50%)) (vapor deposition systems from Lesker or the like, typical vapor deposition pressure 5×10$^{-6}$ mbar). Finally, a cathode of aluminum (100 nm) (high-purity metal from Aldrich) is applied by vapor deposition. In order to protect the device from air and air humidity, the device is finally encapsulated and then characterized. The OLED examples cited have not yet been optimized. Table 3 summarizes the data obtained.

TABLE 3
| Results with materials processed from solution | | | | |
|---|---|---|---|---|
| Ex. | Emitter Device | EQE (%) 1000 cd/m$^2$ | Voltage (V) 1000 cd/m$^2$ | CIE x/y 1000 cd/m$^2$ |
| Sol-D1 | Ir107 | 20.0 | 4.6 | 0.28/0.60 |
| Sol-D2 | Ir300 | 19.3 | 4.5 | 0.48/0.51 |
| Sol-D3 | Ir400 | 16.2 | 4.7 | 0.56/0.41 |
| Sol-D4 | Ir602 | 21.8 | 4.5 | 0.56/0.43 |
| Sol-D5 | Ir606 | 20.7 | 4.4 | 0.66/0.34 |
| Sol-D6 | Ir613 | 19.8 | 4.6 | 0.47/0.49 |
| Sol-D7 | Ir616 | 21.5 | 4.4 | 0.49/0.50 |
TABLE 4
Structural formulae of the materials used
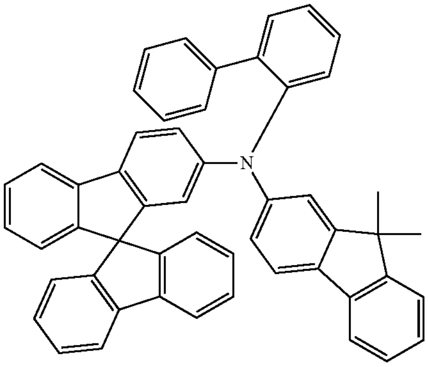 [SMILES: CC1(C)c2ccccc2-c2ccc(N(c3ccc4c(c3)C3(c5ccccc5-c5ccccc53)c3ccccc3-4)c3ccccc3-c3ccccc3)cc21]
HTM1
[136463-07-5]
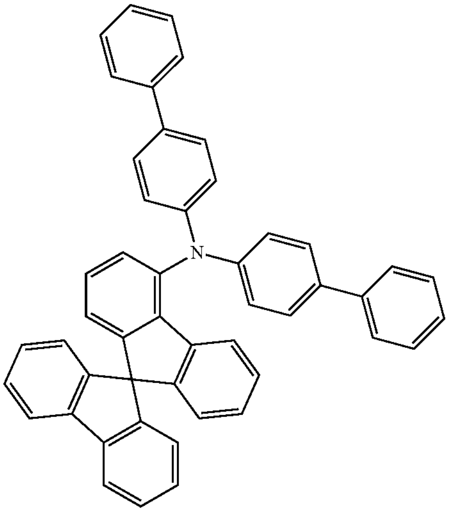 [SMILES: c1ccc(-c2ccc(N(c3ccc(-c4ccccc4)cc3)c3cccc4c3-c3ccccc3C43c4ccccc4-c4ccccc43)cc2)cc1]
HTM2
[140933-43-3]
TABLE 4-continued
Structural formulae of the materials used
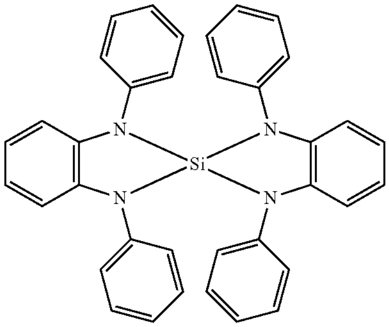 [SMILES: c1ccc(N2c3ccccc3N(c3ccccc3)[Si]23N(c2ccccc2)c2ccccc2N3c2ccccc2)cc1]
HTM3
[1206465-62-4]
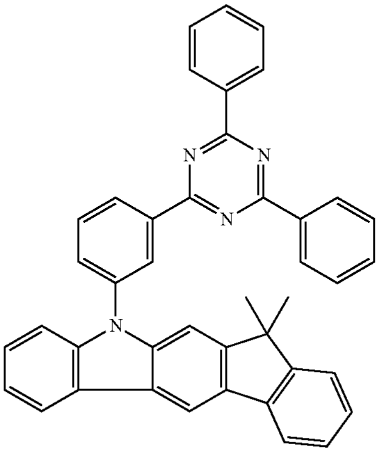 [SMILES: CC1(C)c2ccccc2-c2cc3c4ccccc4n(-c4cccc(-c5nc(-c6ccccc6)nc(-c6ccccc6)n5)c4)c3cc21]
M1
[1257248-13-7]
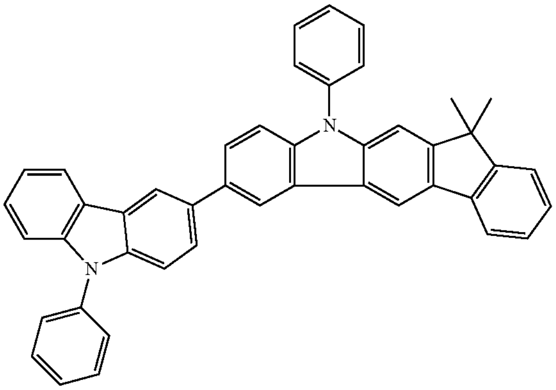 [SMILES: CC1(C)c2ccccc2-c2cc3c4cc(-c5ccc6c(c5)c5ccccc5n6-c5ccccc5)ccc4n(-c4ccccc4)c3cc21]
M2
[1357150-54-9]

TABLE 4-continued
Structural formulae of the materials used
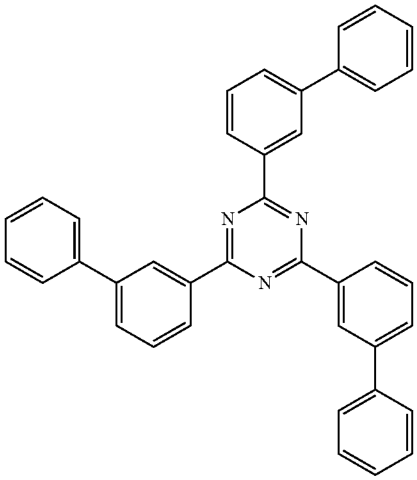 [SMILES: c1ccc(-c2cccc(-c3nc(-c4cccc(-c5ccccc5)c4)nc(-c4cccc(-c5ccccc5)c4)n3)c2)cc1]
M3
[1201800-83-0]
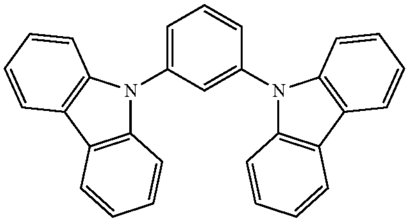 [SMILES: c1cc(-n2c3ccccc3c3ccccc32)cc(-n2c3ccccc3c3ccccc32)c1]
M4
[550378-78-4]
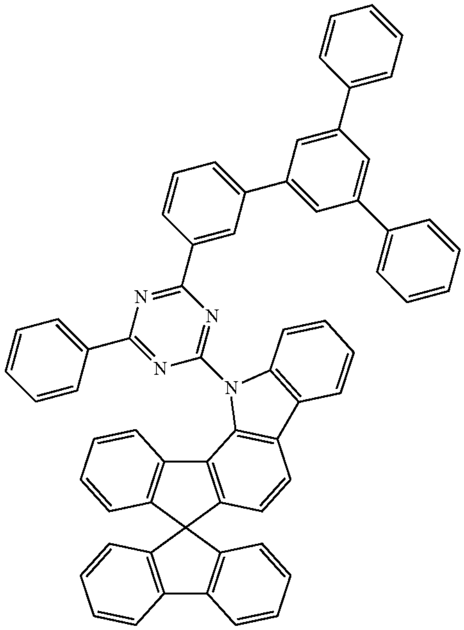 [SMILES: c1ccc(-c2cc(-c3ccccc3)cc(-c3cccc(-c4nc(-c5ccccc5)nc(-n5c6ccccc6c6ccc7c(c65)-c5ccccc5C75c6ccccc6-c6ccccc65)n4)c3)c2)cc1]
M5
[1616231-60-7]
TABLE 4-continued
Structural formulae of the materials used
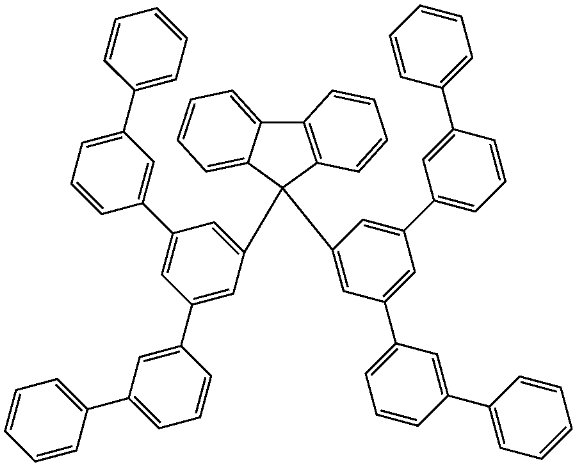 [SMILES: c1ccc(-c2cccc(-c3cc(-c4cccc(-c5ccccc5)c4)cc(C4(c5cc(-c6cccc(-c7ccccc7)c6)cc(-c6cccc(-c7ccccc7)c6)c5)c5ccccc5-c5ccccc54)c3)c2)cc1]
M6
[1246496-85-4]
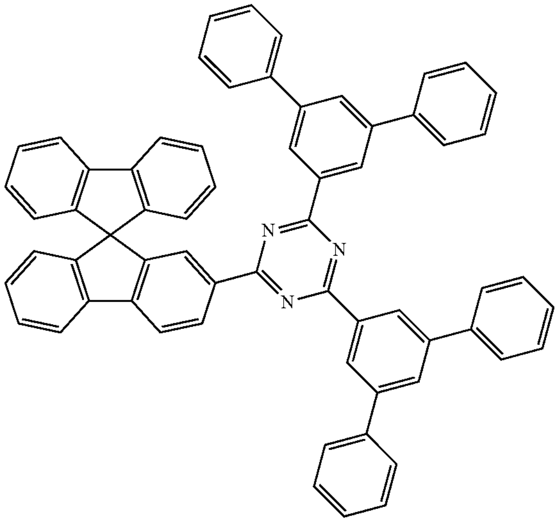 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ETM1 = M10
[1233200-52-6]
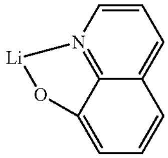
ETM2
[25387-93-3]

The invention claimed is:

1. A compound of formula (1)

Formula (1)

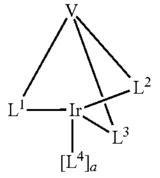

where the symbols and indices used are as follows:

$L^1$ is a bidentate subligand which coordinates to the iridium via one carbon atom and one nitrogen atom or via two carbon atoms;

$L^2$, $L^3$ are the same or different at each instance and are monodentate subligands selected from an aryl or heteroaryl group having 5 to 14 aromatic ring atoms or a heteroalicyclic group having 5 to 7 ring atoms, each of which coordinates to the iridium via a carbon atom or a nitrogen atom, each of which is part of the aryl or heteroaryl group or the heteroalicyclic group, and which may be substituted by one or more R radicals;

$L^4$ is a bidentate ligand or is the same or different at each instance and is a monodentate ligand;

a is 1 when $L^4$ is a bidentate ligand, and is 2 when $L^4$ is a monodentate ligand;

V is a group of formula (2) or (3)

Formula (2)

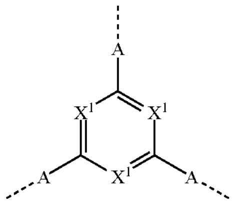

Formula (3)

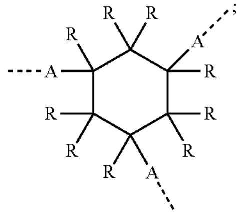

where the dotted bonds each represent the position of linkage to the subligands $L^1$, $L^2$ and $L^3$, and in addition:

A is the same or different at each instance and is $CR_2$—$CR_2$ or a group of the following formula (4):

Formula (4)

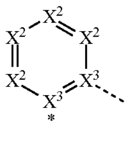

where the dotted bond in each case represents the position of the bond of the subligands $L^1$, $L^2$ or $L^3$ and * represents the position of the linkage of the unit of the formula (4) to the central trivalent aryl or heteroaryl group in formula (2) or to the central cyclohexane group in formula (3);

$X^1$ is the same or different at each instance and is CR or N;

$X^2$ is the same or different at each instance and is CR or N; or two adjacent $X^2$ groups together are NR, O or S, thus forming a five-membered ring, and the remaining $X^2$ groups are the same or different at each instance and are CR or N; or two adjacent $X^2$ groups together are CR or N when one of the $X^3$ groups in the cycle is N, thus forming a five-membered ring, and the remaining $X^2$ groups are the same or different at each instance and are CR or N; with the proviso that not more than two adjacent $X^2$ groups in each ring are N;

$X^3$ is C at each instance in the same cycle or one $X^3$ group is N and the other $X^3$ group in the same cycle is C; with the proviso that two adjacent $X^2$ groups together are CR or N when one of the $X^3$ groups in the cycle is N;

R is the same or different at each instance and is H, D, F, Cl, Br, I, $N(R^1)_2$, $OR^1$, $SR^1$, CN, $NO_2$, COOH, C(═O)$N(R^1)_2$, $Si(R^1)_3$, $Ge(R^1)_3$, $B(OR^1)_2$, C(═O)$R^1$, P(═O)$(R^1)_2$, S(═O)$R^1$, S(═O)$_2R^1$, $OSO_2R^1$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^1$ radicals and where one or more nonadjacent $CH_2$ groups may be replaced by $Si(R^1)_2$, C═O, $NR^1$, O, S or $CONR^1$, or an aromatic or heteroaromatic ring system which has 5 to 40 aromatic ring atoms and may be substituted in each case by one or more $R^1$ radicals; at the same time, two R radicals together may also form a ring system;

$R^1$ is the same or different at each instance and is H, D, F, Cl, Br, I, $N(R^2)_2$, $OR^2$, $SR^2$, CN, $NO_2$, $Si(R^2)_3$, $Ge(R^2)_3$, $B(OR^2)_2$, C(═O)$R^2$, P(═O)$(R^2)_2$, S(═O)$R^2$, S(═O)$_2R^2$, $OsO_2R^2$, a straight-chain alkyl group having 1 to 20 carbon atoms or an alkenyl or alkynyl group having 2 to 20 carbon atoms or a branched or cyclic alkyl group having 3 to 20 carbon atoms, where the alkyl, alkenyl or alkynyl group may in each case be substituted by one or more $R^2$ radicals and where one or more nonadjacent $CH_2$ groups may be replaced by $Si(R^2)_2$, C═O, $NR^2$, O, S or $CONR^2$, or an aromatic or heteroaromatic ring system which has 5 to 40 aromatic ring atoms and may be substituted in each case by one or more $R^2$ radicals; at the same time, two or more $R^1$ radicals together may form a ring system;

$R^2$ is the same or different at each instance and is H, D, F or an aliphatic, aromatic and/or heteroaromatic organic radical, especially a hydrocarbyl radical, having 1 to 20 carbon atoms, in which one or more hydrogen atoms may also be replaced by F.

2. The compound as claimed in claim 1, wherein the group of the formula (2) is represented by formula (2a) and in that the group of the formula (3) is represented by formula (3a):

Formula (2a)

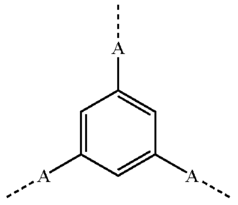

-continued

Formula (3a)

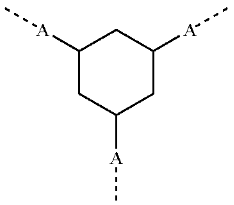

where the symbols have the definitions given in claim 1.

3. The compound as claimed in claim 1, wherein the group of the formula (4) is represented by formula (4'):

Formula (4')

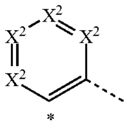

where the symbols have the definitions detailed in claim 1 and $X^2$ is the same or different at each instance and is CR.

4. The compound as claimed in claim 3, wherein all three A groups are the same group of the formula (4') with $X^2$=CR, or in that two A groups are the same group of the formula (4') with $X^2$=CR and the third A group is $CR_2$—$CR_2$, or in that one A group is a group of the formula (4') with $X^2$=CR and the two other A groups are the same $CR_2$—$CR_2$ group, or in that all three A groups are the same $CR_2$—$CR_2$ group.

5. The compound as claimed in claim 1, wherein the group of the formula (2) is selected from the groups of the formulae (2a-1) to (2d-1) and in that the group of the formula (3) is selected from the groups of the formulae (3a-1) to (3d-1):

Formula (2a-1)

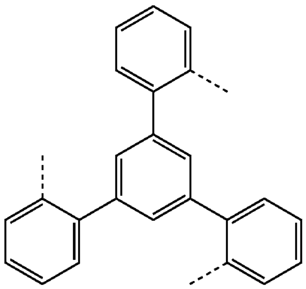

Formula (2b-1)

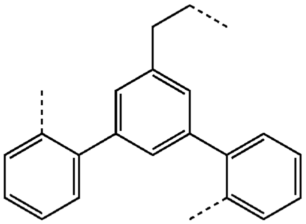

-continued

Formula (2c-1)

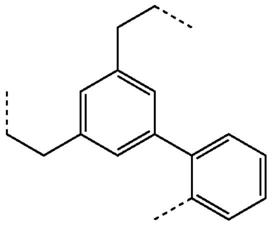

Formula (2d-1)

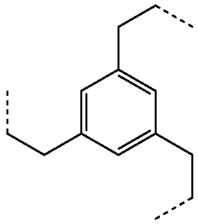

Formula (3a-1)

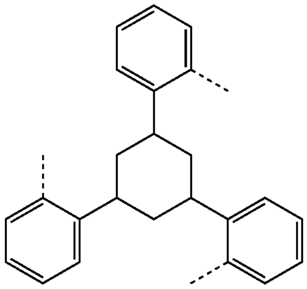

Formula (3b-1)

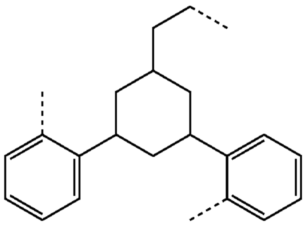

Formula (3c-1)

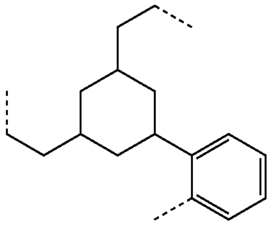

Formula (3d-1)

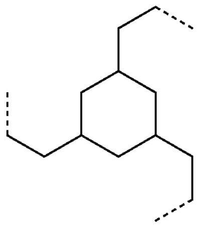

where the symbols have the definitions given in claim 1.

6. The compound as claimed in claim 1, wherein the subligand $L^1$ has a structure of one of the following formulae ($L^1$-1) and ($L^1$-2):

Formula ($L^1$-1)

Formula ($L^1$-2)

where the dotted bond represents the bond of the subligand $L^1$ to V and the other symbols are as follows:

CyC is the same or different at each instance and is a substituted or unsubstituted aryl or heteroaryl group which has 5 to 14 aromatic ring atoms and coordinates in each case to the iridium via a carbon atom and which is bonded to CyD via a covalent bond;

CyD is the same or different at each instance and is a substituted or unsubstituted heteroaryl group which has 5 to 14 aromatic ring atoms or a substituted or unsubstituted heteroalicyclic group having 5 to 7 ring atoms, each of which coordinates to the iridium via a nitrogen atom or via a carbene carbon atom and which is bonded to CyC via a covalent bond;

at the same time, two or more of the optional substituents together may form a ring system.

7. The compound as claimed in claim 6, wherein CyC is selected from the structures of the formulae (CyC-1) to (CyC-20), where the CyC group binds in each case at the position identified by # to CyD and at the position identified by * to the iridium:

(CyC-1)

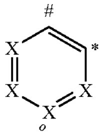

(CyC-2)

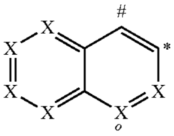

(CyC-3)

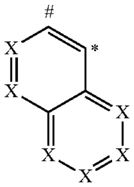

(CyC-4)

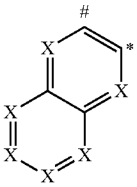

-continued (CyC-5)

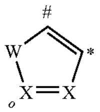

(CyC-6)

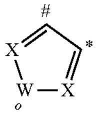

(CyC-7)

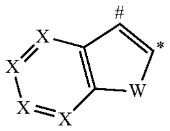

(CyC-8)

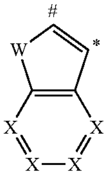

(CyC-9)

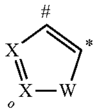

(CyC-10)

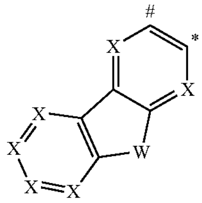

(CyC-11)

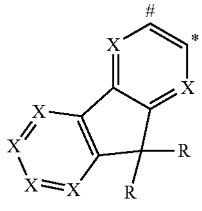

(CyC-12)

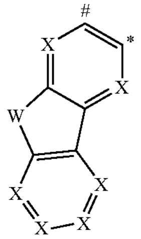

-continued
(CyC-13)
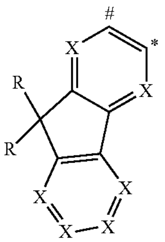
(CyC-14)
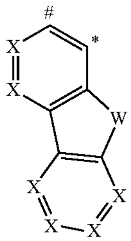
(CyC-15)
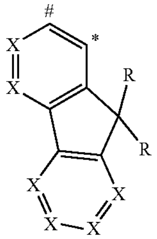
(CyC-16)
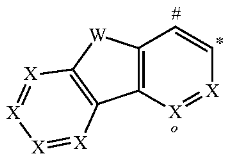
(CyC-17)
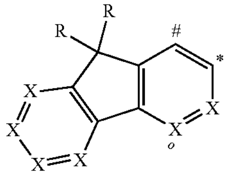
(CyC-18)
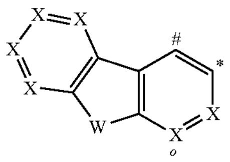
(CyC-19)
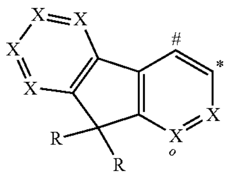
-continued
(CyC-20)
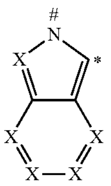
and in that CyD is selected from the structures of the formulae (CyD-1) to (CyD-23), where the CyD group binds in each case at the position identified by # to CyC and coordinates at the position identified by * to the iridium,
(CyD-1)
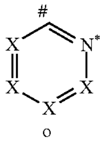
(CyD-2)
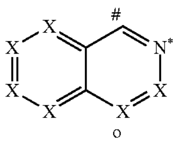
(CyD-3)
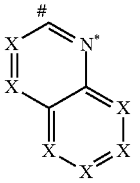
(CyD-4)
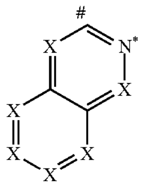
(CyD-5)
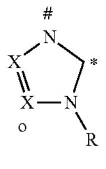
(CyD-6)
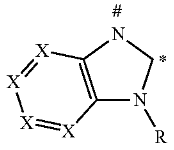
(CyD-7)
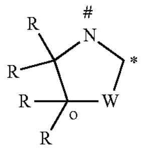

-continued
(CyD-8)
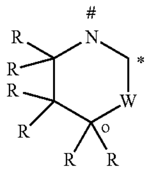
(CyD-9)
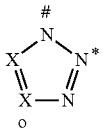
(CyD-10)
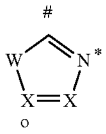
(CyD-11)
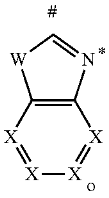
(CyD-12)
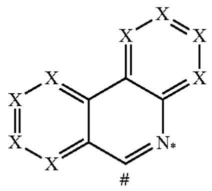
(CyD-13)
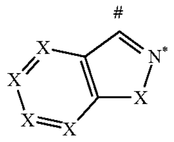
(CyD-14)
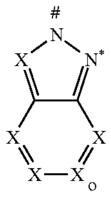
(CyD-15)
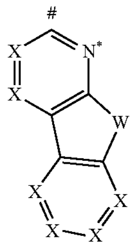
-continued
(CyD-16)
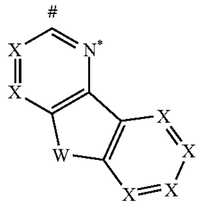
(CyD-17)
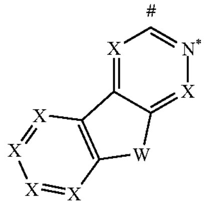
(CyD-18)
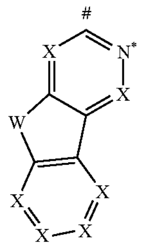
(CyD-19)
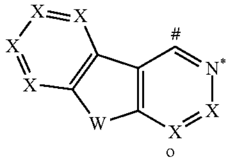
(CyD-20)
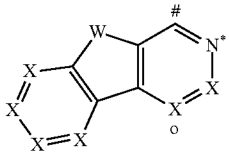
(CyD-21)
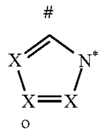
(CyD-22)
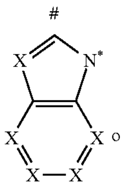
(CyD-23)
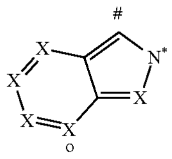

wherein

X is the same or different at each instance and is CR or N, with the proviso that at most two symbols X per ring are N;

W is the same or different at each instance and is NR, O or S, and in CyD may additionally also be $CR_2$;

with the proviso that the symbol X bonded to the bridge Vis C, where the bond to the bridge V is preferably via the position marked "o".

8. The compound as claimed in claim 1, wherein $L^1$ is selected from the structures of the formulae ($L^1$-1-1) to ($L^1$-1-3) and ($L^1$-2-1) to ($L^1$-2-5) that coordinate to the iridium via the two positions identified by *:

($L^1$-1-1)

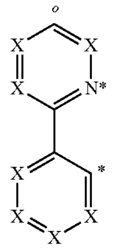

($L^1$-1-2)

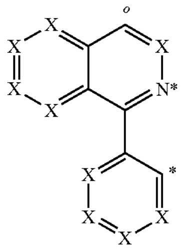

($L^1$-1-3)

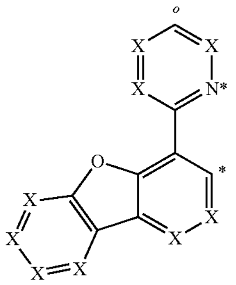

($L^1$-2-1)

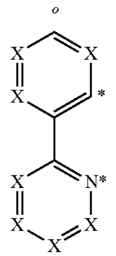

-continued ($L^1$-2-2)

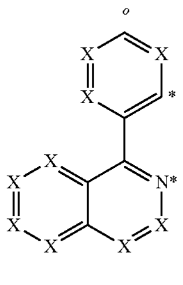

($L^1$-2-3)

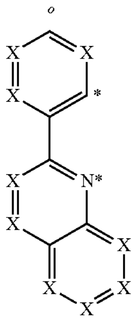

($L^1$-2-4)

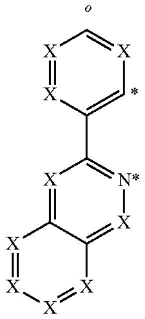

($L^1$-2-5)

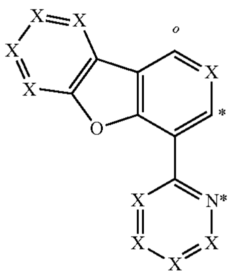

where the symbols have the definitions given in claim 1 and "o" represents the position of the bond to the bridge V, or in that $L^1$ is selected from the structures of the formula ($L^1$-39) or ($L^1$-40) that coordinate to the iridium by the two positions identified by *:

$(L^1\text{-}39)$

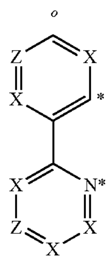

$(L^1\text{-}40)$

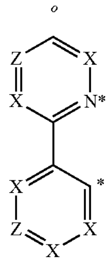

where "o" denotes the position of linkage to the bridge V, and in addition:

X is the same or different at each instance and is CR or N;

Z is CR', CR or N, with the proviso that exactly one Z is CR' and the other Z is CR or N;

where a maximum of one symbol X or Z in total per cycle is N;

R' is a group of the following formula (16) or (17):

Formula (16)

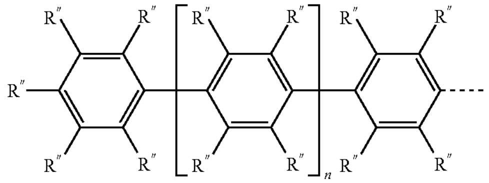

Formula (17)

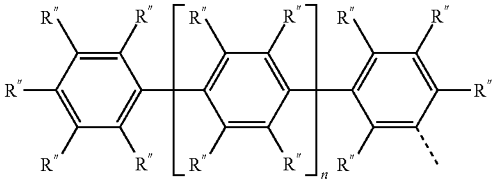

where the dotted bond indicates the linkage of the group to the subligands of the formula $(L^1\text{-}39)$ or $(L^1\text{-}40)$;

R" is the same or different at each instance and is H, D, F, CN, a straight-chain alkyl group having 1 to 10 carbon atoms in which one or more hydrogen atoms may also be replaced by D or F, or a branched or cyclic alkyl group having 3 to 10 carbon atoms in which one or more hydrogen atoms may also be replaced by D or F, or an alkenyl group having 2 to 10 carbon atoms in which one or more hydrogen atoms may also be replaced by D or F; at the same time, two adjacent R" radicals or two R" radicals on adjacent phenyl groups together may also form a ring system; or two R" on adjacent phenyl groups together are a group selected from $C(R^1)_2$, $NR^1$, O or S, such that the two phenyl rings together with the bridging group are a carbazole, fluorene, dibenzofuran or dibenzothiophene, and the further R" are as defined above;

n is 0, 1, 2, 3, 4 or 5.

9. The compound as claimed in claim 1, wherein $L^2$ and $L^3$ are the same or different at each instance and are selected from the structures of the formulae $(L^2\text{-}1)/(L^3\text{-}1)$ to $(L^2\text{-}55)/(L^3\text{-}55)$, where the groups each coordinate to the iridium at the position identified by * and to the bridgehead V at the position identified by "o":

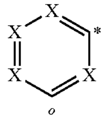

$(L^2\text{-}1)$
$(L^3\text{-}1)$

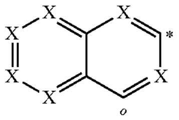

$(L^2\text{-}2)$
$(L^3\text{-}2)$

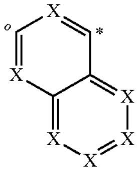

$(L^2\text{-}3)$
$(L^3\text{-}3)$

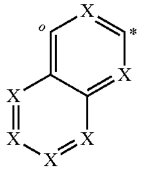

$(L^2\text{-}4)$
$(L^3\text{-}4)$

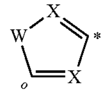

$(L^2\text{-}5)$
$(L^3\text{-}5)$

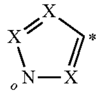

$(L^2\text{-}6)$
$(L^3\text{-}6)$

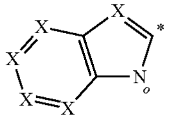

$(L^2\text{-}7)$
$(L^3\text{-}7)$

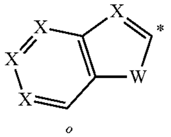

$(L^2\text{-}8)$
$(L^3\text{-}8)$

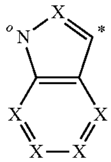

$(L^2\text{-}9)$
$(L^3\text{-}9)$

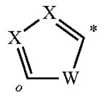

$(L^2\text{-}10)$
$(L^3\text{-}10)$

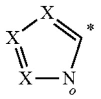

$(L^2\text{-}11)$
$(L^3\text{-}11)$

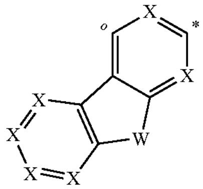

$(L^2\text{-}12)$
$(L^3\text{-}12)$

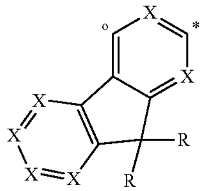

$(L^2\text{-}13)$
$(L^3\text{-}13)$

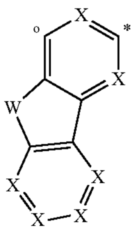

$(L^2\text{-}14)$
$(L^3\text{-}14)$

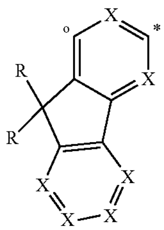

$(L^2\text{-}15)$
$(L^3\text{-}15)$

-continued

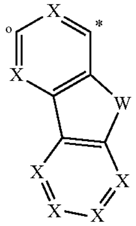

($L^2$-16)
($L^3$-16)

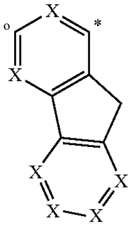

($L^2$-17)
($L^3$-17)

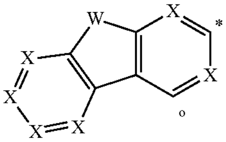

($L^2$-18)
($L^3$-18)

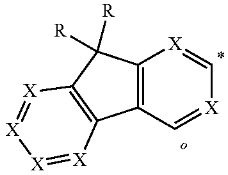

($L^2$-19)
($L^3$-19)

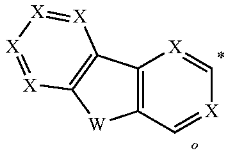

($L^2$-20)
($L^3$-20)

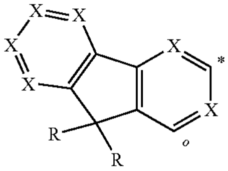

($L^2$-21)
($L^3$-21)

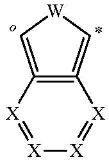

($L^2$-22)
($L^3$-22)

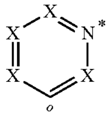

($L^2$-23)
($L^3$-23)

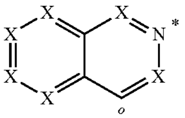

($L^2$-24)
($L^3$-24)

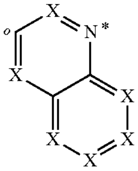

($L^2$-25)
($L^3$-25)

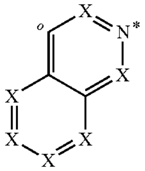

($L^2$-26)
($L^3$-26)

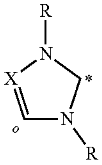

($L^2$-27)
($L^3$-27)

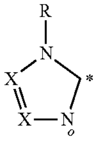

($L^2$-28)
($L^3$-28)

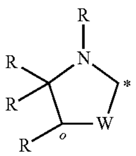

($L^2$-29)
($L^3$-29)

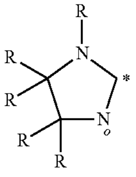

($L^2$-30)
($L^3$-30)

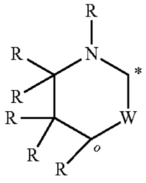

($L^2$-31)
($L^3$-31)

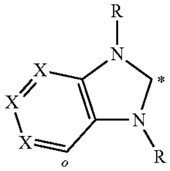

($L^2$-32)
($L^3$-32)

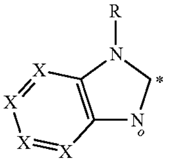

($L^2$-33)
($L^3$-33)

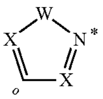

($L^2$-34)
($L^3$-34)

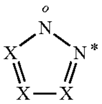

($L^2$-35)
($L^3$-35)

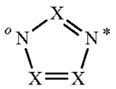

($L^2$-36)
($L^3$-36)

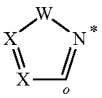

($L^2$-37)
($L^3$-37)

-continued

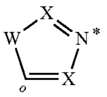

($L^2$-38)
($L^3$-38)

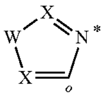

($L^2$-39)
($L^3$-39)

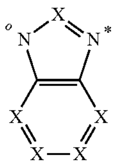

($L^2$-40)
($L^3$-40)

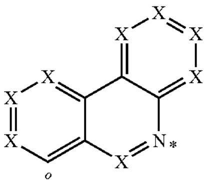

($L^2$-41)
($L^3$-41)

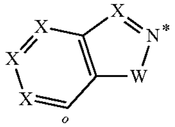

($L^2$-42)
($L^3$-42)

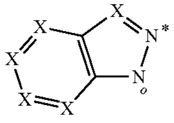

($L^2$-43)
($L^3$-43)

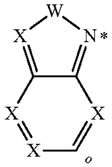

($L^2$-44)
($L^3$-44)

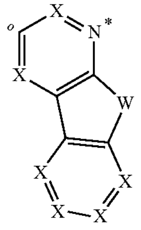

($L^2$-45)
($L^3$-45)

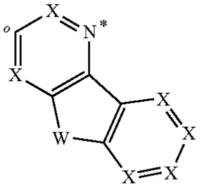

($L^2$-46)
($L^3$-46)

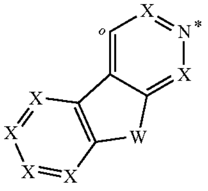

($L^2$-47)
($L^3$-47)

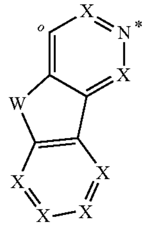

($L^2$-48)
($L^3$-48)

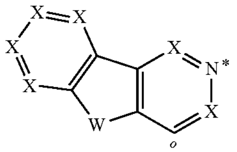

($L^2$-49)
($L^3$-49)

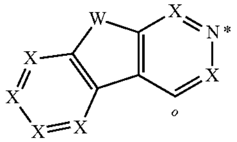

($L^2$-50)
($L^3$-50)

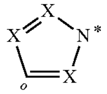

($L^2$-51)
($L^3$-51)

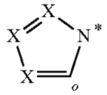

($L^2$-52)
($L^3$-52)

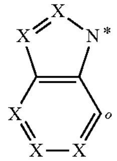

($L^2$-53)
($L^3$-53)

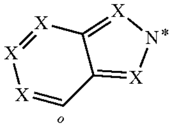

($L^2$-54)
($L^3$-54)

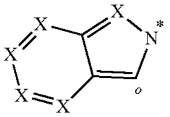

($L^2$-55)
($L^3$-55)

where R has the definitions given in claim 1 and the other symbols are as follows:

X is the same or different at each instance and is CR or N, with the proviso that at most two symbols X per ring are N;

W is the same or different at each instance and is NR, O or S.

10. The compound as claimed in claim 1, wherein the monodentate ligands $L^4$ are the same or different at each instance and are selected from the group consisting of carbon monoxide, nitrogen monoxide, alkyl cyanides, aryl cyanides, alkyl isocyanides, aryl isocyanides, amines, phosphines, phosphites, arsines, stibines, nitrogen heterocycles, carbenes, hydride, deuteride, fluoride, chloride, bromide, iodide, alkylacetylidene, arylacetylidene, cyanide, cyanate, isocyanate, thiocyanate, isothiocyanate, aliphatic or aromatic alkoxides, aliphatic or aromatic thioalkoxides, amides, carboxylates or aryl groups, and in that the bidentate ligands $L^4$ are selected from the group consisting of diamines, imines, diimines, heterocycles containing two nitrogen atoms, diphosphines, 1,3-diketonates derived from 1,3-diketones, 3-ketonates derived from 3-keto esters, carboxylates derived from aminocarboxylic acids, salicyliminates derived from salicylimines, dialkoxides derived from dialcohols, dithiolates derived from dithiols, bis(pyrazolylborates), bis(imidazolyl)borates, 3-(2-pyridyl)diazoles, or 3-(2-pyridyl)triazoles;

or $L^4$ is a ligand of one of the formulae ($L^4$-1), ($L^4$-2) and ($L^4$-3):

Formula ($L^4$-1)

Formula ($L^4$-2)

Formula ($L^4$-3)

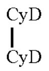

where the symbols used are as follows:

CyC is the same or different at each instance and is a substituted or unsubstituted aryl or heteroaryl group which has 5 to 14 aromatic ring atoms and coordinates in each case to the metal via a carbon atom and which is bonded to CyD via a covalent bond;

CyD is the same or different at each instance and is a substituted or unsubstituted heteroaryl group which has 5 to 14 aromatic ring atoms and coordinates to the metal via a nitrogen atom or via a carbene carbon atom and which is bonded to CyC via a covalent bond;

at the same time, two or more of the optional substituents together may form a ring system;

or $L^4$ is a ligand of one of the formulae ($L^4$-19) to ($L^4$-24), where these ligands each coordinate to the iridium via the two atoms identified by *:

($L^4$-19)

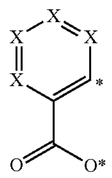

-continued ($L^4$-20)

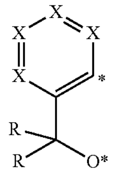

($L^4$-21)

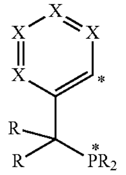

($L^4$-22)

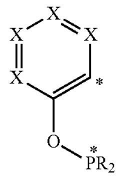

($L^4$-23)

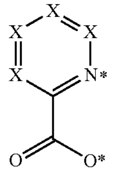

($L^4$-24)

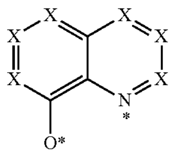

where R has the definitions given in claim 1 and X is the same or different at each instance and is CR or N, with the proviso that not more than two X are N.

11. A formulation comprising at least one compound as claimed in claim 1 and at least one further compound and/or a solvent.

12. An electronic device comprising at least one compound as claimed in claim 1.

13. The electronic device as claimed in claim 12, which is an organic electroluminescent device, wherein the compound is used as emitter in an emitting layer in combination with one or more matrix materials selected from the group consisting of ketones, phosphine oxides, sulfur oxides, sulfones, triarylamines, carbazole derivatives, biscarbazoles, bridged carbazole derivatives, indolocarbazole derivatives, indenocarbazole derivatives, azacarbazoles, bipolar matrix materials, azaboroles, boronic esters, diazasilole derivatives, diazaphosphole derivatives, triazine derivatives, zinc complexes, dibenzofuran derivatives, dibenzothiophene derivatives or triphenylene derivatives.

* * * * *